US012761557B2

(12) United States Patent
Yoshimura et al.

(10) Patent No.: US 12,761,557 B2
(45) Date of Patent: Oct. 13, 2026

(54) ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

(71) Applicant: FUJIFILM Corporation, Tokyo (JP)

(72) Inventors: Tsutomu Yoshimura, Haibara-gun (JP); Akiyoshi Goto, Haibara-gun (JP); Kyohei Sakita, Haibara-gun (JP); Kazuhiro Marumo, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 870 days.

(21) Appl. No.: 18/174,312

(22) Filed: Feb. 24, 2023

(65) Prior Publication Data

US 2023/0221640 A1 Jul. 13, 2023

Related U.S. Application Data

(63) Continuation of application No. PCT/JP2021/028542, filed on Aug. 2, 2021.

(30) Foreign Application Priority Data

Aug. 28, 2020 (JP) ................................ 2020-144145

(51) Int. Cl.
*G03F 7/039* (2006.01)
*C08F 220/36* (2006.01)
*C08F 220/38* (2006.01)

(52) U.S. Cl.
CPC ............ *G03F 7/039* (2013.01); *C08F 220/36* (2013.01); *C08F 220/38* (2013.01); *G03F 7/0392* (2013.01); *G03F 7/0397* (2013.01)

(58) Field of Classification Search
CPC ..... G03F 7/0392; G03F 7/0395; G03F 7/0397
See application file for complete search history.

(56) References Cited

U.S. PATENT DOCUMENTS

| | | | | |
|---|---|---|---|---|
| 5,002,853 A | 3/1991 | Aoai et al. | | |
| 2008/0102402 A1* | 5/2008 | Lee | ...................... | C07D 209/48 526/287 |
| 2023/0168581 A1* | 6/2023 | Shirakawa | ........... | C07D 327/06 430/270.1 |

FOREIGN PATENT DOCUMENTS

| | | |
|---|---|---|
| JP | 2-100054 A | 4/1990 |
| JP | 10-221852 A | 8/1998 |

(Continued)

OTHER PUBLICATIONS

Japanese Office Action dated Apr. 2, 2024 in Application No. 2022-545582.

(Continued)

*Primary Examiner* — Amanda C. Walke

(74) *Attorney, Agent, or Firm* — Sughrue Mion, PLLC

(57) ABSTRACT

Provided are an actinic ray-sensitive or radiation-sensitive resin composition having excellent defect suppressing properties, a resist film, a pattern forming method, and a method for manufacturing an electronic device. The actinic ray-sensitive or radiation-sensitive resin composition according to an embodiment is an actinic ray-sensitive or radiation-sensitive resin composition including a resin A having a repeating unit al having a group represented by any one of General Formula (1), (2), (3), (4), (5), or (6), which is a nonionic group that decomposes upon irradiation with actinic rays or radiation, and an additive B that is at least any one of an acid having an acid group having a pKa of −3.60 or more, or a salt having a structure in which a hydrogen atom of an acid group having a pKa of −3.60 or more is substituted with a cation.

(1)

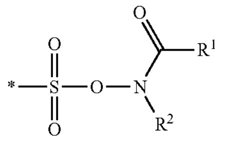

(2)

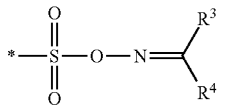

(3)

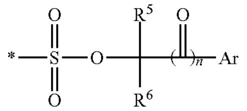

(4)

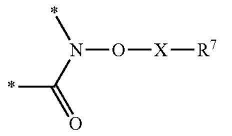

(5)

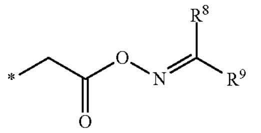

(6)

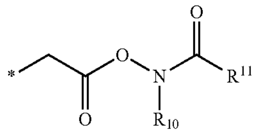

20 Claims, No Drawings

(56) References Cited

FOREIGN PATENT DOCUMENTS

| | | | | | |
|---|---|---|---|---|---|
| JP | 3828259 | B2 | * | 10/2006 | |
| JP | 2008-111120 | A | | 5/2008 | |
| JP | 2011-053315 | A | | 3/2011 | |
| KR | 20010045129 | A | * | 6/2001 | ........... G03F 7/0395 |
| KR | 101357606 | B1 | * | 2/2014 | |
| KR | 20230135443 | A | * | 9/2023 | ............. G03F 7/004 |
| WO | WO-2014119698 | A1 | * | 8/2014 | ........... C07C 381/12 |

OTHER PUBLICATIONS

International Preliminary Report on Patentability dated Feb. 28, 2023 with a Translation of the Written Opinion of the International Searching Authority in Application No. PCT/JP2021/028542.

Written Opinion of the International Searching Authority dated Oct. 19, 2021 in Application No. PCT/JP2021/028542.

International Search Report dated Oct. 19, 2021 in Application No. PCT/JP2021/028542.

* cited by examiner

ACTINIC RAY-SENSITIVE OR RADIATION-SENSITIVE RESIN COMPOSITION, RESIST FILM, PATTERN FORMING METHOD, AND METHOD FOR MANUFACTURING ELECTRONIC DEVICE

CROSS-REFERENCE TO RELATED APPLICATIONS

This application is a Continuation of PCT International Application No. PCT/JP2021/028542 filed on Aug. 2, 2021, which claims priority under 35 U.S.C. § 119(a) to Japanese Patent Application No. 2020-144145 filed on Aug. 28, 2020. Each of the above applications is hereby expressly incorporated by reference, in their entirety, into the present application.

BACKGROUND OF THE INVENTION

1. Field of the Invention

The present invention relates to an actinic ray-sensitive or radiation-sensitive resin composition, a resist film, a pattern forming method, and a method for manufacturing an electronic device.

2. Description of the Related Art

Various methods have been studied as a pattern forming method, and examples thereof include the following methods.

That is, an actinic ray-sensitive or radiation-sensitive resin film (hereinafter also referred to as a "resist film") formed using an actinic ray-sensitive or radiation-sensitive resin composition is exposed, and the resist film is caused to have a change in solubility in a developer in a region in which the exposed pattern is reflected. Thereafter, development is performed using a developer (an alkali water-based developer, an organic solvent-based developer, or the like), and the exposed portion or the unexposed portion of the resist film is removed to obtain a desired pattern.

For example, JP2008-111120A discloses a photoresist composition including a photoresist polymer including a repeating unit represented by the following chemical formula; a photoacid generator that generates an acid; and an organic solvent are contained, in which a content of the photoacid generator is 0.1 to 20 parts by weight and a content of the organic solvent is 300 to 5,000 parts by weight, with respect to 100 parts by weight of the photoresist polymer (claims 3 and 6).

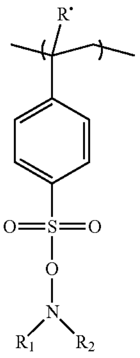

SUMMARY OF THE INVENTION

The present inventors have conducted studies on a photoresist composition (actinic ray-sensitive or radiation-sensitive resin composition) described in JP2008-111120A, and have thus found that there is room in improvement of defect suppressing properties in the formation of a pattern using the photoresist composition.

Therefore, an object of the present invention is to provide an actinic ray-sensitive or radiation-sensitive resin composition having excellent defect suppressing properties.

In addition, another object of the present invention is to provide a resist film, a pattern forming method, and a method for manufacturing an electronic device, each relating to the actinic ray-sensitive or radiation-sensitive resin composition.

The present inventors have found that the objects can be accomplished by the following configurations.

[1] An actinic ray-sensitive or radiation-sensitive resin composition comprising:

a resin A having a repeating unit a1 having a group represented by any one of General Formula (1), (2), (3), (4), (5), or (6), which is a nonionic group that decomposes upon irradiation with actinic rays or radiation and a content of which is 20% by mole or more with respect to all repeating units; and an additive B that is at least any one of an acid having an acid group having a pKa of −3.60 or more, or a salt having a structure in which a hydrogen atom of an acid group having a pKa of −3.60 or more is substituted with a cation.

(1)

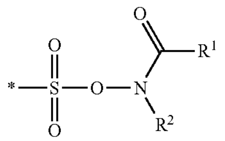

(2)

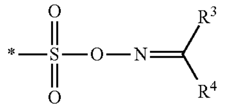

(3)

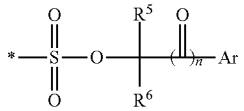

(4)

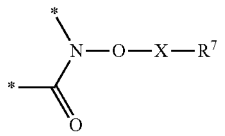

(5)

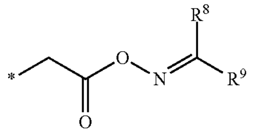

(6)

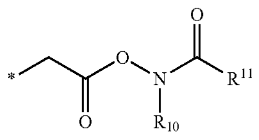

In General Formulae (1) to (6), * represents a bonding position.

In General Formula (1), $R^1$ and $R^2$ each independently represent an organic group. $R^1$ and $R^2$ may be bonded to each other to form a ring.

In General Formula (2), $R^3$ and $R^4$ each independently represent an organic group. $R^3$ and $R^4$ may be bonded to each other to form a ring.

In General Formula (3), $R^5$ and $R^6$ each independently represent a hydrogen atom or an organic group. $R^5$ and $R^6$ may be bonded to each other to form a ring.

n represents 0 or 1.

Ar represents an aromatic ring group which may have a substituent.

In General Formula (4), $R^7$ represents an organic group. X represents —CO— or —$SO_2$—.

In General Formula (5), $R^8$ and $R^9$ each independently represent an organic group. $R^8$ and $R^9$ may be bonded to each other to form a ring.

In General Formula (6), $R^{10}$ and $R^{11}$ each independently represent an organic group. $R^{10}$ and $R^{11}$ may be bonded to each other to form a ring.

[2] The actinic ray-sensitive or radiation-sensitive resin composition as described in [1], in which the actinic ray-sensitive or radiation-sensitive resin composition includes the resin A having a content of the repeating unit a1 of 40% by mole or more with respect to all the repeating units.

[3] The actinic ray-sensitive or radiation-sensitive resin composition as described in [1] or [2], in which a content of a repeating unit having an acid-decomposable group not corresponding to any one of the groups represented by General Formulae (1) to (6) in the resin A is 20% by mole or less with respect to all the repeating units.

[4] The actinic ray-sensitive or radiation-sensitive resin composition as described in any one of [1] to [3], in which SP values of all the repeating units constituting the resin A are 18.0 $MPa^{0.5}$ or more.

[5] The actinic ray-sensitive or radiation-sensitive resin composition as described in any one of [1] to [4], in which the resin A has a repeating unit having a lactone group.

[6] The actinic ray-sensitive or radiation-sensitive resin composition as described in any one of [1] to [5], in which a concentration of solid contents is 2% by mass or less.

[7] A resist film formed of the actinic ray-sensitive or radiation-sensitive resin composition as described in any one of [1] to [6].

[8] A pattern forming method comprising:

a step of forming a resist film on a substrate using the actinic ray-sensitive or radiation-sensitive resin composition as described in any one of [1] to [6];

a step of exposing the resist film; and a step of developing the exposed resist film using a developer.

[9] A method for manufacturing an electronic device, comprising the pattern forming method as described in [8].

According to the present invention, it is possible to provide an actinic ray-sensitive or radiation-sensitive resin composition having excellent defect suppressing properties.

In addition, the present invention can also provide a resist film, a pattern forming method, and a method for manufacturing an electronic device, each relating to the actinic ray-sensitive or radiation-sensitive resin composition.

DESCRIPTION OF THE PREFERRED EMBODIMENTS

Hereinafter, the present invention will be described in detail.

Description of configuration requirements described below may be made on the basis of representative embodiments of the present invention in some cases, but the present invention is not limited to such embodiments.

In notations for a group (atomic group) in the present specification, in a case where the group is noted without specifying whether it is substituted or unsubstituted, the group includes both a group having no substituent and a group having a substituent as long as this does not impair the spirit of the present invention. For example, an "alkyl group" includes not only an alkyl group having no substituent (unsubstituted alkyl group), but also an alkyl group having a substituent (substituted alkyl group).

In addition, an "organic group" in the present specification refers to a group including at least one carbon atom.

The substituent is a monovalent substituent unless otherwise specified.

"Actinic rays" or "radiation" in the present specification means, for example, a bright line spectrum of a mercury lamp, far ultraviolet rays typified by an excimer laser, extreme ultraviolet rays (EUV light), X-rays, an electron beam (EB), or the like. "Light" in the present specification means actinic rays or radiation.

Unless otherwise specified, "exposure" in the present specification encompasses not only exposure by a bright line spectrum of a mercury lamp, far ultraviolet rays typified by an excimer laser, extreme ultraviolet rays (EUV light), X-rays, or the like, but also lithography by particle beams such as electron beams and ion beams.

In the present specification, a numerical range expressed using "to" is used in a meaning of a range that includes the preceding and succeeding numerical values of "to" as the lower limit value and the upper limit value, respectively.

The bonding direction of divalent groups noted in the present specification is not limited unless otherwise specified. For example, in a case where Y in a compound represented by Formula "X—Y—Z" is —COO—, Y may be —CO—O— or —O—CO—. In addition, the compound may be "X—CO—O—Z" or "X—O—CO—Z".

In the present specification, (meth)acrylate represents acrylate and methacrylate, and (meth)acryl represents acryl and methacryl.

In the present specification, a weight-average molecular weight (Mw), a number-average molecular weight (Mn), and a dispersity (also referred to as a molecular weight distribution) (Mw/Mn) of a resin are defined as values expressed in terms of polystyrene by means of gel permeation chromatography (GPC) measurement (solvent: tetrahydrofuran, flow amount (amount of a sample injected): 10 μL, columns: TSK gel Multipore HXL-M manufactured by Tosoh Corporation, column temperature: 40° C., flow rate: 1.0 mL/min, and detector: differential refractive index detector) using a GPC apparatus (HLC-8120GPC manufactured by Tosoh Corporation).

In the present specification, the compositional ratio (a molar ratio, a mass ratio, or the like) of the resin is measured by means of $^{13}C$-nuclear magnetic resonance (NMR).

In the present specification, an acid dissociation constant (pKa) represents a pKa in an aqueous solution, and is specifically a value determined by computation from a value based on a Hammett's substituent constant and database of publicly known literature values, using the following software package 1. Any of the pKa values described in the present specification indicate values determined by computation using the software package.

Software Package 1: Advanced Chemistry Development (ACD/Labs) Software V 8.14 for Solaris (1994-2007 ACD/Labs).

On the other hand, the pKa can also be determined by a molecular orbital computation method. Examples of a specific method therefor include a method for performing calculation by computing $H^+$ dissociation free energy in an aqueous solution based on a thermodynamic cycle. With regard to a computation method for $H^+$ dissociation free energy, the $H^+$ dissociation free energy can be computed by, for example, density functional theory (DFT), but various other methods have been reported in literature and the like, and are not limited thereto. Furthermore, there are a plurality of software applications capable of performing DFT, and examples thereof include Gaussian 16.

As described above, the pKa in the present specification refers to a value determined by computation from a value based on a Hammett's substituent constant and database of publicly known literature values, using the software package 1, but in a case where the pKa cannot be calculated by the method, a value obtained by Gaussian 16 based on density functional theory (DFT) shall be adopted.

In addition, the pKa in the present specification refers to a "pKa in an aqueous solution" as described above, but in a case where the pKa in an aqueous solution cannot be calculated, a "pKa in a dimethyl sulfoxide (DMSO) solution" shall be adopted.

In the present specification, examples of the halogen atom include a fluorine atom, a chlorine atom, a bromine atom, and an iodine atom.

[Actinic Ray-Sensitive or Radiation-Sensitive Resin Composition]

The actinic ray-sensitive or radiation-sensitive resin composition according to an embodiment of the present invention includes:

- a resin A having a repeating unit a1 having a group represented by any one of General Formula (1), (2), (3), (4), (5), or (6), which is a nonionic group that decomposes upon irradiation with actinic rays or radiation and a content of which is 20% by mole or more with respect to all repeating units, and
- an additive B that is at least any one of an acid having an acid group having a pKa of −3.60 or more, or a salt having a structure in which a hydrogen atom of an acid group having a pKa of −3.60 or more is substituted with a cation.

Hereinafter, the actinic ray-sensitive or radiation-sensitive resin composition is also referred to as a "resist composition".

The group represented by any one of General Formula (1), (2), (3), (4), (5), or (6), which is an nonionic group that decomposes upon irradiation with actinic rays or radiation, is also referred to as a "specific functional group".

The mechanism of action of improving the defect suppressing properties in the formation of a pattern by adopting such a configuration is not necessarily clear, but is speculated to be as follows by the present inventors.

First, in a resist film formed of a typical chemically amplified resist composition, an acid generated from a photoacid generator by exposure acts on an acid-decomposable resin to cause decomposition of an acid-decomposable group, leading to a change in polarity in the exposed portion. In this case, the acid generated from the photoacid generator diffuses in the resist film, so that the dissolution contrast is easily deteriorated. In addition, it has been difficult to suppress the generation of fine defects due to probabilistic factors such as whether or not the photoacid generator that received light decomposes to generate an acid; whether or not the generated acid encounters an acid-decomposable group; and whether or not decomposition of the acid-decomposable group actually occurs even in a case where the generated acid encounters an acid-decomposable group.

On the other hand, the resist composition of the embodiment of the present invention includes the resin A, and a specific functional group in the resin A is exposed to directly cleave a chemical bond, resulting in a change in polarity of a portion thereof. It is presumed that it makes a contribution to suppressed generation of defects in the formation of a pattern that the dependence on the probabilistic factors as described above is small and a change in polarity in the exposed portion can be realized more directly.

In addition, the resist composition of the embodiment of the present invention also includes an additive B. It is presumed that it makes a contribution to excellent defect suppressing properties the resist composition of the embodiment of the present invention that the additive B interacts with the resin A to promote a cleavage of side chains in a case where the resin A is exposed, and at the same time, increases a difference in solubility between the exposed portion and the unexposed portion of the resin A during development.

In addition, the resist composition of the embodiment of the present invention is also excellent in a resolution in the formation of a pattern.

Hereinafter, the resist composition of the embodiment of the present invention being more excellent in at least one of defect suppressing properties or a resolution is also referred to as the effect of the present invention being more excellent.

Hereinafter, the resist composition of the embodiment of the present invention will be described in detail.

The resist composition may be either a positive tone resist composition or a negative tone resist composition. In addition, the resist composition may be either a resist composition for alkali development or a resist composition for organic solvent development.

The resist composition of the embodiment of the present invention is typically a non-chemically amplified resist composition, but the resist composition of the embodiment of the present invention may be combined with the mechanism as a chemically amplified resist composition.

Hereinbelow, various components of the resist composition will first be described in detail.

[Resin A]

The resist composition includes a resin A.

The resin A is a resin having a repeating unit a1 having a group (specific functional group) represented by any one of General Formula (1), (2), (3), (4), (5), or (6), which is a nonionic group that decomposes by irradiation (exposure) with actinic rays or radiation.

The specific functional group decomposes upon irradiation with actinic rays or radiation to generate a polar group.

That is, the resin A has a repeating unit having a group that decomposes by exposure to generate a polar group. A resin having this repeating unit usually has an increased polarity by exposure, and thus has an increased solubility in an alkali developer, and a decreased solubility in an organic solvent.

That is, in the pattern forming method of an embodiment of the present invention, typically, in a case where an alkali developer is adopted as the developer, a positive tone pattern is suitably formed, and in a case where an organic developer is adopted as the developer, a negative tone pattern is suitably formed.

<Repeating Unit a1>

The resin A has a repeating unit a1.

The repeating unit a1 has a specific functional group.

The specific functional group is a group represented by any one of General Formula (1), . . . , or (6).

(1)

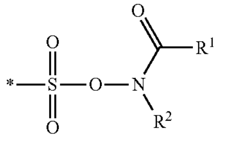

(2)

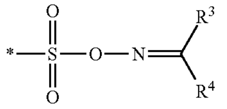

(3)

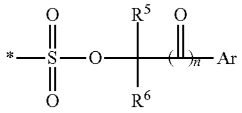

(4)

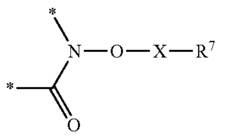

(5)

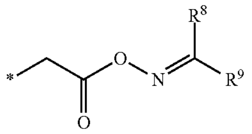

(6)

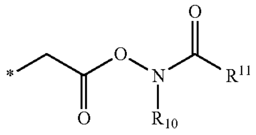

In General Formula (1), * represents a bonding position.

In General Formula (1), $R^1$ and $R^2$ each independently represent an organic group.

Examples of the organic group include a cyano group, an alkyl group, an alkoxy group, an alkoxycarbonyl group, an alkenyl group, a cycloalkyl group, and an aromatic ring group.

The alkyl group may be linear or branched, and preferably has 1 to 5 carbon atoms. Examples of the alkyl group include a methyl group, an ethyl group, an n-propyl group, an isopropyl group, an n-butyl group, an isobutyl group, and a t-butyl group.

Examples of an alkyl group moiety in the alkoxy group and the alkoxycarbonyl group include the same groups as those of the alkyl group.

The alkenyl group may be linear or branched, and preferably has 1 to 5 carbon atoms. Examples of the alkenyl group include a vinyl group.

The cycloalkyl group preferably has 3 to 15 ring member atoms. The cycloalkyl group is preferably a monocyclic cycloalkyl group such as a cyclopentyl group and a cyclohexyl group, or a polycyclic cycloalkyl group such as a norbornyl group, a tetracyclodecanyl group, a tetracyclododecanyl group, and an adamantyl group. In the cycloalkyl group, for example, one or more (for example, 1 to 3) of methylene groups constituting a ring may be substituted with a heteroatom (—O—, —S—, or the like), $—SO_2—$, $—SO_3—$, an ester group, a carbonyl group, or a vinylidene group. In addition, in such the cycloalkyl group, one or more (for example, 1 or 2) of the ethylene groups constituting the cycloalkane ring may be substituted with a vinylene group.

The aromatic ring group may be a monocycle or a polycycle, and preferably has 5 to 15 ring member atoms. The aromatic ring group may have one or more (for example, 1 to 5) heteroatoms (an oxygen atom, a sulfur atom, and/or a nitrogen atom) as a ring member atom. Examples of the aromatic ring group include a benzene ring group, a naphthalene ring group, an anthracene ring group, a thiazole ring group, and a benzothiazole ring group.

Examples of the substituent which may be contained in the alkyl group, the alkoxy group, the alkoxycarbonyl group, and the alkenyl group include a halogen atom (such as a fluorine atom), a hydroxyl group, a nitro group, a cyano group, a cycloalkyl group, and an aromatic ring group. For example, the alkyl group may have a fluorine atom as a substituent, and may thus be a perfluoroalkyl group. Examples of the cycloalkyl group and the aromatic ring group as the substituent include the cycloalkyl group and the aromatic ring group described above as a form which the organic group can take.

Examples of the substituent which may be contained in the cycloalkyl group and the aromatic ring group include a halogen atom, a hydroxyl group, a nitro group, a cyano group, an alkyl group, an alkoxy group, an alkoxycarbonyl group, and an alkenyl group. Examples of the alkyl group, the alkoxy group, the alkoxycarbonyl group, and the alkenyl group as the substituent include the alkyl group, the alkoxy group, the alkoxycarbonyl group, and the alkenyl group described as a form which the organic group can take. The alkyl group, the alkoxy group, the alkoxycarbonyl group, and the alkenyl group as the substituent may further have the substituent as described above.

$R^1$ and $R^2$ may be bonded to each other to form a ring.

The ring formed by mutual bonding of $R^1$ and $R^2$ may be a monocycle or a polycycle. The ring preferably has 4 to 15 ring member atoms.

In a case where $R^1$ and $R^2$ are bonded to each other to form a ring, it is preferable that $R^1$ and $R^2$ are bonded to each other to form a group represented by General Formula (LC).

$$*^V\text{-}L^{C1}\text{-}L^{L1}\text{-}L^{A1}\text{-}L^{A2}\text{-}L^{L2}\text{-}L^{C2}\text{-}*^W \quad \text{(LC)}$$

In General Formula (LC), $*^V$ represents a bonding position on the $R^1$ side. In other words, $*^V$ is a bonding position with —CO— specified in General Formula (1).

In General Formula (LC), *W represents a bonding position on the $R^2$ side. In other words, $*^W$ is a bonding position with a nitrogen atom specified in General Formula (1).

In General Formula (LC), $L^{C1}$ and $L^{C2}$ each independently represent a single bond, —CO—, or $—SO_2—$.

In General Formula (LC), $L^{L1}$ and $L^{L2}$ each independently represent a single bond or an alkylene group.

The alkylene group may be linear or branched, and preferably has 1 to 15 carbon atoms.

One or more (for example, 1 to 3) of methylene groups constituting the alkylene group may be substituted with a heteroatom (—O—, —S—, or the like), $—SO_2—$, $—SO_3—$, an ester group, a carbonyl group, or a vinylidene group. The vinylidene group may have a substituent, and examples of the substituent which is contained in the vinylidene group include an organic group. Examples of the organic group which can be contained in the vinylidene group include the organic group described as the organic group represented by $R^1$.

In addition, one or more (for example, 1 or 2) of the ethylene groups constituting an alkylene group may be substituted with a vinylene group.

The alkylene group may be, for example, "-alkylene group in which a methylene group or the like is not substituted-", "-alkylene group-O— in which a methylene group or the like is not substituted", "—S-vinylene group-vinylidene group-", or "-vinylene group-".

Furthermore, the alkylene group in which a methylene group or the like is not substituted is intended to be a linear or branched alkylene group in which a methylene group constituting the alkylene group is not substituted with a heteroatom or the like, and an ethylene group constituting the alkylene group is not substituted with a vinylene group. The alkylene group in which a methylene group or the like is not substituted preferably has 1 to 8 carbon atoms.

In General Formula (LC), $L^{A1}$ and $L^{A2}$ each independently represent a single bond or an aromatic ring.

The aromatic ring group may be a monocycle or a polycycle, and preferably has 5 to 15 ring member atoms. The aromatic ring group may have one or more (for example, 1 to 5) heteroatoms (an oxygen atom, a sulfur atom, and/or a nitrogen atom) as a ring member atom. Examples of the aromatic ring group include a benzene ring group (a benzene-1,2-diyl group and the like), a naphthalene ring group (a naphthalene-1,2-diyl group and the like), an anthracene ring group, a thiazole ring group, and a benzothiazole ring group.

In General Formula (LC), it is preferable that at least one of $L^C1$, $L^{L1}$, $L^{A1}$, $L^{A2}$, $L^{L2}$, or $L^{C2}$ is other than a single bond, and at least one of $L^{L1}$, $L^{A1}$, $L^{A2}$, or $L^{L2}$ is other than a single bond. In addition, in a case where both $L^{A1}$ and $L^{A2}$ are single bonds, it is also preferable that $L^{L2}$ is a single bond.

The total number of atoms other than a hydrogen atom in the group represented by General Formula (LC) is preferably 3 to 100, and more preferably 4 to 20.

In the group represented by General Formula (LC), formed by mutual bonding of $R^1$ and $R^2$ in General Formula (1), it is preferable that $L^{C1}$ is a single bond, $L^{L1}$ is a single bond, $L^{A1}$ is an aromatic ring group, $L^{A2}$ is a single bond, $L^{12}$ is a single bond, and $L^{C2}$ is —CO—.

In General Formula (2), * represents a bonding position.

In General Formula (2), $R^3$ and $R^4$ each independently represent an organic group.

Examples of the organic group represented by $R^3$ or $R^4$ of General Formula (2) include the organic group described as the organic group represented by $R^1$ or $R^2$ of General Formula (1).

$R^3$ and $R^4$ may be bonded to each other to form a ring.

The ring formed by mutual bonding of $R^3$ and $R^4$ may be a monocycle or a polycycle. The ring preferably has 4 to 15 ring member atoms.

In a case where $R^3$ and $R^4$ are bonded to each other to form a ring, it is preferable that $R^3$ and $R^4$ are bonded to each other to form a group represented by General Formula (LC).

It should be noted that in General Formula (LC) in this case, $*^V$ is a bonding position on the $R^3$ side and $*^W$ is a bonding position on the $R^4$ side.

In the group represented by General Formula (LC), formed by mutual bonding of $R^3$ and $R^4$ in General Formula (1), it is preferable that $L^{C1}$ is a single bond. $L^{L1}$ is an alkylene group, $L^{A1}$ is a single bond or an aromatic ring group, $L^{A2}$ is a single bond, $L^{L2}$ is a single bond, and $L^{C2}$ is a single bond.

In General Formula (3), * represents a bonding position.

In General Formula (3), $R^5$ and $R^6$ each independently represent a hydrogen atom or an organic group.

Examples of the organic group represented by $R^5$ or $R^6$ of General Formula (3) include the organic group described as the organic group represented by $R^1$ or $R^2$ of General Formula (1).

$R^5$ and $R^6$ may be bonded to each other to form a ring.

The ring formed by mutual bonding of $R^5$ and $R^6$ may be a monocycle or a polycycle. The ring preferably has 4 to 15 ring member atoms.

In a case where $R^5$ and $R^6$ are bonded to each other to form a ring, it is preferable that $R^5$ and $R^6$ are bonded to each other to form a group represented by General Formula (LC).

It should be noted that in General Formula (LC) in this case, $*^V$ is a bonding position on the $R^5$ side, and $*^W$ is a bonding position on the $R^6$ side.

In the group represented by General Formula (LC), which is formed by mutual bonding of $R^5$ and $R^6$ in General Formula (3), it is preferable that $L^{C1}$ is a single bond, $L^{L1}$ is an alkylene group, $L^{A1}$ is a single bond, $L^{A2}$ is a single bond, $L^{L2}$ is a single bond, and $L^{C2}$ is a single bond.

In General Formula (3), n represents 0 or 1.

In General Formula (3), Ar represents an aromatic ring group which may have a substituent.

Examples of the aromatic ring group represented by Ar in General Formula (3) include the aromatic ring group described as one form of the organic group represented by $R^1$ or $R^2$ in General Formula (1).

In addition, it is also preferable that the group represented by General Formula (3) constitutes an acid-decomposable group obtained by protecting a sulfonic acid group as a polar group with "$—CR^5R^6—(CO)_n—Ar$" as a protective group.

In General Formula (4), * represents a bonding position.

In General Formula (4), $R^7$ represents an organic group.

Examples of the organic group represented by $R^7$ of General Formula (4) include the organic group described as the organic group represented by $R^1$ or $R^2$ of General Formula (1).

In General Formula (4), X represents —CO— or $—SO_2—$.

In General Formula (5), * represents a bonding position.

In General Formula (5), $R^8$ and $R^9$ each independently represent an organic group.

Examples of the organic group represented by $R^8$ or $R^9$ of General Formula (5) include the organic group described as the organic group represented by $R^1$ or $R^2$ of General Formula (1).

$R^8$ and $R^9$ may be bonded to each other to form a ring.

The ring formed by mutual bonding of $R^8$ and $R^9$ may be a monocycle or a polycycle. The ring preferably has 4 to 15 ring member atoms.

In a case where $R^8$ and $R^9$ are bonded to each other to form a ring, it is preferable that $R^8$ and $R^9$ are bonded to each other to form a group represented by General Formula (LC).

It should be noted that in General Formula (LC) in this case, $*^V$ is a bonding position on the $R^8$ side, and $*^W$ is a bonding position on the $R^9$ side.

In the group represented by General Formula (LC), which is formed by mutual bonding of $R^8$ and $R^9$ in General Formula (5), it is preferable that $L^{C1}$ is a single bond, $L^{L1}$ is an alkylene group, $L^{A1}$ is a single bond or an aromatic ring group, $L^{A2}$ is a single bond or an aromatic ring group. $L^{L2}$ is a single bond, and $L^{C2}$ is a single bond.

In General Formula (6), * represents a bonding position.

In General Formula (6), $R^{10}$ and $R^{11}$ each independently represent an organic group.

Examples of the organic group represented by $R^{10}$ or $R^{11}$ of General Formula (6) include the organic group described as the organic group represented by $R^1$ or $R^2$ of General Formula (1).

$R^{10}$ and $R^{11}$ may be bonded to each other to form a ring.

The ring formed by mutual bonding of $R^{10}$ and $R^{11}$ may be a monocycle or a polycycle. The ring preferably has 4 to 15 ring member atoms.

In a case where $R^{10}$ and $R^{11}$ are bonded to each other to form a ring, it is preferable that $R^{10}$ and $R^{11}$ are bonded to each other to form a group represented by General Formula (LC).

It should be noted that in General Formula (LC) in this case, $*^V$ is a bonding position on the $R^{10}$ side, and $*^W$ is a bonding position on the $R^{11}$ side.

In the group represented by General Formula (LC), which is formed by mutual bonding of $R^{10}$ and $R^{11}$ in General Formula (6), it is preferable that $L^{C1}$ is —CO—, $L^{L1}$ is a single bond, $L^{A1}$ is an aromatic ring group, $L^{A2}$ is a single bond, $L^{L2}$ is a single bond, and $L^{C2}$ is a single bond.

The repeating unit a1 may have at least one specific functional group, and may have two or more (for example, 2 to 4) repeating units a1. In a case where the repeating unit a1 has two or more specific functional groups, the two or more specific functional groups may have the same structure or different structures. In addition, the two or more specific functional groups may be specific functional groups represented by the same general formula or specific functional groups represented by different general formulae.

The repeating unit a1 is preferably, for example, a repeating unit represented by General Formula (aa).

The repeating unit represented by General Formula (aa) is the repeating unit a1 having a group represented by any one of General Formula (1), (2), or (3), General Formula (5), or General Formula (6) mentioned above.

(aa)

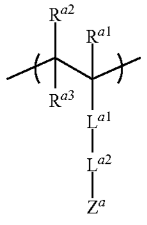

In General Formula (aa), $R^{a1}$ to $R^{a3}$ each independently represent a hydrogen atom or a substituent.

The substituent is preferably a halogen atom or an alkyl group, and more preferably a methyl group.

In General Formula (aa), $L^{a1}$ represents —COO—, an aromatic ring group, or a group formed by combination of these groups.

The aromatic ring group may be a monocycle or a polycycle, and preferably has 5 to 15 ring member atoms. The aromatic ring group may have one or more (for example, 1 to 5) heteroatoms (an oxygen atom, a sulfur atom, and/or a nitrogen atom) as a ring member atom. The aromatic ring group is preferably a benzene ring group (a benzene-1,4-diyl group or the like).

Examples of the group formed by the combination include —COO-aromatic ring group- and -aromatic ring group-COO—.

In General Formula (aa), $L^{a2}$ represents a single bond or a divalent linking group.

Examples of the divalent linking group include —CO—, —O—, —S—, —SO—, —$SO_2$—, a hydrocarbon group (for example, an alkylene group, a cycloalkylene group, an alkenylene group, and an arylene group), and a linking group in which a plurality of these groups are linked. As the substituent which may be contained in the hydrocarbon group, a halogen atom is preferable.

The alkylene group may be linear or branched, and preferably has 1 to 4 carbon atoms.

The cycloalkylene group may be a monocycle or a polycycle, and preferably has 3 to 15 carbon atoms.

One or more (preferably 1 or 2) of —$CH_2$—'s constituting the ring structure of the cycloalkylene group may be substituted with a heteroatom (—O—, —S—, and the like), —$SO_2$—, —$SO_3$—, an ester group, or a carbonyl group. As a result of this, the cycloalkylene group may be a lactone group. Examples of the lactone group include a lactone group obtained by extracting two hydrogen atoms having a lactone structure represented by any one of Formula (LC1-1), . . . , or (LC1-21), which will be described later.

Among those, the divalent linking group is preferably an alkylene group or a -cycloalkylene group-O—.

In General Formula (aa), $Z^a$ represents any one of the groups represented by General Formulae (1) to (3), General Formula (5), and General Formula (6).

Among those, the group to which the group represented by any one of General Formula (1), . . . , or (3) is directly bonded is preferably other than an oxygen atom, and an alkylene group (for example, an alkylene group constituting $L^{a2}$) or an aromatic ring group (for example, an aromatic ring group constituting $L^{a2}$) is preferable.

The group to which the group represented by General Formula (5) or (6) is directly bonded is preferably an oxygen atom (for example, an oxygen atom in —COO— constituting $L^{a1}$ or an oxygen atom in —O— constituting $L^{a2}$).

The repeating unit a1 is also preferably, for example, a repeating unit represented by any one of General Formula (ab), . . . , or (ad).

The repeating unit represented by any one of General Formula (ab), . . . , or (ad) is the repeating unit a1 having a group represented by General Formula (4).

(ab)

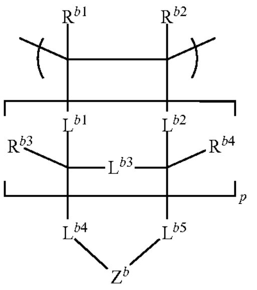

(ac)

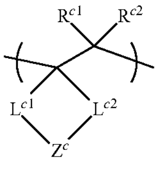

-continued (ad)

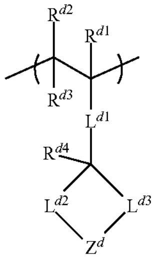

In General Formula (ab), p represents an integer of 0 or more, and is preferably an integer of 0 to 2.

In a case where p is an integer of 2 or more, $R^{b3}$'s, $R^{b4}$'s, $L^{b1}$'s, $L^{b2}$'s, and $L^{b3}$'s, each of which are present in plurality, may be the same as or different from each other.

In General Formula (ab), $R^{b1}$ to $R^{b4}$ each independently represent a hydrogen atom or a substituent.

Examples of the substituent include a halogen atom and an alkyl group.

Among those, $R^{b1}$ to $R^{b4}$ are each preferably the hydrogen atom.

In General Formula (ab), $L^{b1}$ to $L^{b5}$ each independently represent a single bond or a divalent linking group.

Examples of the divalent linking group include —CO—, —O—, —S—, —SO—, —$SO_2$—, a hydrocarbon group (for example, an alkylene group, a cycloalkylene group, an alkenylene group, and an arylene group), and a linking group in which a plurality of these groups are linked. As the substituent which may be contained in the hydrocarbon group, a halogen atom is preferable.

The alkylene group may be linear or branched, and preferably has 1 to 4 carbon atoms.

Among those, $L^{b1}$, $L^{b2}$, and $L^{b4}$ are each preferably the single bond.

$L^{b3}$ is preferably the single bond or an alkylene group, and more preferably the single bond or a methylene group.

$L^{b5}$ is preferably —CO—.

In General Formula (ab), $Z^b$ is a group represented by General Formula (4).

It is preferable that —CO— specified in General Formula (4) is bonded to $L^{b4}$.

In General Formula (ac), $R^{c1}$ and $R^{c2}$ each independently represent a hydrogen atom or a substituent.

Examples of the substituent include a halogen atom and an alkyl group.

Among those, $R^{c1}$ and $R^{c2}$ are each preferably the hydrogen atom.

In General Formula (ac), $L^{c1}$ and $L^{c2}$ each independently represent a single bond or a divalent linking group.

Examples of the divalent linking group include —CO—, —O—, —S—, —SO—, —$SO_2$—, a hydrocarbon group (for example, an alkylene group, a cycloalkylene group, an alkenylene group, and an arylene group), and a linking group in which a plurality of these groups are linked. As the substituent which may be contained in the hydrocarbon group, a halogen atom is preferable.

The alkylene group may be linear or branched, and preferably has 1 to 4 carbon atoms.

The divalent linking group is preferably a group consisting of one or more selected from the group consisting of an alkylene group, —O—, and —CO—, and is more preferably "*p-alkylene group-O-alkylene group-*q" or "*p-alkylene group-CO-*q". *p and *q are each a bonding position, where *p may be a bonding position on the $Z^c$ side or *q may be a bonding position on the $Z^c$ side. It is also preferable that the *p-side and/or *q-side alkylene group in "*p-alkylene group-O-alkylene group-*q" and the alkylene group in "*p-alkylene group-CO-*q" each have a halogen atom as the substituent, and may be a perhalogenated alkylene group (a perfluoroalkylene group and the like).

Among those, $L^{c1}$ is preferably the single bond.

$L^{c2}$ is preferably a divalent linking group, and more preferably "*p-alkylene group-O-alkylene group-*q" or "*p-alkylene group-CO-*q".

In General Formula (ac), $Z^c$ is the group represented by General Formula (4) mentioned above.

It is preferable that —CO— specified in General Formula (4) is bonded to $L^{c1}$.

In General Formula (ad), $R^{d1}$ to $R^{d4}$ each independently represent a hydrogen atom or a substituent.

Examples of the substituent include a halogen atom and an alkyl group.

Among those, $R^{d1}$ is preferably the hydrogen atom or the alkyl group, and more preferably the hydrogen atom or a methyl group.

$R^{d2}$ to $R^{d4}$ are each preferably the hydrogen atom.

In General Formula (ad), $L^{d1}$ to $L^{d3}$ each independently represent a single bond or a divalent linking group.

Examples of the divalent linking group include —CO—, —O—, —S—, —SO—, —$SO_2$—, a hydrocarbon group (for example, an alkylene group, a cycloalkylene group, an alkenylene group, and an arylene group), and a linking group in which a plurality of these groups are linked. As the substituent which may be contained in the hydrocarbon group, a halogen atom is preferable.

The alkylene group may be linear or branched, and preferably has 1 to 4 carbon atoms.

Among those, $L^{d1}$ is preferably an ester group (—COO—).

$L^{d2}$ is preferably the single bond.

$L^{d3}$ is preferably "*p-alkylene group-CO-*q". *p and*q are each a bonding position, where *p may be a bonding position on the $Z^d$ side,*q may be a bonding position on the $Z^d$ side, and*q is preferably the bonding position on the $Z^d$ side.

In General Formula (ad), $Z^d$ is a group represented by General Formula (4).

It is preferable that —CO— specified in General Formula (4) is bonded to $L^{d2}$.

The repeating unit a1 will be exemplified below.

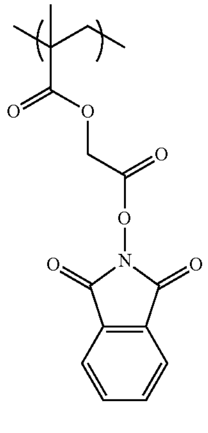

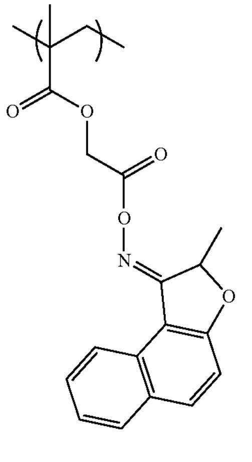

-continued
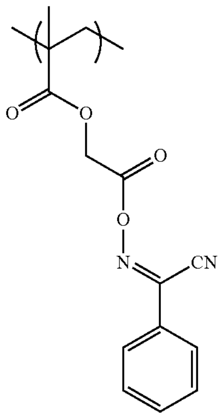
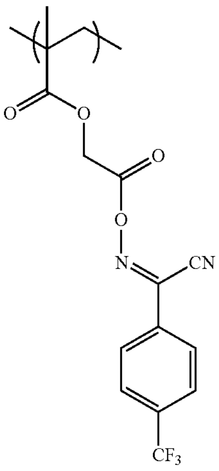
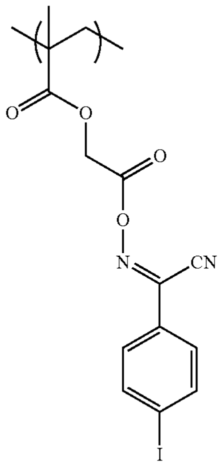
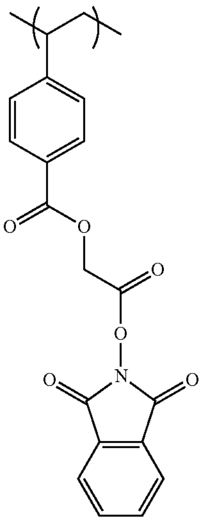
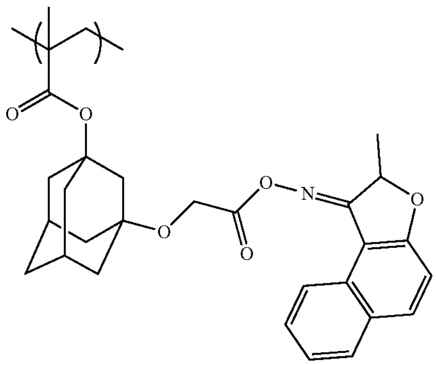
-continued
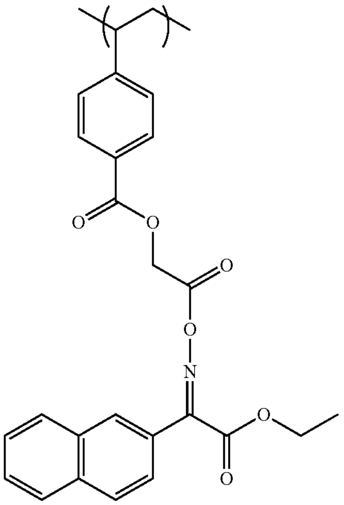
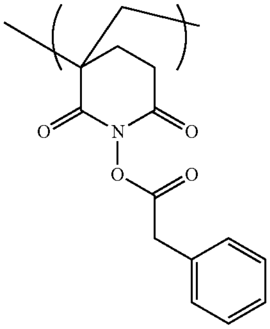
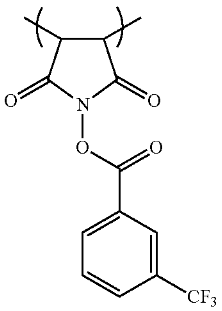
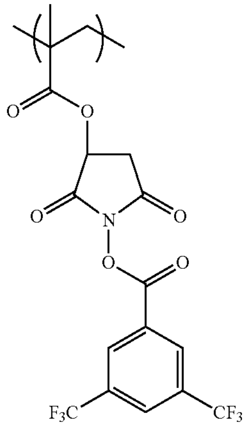
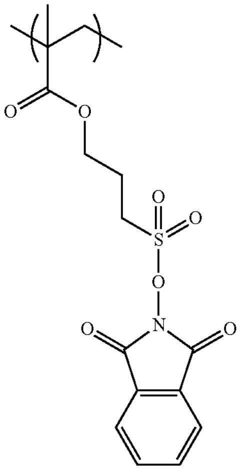

-continued
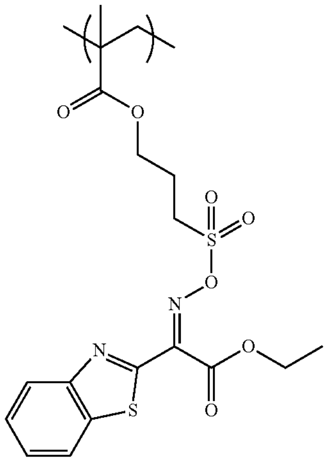
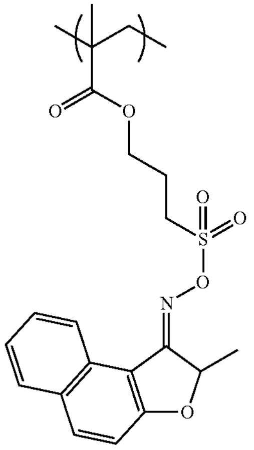
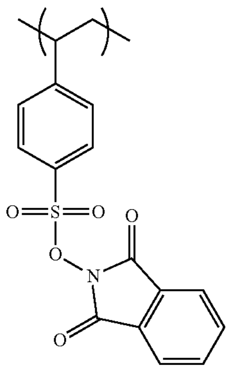
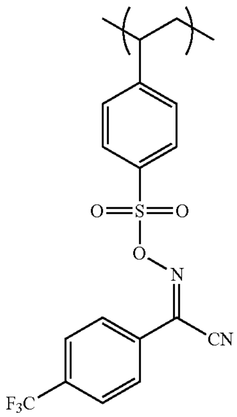
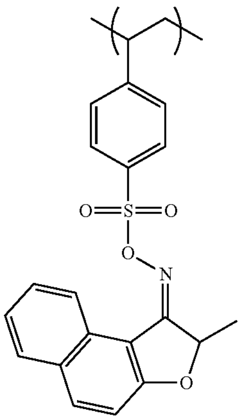
-continued
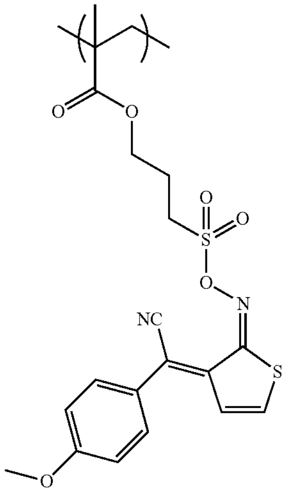
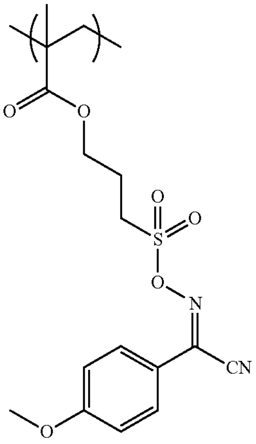
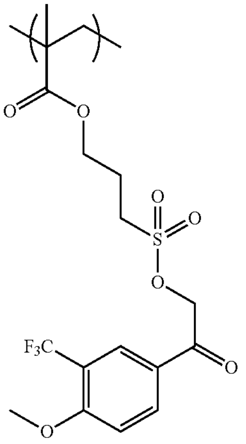
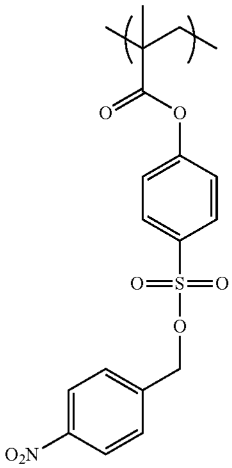
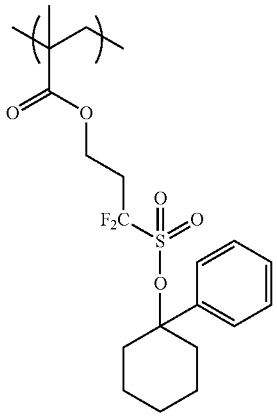

-continued

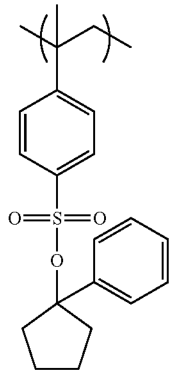

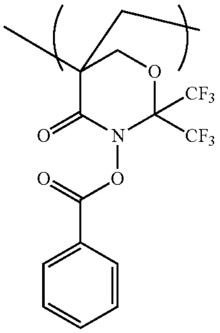

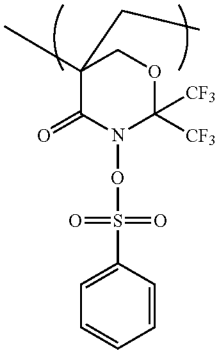

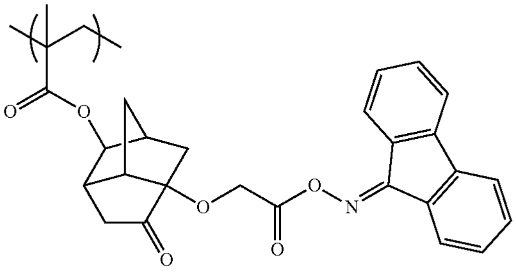

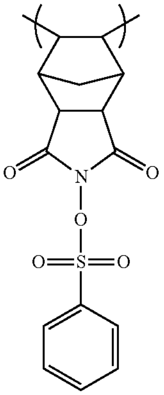

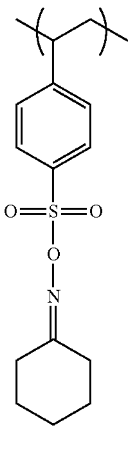

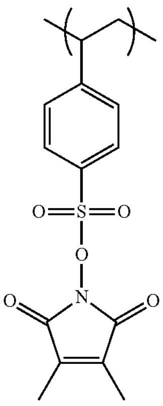

The content of the repeating unit a1 is 20% by mole or more, and preferably 40% by mole or more with respect to all the repeating units in the resin A. In addition, the upper limit value thereof may be 100% by mole or less.

The repeating unit a1 may be used alone or in combination of two or more kinds thereof. In a case where two or more kinds of such other photoacid generators are used, a total content thereof is preferably within the suitable content range.

In a case where two or more kinds of the resin A are present, it is preferable that the resist composition includes one or more kinds of the resin A in which the content of the repeating unit a1 is 40% by mole or more with respect to all the repeating units. In this case, the resist composition includes the resin A having a content of the repeating unit a11 of 40% by mole or more with respect to all the repeating units, preferably in an amount of 30% to 100% by mass with respect to the total content of the resin A, more preferably in an amount of 60% to 100% by mass with respect to the total content of the resin A, and still more preferably in an amount of 80% to 100% by mass with respect to the total content of the resin A.

<Repeating Unit Having Non-Corresponding Acid-Decomposable Group>

The resin A may include a repeating unit having an acid-decomposable group which does not correspond to the group represented by any one of General Formula (1), (2), (3), (4), (5), or (6) (also referred to as a “non-corresponding acid-decomposable group”).

The expression that the non-corresponding acid-decomposable group does not correspond to the group represented by any one of General Formula (1), (2), (3), (4), (5), or (6) is intended to mean, for example, that the group represented by any one of General Formula (1), (2), (3), (4), (5), or (6) does not include, even with the group being a group that decomposes by the action of an acid to generate a polar group, such the non-corresponding acid-decomposable group. In addition, the non-corresponding acid-decomposable group does not also include the group represented by any one of General Formula (1), (2), (3), (4), (5), or (6) as a part thereof.

The repeating unit having a non-corresponding acid-decomposable group does not need to have a group (specific functional group) represented by any one of General Formula (1), (2), (3), (4), (5), or (6) mentioned above, in addition to the non-corresponding acid-decomposable group, and it is preferable that the repeating unit does not have the specific functional group.

The acid-decomposable group refers to a group that decomposes by the action of an acid to generate a polar group. The acid-decomposable group preferably has a structure in which the polar group is protected by a leaving group that leaves by the action of an acid. The acid-decomposable group can decompose by the action of an acid to generate a polar group.

As the polar group, an alkali-soluble group is preferable, and examples thereof include an acidic group such as a carboxyl group, a phenolic hydroxyl group, a fluorinated alcohol group, a sulfonic acid group, a phosphoric acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, and a tris(alkylsulfonyl)methylene group, and an alcoholic hydroxyl group.

Examples of the leaving group that leaves by the action of an acid include groups represented by Formulae (Y1) to (Y4).

$—C(Rx_1)(Rx_2)(Rx_3)$ Formula (Y1):

$—C(=O)OC(Rx_1)(Rx_2)(Rx_3)$ Formula (Y2):

$—C(R_{36})(R_{37})(OR_{38})$ Formula (Y3):

$—C(Rn)(H)(Ar)$ Formula (Y4):

In Formulae (Y1) and (Y2). $Rx_1$ to $Rx_3$ each independently represent an alkyl group (which is linear or branched, and preferably has 1 to 6 carbon atoms) or a cycloalkyl group (which is a monocycle or a polycycle, and preferably has 3 to 15 carbon atoms), an alkenyl group (which is linear or branched, and preferably has 2 to 6 carbon atoms), an aryl group (which is a monocycle or a polycycle, and preferably has 6 to 15 carbon atoms), or a heteroaryl group (which is a monocycle or a polycycle, and preferably has 5 to 15 ring member atoms).

Two of $Rx_1$ to $Rx_3$ may be bonded to each other to form a monocycle or a polycycle. Examples of the monocycle or the polycycle include a cycloalkane ring. The cycloalkane ring is preferably a monocyclic cycloalkane ring such as a cyclopentane ring and a cyclohexane ring, or a polycyclic cycloalkane ring such as a norbornane ring, a tetracyclodecane ring, a tetracyclododecane ring, and an adamantane ring. In the cycloalkane ring, for example, one or more (for example, 1 to 3) of methylene groups constituting a ring may be substituted with a heteroatom (—O—, —S—, or the like), $—SO_2—$, $—SO_3—$, an ester group, a carbonyl group, or a vinylidene group. In addition, in such the cycloalkane ring, one or more (for example, 1 or 2) of the ethylene groups constituting the cycloalkane ring may be substituted with a vinylene group.

In Formula (Y1), two of $Rx_1$ to $Rx_3$ are bonded to form a cycloalkane ring, and in a case where this cycloalkane ring forms a vinylene group with the α carbon and the γ carbon with respect to C (carbon) atom specified in Formula (Y1), the remaining group of $Rx_1$ to $Rx_3$ may be a hydrogen atom.

In Formula (Y3), $R_{36}$ to $R_{38}$ each independently represent a hydrogen atom or an organic group. The organic group is preferably an alkyl group (which is linear or branched, and preferably has 1 to 6 carbon atoms), a cycloalkyl group (which is a monocycle or a polycycle, and preferably has 3 to 15 carbon atoms), and an aryl group (which is a monocycle or a polycycle, and preferably has 6 to 15 carbon atoms), an aralkyl group (preferably having 7 to 18 carbon atoms), or an alkenyl group (which is linear or branched, and preferably has 2 to 6 carbon atoms).

$R_{37}$ and $R_{38}$ may be bonded to each other to form a ring. Examples of the ring include rings such as a monocycle or polycycle which can be formed by bonding of two of $Rx_1$ to $Rx_3$.

In Formula (Y4), Ar represents an aromatic ring group. Rn is an alkyl group (which is linear or branched, and preferably has 1 to 6 carbon atoms), a cycloalkyl group (which is a monocycle or a polycycle, and preferably has 3 to 15 carbon atoms), or an aryl group (which is a monocycle or a polycycle, and preferably has 6 to 15 carbon atoms). Rn and Ar may be bonded to each other to form a non-aromatic ring. An Ar aryl group (which is a monocycle or a polycycle, and preferably has 6 to 15 carbon atoms) is preferable.

The content of the repeating unit having a non-corresponding acid-decomposable group (the acid-decomposable group which does not correspond to the group represented by any one of General Formula (1), (2), (3), (4), (5), or (6)) is preferably 60% by mole or less, more preferably 50% by mole or less, and still more preferably 20% by mole or less with respect to all the repeating units in the resin A. In addition, the lower limit value thereof may be 0% by mole or more. That is, the resin A does not have to have a repeating unit having a non-corresponding acid-decomposable group.

The repeating unit having a non-corresponding acid-decomposable group may be used alone or in combination of two or more kinds thereof. In a case where two or more kinds of such other photoacid generators are used, a total content thereof is preferably within the suitable content range.

<Repeating Unit Having Lactone Group>

It is also preferable that the resin A has a repeating unit having a lactone group.

The repeating unit having a lactone group may or may not correspond to the above-mentioned repeating unit.

For example, the repeating unit having a lactone group may or may not correspond to the repeating unit a1 as long as it has a lactone group, or may or may not correspond to the repeating unit having a non-corresponding acid-decomposable group.

The lactone group may have a lactone structure or a sultone structure. The lactone structure is preferably a 5- to 7-membered ring lactone structure. Among those, a structure in which a bicyclo structure or a spiro structure is formed and another ring structure is fused to a 5- to 7-membered ring lactone structure is more preferable.

The resin A preferably has a repeating unit having a lactone group obtained by extracting one or more (for example, 1 or 2) hydrogen atoms having a lactone structure represented by any one of Formula (LC1-1), (LC1-2), (LC1-3), (LC1-4), (LC1-5), (LC1-6), (LC1-7), (LC1-8), (LC1-9), (LC1-10), (LC1-11), (LC1-12), (LC1-13), (LC1-14), (LC1-15), (LC1-16), (LC1-17), (LC1-18), (LC1-19), (LC1-20), or (LC1-21).

In addition, the lactone group may be directly bonded to the main chain. For example, a ring member atom of the lactone group may constitute the main chain of the resin A.

LC1-1

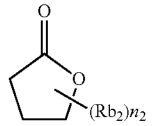

LC1-2

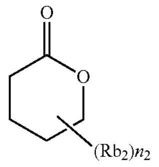

LC1-3

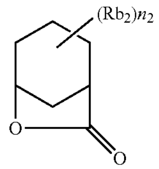

LC1-4

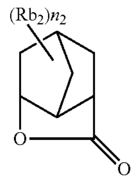

LC1-5

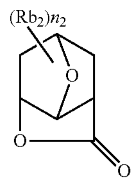

-continued

LC1-6

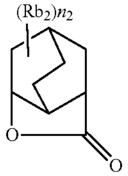

LC1-7

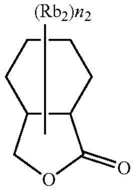

LC1-8

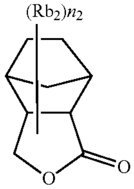

LC1-9

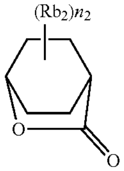

LC1-10

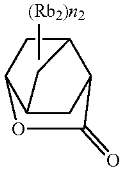

LC1-11

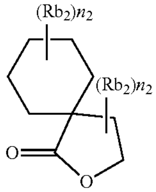

LC1-12

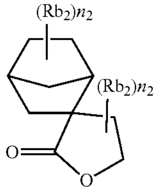

LC1-13

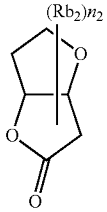

-continued

LC1-14

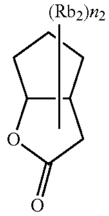

LC1-15

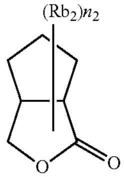

LC1-16

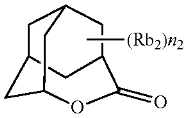

LC1-17

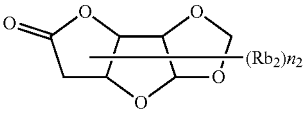

LC1-18

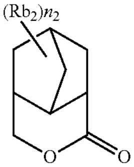

LC1-19

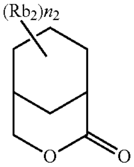

LC1-20

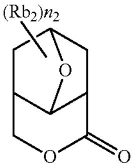

LC1-21

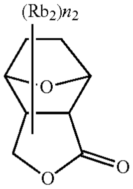

The lactone structure may have a substituent ($Rb_2$). Examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, a group including an acid-decomposable group (which may be the acid-decomposable group itself), a group including a specific functional group (which may be the specific functional group itself), and a group formed by combination thereof. n2 represents an integer of 0 to 4. In a case where n2 is an integer of 2 or more, $Rb_2$'s which are present in plurality may be different from each other, and $Rb_2$'s which are present in plurality may be bonded to each other to form a ring.

One or more (for example, 1 or 2) of methylene groups not adjacent to —COO— or —O— among the ring member atoms of the lactone structure may be substituted with a heteroatom such as —O— or —S—.

Examples of the repeating unit having a lactone group include a repeating unit represented by General Formula (AI).

(AI)

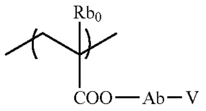

In General Formula (AI), $Rb_0$ represents a hydrogen atom, a halogen atom, or an alkyl group having 1 to 4 carbon atoms.

Preferred examples of the substituent which may be contained in the alkyl group of $Rb_0$ include a hydroxyl group and a halogen atom.

Examples of the halogen atom of $Rb_0$ include a fluorine atom, a chlorine atom, a bromine atom, and an iodine atom. $Rb_0$ is preferably the hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent group formed by combination of these groups. Among those, the single bond or a linking group represented by $-Ab_1-CO_2-$ is preferable. Abis a linear or branched alkylene group, or a monocyclic or polycyclic cycloalkylene group, and is preferably a methylene group, an ethylene group, a cyclohexylene group, an adamantylene group, or a norbornylene group.

V represents a group formed by extracting one hydrogen atom from ring member atoms of a lactone structure represented by any one of Formula (LC1-1), (LC1-2), (LC1-3), (LC1-4), (LC1-5), (LC1-6), (LC1-7), (LC1-8), (LC1-9), (LC1-10), (LC1-11), (LC1-12), (LC1-13), (LC1-14), (LC1-15), (LC1-16), (LC1-17), (LC1-18), (LC1-19), (LC1-20), or (LC1-21).

The repeating unit having a lactone group may be, for example, a repeating unit represented by General Formula (AII) or (AIII).

(AII)

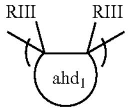

(AIII)

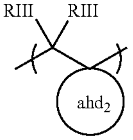

In General Formulae (AII) and (AIII), RIII's each independently represent a hydrogen atom or a substituent.

RIII is preferably a hydrogen atom.

In General Formula (AII), $ahd_1$ represents a group formed by extracting one hydrogen atom from each adjacent ring member atom of the lactone structure represented by any one of Formula (LC1-1), (LC1-2), (LC1-3), (LC1-4), (LC1-5), (LC1-6), (LC1-7), (LC1-8), (LC1-9), (LC1-10), (LC1-11), (LC1-12), (LC1-13), (LC1-14), (LC1-15), (LC1-16), (LC1-17), (LC1-18), (LC1-19), (LC1-20), or (LC1-21).

In General Formula (AIII), $ahd_2$ represents a group formed by extracting two hydrogen atoms from one of the ring member atom having a lactone structure represented by any one of Formula (LC1-1), (LC1-2), (LC1-3), (LC1-4), (LC1-5), (LC1-6), (LC1-7), (LC1-8), (LC1-9), (LC1-10), (LC1-11), (LC1-12), (LC1-13), (LC1-14), (LC1-15), (LC1-16), (LC1-17), (LC1-18), (LC1-19), (LC1-20), or (LC1-21).

The repeating unit having a lactone group is exemplified below.

(in the formulae, Rx represents H, $CH_3$, $CH_2OH$, or $CF_3$)

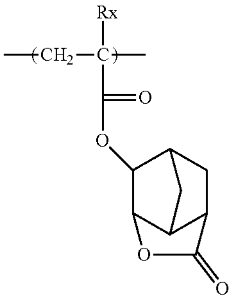
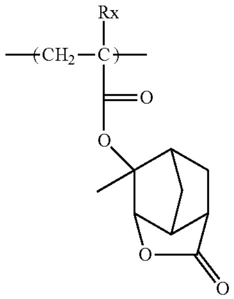
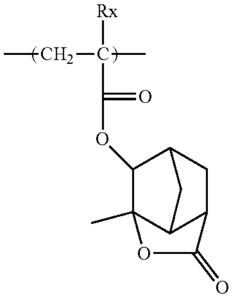
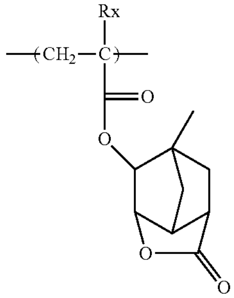
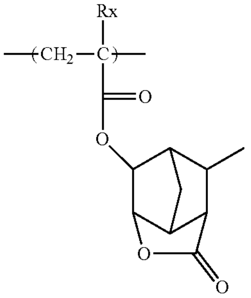
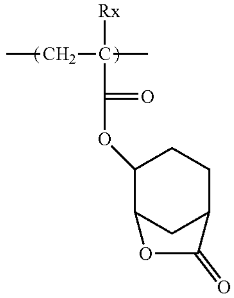
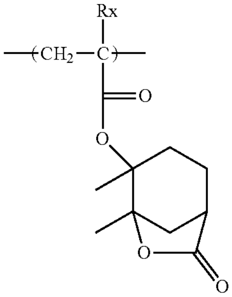
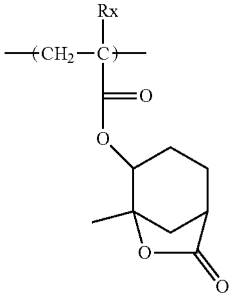

-continued
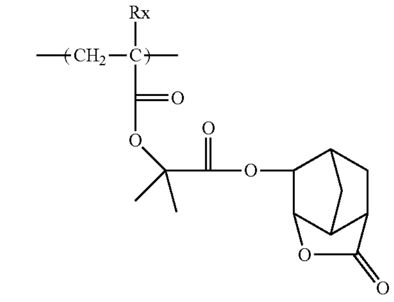
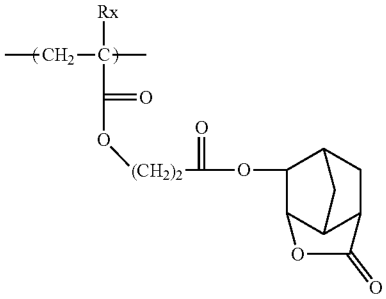
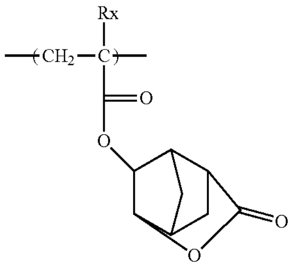
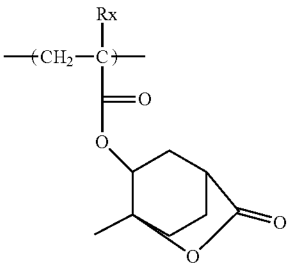
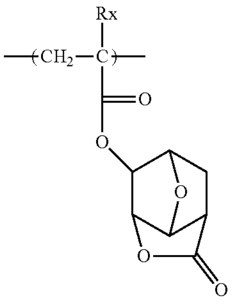
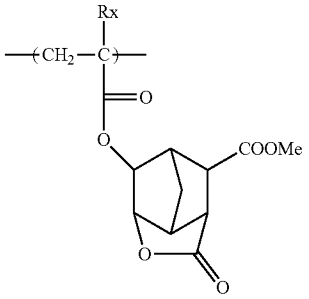
-continued
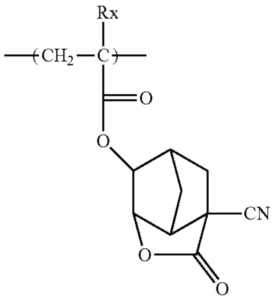
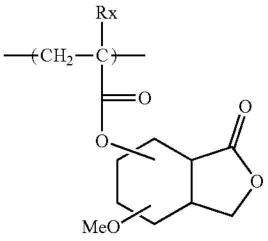
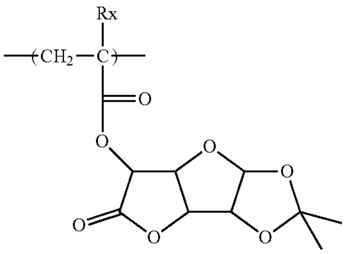
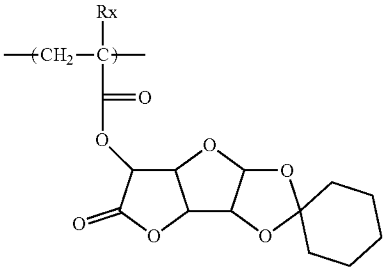
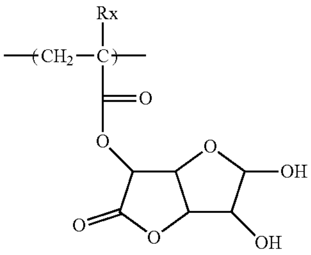
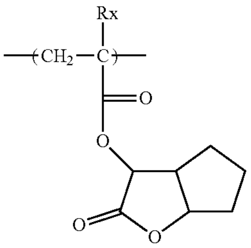
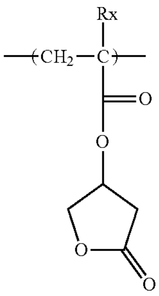
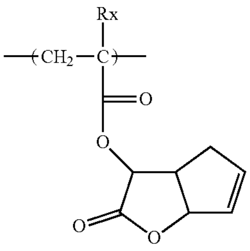
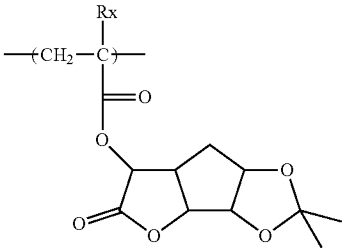

-continued
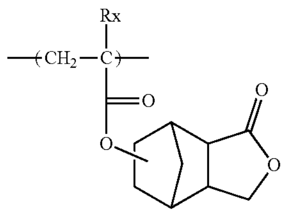
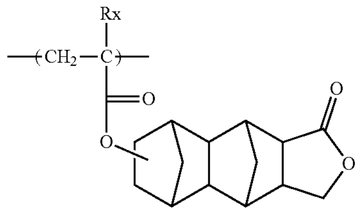
(in the formulae, Rx represents H, $CH_3$, $CH_2OH$, or $CF_3$)
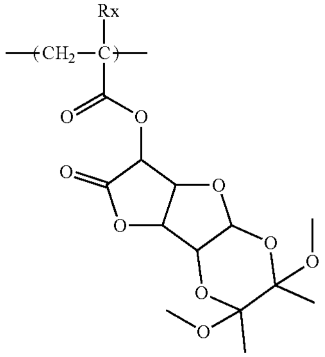
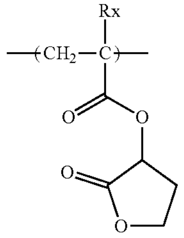
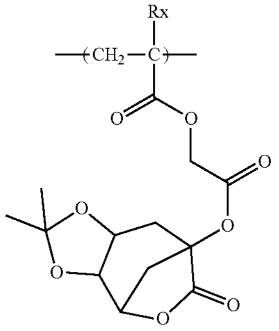
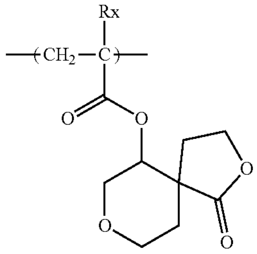
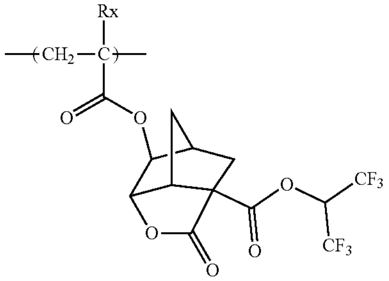
-continued
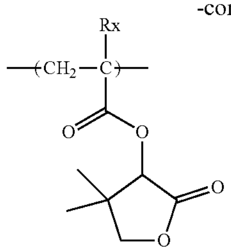
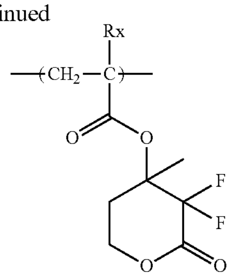
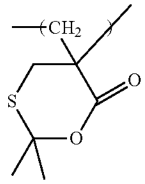
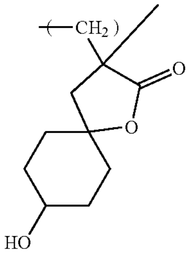
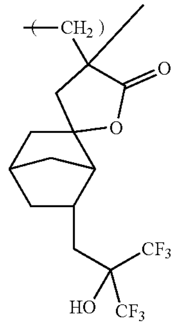
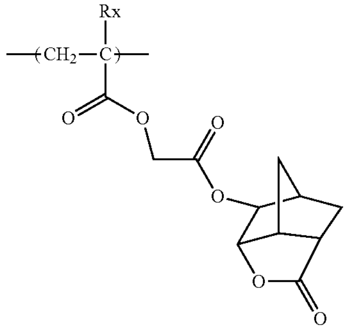
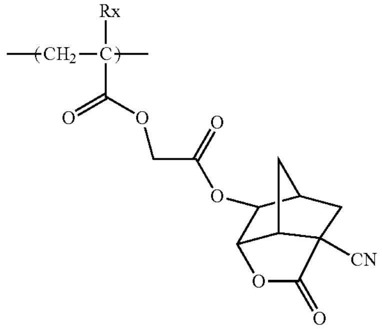
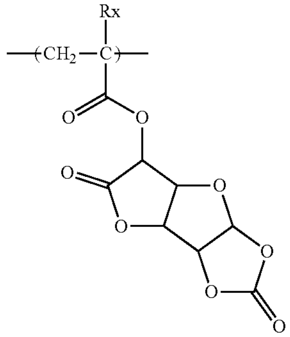

-continued

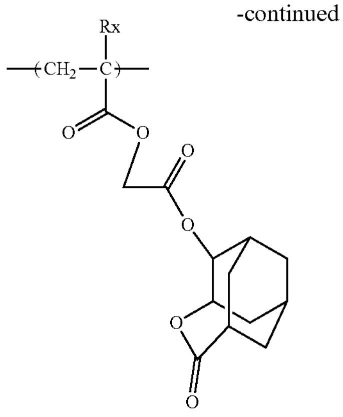

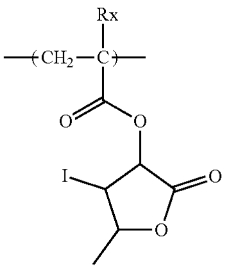

In a case where an optical isomer is present in the repeating unit having a lactone group, any of the optical isomers may be used. In addition, one kind of optical isomers may be used alone or a plurality of kinds of optical isomers may be mixed and used. In a case where one kind of optical isomers is mainly used, an optical purity (ee) thereof is preferably 90 or more, and more preferably 95 or more.

The content of the repeating unit having a lactone group is preferably 5% to 100% by mole, more preferably 10% to 80% by mole, and still more preferably 15% to 65% by mole with respect to all the repeating units in the resin A.

Among the repeating units having a lactone group, the suitable content may be satisfied by a total of the repeating unit having a lactone group corresponding to the repeating unit a1 and the repeating unit having a lactone group not corresponding to the repeating unit a1, the suitable content may be satisfied by the repeating unit having a lactone group corresponding to the repeating unit a1 alone, or the suitable content may be satisfied by the repeating unit having a lactone group not corresponding to the repeating unit a1 alone.

The repeating unit having a lactone group may be used alone or in combination of two or more kinds thereof. In a case where two or more kinds of such other photoacid generators are used, a total content thereof is preferably within the suitable content range.

<Repeating Unit Having Sultone Group or Carbonate Group>

It is also preferable that the resin A has a repeating unit having a sultone group.

The sultone group may have a sultone structure. The sultone structure is preferably a 5- to 7-membered ring sultone structure. Among those, a structure in which a bicyclo structure or a spiro structure is formed and another ring structure is fused to a 5- to 7-membered ring sultone structure is more preferable.

In addition, the sultone group may be directly bonded to the main chain. For example, a ring member atom of the sultone group may constitute the main chain of the resin A.

The resin A preferably has a repeating unit having a sultone group, formed by extracting one or more (for example, 1 or 2) hydrogen atoms from a ring member atom of a sultone structure represented by any one of Formula (SL1-1), (SL1-2), or (SL1-3).

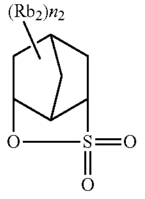

SL1-1

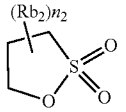

SL1-2

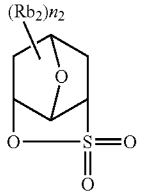

SL1-3

The sultone structure may have a substituent ($Rb_2$). The substituent ($Rb_2$) in any one of Formula (SL1-1), (SL1-2), or (SL1-3) can be described in the same manner as the substituent ($Rb_2$) in the lactone structure represented by any one of Formula (LC1-1), (LC1-2), (LC1-3), (LC1-4), (LC1-5), (LC1-6), (LC1-7), (LC1-8), (LC1-9), (LC1-10), (LC1-11), (LC1-12), (LC1-13), (LC1-14), (LC1-15), (LC1-16), (LC1-17), (LC1-18), (LC1-19), (LC1-20), or (LC1-21).

One or more (for example, 1 or 2) of methylene groups not adjacent to —COO— or —O— among the ring member atoms having the sultone structure may be substituted with a heteroatom such as —O— or —S—.

Examples of the repeating unit having a sultone group include a repeating unit represented by General Formula (AI) mentioned above, in which V is substituted with a group formed by extracting one hydrogen atom from a ring member atom of the sultone structure represented by any one of Formula (SL1-1), (SL1-2), or (SL1-3), a repeating unit represented by General Formula (AII) mentioned above, in which $ahd_1$ is substituted with a group formed by extracting one hydrogen atom from a ring member atom of the sultone structure represented by any one of Formula (SL1-1), (SL1-2), or (SL1-3), and a repeating unit represented by General Formula (AIII) mentioned above, in which $ahd_2$ is substituted with a group formed by extracting two hydrogen atoms from a ring member atom of the sultone structure represented by any one of Formula (SL1-1), (SL1-2), or (SL1-3).

As the carbonate group, a cyclic carbonic acid ester group is preferable.

As the repeating unit having a cyclic carbonic acid ester group, a repeating unit represented by Formula (A-1) is preferable.

(A-1)

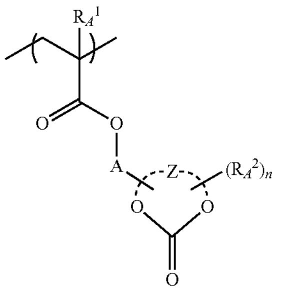

In Formula (A-1), $R_A^1$ represents a hydrogen atom, a halogen atom, or a monovalent organic group (preferably a methyl group).

n represents an integer of 0 or more.

$R_A^2$ represents a substituent. In a case where n is 2 or more, $R_A^2$ which are present in plurality may be the same as or different from each other.

A represents a single bond or a divalent linking group. As the divalent linking group, an alkylene group, a divalent linking group having a monocyclic or polycyclic alicyclic hydrocarbon structure, an ether group, an ester group, a carbonyl group, a carboxyl group, or a divalent group formed by combination of these groups is preferable.

Z represents an atomic group that forms a monocycle or polycycle with a group represented by —O—CO—O— in the formula.

The repeating unit having a sultone group or a carbonate group will be exemplified below.

(in the formulae, Rx represents H, $CH_3$. $CH_2OH$, or $CF_3$)

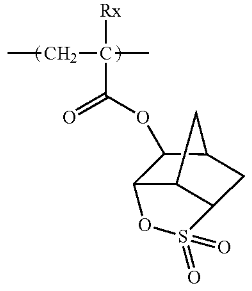

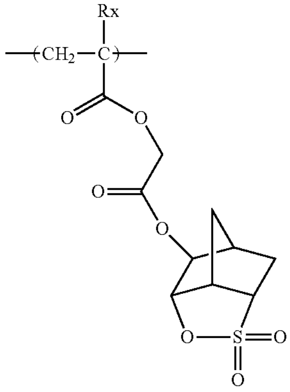

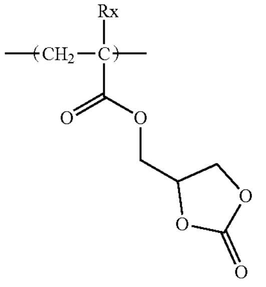

-continued

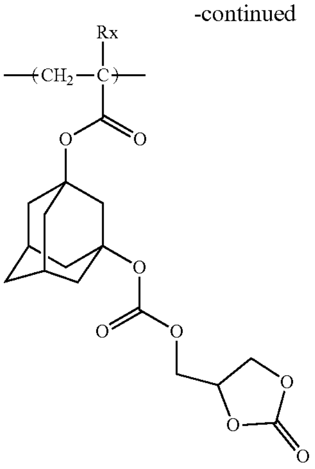

The content of the repeating unit having a sultone group or a carbonate group is preferably 1% by mole or more, and more preferably 10% by mole or more with respect to all the repeating units in the resin A. In addition, the upper limit value is preferably 85% by mole or less, more preferably 80% by mole or less, still more preferably 70% by mole or less, and particularly preferably 60% by mole or less.

<Repeating Unit Having Acid Group>

The resin A may have a repeating unit having an acid group.

It is preferable that the repeating unit having an acid group is different from the above-mentioned repeating unit.

As the acid group, an acid group having a pKa of 13 or less is preferable. The acid dissociation constant of the acid group is preferably 13 or less, more preferably 3 to 13, and still more preferably 5 to 10, as described above.

In a case where the resin A has an acid group having a pKa of 13 or less, the content of the acid group in the resin A is not particularly limited, but is 0.2 to 6.0 mmol/g in many cases. Among those, the content of the acid group is preferably 0.8 to 6.0 mmol/g, more preferably 1.2 to 5.0 mmol/g, and still more preferably 1.6 to 4.0 mmol/g. In a case where the content of the acid group is within the range, the progress of development is improved, and thus, the shape of a pattern thus formed is excellent and the resolution is also excellent.

As the acid group, for example, a carboxyl group, a hydroxyl group, a phenolic hydroxyl group, a fluorinated alcohol group (preferably a hexafluoroisopropanol group), a sulfonic acid group, a sulfonamide group, or an isopropanol group is preferable.

In addition, in the hexafluoroisopropanol group, one or more (preferably one or two) fluorine atoms may be substituted with a group (an alkoxycarbonyl group and the like) other than a fluorine atom. —$C(CF_3)(OH)$—$CF_2$— formed as above is also preferable as the acid group. In addition, one or more fluorine atoms may be substituted with a group other than a fluorine atom to form a ring including —$C(CF_3)(OH)$—$CF_2$—.

A repeating unit having an acid group may have a fluorine atom or an iodine atom.

As the repeating unit having an acid group, a repeating unit represented by Formula (B) is preferable.

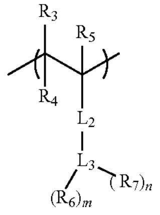

(B)

$R_3$ represents a hydrogen atom or a monovalent organic group which may have a fluorine atom or an iodine atom.

The monovalent organic group which may have a fluorine atom or an iodine atom is preferably a group represented by $-L_4-R_8$. $L_4$ represents a single bond or an ester group. $R_8$ is an alkyl group which may have a fluorine atom or an iodine atom, a cycloalkyl group which may have a fluorine atom or an iodine atom, an aryl group which may have a fluorine atom or an iodine atom, or a group formed by combination thereof.

$R_4$ and $R_5$ each independently represent a hydrogen atom, a fluorine atom, an iodine atom, or an alkyl group which may have a fluorine atom or an iodine atom.

$L_2$ represents a single bond, an ester group, or a divalent group formed by combination of —CO—, —O—, and an alkylene group (which preferably has 1 to 6 carbon atoms, and may be linear or branched; $—CH_2—$ may be substituted with a halogen atom).

$L_3$ represents an (n+m+1)-valent aromatic hydrocarbon ring group or an (n+m+1)-valent alicyclic hydrocarbon ring group. Examples of the aromatic hydrocarbon ring group include a benzene ring group and a naphthalene ring group. The alicyclic hydrocarbon ring group may be a monocycle or a polycycle, and examples thereof include a cycloalkyl ring group, a norbornene ring group, and an adamantane ring group.

$R_6$ represents a hydroxyl group or a fluorinated alcohol group. The fluorinated alcohol group is preferably a monovalent group represented by Formula (3L).

$$*-L_{6X}-R_{6X} \quad (3L)$$

$L_{6X}$ represents a single bond or a divalent linking group. The divalent linking group is not particularly limited, but examples thereof include —CO—, —O—, —SO—, $—SO_2—$, $—NR^A—$, an alkylene group (which preferably has 1 to 6 carbon atoms, and may be linear or branched) which may have a substituent, and a divalent linking group formed by combination of a plurality of these groups. Examples of $R^A$ include a hydrogen atom or an alkyl group having 1 to 6 carbon atoms. In addition, the alkylene group may have a substituent. Examples of the substituent include a halogen atom (preferably a fluorine atom) and a hydroxyl group. $R_{6X}$ represents a hexafluoroisopropanol group. Furthermore, in a case where $R_6$ is a hydroxyl group, it is also preferable that $L_3$ is the (n+m+1)-valent aromatic hydrocarbon ring group.

$R_7$ represents a halogen atom. Examples of the halogen atom include a fluorine atom, a chlorine atom, a bromine atom, and an iodine atom.

m represents an integer of 1 or more. m is preferably an integer of 1 to 3, and more preferably an integer of 1 or 2.

n represents 0 or an integer of 1 or more. n is preferably an integer of 1 to 4.

Furthermore, (n+m+1) is preferably an integer of 1 to 5.

As the repeating unit having an acid group, a repeating unit represented by Formula (I) is also preferable.

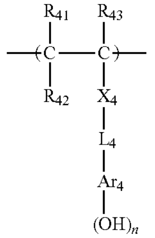

(I)

In Formula (I), $R_{41}$, $R_{42}$, and $R_{43}$ each independently represent a hydrogen atom, an alkyl group, a cycloalkyl group, a halogen atom, a cyano group, or an alkoxycarbonyl group. It should be noted that $R_{42}$ may be bonded to $Ar_4$ to form a ring, in which case $R_{42}$ represents a single bond or an alkylene group.

$X_4$ represents a single bond, —COO—, or $—CONR_{64}—$, and $R_{64}$ represents a hydrogen atom or an alkyl group.

$L_4$ represents a single bond or an alkylene group.

$Ar_4$ represents an (n+1)-valent aromatic ring group, and in a case where $Ar_4$ is bonded to $R_{42}$ to form a ring, $Ar_4$ represents an (n+2)-valent aromatic ring group.

n represents an integer of 1 to 5.

As the alkyl group represented by each of $R_{41}$, $R_{42}$, and $R_{43}$ in Formula (I), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group is preferable, an alkyl group having 8 or less carbon atoms is more preferable, and an alkyl group having 3 or less carbon atoms is still more preferable.

The cycloalkyl group of each of $R_{41}$, $R_{42}$, and $R_{43}$ in Formula (I) may be monocyclic or polycyclic. Among those, a monocyclic cycloalkyl group having 3 to 8 carbon atoms, such as a cyclopropyl group, a cyclopentyl group, and a cyclohexyl group, is preferable.

Examples of the halogen atom of each of $R_{41}$, $R_{42}$, and $R_{43}$ in Formula (I) include a fluorine atom, a chlorine atom, a bromine atom, and an iodine atom, and the fluorine atom is preferable.

As the alkyl group included in the alkoxycarbonyl group of each of $R_{41}$, $R_{42}$, and $R_{43}$ in Formula (I), the same ones as the alkyl group in each of $R_{41}$, $R_{42}$, and $R_{43}$ are preferable.

Preferred examples of the substituent in each of the groups include an alkyl group, a cycloalkyl group, an aryl group, an amino group, an amide group, a ureide group, a urethane group, a hydroxyl group, a carboxyl group, a halogen atom, an alkoxy group, a thioether group, an acyl group, an acyloxy group, an alkoxycarbonyl group, a cyano group, and a nitro group. The substituent preferably has 8 or less carbon atoms.

$Ar_4$ represents an (n+1)-valent aromatic ring group. The divalent aromatic ring group in a case where n is 1 is preferably for example, an arylene group having 6 to 18 carbon atoms, such as a phenylene group, a tolylene group, a naphthylene group, and an anthracenylene group, or a divalent aromatic ring group including a heterocyclic ring such as a thiophene ring, a furan ring, a pyrrole ring, a benzothiophene ring, a benzofuran ring, a benzopyrrole ring, a triazine ring, an imidazole ring, a benzimidazole ring, a triazole ring, a thiadiazole ring, and a thiazole ring. Furthermore, the aromatic ring group may have a substituent.

Specific examples of the (n+1)-valent aromatic ring group in a case where n is an integer of 2 or more include groups formed by removing any (n−1) hydrogen atoms from the above-mentioned specific examples of the divalent aromatic ring group.

The (n+1)-valent aromatic ring group may further have a substituent.

Examples of the substituent which can be contained in the alkyl group, the cycloalkyl group, the alkoxycarbonyl group, the alkylene group, and the (n+1)-valent aromatic ring group, each mentioned above, include the alkyl groups; the alkoxy groups such as a methoxy group, an ethoxy group, a hydroxyethoxy group, a propoxy group, a hydroxypropoxy group, and a butoxy group; the aryl groups such as a phenyl group; and the like, as mentioned for each of $R_{41}$, $R_{42}$, and $R_{43}$ in Formula (I).

Examples of the alkyl group of $R_{64}$ in —$CONR_{64}$— represented by $X_4$ ($R_{64}$ represents a hydrogen atom or an alkyl group) include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, and an alkyl group having 8 or less carbon atoms, is preferable.

As $X_4$, a single bond, —COO—, or —CONH— is preferable, and the single bond or —COO— is more preferable.

As the alkylene group in $L_4$, an alkylene group having 1 to 8 carbon atoms, such as a methylene group, an ethylene group, a propylene group, a butylene group, a hexylene group, and an octylene group, is preferable.

As $Ar_4$, an aromatic ring group having 6 to 18 carbon atoms is preferable, and a benzene ring group, a naphthalene ring group, and a biphenylene ring group are more preferable.

The repeating unit represented by Formula (1) is preferably equipped with a hydroxystyrene structure. That is, $Ar_4$ is preferably the benzene ring group.

As the repeating unit represented by Formula (I), a repeating unit represented by Formula (1) is preferable.

(1)

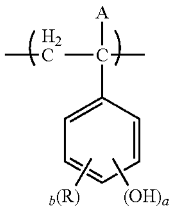

In Formula (1),

A represents a hydrogen atom, an alkyl group, a cycloalkyl group, a halogen atom, or a cyano group.

R represents a halogen atom, an alkyl group, a cycloalkyl group, an aryl group, an alkenyl group, an aralkyl group, an alkoxy group, an alkylcarbonyloxy group, an alkylsulfonyloxy group, an alkyloxycarbonyl group, or an aryloxycarbonyl group, and in a case where a plurality of R's are present, R's may be the same as or different from each other. In a case where there are a plurality of R's, R's may be bonded to each other to form a ring. As R, the hydrogen atom is preferable.

a represents an integer of 1 to 3.

b represents an integer of 0 to (5-a).

The repeating unit having an acid group is exemplified below.

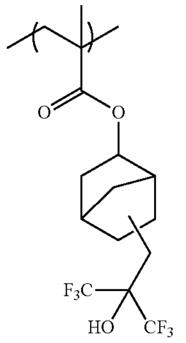
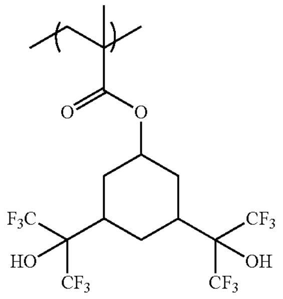
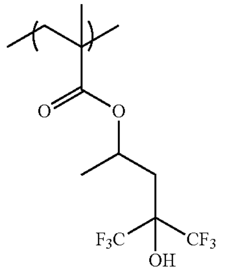
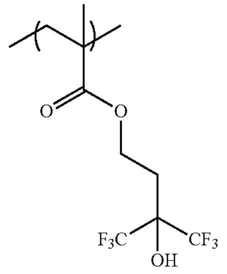
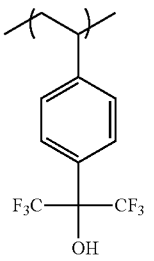
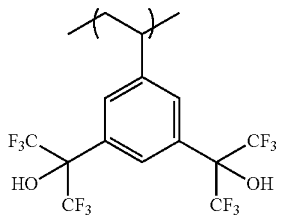
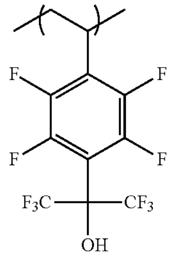
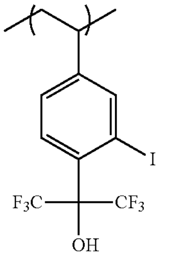
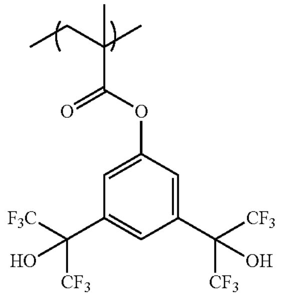
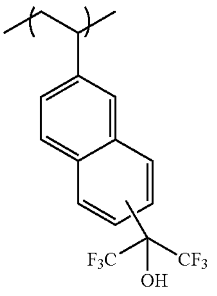

In the following examples, a represents or 2 in the formula.

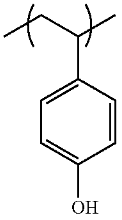
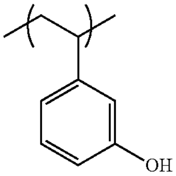
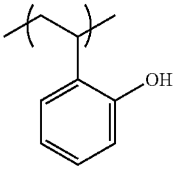
(B-1)
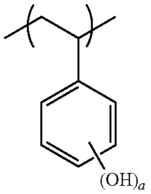
(B-2)
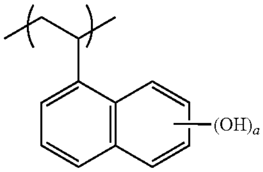
(B-3)
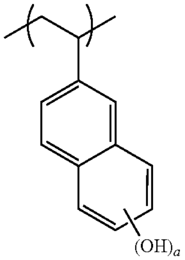
(B-4)
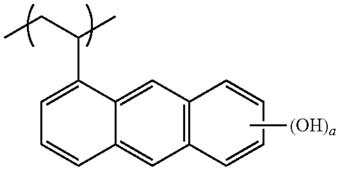
(B-5)
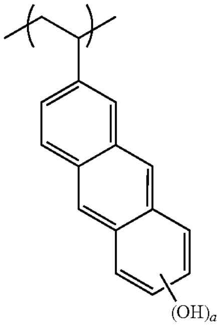
(B-6)
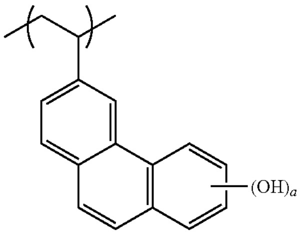
-continued
(B-7)
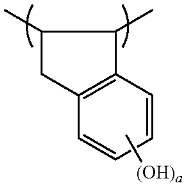
(B-8)
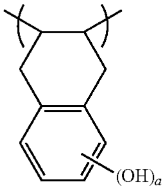
(B-9)
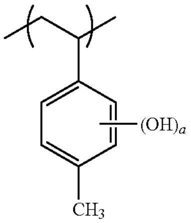
(B-10)
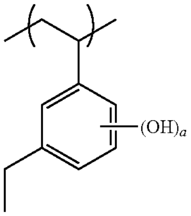
(B-11)
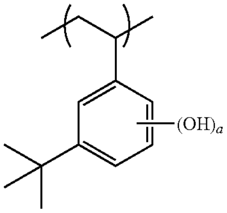
(B-12)
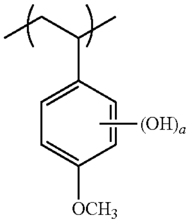
(B-13)
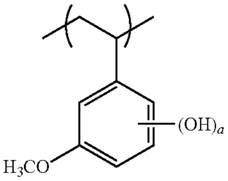

-continued
(B-14)
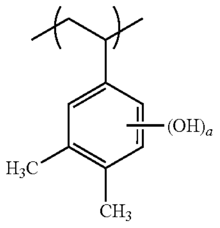
(B-15)
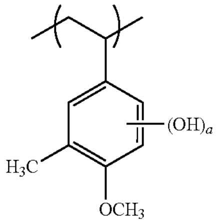
(B-16)
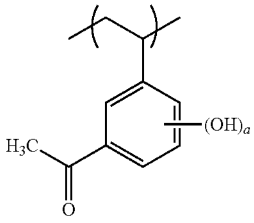
(B-17)
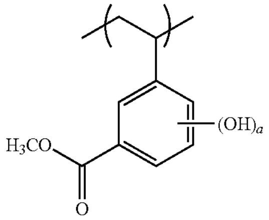
(B-18)
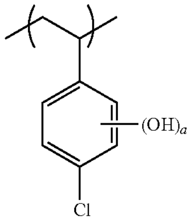
(B-19)
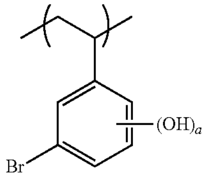
(B-20)
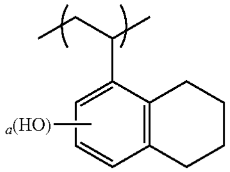
-continued
(B-21)
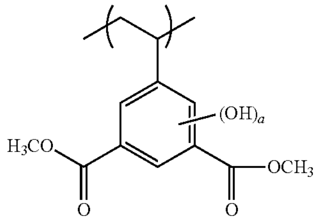
(B-22)
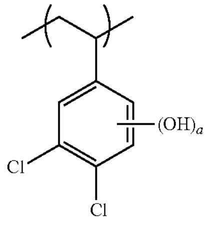
(B-23)
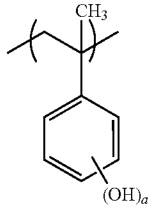
(B-24)
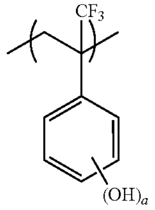
(B-25)
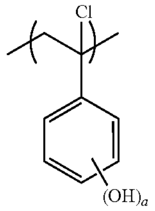
(B-26)
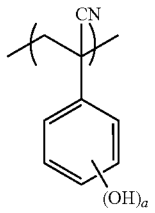
(B-27)
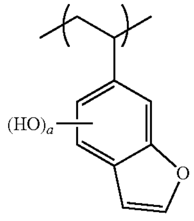

-continued
(B-28)
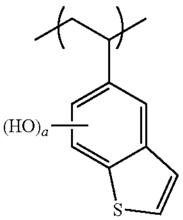
(B-29)
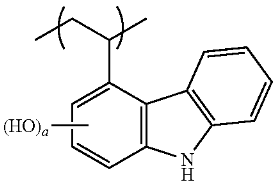
(B-30)
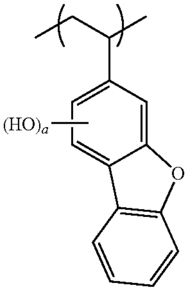
(B-31)
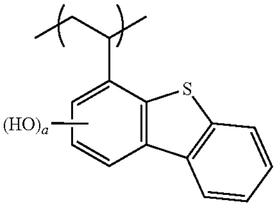
(B-32)
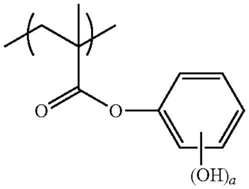
(B-33)
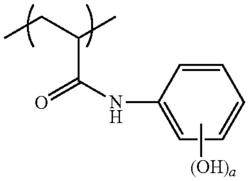
(B-34)
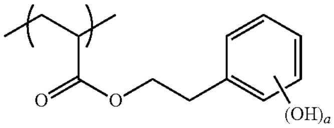
-continued
(B-35)
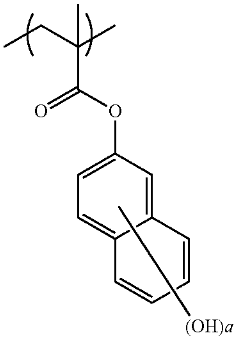
(B-36)
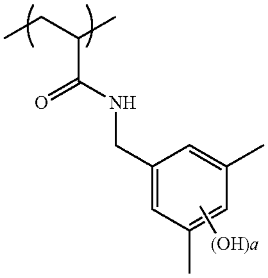
(B-37)
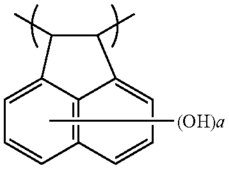
(B-38)
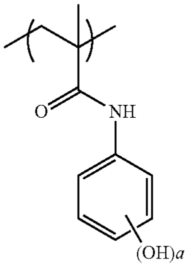
Moreover, among the repeating units, the repeating units specifically described below are preferable. In the formula, R represents a hydrogen atom or a methyl group, and a represents 2 or 3.
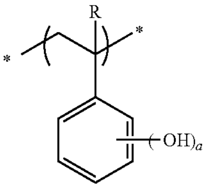
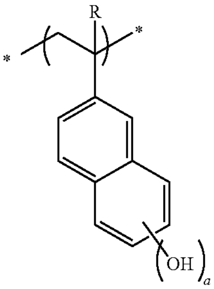

-continued
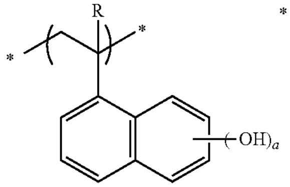
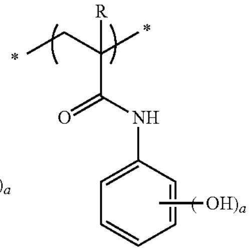
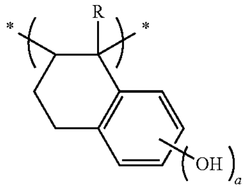
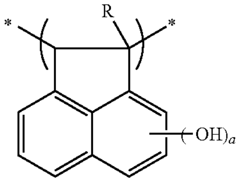
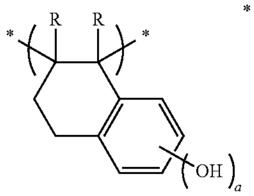
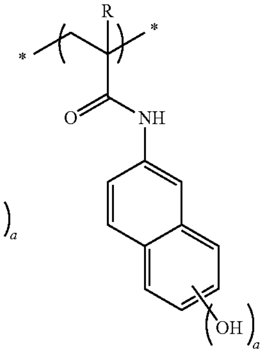
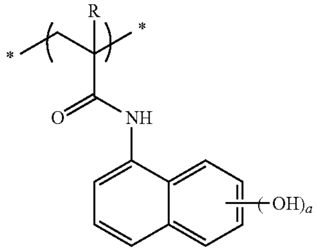
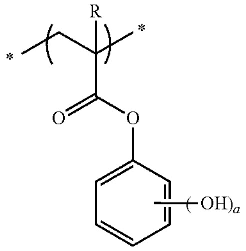
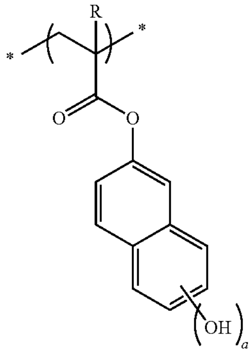
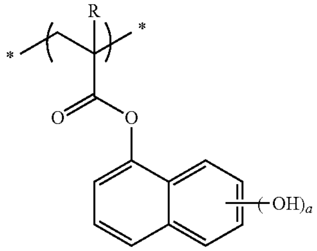
-continued
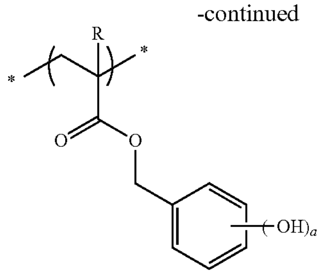
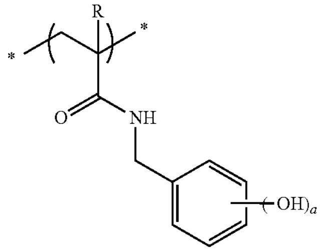
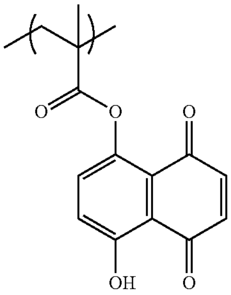
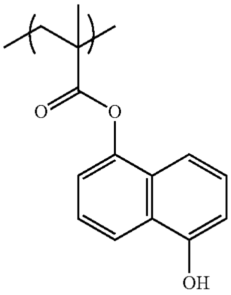
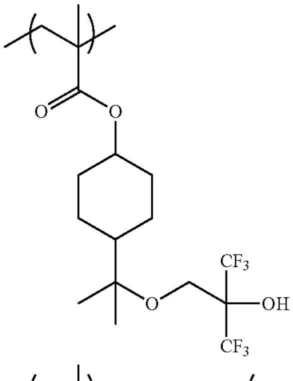
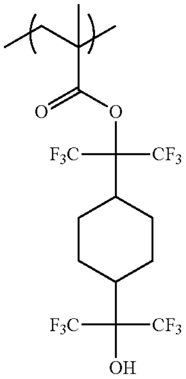
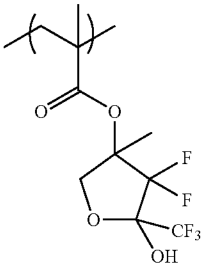

-continued

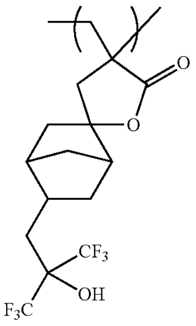

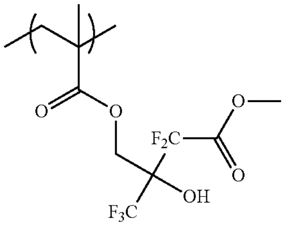

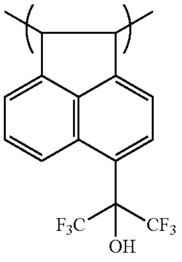

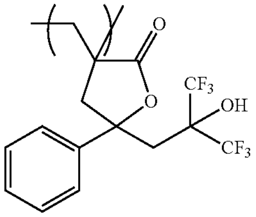

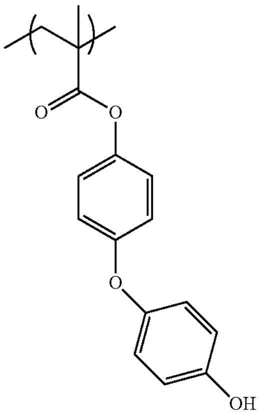

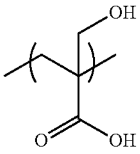

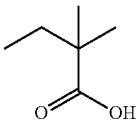

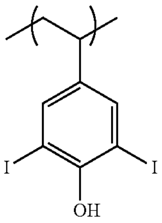

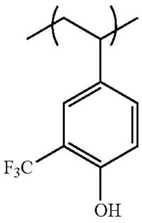

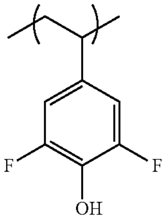

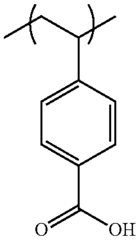

-continued

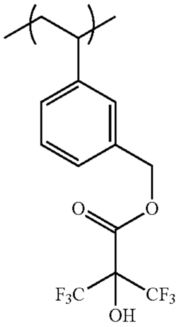

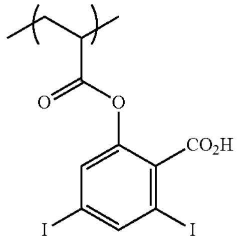

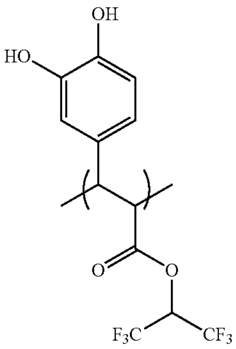

The content of the repeating unit having an acid group is preferably 5% by mole or more, and more preferably 10% by mole or more with respect to all the repeating units in the resin A. In addition, the upper limit value is preferably 70% by mole or less, more preferably 65% by mole or less, and still more preferably 60% by mole or less.

<Repeating Unit Having Fluorine Atom or Iodine Atom>

The resin A may have a repeating unit having a fluorine atom or an iodine atom.

It is preferable that the repeating unit having a fluorine atom or an iodine atom is different from the above-mentioned repeating unit.

As the repeating unit having a fluorine atom or an iodine atom, a repeating unit represented by Formula (C) is preferable.

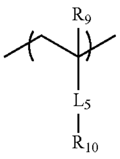

(C)

$L_5$ represents a single bond or an ester group.

$R_9$ represents a hydrogen atom, or an alkyl group which may have a fluorine atom or an iodine atom.

$R_{10}$ represents a hydrogen atom, an alkyl group which may have a fluorine atom or an iodine atom, a cycloalkyl group which may have a fluorine atom or an iodine atom, an aryl group which may have a fluorine atom or an iodine atom, or a group formed by combination thereof.

The repeating unit having a fluorine atom or an iodine atom will be exemplified below.

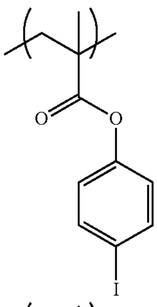
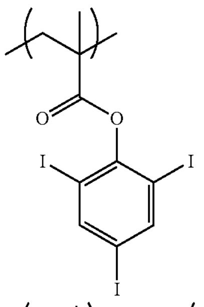
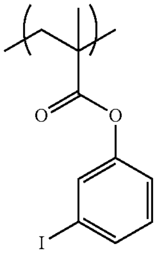
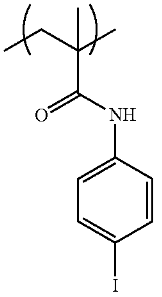
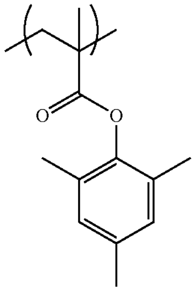
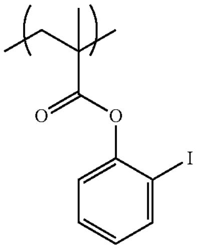
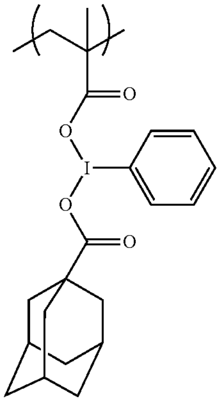
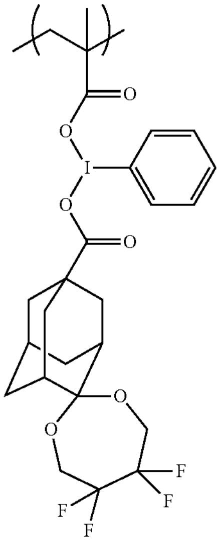
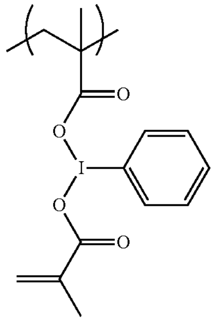

The content of the repeating unit having a fluorine atom or an iodine atom is preferably 0% by mole or more, more preferably 5% by mole or more, and still more preferably 10% by mole or more with respect to all the repeating units in the resin A. In addition, the upper limit value is preferably 50% by mole or less, more preferably 45% by mole or less, and still more preferably 40% by mole or less.

<Repeating Unit Represented by Formula (V-1) or Formula (V-2)>

The resin A may have a repeating unit represented by Formula (V-1) or Formula (V-2).

The repeating unit represented by Formulae (V-1) and (V-2) is preferably a repeating unit different from the above-mentioned repeating units.

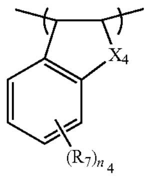

(V-1)

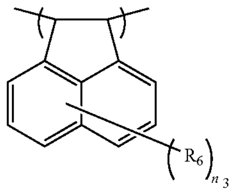

(V-2)

In the formulae, $R_6$ and $R_7$ each independently represent a hydrogen atom, a hydroxyl group, an alkyl group, an alkoxy group, an acyloxy group, a cyano group, a nitro group, an amino group, a halogen atom, an ester group (—OCOR or —COOR: R is an alkyl group or fluorinated alkyl group having 1 to 6 carbon atoms), or a carboxyl group. As the alkyl group, a linear, branched, or cyclic alkyl group having 1 to 10 carbon atoms is preferable.

$n_3$ represents an integer of 0 to 6.

$n_4$ represents an integer of 0 to 4.

$X_4$ is a methylene group, an oxygen atom, or a sulfur atom.

The repeating unit represented by Formula (V-1) or (V-2) will be exemplified below.

Examples of the repeating unit represented by Formula (V-1) or (V-2) include the repeating unit described in paragraph [0100] of WO2018/193954A.

The content of a repeating unit represented by Formula (V-1) or Formula (V-2) is preferably 1% to 65% by mole, and more preferably 5% to 45% by mole with respect to all the repeating units in the resin A.

<Repeating Unit for Reducing Motility of Main Chain>

The resin A may have a repeating unit for reducing the motility of the main chain as a repeating unit different from the repeating unit a1.

The resin A preferably has a high glass transition temperature (Tg) from the viewpoint that excessive diffusion of an acid generated or pattern collapse during development can be suppressed. Tg is preferably higher than 90° C., more preferably higher than 100° C., still more preferably higher than 110° C., and particularly preferably higher than 125° C. Furthermore, since an excessive increase in Tg causes a decrease in the dissolution rate in a developer, Tg is preferably 400° C. or lower, and more preferably 350° C. or lower.

Furthermore, in the present specification, the glass transition temperature (Tg) of a polymer such as the resin A is calculated by the following method. First, the Tg of a homopolymer consisting only of each repeating unit included in the polymer is calculated by a Bicerano method.

Hereinafter, the calculated Tg is referred to as the "Tg of the repeating unit". Next, the mass proportion (%) of each repeating unit to all the repeating units in the polymer is calculated. Then, the Tg at each mass proportion is calculated using a Fox's equation (described in Materials Letters 62 (2008) 3152, and the like), and these are summed to obtain the Tg (° C.) of the polymer.

The Bicerano method is described in Prediction of polymer properties, Marcel Dekker Inc., New York (1993), and the like. In addition, the calculation of a Tg by the Bicerano method can be carried out using MDL Polymer (MDL Information Systems, Inc.), which is software for estimating physical properties of a polymer.

In order to raise the Tg of the resin A (preferably to raise the Tg to higher than 90° C.), it is preferable to reduce the motility of the main chain of the resin A. Examples of a method for reducing the motility of the main chain of the resin A include the following (a) to (e) methods.

(a) Introduction of a bulky substituent into the main chain
(b) Introduction of a plurality of substituents into the main chain
(c) Introduction of a substituent that induces an interaction between the resins A near the main chain
(d) Formation of the main chain in a cyclic structure
(e) Linking of a cyclic structure to the main chain Furthermore, the resin A preferably has a repeating unit having a Tg of a homopolymer exhibiting 130° C. or higher.

In addition, the type of the repeating unit having a Tg of the homopolymer exhibiting 130° C. or higher is not particularly limited, and may be any of repeating units having a Tg of a homopolymer of 130° C. or higher calculated by the Bicerano method. Moreover, it corresponds to a repeating unit having a Tg of a homopolymer exhibiting 130° C. or higher, depending on the type of a functional group in the repeating units represented by Formula (A) to Formula (E) which will be described later.

(Repeating Unit Represented by Formula (A))

As an example of a specific unit for accomplishing (a) above, a method of introducing a repeating unit represented by Formula (A) into the resin A may be mentioned.

(A)

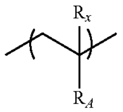

In Formula (A), $R_A$ represents a group having a polycyclic structure. $R_x$ represents a hydrogen atom, a methyl group, or an ethyl group. The group having a polycyclic structure is a group having a plurality of ring structures, and the plurality of ring structures may or may not be fused.

Specific examples of the repeating unit represented by Formula (A) include those described in paragraphs [0107] to [0119] of WO2018/193954A.

A content of the repeating unit represented by Formula (A) is preferably 1% to 65% by mole, and more preferably 5% to 45% by mole with respect to all the repeating units in the resin A.

(Repeating Unit Represented by Formula (B))

As an example of a specific unit for accomplishing (b) above, a method of introducing a repeating unit represented by Formula (B) into the resin A may be mentioned.

(B)

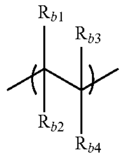

In Formula (B), $R_{b1}$ to $R_{b4}$ each independently represent a hydrogen atom or an organic group, and at least two or more of $Rb_1$, $Rb_2$, $Rb_3$, or $Rb_4$ represent an organic group.

Furthermore, in a case where at least one of the organic groups is a group in which a ring structure is directly linked to the main chain in the repeating unit, the types of the other organic groups are not particularly limited.

In addition, in a case where none of the organic groups is a group in which a ring structure is directly linked to the main chain in the repeating unit, at least two or more of the organic groups are substituents having three or more constituent atoms excluding hydrogen atoms.

Specific examples of the repeating unit represented by Formula (B) include those described in paragraphs [0113] to [0115] of WO2018/193954A.

A content of the repeating unit represented by Formula (B) is preferably 1% to 65% by mole, and more preferably 5% to 45% by mole with respect to all the repeating units in the resin A.

(Repeating Unit Represented by Formula (C))

As an example of a specific unit for accomplishing (c) above, a method of introducing a repeating unit represented by Formula (C) into the resin A may be mentioned.

(C)

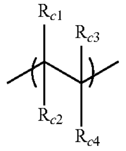

In Formula (C), $R_{c1}$ to $R_{c4}$ each independently represent a hydrogen atom or an organic group, and at least one of $R_{c1}$, $R_{c2}$, $R_{c3}$, or $R_{c4}$ is a group having a hydrogen-bonding hydrogen atom with a number of atoms of 3 or less from the main chain carbon. Above all, it is preferable that the group has hydrogen-bonding hydrogen atoms with a number of atoms of 2 or less (on a side closer to the vicinity of the main chain) to induce an interaction between the main chains of the resin A.

Specific examples of the repeating unit represented by Formula (C) include those described in paragraphs [0119] to [0121] of WO2018/193954A.

A content of the repeating unit represented by Formula (C) is preferably 1% to 65% by mole, and more preferably 5% to 45% by mole with respect to all the repeating units in the resin A.

(Repeating Unit Represented by Formula (D))

As an example of a specific unit for accomplishing (d) above, a method of introducing a repeating unit represented by Formula (D) into the resin A may be mentioned.

(D)

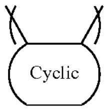

In Formula (D), "Cyclic" is a group that forms a main chain with a cyclic structure. The number of the ring-constituting atoms is not particularly limited.

Specific examples of the repeating unit represented by Formula (D) include those described in paragraphs [0126] to [0127] of WO2018/193954A.

A content of the repeating unit represented by Formula (D) is preferably 1% to 65% by mole, and more preferably 5% to 45% by mole with respect to all the repeating units in the resin A.

(Repeating Unit Represented by Formula (E))

As an example of a specific unit for accomplishing (e) above, a method of introducing a repeating unit represented by Formula (E) into the resin A may be mentioned.

(E)

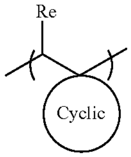

In Formula (E), Re's each independently represent a hydrogen atom or an organic group. Examples of the organic group include an alkyl group, a cycloalkyl group, an aryl group, an aralkyl group, and an alkenyl group, which may have a substituent.

"Cyclic" is a cyclic group including a carbon atom of the main chain. The number of atoms included in the cyclic group is not particularly limited.

Specific examples of the repeating unit represented by Formula (E) include those described in paragraphs [0131] to [0133] of WO2018/193954A.

A content of the repeating unit represented by Formula (E) is preferably 1% to 65% by mole, and more preferably 5% to 45% by mole with respect to all the repeating units in the resin A.

<Repeating Unit Having Hydroxyl Group or Cyano Group>

The resin A may have a repeating unit having a hydroxyl group or a cyano group. As a result of this, the adhesiveness to a substrate and the affinity for a developer are improved.

The repeating unit having a hydroxyl group or a cyano group is preferably a repeating unit having an alicyclic hydrocarbon structure substituted with a hydroxyl group or a cyano group.

The repeating unit having a hydroxyl group or a cyano group preferably has no acid-decomposable group. Examples of the repeating unit having a hydroxyl group or a cyano group include those described in paragraphs [0153] to [0158] of WO2020/004306A.

The content of the repeating unit having a hydroxyl group or a cyano group is preferably 1% to 65% by mole, and more preferably 5% to 45% by mole with respect to all the repeating units in the resin A.

<Repeating Unit Having Alicyclic Hydrocarbon Structure and not Exhibiting Acid Decomposability>

The resin A may have a repeating unit having an alicyclic hydrocarbon structure and not exhibiting acid decomposability. This can reduce the elution of low-molecular-weight components from the resist film into an immersion liquid during liquid immersion exposure. Examples of such the repeating unit include repeating units derived from 1-adamantyl (meth)acrylate, diamantyl (meth)acrylate, tricyclodecanyl (meth)acrylate, and cyclohexyl (meth)acrylate.

The content of the repeating unit having an alicyclic hydrocarbon structure and not exhibiting acid decomposability is preferably 1% to 65% by mole, and more preferably 5% to 45% by mole with respect to all the repeating units in the resin A.

<Repeating Unit Represented by Formula (III) Having Neither Hydroxyl Group Nor Cyano Group>

The resin A may have a repeating unit represented by Formula (III), which has neither a hydroxyl group nor a cyano group.

(III)

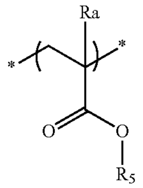

In Formula (III), $R_5$ represents a hydrocarbon group having at least one cyclic structure and having neither a hydroxyl group nor a cyano group.

Ra represents a hydrogen atom, an alkyl group, or a $-CH_2-O-Ra_2$ group. In the formula, $Ra_2$ represents a hydrogen atom, an alkyl group, or an acyl group.

The cyclic structure contained in $R_5$ includes a monocyclic hydrocarbon group and a polycyclic hydrocarbon group. Examples of the monocyclic hydrocarbon group include a cycloalkyl group having 3 to 12 carbon atoms (more preferably 3 to 7 carbon atoms) or a cycloalkenyl group having 3 to 12 carbon atoms.

Detailed definitions of each group in Formula (III) and specific examples of the repeating unit include those described in paragraphs [0169] to [0173] of WO2020/004306A.

The content of the repeating unit represented by Formula (III), which has neither a hydroxyl group nor a cyano group, is preferably 1% to 65% by mole, and more preferably 5% to 45% by mole, with respect to all the repeating units in the resin A.

<Other Repeating Units>

Furthermore, the resin A may have repeating units other than the above-mentioned repeating units.

For example, the resin A may have a repeating unit selected from the group consisting of a repeating unit having an oxathiane ring group, a repeating unit having an oxazolone ring group, a repeating unit having a dioxane ring group, a repeating unit having a hydantoin ring group, and a repeating unit having a sulfolane ring group.

A content of such other repeating units is preferably 1% to 65% by mole, and more preferably 5% to 45% by mole with respect to all the repeating units in the resin A.

Such other repeating units will be exemplified below.

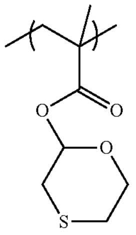

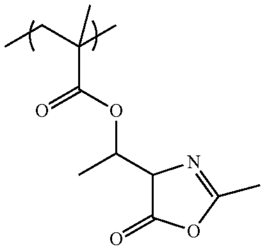

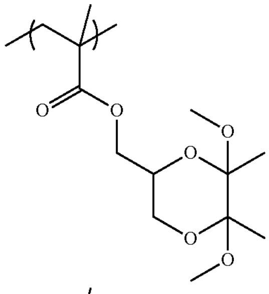

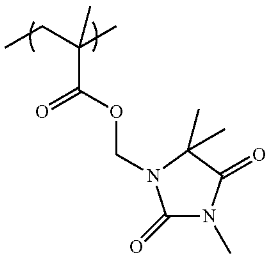

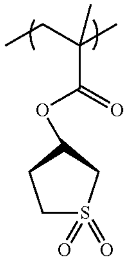

The resin A may have a variety of repeating structural units, in addition to the repeating structural units described above, for the purpose of adjusting dry etching resistance, suitability for a standard developer, adhesiveness to a substrate, a resist profile, resolving power, heat resistance, sensitivity, and the like.

For the resin A, it is preferable that the SP values of all the repeating units constituting the resin A are predetermined values. The predetermined value of the repeating unit is 18.0 $MPa^{0.5}$ or more, and preferably 18.0 to 30.0 $MPa^{0.5}$.

For the SP values of all the repeating units constituting the resin A, which are predetermined values, it is only necessary that the SP values of substantially all the repeating units are predetermined values, it is only necessary that the content of the repeating units having the predetermined SP values is 98% to 100% by mass with respect to all the repeating units, and the content is preferably 99% to 100% by mass, and more preferably 99.8% to 100% by mass with respect to all the repeating units.

In the present specification, the SP value (unit: $MPa^{0.5}$) of the repeating unit constituting the resin A is determined based on the following equation.

$$\text{SP value}=(\delta D^2+\delta P^2+\delta H^2)^{0.5}$$

δD: Dispersion term of repeating unit (unit: $MPa^{0.5}$)

δP: Dipole-dipole term of repeating unit (unit: $MPa^{0.5}$)

δH: Hydrogen bond term of repeating unit (unit: $MPa^{0.5}$)

In addition, each of the dispersion term, the dipole-dipole term, and the hydrogen bond term in the repeating unit is a value calculated using HSPiP (software "Hansen Solvency Parameters in Practice (HSPiP) ver. 5.1.08").

Specifically, the dispersion term, the dipole-dipole term, and the hydrogen bond term of the repeating unit to be calculated are calculated based on the structure of the polymerizable monomer corresponding to the repeating unit. That is, the dispersion term, the dipole-dipole term, and the hydrogen bond term determined by the software (HSPiP) for the structure of the polymerizable monomer corresponding to a certain repeating unit are used as the dispersion term, the dipole-dipole term, and hydrogen bond term of the repeating unit.

"Structure of polymerizable monomer corresponding to repeating unit" means a structure under an assumption of a state where the main chain of the repeating unit turns into a polymerizable double-bonded state and thus, the monomer does not have a bond to another repeating unit, instead of a state where a bonding site extends from the main chain of the repeating unit to be calculated to another repeating unit.

For example, in a case where the repeating unit to be calculated is a repeating unit P0 represented by the following structural formula, a compound P0x represented by the following structural formula corresponds to the structure of a polymerizable monomer corresponding to the repeating unit P0. Similarly, compounds P1x and P2x represented by the following structural formulae correspond to the structures of polymerizable monomers corresponding to the repeating units P1 and P2, respectively.

(P0)

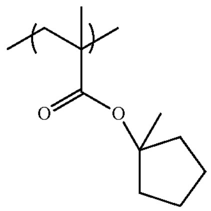

(P0x)

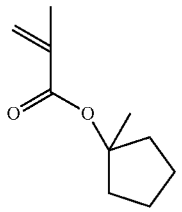

(P1)

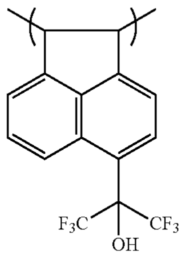

-continued (P1x)

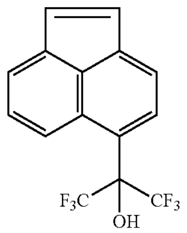

(P2)

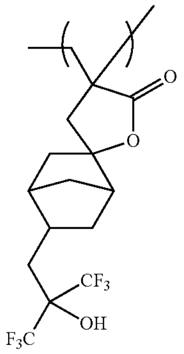

(P2x)

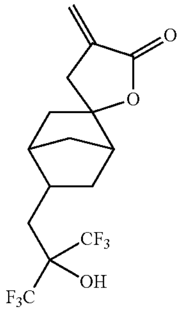

The resin A can be synthesized in accordance with an ordinary method (for example, radical polymerization).

The weight-average molecular weight of the resin A as a value expressed in terms of polystyrene by a GPC method is preferably 1,000 to 200,000, more preferably 3,000 to 20,000, and still more preferably 5,000 to 15,000. By setting the weight-average molecular weight of the resin A to 1,000 to 200.000, deterioration of heat resistance and dry etching resistance can be further suppressed. In addition, deterioration of developability and deterioration of film forming property due to high viscosity can also be further suppressed.

The dispersity (molecular weight distribution) of the resin A is usually 1 to 5, preferably 1 to 3, more preferably 1.2 or 3.0, and still more preferably 1.2 to 2.0. The smaller the dispersity, the more excellent the resolution and the resist shape, and the smoother the side wall of the resist pattern, the more excellent the roughness.

In the resist composition, the content of the resin A is preferably 10% to 99% by mass, more preferably 20% to 98% by mass, and still more preferably 25% to 95% by mass by mass with respect to the total solid content of the composition.

In addition, the resin A may be used alone or in combination of two or more kinds thereof. In a case where two or more kinds of such other photoacid generators are used, a total content thereof is preferably within the suitable content range.

Furthermore, the solid content is intended to mean a component forming a resist film, and does not include a solvent. In addition, any of components that form a resist film are regarded as a solid content even in a case where they have a property and a state of a liquid.

[Additive B]

The resist composition includes the additive B.

The additive B is at least any one of an acid having an acid group having a pKa of −3.60 or more (hereinafter also referred to as a "specific acid") or a salt having a structure in which a hydrogen atom of an acid group having a pKa of −3.60 or more is substituted with a cation (hereinafter also referred to as a "specific salt").

<Specific Acid>

The specific acid has an acid group of which pKa has a predetermined value.

The predetermined value in the specific acid is −3.60 or more, preferably −3.60 to 12.00, more preferably 0.00 to 11.00, and still more preferably 5.00 to 10.00.

The number of acid groups contained in the specific acid is, for example, 1 to 10. In a case where the specific acid has a plurality of acid groups, it is only necessary that the pKa of at least one acid group is a predetermined value, it is preferable that the pKa's of at least half of the acid groups are predetermined values, and it is more preferable that the pKa's of all the acid groups are predetermined values.

In addition, in a case where the specific acid has a plurality of acid groups, it is also preferable that the pKa of the acid group exhibiting the lowest pKa is a predetermined value.

Examples of the acid group having a specific acid include a carboxyl group, a hydroxyl group, a phenolic hydroxyl group, a fluorinated alcohol group (preferably a hexafluoroisopropanol group), a sulfonic acid group, a sulfonamide group, and an isopropanol group, and the phenolic hydroxyl group is preferable.

The specific acid may be in a form of a low-molecular-weight compound or a form incorporated into a part of a polymer. In addition, a combination of the form of a low-molecular-weight compound and the form incorporated into a part of a polymer may also be used.

In a case where the specific acid is in the form incorporated into a part of a polymer, it may be incorporated into the resin A or into a resin other than the resin A.

In the present invention, the specific acid is preferably in the form of the low-molecular-weight compound.

The molecular weight of the specific acid (the molecular weight of the weight average in a case having a molecular weight distribution) is more preferably 100 to 1,000, and more preferably 150 to 800.

Examples of the specific acid include a compound represented by General Formula (RA1) or (RA2) and a compound having a repeating unit represented by General Formula (RA3).

$$Ar^{A}\text{—}(OH)_{ax} \quad \text{(RA1)}$$

$$Q[\text{-}Ar^{A}\text{—}(OH)_{ax}]_{bx} \quad \text{(RA2)}$$

$$\text{-}[AL^{A}\text{-}Ar^{A}(OH)_{ax}]\text{—} \quad \text{(RA3)}$$

In General Formula (RA1), ax represents an integer of 1 or more, and is preferably an integer of 1 to 3.

In General Formula (RA1), $Ar^A$ represents an aromatic ring group. The aromatic ring group may be a monocycle or a polycycle, and preferably has 5 to 15 ring member atoms. The aromatic ring group may have one or more (for example, 1 to 5) heteroatoms (an oxygen atom, a sulfur atom, and/or a nitrogen atom) as a ring member atom, and it is preferable that the aromatic ring group has no heteroatom. Examples of the aromatic ring group include a benzene ring group, a naphthalene ring group, and an anthracene ring group.

The aromatic ring group may have a substituent other than a hydroxyl group, and examples of the substituent include an alkyl group, an alkoxy group, and an alkoxycarbonyl group. The alkyl group, and an alkyl group moiety of the alkoxy group and the alkoxycarbonyl group may be linear or branched, and preferably have 1 to 15 carbon atoms.

In General Formula (RA2), ax represents an integer of 1 or more. ax in General Formula (RA2) is the same as ax in General Formula (RA1).

In General Formula (RA2), $Ar^A$ represents an aromatic ring group. $Ar^A$ in General Formula (RA2) is the same as $Ar^A$ in General Formula (RA1).

In General Formula (RA2), bx represents an integer of 2 or more, and is preferably an integer of 2 to 10.

In General Formula (RA2), Q represents a bx-valent linking group. The bx-valent linking group is preferably —CO—, —O—, —S—, —SO—, $—SO_2—$, —NH—, —N<, a cyclic group, a chain hydrocarbon ring group, or a group formed by combination thereof.

The cyclic group may be a hydrocarbon ring group or a heterocyclic group, may be an aromatic ring group or a non-aromatic ring group, may be a monocycle or a polycycle, preferably has 3 to 12 ring member atoms, and is preferably divalent to pentavalent. The chain hydrocarbon ring group may be linear or branched, preferably has 2 to 10 carbon atoms, and is preferably divalent to pentavalent.

In General Formula (RA3), ax represents an integer of 1 or more. ax in General Formula (RA3) is the same as ax in General Formula (RA1).

In General Formula (RA3), $Ar^A$ represents an aromatic ring group. $Ar^A$ in General Formula (RA3) is the same as $Ar^A$ in General Formula (RA1).

In General Formula (RA3), $AL^A$ represents an alkylene group. The alkylene group may be linear or branched, and preferably has 1 to 5 carbon atoms.

The compound having a repeating unit represented by General Formula (RA3) may have a repeating unit represented by General Formula (RA3). The content of the repeating unit represented by General Formula (RA3) is preferably 60% to 100% by mass, more preferably 80% to 100% by mass, and still more preferably 98% to 100% with respect to the total mass of the compound.

The compound may be a polymer or an oligomer. In addition, the compound may be a compound having a cyclic structure having all or a part of the repeating units represented by General Formula (RA3). The compound having a cyclic structure is, for example, a compound in a form in which the compound is represented by "$-[AL^A-Ar^A(OH).]-[AL^A-Ar^A(OH)_{ax}]_{AZ}-[AL^A-Ar^A(OH)_{ax}]—$ (AZ is an integer of 1 or more, and is preferably an integer of 1 to 10, and the other symbols have definitions as mentioned above)", and the left-end $AL^A$ and the right-end $Ar^A$ are bonded to each other.

The specific acids are exemplified below. The numerical value described in the vicinity of each specific acid is pKa of the acid group contained in the specific acid. In a case where the specific acid has a plurality of acid groups, only the pK of the acid group showing the lowest pKa among the plurality of acid groups is shown.

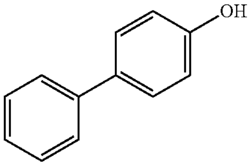

9.82

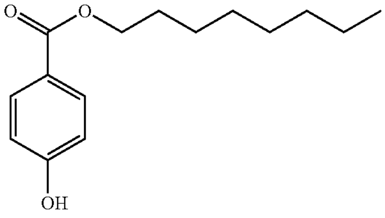

8.23

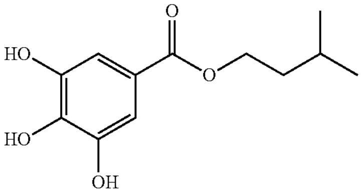

7.94

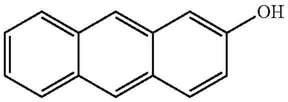

9.57

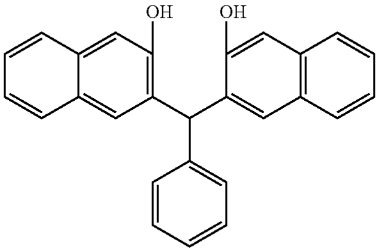

9.02

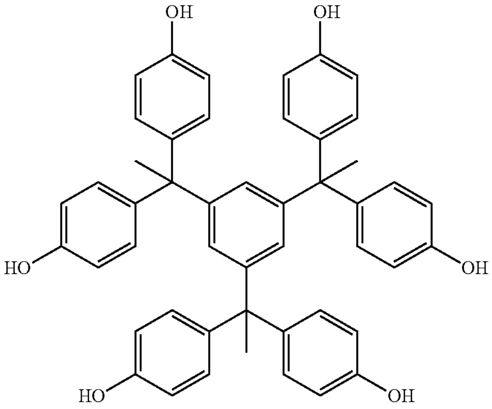

8.97

-continued

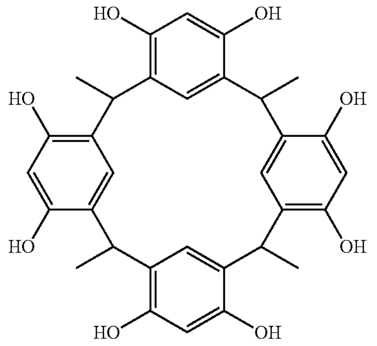

8.84

<Specific Salt>

The specific salt is a salt having a structure in which a hydrogen atom of an acid group having a pKa of a predetermined value is substituted with a cation.

The predetermined value of the specific salt is −3.60 or more, preferably −3.60 to 12.00, more preferably −3.60 to 7.00, and still more preferably −3.60 to 5.00.

The number of acid groups in which the hydrogen atom is substituted with a cation in the specific salt is, for example, 1 to 10. In a case where the specific salt has a plurality of the acid groups, the pKa of at least one of the acid groups may be a predetermined value.

In the specific salt, the cation substituting the hydrogen atom of the acid group and the acid group may be linked by a covalent bond with one or more atoms interposed therebetween. That is, the specific salt may be an intramolecular salt (a zwitterion and a betaine compound).

In addition, the cation substituting the hydrogen atom of the acid group and the acid group may not have a link in a covalent bond. That is, the specific salt may be an onium salt.

The specific salt may be a compound (photoacid generator) that generates an acid upon irradiation with actinic rays or radiation, or may be other than the compound.

The specific salt may be in a form of a low-molecular-weight compound or a form incorporated into a part of a polymer. In addition, a combination of the form of a low-molecular-weight compound and the form incorporated into a part of a polymer may also be used.

In a case where the specific salt is in the form of a low-molecular-weight compound, the molecular weight is preferably 3,000 or less, more preferably 2,000 or less, and still more preferably 1,000 or less.

It should be noted that in a case where the specific salt is a compound (I) or (II) which will be described later, the molecular weight thereof is preferably 100 to 10,000, more preferably 100 to 2,500, and still more preferably 100 to 1,500.

In a case where the specific salt is in the form incorporated into a part of a polymer, it may be incorporated into the resin A or into a resin other than the resin A.

In the present invention, the specific salt is preferably in the form of the low-molecular-weight compound.

Examples of the acid group in the specific salt include a phenolic hydroxyl group, a sulfonic acid group (an aliphatic sulfonic acid group, an aromatic sulfonic acid group, a camphor sulfonic acid group, and the like), a carboxylic acid group (an aliphatic carboxylic acid group, an aromatic carboxylic acid, an aralkylcarboxylic acid group, and the like), a carbonylsulfonylimide group, a bis(sulfonyl)imide group (a bis(alkylsulfonyl)imide group and the like), a bis(carbonyl)imide group, and a tris(alkylsulfonyl)methide group.

Hereinafter, first, the specific salt which is an onium salt will be described in detail, and then the specific salt which is an intramolecular salt will be described.

(Specific Salt which is Onium Salt)

The specific salt which is an onium salt usually has a cationic site and an anionic site.

The cationic site is a cation that substitutes a hydrogen atom of the acid group in the specific salt.

The anionic site is an acid group in which a hydrogen atom is substituted with a cation, or a part thereof.

Examples of the specific salt which is an onium salt include a compound represented by "$M^{p+}{}_{m}X^{q-}{}_{n}$".

In "$M^{p+}{}_{m}X^{q-}{}_{n}$", p, q, m, and n each independently represent an integer of 1 or more (preferably 1 to 8).

$M^{p+}$ represents an organic cation having a charge of p. The organic cation may include a cationic site as a part, or may be the cationic site itself. The organic cation is preferably the cationic site itself.

$X^{q-}$ represents an organic anion having a charge of q. The organic anion may include an anionic site as a part, or may be the anionic site itself. The organic anion preferably includes the anionic site as a part.

In a case where a plurality of $M^{p+}$ and $X^{q-}$'s are present, $M^{p+}$ and $X^{q-}$'s may be the same as or different from each other.

A value obtained by multiplying an average value of p's in $M^{p+}$'s which can be present in plurality, by m, and a value obtained by multiplying an average value of q's in $X^{q-}$'s which can be present in plurality, by n, are the same value.

Among those, p is preferably 1.

For example, it is preferable that p, q, m, and n are all 1.

In addition, it is also preferable that p is 1, q is 2 to 8, m is the same value as q, and n is 1.

Organic Cations

The cationic site is a structural site including a positively charged atom or an atomic group, and is preferably, for example, a monovalent organic cation ($M^{p+}$ in which p is 1).

The organic cations are each independently preferably an organic cation represented by Formula (ZaI) (cation (ZaI)) or an organic cation represented by Formula (ZaII) (cation (ZaII)).

(ZaI)

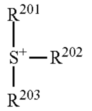

(ZaII)

$$R^{204}—I^{+}—R^{205}$$

In Formula (ZaI), $R^{201}$, $R^{202}$, and $R^{203}$ each independently represent an organic group.

The organic group as each of $R^{201}$, $R^{202}$, and $R^{203}$ usually has 1 to 30 carbon atoms, and preferably has 1 to 20 carbon atoms. In addition, two of $R^{201}$ to $R^{203}$ may be bonded to each other to form a ring structure, and the ring may include an oxygen atom, a sulfur atom, an ester group, an amide group, or a carbonyl group. Examples of the group formed by the bonding of two of $R^{201}$ to $R^{203}$ include an alkylene group (for example, a butylene group and a pentylene group), and $—CH_2—CH_2—O—CH_2—CH_2—$.

Suitable aspects of the organic cation as Formula (ZaI) include a cation (ZaI-1), a cation (ZaI-2), an organic cation represented by Formula (ZaI-3b) (cation (ZaI-3b)), and an organic cation represented by Formula (ZaI-4b) (cation (ZaI-4b)), each of which will be described later.

First, the cation (ZaI-1) will be described.

The cation (ZaI-1) is an arylsulfonium cation in which at least one of $R^{201}$, $R^{202}$, or $R^{203}$ of Formula (ZaI) is an aryl group.

In the arylsulfonium cation, all of $R^{201}$ to $R^{203}$ may be aryl groups, or some of $R^{201}$ to $R^{203}$ may be an aryl group, and the rest may be an alkyl group or a cycloalkyl group.

In addition, one of $R^{201}$ to $R^{203}$ is an aryl group, two of $R^{201}$ to $R^{203}$ may be bonded to each other to form a ring structure, and an oxygen atom, a sulfur atom, an ester group, an amide group, or a carbonyl group may be included in the ring. Examples of the group formed by the bonding of two of $R^{201}$ to $R^{203}$ include an alkylene group (for example, a butylene group, a pentylene group, or $—CH_2—CH_2—O—CH_2—CH_2—$) in which one or more methylene groups may be substituted with an oxygen atom, a sulfur atom, an ester group, an amide group, and/or a carbonyl group.

Examples of the arylsulfonium cation include a triarylsulfonium cation, a diarylalkylsulfonium cation, an aryldialkylsulfonium cation, a diarylcycloalkylsulfonium cation, and an aryldicycloalkylsulfonium cation.

As the aryl group included in the arylsulfonium cation, a phenyl group or a naphthyl group is preferable, and the phenyl group is more preferable. The aryl group may be an aryl group which has a heterocyclic structure having an oxygen atom, a nitrogen atom, a sulfur atom, or the like. Examples of the heterocyclic structure include a pyrrole residue, a furan residue, a thiophene residue, an indole residue, a benzofuran residue, and a benzothiophene residue. In a case where the arylsulfonium cation has two or more aryl groups, the two or more aryl groups may be the same as or different from each other.

The alkyl group or the cycloalkyl group contained in the arylsulfonium cation, as necessary, is preferably a linear alkyl group having 1 to 15 carbon atoms, a branched alkyl group having 3 to 15 carbon atoms, or a cycloalkyl group having 3 to 15 carbon atoms, and more preferably a methyl group, an ethyl group, a propyl group, an n-butyl group, a sec-butyl group, a t-butyl group, a cyclopropyl group, a cyclobutyl group, or a cyclohexyl group.

The substituents which may be contained in each of the aryl group, the alkyl group, and the cycloalkyl group of each of $R^{201}$ to $R^{203}$ are each independently preferably an alkyl group (for example, having 1 to 15 carbon atoms), a cycloalkyl group (for example, having 3 to 15 carbon atoms), an aryl group (for example, having 6 to 14 carbon atoms), an alkoxy group (for example, having 1 to 15 carbon atoms), a cycloalkylalkoxy group (for example, having 1 to 15 carbon atoms), a halogen atom (for example, fluorine and iodine), a hydroxyl group, a carboxyl group, an ester group, a sulfinyl group, a sulfonyl group, an alkylthio group, a phenylthio group, or the like.

The substituent may further have a substituent as possible and is also preferably in the form of an alkyl halide group such as a trifluoromethyl group, for example, in which the alkyl group has a halogen atom as a substituent.

In addition, it is also preferable that the substituents form an acid-decomposable group by any combination.

Furthermore, the acid-decomposable group is intended to be a group that decomposes by the action of an acid to produce a polar group, and preferably has a structure in which a polar group is protected by a leaving group that leaves by the action of an acid. The polar group and the leaving group are as described above.

Next, the cation (ZaI-2) will be described.

The cation (ZaI-2) is a cation in which $R^{201}$ to $R^{203}$ in Formula (ZaI) are each independently a cation representing an organic group having no aromatic ring. Here, the aromatic ring also includes an aromatic ring including a heteroatom.

The organic group having no aromatic ring as each of $R^{201}$ to $R^{203}$ generally has 1 to 30 carbon atoms, and preferably 1 to 20 carbon atoms.

$R^{201}$ to $R^{203}$ are each independently preferably an alkyl group, a cycloalkyl group, an allyl group, or a vinyl group, more preferably a linear or branched 2-oxoalkyl group, a 2-oxocycloalkyl group, or an alkoxycarbonylmethyl group, and still more preferably the linear or branched 2-oxoalkyl group.

Examples of the alkyl group and the cycloalkyl group of each of $R^{211}$, to $R^{203}$ include a linear alkyl group having 1 to 10 carbon atoms or branched alkyl group having 3 to 10 carbon atoms (for example, a methyl group, an ethyl group, a propyl group, a butyl group, and a pentyl group), and a cycloalkyl group having 3 to 10 carbon atoms (for example, a cyclopentyl group, a cyclohexyl group, and a norbornyl group).

$R^{201}$ to $R^{203}$ may further be substituted with a halogen atom, an alkoxy group (for example, having 1 to 5 carbon atoms), a hydroxyl group, a cyano group, or a nitro group.

In addition, it is also preferable that the substituents of $R^{201}$ to $R^{203}$ each independently form an acid-decomposable group by any combination of the substituents.

Next, the cation (ZaI-3b) will be described.

The cation (ZaI-3b) is a cation represented by Formula (ZaI-3b).

(ZaI-3b)

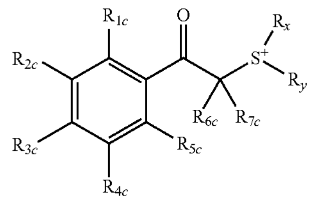

In Formula (ZaI-3b), $R_{1c}$ to $R_{5c}$ each independently represent a hydrogen atom, an alkyl group, a cycloalkyl group, an aryl group, an alkoxy group, an aryloxy group, an alkoxycarbonyl group, an alkylcarbonyloxy group, a cycloalkylcarbonyloxy group, a halogen atom, a hydroxyl group, a nitro group, an alkylthio group, or an arylthio group.

$R_{6c}$ and $R_{7c}$ each independently represent a hydrogen atom, an alkyl group (a t-butyl group or the like), a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonylalkyl group, an allyl group, or a vinyl group.

In addition, it is also preferable that the substituents of $R_{1c}$ to $R_{7c}$, $R_x$, and $R_y$ each independently form an acid-decomposable group by any combination of substituents.

Any two or more of $R_{1c}$, . . . , or $R_{5c}$, $R_{5c}$ and $R_{6c}$, $R_{6c}$ and $R_{7c}$, $R_{5c}$ and $R_x$, and $R_x$ and $R_y$ may each be bonded to each other to form a ring, and the ring may each independently include an oxygen atom, a sulfur atom, a ketone group, an ester bond, or an amide bond.

Examples of the ring include an aromatic or non-aromatic hydrocarbon ring, an aromatic or non-aromatic heterocyclic ring, and a polycyclic fused ring formed by combination of two or more kinds of these rings. Examples of the ring include a 3- to 10-membered ring, and the ring is preferably a 4- to 8-membered ring, and more preferably a 5- or 6-membered ring.

Examples of the group formed by the bonding of any two or more of $R_{1c}$, $R_{2c}$, $R_{3c}$, $R_{4c}$, or $R_{5c}$, $R_{6c}$ and $R_{7c}$, and $R_x$ and $R_y$ include an alkylene group such as a butylene group and a pentylene group. The methylene group in this alkylene group may be substituted with a heteroatom such as an oxygen atom.

As the group formed by the bonding of $R_{5c}$ and $R_{6c}$, and $R_{5c}$ and $R_x$, a single bond or an alkylene group is preferable. Examples of the alkylene group include a methylene group and an ethylene group.

A ring formed by the mutual bonding of any two or more of $R_{1c}$ to $R_{5c}$, $R_{6c}$, $R_{7c}$, $R_x$, $R_y$, or $R_{1c}$ to $R_{5c}$, and a ring formed by the mutual bonding of each pair of $R_{5c}$ and $R_{6c}$, $R_{6c}$ and $R_{7c}$, $R_{5c}$ and $R_x$, and $R_x$ and $R_y$ may have a substituent.

Next, the cation (ZaI-4b) will be described.

The cation (ZaI-4b) is a cation represented by Formula (ZaI-4b).

(ZaI-4b)

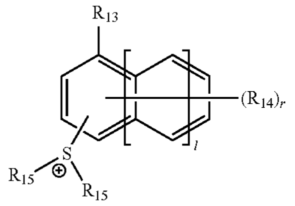

In Formula (ZaI-4b), l represents an integer of 0 to 2.

r represents an integer of 0 to 8.

$R_{13}$ represents a hydrogen atom, a halogen atom (for example, a fluorine atom and an iodine atom), a hydroxyl group, an alkyl group, an alkyl halide group, an alkoxy group, a carboxyl group, an alkoxycarbonyl group, or a group having a cycloalkyl group (which may be the cycloalkyl group itself or a group including the cycloalkyl group in a part thereof). These groups may have a substituent.

$R_{14}$ represents a hydroxyl group, a halogen atom (for example, a fluorine atom and an iodine atom), an alkyl group, an alkyl halide group, an alkoxy group, an alkoxycarbonyl group, an alkylcarbonyl group, an alkylsulfonyl group, a cycloalkylsulfonyl group, or a group having a cycloalkyl group (which may be the cycloalkyl group itself or a group including the cycloalkyl group in a part thereof). These groups may have a substituent. In a case where $R_{14}$'s are present in plurality, they each independently represent the group such as a hydroxyl group.

$R_{15}$'s each independently represent an alkyl group, a cycloalkyl group, or a naphthyl group. Two $R_{15}$'s may be bonded to each other to form a ring. In a case where two $R_{15}$'s are bonded to each other to form a ring, the ring skeleton may include a heteroatom such as an oxygen atom and a nitrogen atom. In one aspect, it is preferable that two $R_{15}$'s are alkylene groups and are bonded to each other to form a ring structure. Furthermore, the alkyl group, the cycloalkyl group, the naphthyl group, and the ring formed by the mutual bonding two $R_{15}$'s may have a substituent.

In Formula (ZaI-4b), the alkyl group of each of $R_{13}$, $R_{14}$, and $R_{15}$ is linear or branched. The alkyl group preferably has 1 to 10 carbon atoms. The alkyl group is more preferably a methyl group, an ethyl group, an n-butyl group, a t-butyl group, or the like.

In addition, it is also preferable that the respective substituents of $R_3$ to $R_{15}$, $R_x$, and $R_y$ each independently form an acid-decomposable group by any combination of substituents.

Next, Formula (ZaII) will be described.

In Formula (ZaII), $R^{204}$ and $R^{205}$ each independently represent an aryl group, an alkyl group, or a cycloalkyl group.

The aryl group of each of $R^{204}$ and $R^{205}$ is preferably a phenyl group or a naphthyl group, and more preferably the phenyl group. The aryl group of each of $R^{204}$ and $R^{205}$ may be an aryl group which has a heterocyclic ring having an oxygen atom, a nitrogen atom, a sulfur atom, or the like. Examples of the skeleton of the aryl group having a heterocyclic ring include pyrrole, furan, thiophene, indole, benzofuran, and benzothiophene.

The alkyl group and the cycloalkyl group of each of $R^{204}$ and $R^{205}$ is preferably a linear alkyl group having 1 to 10 carbon atoms or a branched alkyl group having 3 to 10 carbon atoms (for example, a methyl group, an ethyl group, a propyl group, a butyl group, and a pentyl group), or a cycloalkyl group having 3 to 10 carbon atoms (for example, a cyclopentyl group, a cyclohexyl group, or a norbornyl group).

The aryl group, the alkyl group, and the cycloalkyl group of each of $R^{204}$ and $R^{205}$ may each independently have a substituent. Examples of the substituent which may be contained in each of the aryl group, the alkyl group, and the cycloalkyl group of each of $R^{204}$ and $R^{205}$ include an alkyl group (for example, having 1 to 15 carbon atoms), a cycloalkyl group (for example, having 3 to 15 carbon atoms), an aryl group (for example, having 6 to 15 carbon atoms), an alkoxy group (for example, having 1 to 15 carbon atoms), a halogen atom, a hydroxyl group, and a phenylthio group. In addition, it is also preferable that the substituents of $R^{204}$ and $R^{205}$ each independently form an acid-decomposable group by any combination of the substituents.

Examples of the organic cation include a quaternary ammonium cation.

Examples of the quaternary ammonium compound include a cation represented by Formula (ZaIII).

$(R^{CA})_4N^+$ (ZaIII)

In the formula, $R^{CA}$ represents an alkyl group. The substituent which can be contained in the alkyl group is preferably a hydroxyl group or phenyl. Four of $R^{CA}$'s may be the same as or different from each other.

As the alkyl group represented by $R^{CA}$, an alkyl group having 1 to 6 carbon atoms is preferable.

As the alkyl group represented by $R^{CA}$, a methyl group, an ethyl group, a propyl group, a butyl group, a 2-hydroxyethyl group, or a benzyl group is preferable, the methyl group, the ethyl group, the propyl group, the butyl group, or the 2-hydroxyethyl group is more preferable, and the methyl group, the ethyl group, or the 2-hydroxyethyl group is still more preferable.

Examples of the quaternary ammonium compound include a tetramethylammonium cation, a trimethylethylammonium cation, a dimethyldiethylammonium cation, a methyltriethylammonium cation, a tetraethylammonium cation, a tetrapropylammonium cation, a tetrabutylammonium cation, a 2-hydroxyethyltrimethylammonium cation, a bis(2-hydroxyethyl)dimethylammonium cation, a tri(2-hydroxyethyl) methylammonium cation, a tetra(2-hydroxyethyl)ammonium cation, a benzyltrimethylammonium cation, and a cetyltrimethylammonium cation.

Organic Anion

The organic anion may be any organic anion to which a hydrogen atom is bonded to form an acid which is an acid having one or more (for example, 1 to 10) acid groups having a pKa of a predetermined value (−3.60 or more).

Examples of the organic anion include a phenolic hydroxyl anion, a sulfonate anion (an aliphatic sulfonate anion, an aromatic sulfonate anion, a camphor sulfonate anion, and the like), a carboxylate anion (an aliphatic carboxylate anion, an aromatic carboxylate anion, an aralkyl carboxylate anion, a formate anion, a hydrogen carbonate anion, and the like), a carbonylsulfonylimide acid anion, a bis(sulfonyl)imide anion (a bis(alkylsulfonyl)imide anion and the like), a bis(carbonyl)imide anion, and a tris(alkylsulfonyl)methide anion.

The aliphatic site in the aliphatic sulfonate anion and the aliphatic carboxylate anion may be an alkyl group or a cycloalkyl group, and has a linear or branched alkyl group having 1 to 30 carbon atoms, or is preferably a cycloalkyl group having 3 to 30 carbon atoms.

The alkyl group may be, for example, a fluoroalkyl group (which may or may not have a substituent other than a fluorine atom, and may be a perfluoroalkyl group).

The cycloalkyl group may be a monocycle or a polycycle, and one or more (preferably 1 or 2) of $—CH_2—$'s constituting the ring structure of the cycloalkyl group may be substituted with a heteroatom (—O—, —S—, and the like), $—SO_2—$, $—SO_3—$, an ester group, or a carbonyl group.

The aryl group in the aromatic sulfonate anion and the aromatic carboxylate anion is preferably an aryl group having 6 to 14 carbon atoms, and examples thereof include a phenyl group, a tolyl group, and a naphthyl group.

The alkyl group, the cycloalkyl group, and the aryl group exemplified above may have a substituent. The substituent is not particularly limited, but specific examples of the substituent include a nitro group, a halogen atom such as fluorine atom or a chlorine atom, a carboxy group, a hydroxyl group, an amino group, a cyano group, an alkoxy group (preferably having 1 to 15 carbon atoms), an alkyl group (preferably having 1 to 10 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), and an aryloxysulfonyl group (preferably having 6 to 20 carbon atoms).

The aralkyl group in the aralkyl carboxylate anion is preferably an aralkyl group having 7 to 14 carbon atoms, and examples thereof include a benzyl group, a phenethyl group, a naphthylmethyl group, a naphthylethyl group, and a naphthylbutyl group.

Examples of the sulfonylimide anion include a saccharin anion.

The alkyl group in the bis(alkylsulfonyl)imide anion and the tris(alkylsulfonyl)methide anion is preferably an alkyl group having 1 to 5 carbon atoms. Examples of the substituent of such an alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group, and a fluorine atom or an alkyl group substituted with the fluorine atom is preferable.

In addition, the alkyl groups in the bis(alkylsulfonyl)imide anion may be bonded to each other to form a ring structure.

As the organic anion, an aliphatic sulfonate anion in which at least the α-position of a sulfonic acid is substituted with a fluorine atom (an aliphatic sulfonate anion in which one or two fluorine atoms are substituted at the α-position, and the like), an aliphatic sulfonate anion in which the α-position of a sulfonic acid is not substituted with a fluorine atom (an aliphatic sulfonate anion in which a fluorine atom is not substituted at the α-position and 0 to 3 fluorine atoms or perfluoroalkyl groups are substituted at the β-position, and the like), an aromatic sulfonate anion substituted with a fluorine atom or a group having a fluorine atom, a bis(alkylsulfonyl)imide anion in which an alkyl group is substituted with a fluorine atom, or a tris(alkylsulfonyl)methide anion in which an alkyl group is substituted with a fluorine atom is also preferable.

In addition, as the organic anion, an anion represented by Formula (AN) is also preferable.

(AN)

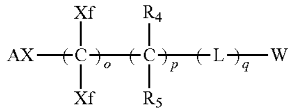

In Expression (AN), o represents an integer of 0 to 5. p represents an integer of 0 to 10. q represents an integer of 0 to 10.

In Formula (AN), AX represents $—SO_3^-$ or $—COO^-$.

In Formula (AN), Xf represents a fluorine atom or an alkyl group substituted with at least one fluorine atom. The alkyl group preferably has 1 to 10 carbon atoms, and more preferably has 1 to 4 carbon atoms. In addition, a perfluoroalkyl group is preferable as the alkyl group substituted with at least one fluorine atom.

Xf is preferably the fluorine atom or a perfluoroalkyl group having 1 to 4 carbon atoms, and more preferably the fluorine atom or $CF_3$. In particular, it is still more preferable that both Xf's are fluorine atoms.

In Formula (AN), $R_4$ and $R_5$ each independently represent a hydrogen atom, a fluorine atom, an alkyl group, or an alkyl group substituted with at least one fluorine atom. In a case where $R_4$'s and $R_5$'s are each present in plurality, $R_4$'s and $R_5$'s may each be the same as or different from each other.

The alkyl group represented by each of $R_4$ and $R_5$ may have a substituent other than a fluorine atom, and preferably has 1 to 4 carbon atoms.

Specific examples and suitable aspects of the alkyl group substituted with at least one fluorine atom are the same ones as the specific examples and the suitable aspects of Xf, respectively.

$R_4$ and $R_5$ are preferably hydrogen atoms.

It is also preferable that one of $R_4$ and $R_5$ bonded to the same carbon atom is a hydrogen atom, and the other is a fluorine atom or an alkyl group substituted with at least one fluorine atom. Among those, in $—C(R_4)(R_5)—$ at the position first and/or second closest to AX, it is also preferable that one of $R_4$ and $R_5$ bonded to the same carbon atom is substituted with a hydrogen atom, and the other one is substituted with a fluorine atom or an alkyl group substituted with at least one fluorine atom. In addition, in —C($R_4$)($R_5$)— at the position first and/or second closest to AX, it is also preferable that $R_4$ and $R_5$ are each independently a hydrogen atom or an alkyl group (which may have a substituent other than a fluorine atom).

In Formula (AN), L represents a divalent linking group. In a case where L's are present in plurality, L's may be the same as or different from each other.

Examples of the divalent linking group include —O—CO—O—, —COO—, —OCO—, —CONH—, —NHCO—, —CO—, —O—, —S—, —SO—, —$SO_2$—, an alkylene group (preferably having 1 to 6 carbon atoms), a cycloalkylene group (preferably having 3 to 15 carbon atoms), an alkenylene group (preferably having 2 to 6 carbon atoms), and a divalent linking group formed by combination of a plurality of these groups. Among those, —O—CO—O—, —COO—, —OCO—, —CONH—, —NHCO—, —CO—, —O—, —$SO_2$—, —O—CO—O-alkylene group-, -alkylene group-O—CO—O—, —COO-alkylene group-, —OCO-alkylene group-, —CONH-alkylene group-, or —NHCO-alkylene group- is preferable; and —O—CO—O—, —O—CO—O-alkylene group-, -alkylene group-O—CO—O—, —COO—, —OCO—, —CONH—, —$SO_2$—, —COO-alkylene group-, or —OCO-alkylene group- is more preferable.

In Formula (AN), W represents an organic group including a cyclic structure. Among those, W is preferably a cyclic organic group.

Examples of the cyclic organic group include an alicyclic group, an aryl group, and a heterocyclic group.

The alicyclic group may be a monocycle or a polycycle. Examples of the monocyclic alicyclic group include monocyclic cycloalkyl groups such as a cyclopentyl group, a cyclohexyl group, and a cyclooctyl group. Examples of the polycyclic alicyclic group include polycyclic cycloalkyl groups such as a norbornyl group, a tricyclodecanyl group, a tetracyclodecanyl group, a tetracyclododecanyl group, and an adamantyl group. Among those, an alicyclic group having a bulky structure having 7 or more carbon atoms, such as a norbornyl group, a tricyclodecanyl group, a tetracyclodecanyl group, a tetracyclododecanyl group, and an adamantyl group, is preferable.

The aryl group may be a monocycle or a polycycle. Examples of the aryl group include a phenyl group, a naphthyl group, a phenanthryl group, and an anthryl group.

The heterocyclic group may be a monocycle or a polycycle. Furthermore, the heterocyclic group may have aromaticity or may not have aromaticity. Examples of the heterocyclic ring having aromaticity include a furan ring, a thiophene ring, a benzofuran ring, a benzothiophene ring, a dibenzofuran ring, a dibenzothiophene ring, and a pyridine ring. Examples of the heterocyclic ring not having aromaticity include a tetrahydropyran ring, a lactone ring, a sultone ring, and a decahydroisoquinoline ring. As the heterocyclic ring in the heterocyclic group, the furan ring, the thiophene ring, the pyridine ring, or the decahydroisoquinoline ring is particularly preferable.

The cyclic organic group may have a substituent. Examples of the substituent include an alkyl group (which may be either linear or branched, preferably having 1 to 12 carbon atoms), a cycloalkyl group (which may be any one of a monocycle, a polycycle, and a spirocycle, and preferably has 3 to 20 carbon atoms), an aryl group (preferably having 6 to 14 carbon atoms), a hydroxyl group, an alkoxy group, an ester group, an amide group, a urethane group, a ureide group, a thioether group, a sulfonamide group, and a sulfonic acid ester group. Incidentally, the carbon constituting the cyclic organic group (carbon contributing to ring formation) may be carbonyl carbon.

As the anion represented by Formula (AN), AX-$CF_2$—$CH_2$—OCO-(L)q'-W, AX-$CF_2$—CHF—$CH_2$—OCO-(L)q'-W, AX-$CF_2$—COO-(L)q'-W, AX-$CF_2$—$CF_2$—$CH_2$—$CH_2$-(L)q-W, or AX-$CF_2$—CH($CF_3$)—OCO-(L)q'-W is preferable. Here, AX, L, q, and W are the same as in Formula (AN). q' represents an integer of 0 to 10.

In addition, a portion other than the organic cation in a compound represented by any one of Formula (Ia-1), (Ia-2), (Ia-3), (Ia-4), or (Ia-5) which will be described later and a compound represented by Formula (IIa-1) or Formula (IIa-2) may be used as the organic anion.

Compounds (I) and (II)

The specific salt which is an onium salt may be one or more kinds selected from the group consisting of compounds (I) and (II) which will be described later.

The compounds (I) and (II) are also each a compound that generates an acid upon irradiation with actinic rays or radiation (photoacid generator).

Compound (I)

The compound (I) is a compound having one or more sites of the following structural site X and one or more sites of the following structural site Y, the compound generating an acid including the following first acidic site derived from the following structural site X and the following second acidic site derived from the following structural site Y upon irradiation with actinic rays or radiation.

Structural site X: a structural site which consists of an anionic site $A_1^-$ and a cationic site $M_1^+$, and forms a first acidic site represented by $HA_1$ upon irradiation with actinic rays or radiation Structural site Y: a structural site which consists of an anionic site $A_2^-$ and a cationic site $M_2^+$, and forms a second acidic site represented by $HA_2$ upon irradiation with actinic rays or radiation It should be noted that the compound (I) satisfies the following condition I.

Condition I: A compound PI formed by substituting the cationic site $M_1^+$ in the structural site X and the cationic site $M_2^+$ in the structural site Y with $H^+$ in the compound (I) has an acid dissociation constant a1 derived from an acidic site represented by $HA_1$, formed by substituting the cationic site $M_1^+$ in the structural site X with $H^+$, and an acid dissociation constant a2 derived from an acidic site represented by $HA_2$, formed by substituting the cationic site $M_2^+$ in the structural site Y with $H^+$, and the acid dissociation constant a2 is larger than the acid dissociation constant a1.

Hereinafter, the condition I will be described more specifically.

In a case where the compound (I) is, for example, a compound that generates an acid having one site of the first acidic site derived from the structural site X and one site of the second acidic site derived from the structural site Y, the compound PI corresponds to a "compound having $HA_1$ and $HA_2$".

More specifically, with regard to the acid dissociation constant a1 and the acid dissociation constant a2 of such a compound PI, in a case where the acid dissociation constant of the compound PI is determined, the pKa with which the compound PI serves as a "compound having $A_1^-$ and $HA_2$" is the acid dissociation constant a1, and the pKa with which the "compound having $A_1^-$ and $HA_2$" serves as a "compound having $A_1^-$ and $A_2^-$" is the acid dissociation constant a2.

In addition, in a case where the compound (I) is, for example, a compound that generates an acid having two sites of the first acidic site derived from the structural site X and one site of the second acidic site derived from the structural site Y, the compound PI corresponds to a "compound having two $HA_1$'s and one $HA_2$".

In a case where the acid dissociation constant of such a compound PI is determined, an acid dissociation constant in a case where the compound PI serves as a "compound having one $A_1^-$, one $HA_1$, and one $HA_2$" and an acid dissociation constant in a case where the "compound having one $A_1^-$, one $HA_1$, and one $HA_2$" serves as a "compound having two $A_1^-$'s and one $HA_2$" correspond to the acid dissociation constant a1. In addition, the acid dissociation constant in a case where the "compound having two $A_1^-$ and one $HA_2$" serves as a "compound having two $A_1^-$'s and $A_2^-$" corresponds to the acid dissociation constant a2. That is, in a case of such the compound PI, a value of the acid dissociation constant a2 is larger than the largest value of the plurality of acid dissociation constants a1 in a case where the compound has a plurality of acid dissociation constants derived from the acidic site represented by $HA_1$, formed by substituting the cationic site MC in the structural site X with $H^+$. Furthermore, the acid dissociation constant in a case where the compound PI serves as a "compound having one $A_1^-$, one $HA_1$ and one $HA_2$" is taken as aa and the acid dissociation constant in a case where the "compound having one $A_1^-$, one $HA_1$, and one $HA_2$" serves as a "compound having two $A_1^-$'s and one $HA_2$" is taken as ab, a relationship between aa and ab satisfies aa<ab.

The acid dissociation constant a1 and the acid dissociation constant a2 can be determined by the above-mentioned method for measuring an acid dissociation constant.

The compound PI corresponds to an acid generated upon irradiating the compound (I) with actinic rays or radiation.

In a case where the compound (1) has two or more structural sites X, the structural sites X may be the same as or different from each other. In addition, two or more $A_1^-$'s and two or more $M_1^+$'s may be the same as or different from each other.

Moreover, in the compound (I), $A_1^-$'s and $A_2^-$, and $M_1^+$'s and $M_2^+$'s may be the same as or different from each other, but it is preferable that $A_1^-$'s and $A_2^-$, are each different from each other.

From the viewpoint that the LWR performance of a pattern thus formed is more excellent, in the compound PI, the difference between the acid dissociation constant a1 (the maximum value in a case where a plurality of acid dissociation constants a1 are present) and the acid dissociation constant a2 is preferably 0.1 or more, more preferably 0.5 or more, and still more preferably 1.0 or more. Furthermore, the upper limit value of the difference between the acid dissociation constant a1 (the maximum value in a case where a plurality of acid dissociation constants a1 are present) and the acid dissociation constant a2 is not particularly limited, but is, for example, 16 or less.

In addition, from the viewpoint that the LWR performance of a pattern thus formed is more excellent, in the compound PI, the acid dissociation constant a2 is, for example, 20 or less, and preferably 15 or less. Furthermore, a lower limit value of the acid dissociation constant a2 is preferably −4.0 or more.

In addition, from the viewpoint that the LWR performance of a pattern thus formed is more excellent, the acid dissociation constant a1 is preferably 2.0 or less, and more preferably 0 or less in the compound PI. Furthermore, a lower limit value of the acid dissociation constant a1 is preferably −20.0 or more.

The anionic site $A_1^-$ and the anionic site $A_2^-$ are structural sites including negatively charged atoms or atomic groups, and examples thereof include structural sites selected from the group consisting of Formulae (AA-1) to (AA-3) and Formulae (BB-1) to (BB-6) shown below. As the anionic site $A_1^-$, those capable of forming an acidic site having a small acid dissociation constant are preferable, and among those, any one of Formula (AA-1), (AA-2), or (AA-3) is preferable. In addition, as the anionic site $A_2^-$, those capable of forming an acidic site having a larger acid dissociation constant than the anionic site $A_1^-$ are preferable, and those selected from any of Formulae (BB-1) to (BB-6) are more preferable. Furthermore, in Formulae (AA-1) to (AA-3) and Formulae (BB-1) to (BB-6), * represents a bonding position.

In Formula (AA-2), $R^A$ represents a monovalent organic group. Examples of the monovalent organic group represented by $R^A$ include a cyano group, a trifluoromethyl group, and a methanesulfonyl group.

AA-1

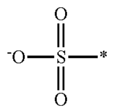

AA-2

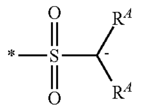

AA-3

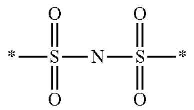

BB-1

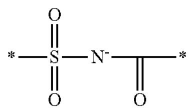

BB-2

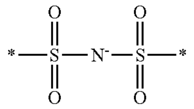

BB-3

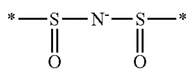

BB-4

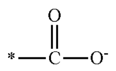

BB-5

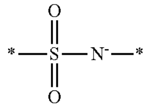

BB-6

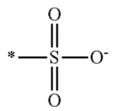

In addition, the cationic site $M_1^+$ and the cationic site $M_2^+$ are structural sites including positively charged atoms or atomic groups, and examples thereof include a monovalent organic cation. Furthermore, the organic cation is not particularly limited, but examples thereof include the above-mentioned organic cations, and among those, an organic cation represented by Formula (ZaI) (cation (ZaI)) or an organic cation represented by Formula (ZaII) (cation (ZaII)) is preferable.

The specific structure of the compound (I) is not particularly limited, but examples thereof include compounds represented by Formulae (Ia-1) to (Ia-5) which will be described later.

Hereinbelow, first, the compound represented by Formula (Ia-1) will be described. The compound represented by Formula (Ia-1) is as follows.

$$M_{11}^{+}A_{11}^{-}\text{-}L_1\text{-}A_{12}^{-}\text{-}M_{12}^{+} \quad \text{(Ia-1)}$$

The compound (Ia-1) generates an acid represented by $HA_{11}$-$L_1$-$A_{12}H$ upon irradiation with actinic rays or radiation.

In Formula (Ia-1), $M_{11}^+$ and $M_{12}^+$ each independently represent an organic cation.

$A_{11}^-$ and $A_{12}^-$ each independently represent a monovalent anionic functional group.

$L_1$ represents a divalent linking group.

$M_{11}^+$ and $M_{12}^+$ may be the same as or different from each other.

$A_{11}^-$ and $A_{12}^-$ may be the same as or different from each other, but are preferably different from each other.

It should be noted that in the compound PIa ($HA_{11}$-$L_1$-$A_{12}H$) formed by substituting organic cations represented by $M_{11}^+$ and $M_{12}^+$ with $H^+$ in Formula (Ia-1), the acid dissociation constant a2 derived from the acidic site represented by $A_{12}H$ is larger than an acid dissociation constant a1 derived from an acidic site represented by $HA_1$. Furthermore, suitable values of the acid dissociation constant a1 and the acid dissociation constant a2 are as described above. In addition, the acids generated from the compound PIa and the compound represented by Formula (Ia-1) upon irradiation with actinic rays or radiation are the same.

In addition, at least one of $M_{11}^+$, $M_{12}^+$, $A_{11}^-$, $A_{12}^-$, or $L_1$ may have an acid-decomposable group as a substituent.

In Formula (Ia-1), examples of the organic cations represented by $M_1^+$ and $M_2^+$ include the above-mentioned organic cations, and among those, an organic cation represented by Formula (ZaI) (cation (ZaI)) or an organic cation represented by Formula (ZaII) (cation (ZaII)) is preferable.

The monovalent anionic functional group represented by $A_{11}^-$ is intended to be a monovalent group including the above-mentioned anionic site $A_1^-$. In addition, the monovalent anionic functional group represented by $A_{12}^-$ is intended to be a monovalent group including the above-mentioned anionic site $A_2^-$.

The monovalent anionic functional group represented by each of $A_{11}^-$ and $A_{12}^-$ is preferably a monovalent anionic functional group including an anionic site of any one of Formula (AA-1), (AA-2), or (AA-3), and Formulae (BB-1) to (BB-6) mentioned above, and more preferably a monovalent anionic functional group selected from the group consisting of Formulae (AX-1) to (AX-3), and Formulae (BX-1) to (BX-7). The monovalent anionic functional group represented by $A_{11}^-$ is preferably, among those, the monovalent anionic functional group represented by any of Formulae (AX-1) to (AX-3). In addition, the monovalent anionic functional group represented by $A_{12}^-$ is preferably, among those, the monovalent anionic functional group represented by any of Formulae (BX-1) to (BX-7), and more preferably the monovalent anionic functional group represented by any of Formulae (BX-1) to (BX-6).

AX-1

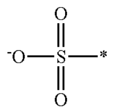

AX-2

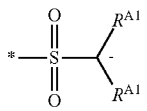

AX-3

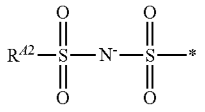

BX-1

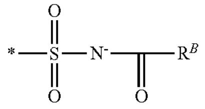

BX-2

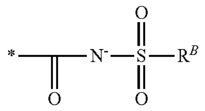

BX-3

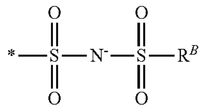

BX-4

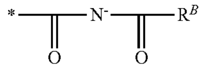

BX-5

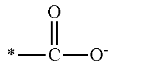

BX-6

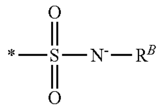

BX-7

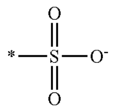

In Formulae (AX-1) to (AX-3), $R^{A1}$ and $R^{A2}$ each independently represent a monovalent organic group. * represents a bonding position.

Examples of the monovalent organic group represented by $R^{A1}$ include a cyano group, a trifluoromethyl group, and a methanesulfonyl group.

As the monovalent organic group represented by $R^{A2}$, a linear, branched, or cyclic alkyl group, or an aryl group is preferable.

The alkyl group preferably has 1 to 15 carbon atoms, more preferably has 1 to 10 carbon atoms, and still more preferably has 1 to 6 carbon atoms.

The alkyl group may have a substituent. As the substituent, a fluorine atom or a cyano group is preferable, and the fluorine atom is more preferable. In a case where the alkyl group has a fluorine atom as the substituent, it may be a perfluoroalkyl group.

As the aryl group, a phenyl group or a naphthyl group is preferable, and the phenyl group is more preferable.

The aryl group may have a substituent. As the substituent, a fluorine atom, an iodine atom, a perfluoroalkyl group (for example, preferably a perfluoroalkyl group having 1 to 10 carbon atoms, and more preferably a perfluoroalkyl group having 1 to 6 carbon atoms), or a cyano group is preferable, and the fluorine atom, the iodine atom, or the perfluoroalkyl group is more preferable.

In Formulae (BX-1) to (BX-4) and Formula (BX-6), $R^B$ represents a monovalent organic group. * represents a bonding position.

As the monovalent organic group represented by $R^B$, a linear, branched, or cyclic alkyl group, or an aryl group is preferable.

The alkyl group preferably has 1 to 15 carbon atoms, more preferably has 1 to 10 carbon atoms, and still more preferably has 1 to 6 carbon atoms.

The alkyl group may have a substituent. The substituent is not particularly limited, but as the substituent, a fluorine atom or a cyano group is preferable, and the fluorine atom is more preferable. In a case where the alkyl group has a fluorine atom as the substituent, it may be a perfluoroalkyl group.

Moreover, in a case where the carbon atom that serves as a bonding position in the alkyl group (for example, in a case of Formulae (BX-1) and (BX-4), the carbon atom corresponds to a carbon atom that directly bonds to —CO— specified in the formula in the alkyl group, and in a case of Formulae (BX-2) and (BX-3), the carbon atom corresponds to a carbon atom that directly bonded to —$SO_2$— specified in the formula in the alkyl group, and in a case of Formula (BX-6), the carbon atom corresponds to a carbon atom that directly bonded to N-specified in the formula in the alkyl group) has a substituent, it is also preferable that the carbon atom has a substituent other than a fluorine atom or a cyano group.

In addition, the alkyl group may have a carbon atom substituted with a carbonyl carbon.

As the aryl group, a phenyl group or a naphthyl group is preferable, and the phenyl group is more preferable.

The aryl group may have a substituent. As the substituent, a fluorine atom, an iodine atom, a perfluoroalkyl group (for example, preferably a perfluoroalkyl group having 1 to 10 carbon atoms, and more preferably a perfluoroalkyl group having 1 to 6 carbon atoms), a cyano group, an alkyl group (for example, preferably an alkyl group having 1 to 10 carbon atoms, and more preferably an alkyl group having 1 to 6 carbon atoms), an alkoxy group (for example, preferably an alkoxy group having 1 to 10 carbon atoms, and more preferably an alkoxy group having 1 to 6 carbon atoms), or an alkoxycarbonyl group (for example, preferably an alkoxycarbonyl group having 2 to 10 carbon atoms, and more preferably an alkoxycarbonyl group having 2 to 6 carbon atoms) is preferable, and the fluorine atom, the iodine atom, the perfluoroalkyl group, the alkyl group, the alkoxy group, or the alkoxycarbonyl group is more preferable.

In Formula (Ia-1), the divalent linking group represented by $L_1$ is not particularly limited, but examples thereof include —CO—, —NR—, —CO—, —O—, —S—, —SO—, —$SO_2$—, an alkylene group (which preferably has 1 to 6 carbon atoms, and may be linear or branched), a cycloalkylene group (preferably having 3 to 15 carbon atoms), an alkenylene group (preferably having 2 to 6 carbon atoms), a divalent aliphatic heterocyclic group (preferably having a 5- to 10-membered ring, more preferably having a 5- to 7-membered ring, and still more preferably having a 5- or 6-membered ring, each having at least one of an N atom, an O atom, an S atom, or an Se atom in the ring structure), a divalent aromatic heterocyclic group (preferably having a 5- to 10-membered ring, more preferably having a 5- to 7-membered ring, and still more preferably having a 5- or 6-membered ring, each having at least one of an N atom, an O atom, an S atom, or an Se atom in the ring structure), a divalent aromatic hydrocarbon ring group (preferably having a 6- to 10-membered ring, and more preferably having a 6-membered ring), and a divalent linking group formed by combination of a plurality of these groups. Examples of R include a hydrogen atom or a monovalent organic group. The monovalent organic group is not particularly limited, but is preferably, for example, an alkyl group (preferably having 1 to 6 carbon atoms).

In addition, the alkylene group, the cycloalkylene group, the alkenylene group, the divalent aliphatic heterocyclic group, the divalent aromatic heterocyclic group, and the divalent aromatic hydrocarbon ring group may each have a substituent. Examples of the substituent include a halogen atom (preferably a fluorine atom).

Among those, the divalent linking group represented by Formula (L1) is preferable as the divalent linking group by $L_1$.

(L1)

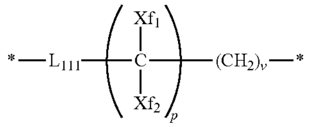

In Formula (L1), $L_{111}$ represents a single bond or a divalent linking group.

The divalent linking group represented by $L_{111}$ is not particularly limited, but examples thereof include —CO—, —NH—, —O—, —SO—, —$SO_2$—, an alkylene group (which preferably has 1 to 6 carbon atoms, and may be linear or branched), which may have a substituent, a cycloalkylene group (preferably having 3 to 15 carbon atoms), which may have a substituent, aryl group (preferably having 6 to 10 carbon atoms) which may have a substituent, and a divalent linking group formed by combination of these groups. The substituent is not particularly limited, but examples thereof include a halogen atom.

p represents an integer of 0 to 3, and preferably represents an integer of 1 to 3.

v represents an integer of 0 or 1.

$Xf_1$'s each independently represent a fluorine atom or an alkyl group substituted with at least one fluorine atom. The alkyl group preferably has 1 to 10 carbon atoms, and more preferably has 1 to 4 carbon atoms. In addition, a perfluoroalkyl group is preferable as the alkyl group substituted with at least one fluorine atom.

$Xf_2$'s each independently represent a hydrogen atom, an alkyl group which may have a fluorine atom as a substituent, or a fluorine atom. The alkyl group preferably has 1 to 10 carbon atoms, and more preferably has 1 to 4 carbon atoms. Among those, $Xf_2$ preferably represents the fluorine atom or the alkyl group substituted with at least one fluorine atom, and is more preferably the fluorine atom or a perfluoroalkyl group.

Among those, $Xf_1$ and $Xf_2$ are each independently preferably the fluorine atom or a perfluoroalkyl group having 1 to 4 carbon atoms, and more preferably the fluorine atom or $CF_3$. In particular, it is still more preferable that both $Xf_1$ and $Xf_2$ are fluorine atoms.

* represents a bonding position.

In a case where $L_{11}$ in Formula (Ia-1) represents a divalent linking group represented by Formula (L1), it is preferable that a bonding site (*) on the Lim side in Formula (L1) is bonded to $A_{12}^-$ in Formula (Ia-1).

Next, Formulae (Ia-2) to (Ia-4) will be described.

(Ia-2)

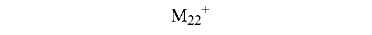

(Ia-3)

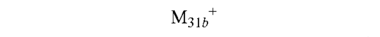

(Ia-4)

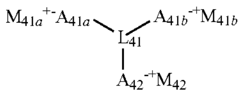

In Formula (Ia-2), $A_{21a}^-$ and $A_{21b}^-$ each independently represent a monovalent anionic functional group. Here, the monovalent anionic functional group represented by each of $A_{21a}^-$ and $A_{21b}^-$ is intended to be a monovalent group including the above-mentioned anionic site $A_1^-$. The monovalent anionic functional group represented by each of $A_{21a}^-$ and $A_{21b}^-$ is not particularly limited, but examples thereof include a monovalent anionic functional group selected from the group consisting of Formulae (AX-1) to (AX-3) mentioned above.

$A_{22}^-$ represents a divalent anionic functional group. Here, the divalent anionic functional group represented by $A_{22}^-$ is intended to be a divalent group including the above-mentioned anionic site $A_2^-$. Examples of the divalent anionic functional group represented by $A_{22}^-$ include divalent anionic functional groups represented by Formulae (BX-8) to (BX-11).

BX-8

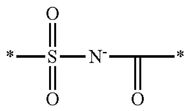

BX-9

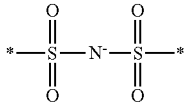

BX-10

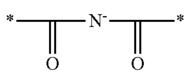

BX-11

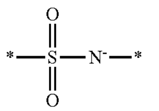

$M_{21a}^+$, $M_{21b}^+$, and $M_{22}$ each independently represent an organic cation. The organic cations represented by $M_{21a}^+$, $M_{21b}^+$, and $M_{22}^+$ each have the same definition as the above-mentioned $M_1^+$, and suitable aspects thereof are also the same.

$L_{21}$ and $L_{22}$ each independently represent a divalent organic group.

In addition, in the compound PIa-2 formed by substituting an organic cation represented by $M_{21a}^+$, $M_{21b}^+$, and $M_{22}^+$ with W in Formula (Ia-2), the acid dissociation constant a2 derived from the acidic site represented by $A_{22}H$ is larger than the acid dissociation constant a1-1 derived from the acidic site represented by $A_{21a}H$ and the acid dissociation constant a1-2 derived from the acidic site represented by $A_{21b}H$. Incidentally, the acid dissociation constant a1-1 and the acid dissociation constant a1-2 correspond to the above-mentioned acid dissociation constant a1.

Furthermore, $A_{21a}^-$ and $A_{21b}^-$ may be the same as or different from each other. In addition, $M_{21a}^+$, $M_{21b}^+$, and $M_{22}^+$ may be the same as or different from each other.

Moreover, at least one of $M_{21a}^+$, $M_{21b}^+$, $M_{22}^+$, $A_{21a}^-$, $A_{21b}^-$, $L_{21}$, or $L_{22}$ may have an acid-decomposable group as a substituent.

In Formula (Ia-3), $A_{31a}^-$ and $A_{32}^-$ each independently represent a monovalent anionic functional group. Furthermore, the monovalent anionic functional group represented by $A_{31a}^-$ has the same definition as $A_{21a}^-$ and $A_{21b}^-$ in Formula (Ia-2) mentioned above, and suitable aspects thereof are also the same.

The monovalent anionic functional group represented by $A_{32}^-$ is intended to be a monovalent group including the above-mentioned anionic site $A_2^-$. The monovalent anionic functional group represented by $A_{32}^-$ is not particularly limited, but examples thereof include a monovalent anionic functional group selected from the group consisting of Formulae (BX-1) to (BX-7) mentioned above.

$A_{31b}^-$ represents a divalent anionic functional group. Here, the divalent anionic functional group represented by $A_{31b}^-$ is intended to be a divalent group including the above-mentioned anionic site $A_1^-$. Examples of the divalent anionic functional group represented by $A_{31b}^-$ include a divalent anionic functional group represented by Formula (AX-4).

AX-4

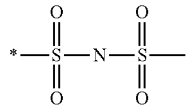

$M_{31a}^+$, $M_{31b}^+$, and $M_{32}^+$ each independently represent a monovalent organic cation. The organic cation represented by $M_{31a}^+$, $M_{31b}^+$, and $M_{32}^+$ have the same definitions as the above-mentioned $M_1^+$, and suitable aspects thereof are also the same.

$L_{31}$ and $L_{32}$ each independently represent a divalent organic group.

In addition, in the compound PIa-3 formed by substituting an organic cation represented by $M_{31a}^+$, $M_{31b}^+$, and $M_{32}^+$ with W in Formula (Ia-3), the acid dissociation constant a2 derived from the acidic site represented by $A_{32}H$ is larger than the acid dissociation constant a1-3 derived from the acidic site represented by $A_{31a}H$ and the acid dissociation constant a1-4 derived from the acidic site represented by $A_{31}H$. Incidentally, the acid dissociation constant a1-3 and the acid dissociation constant a1-4 correspond to the above-mentioned acid dissociation constant a1.

Furthermore, $A_{31a}^-$ and $A_{32}^-$ may be the same as or different from each other. In addition, $M_{31a}^+$, $M_{31b}^+$, and $M_{32}^+$ may be the same as or different from each other.

Moreover, at least one of $M_{31a}^+$, $M_{31b}^+$, $M_{32}^+$, $A_{31a}^+$, $A_{32}^+$, $L_{31}$, or $L_{32}$ may have an acid-decomposable group as a substituent.

In Formula (Ia-4), $A_{41a}^-$, $A_{41b}^-$, and $A_{42}^-$ each independently represent a monovalent anionic functional group. Furthermore, the monovalent anionic functional groups represented by $A_{41a}^-$ and $A_{41b}^-$ have the same definitions as $A_{21a}^-$ and $A_{21b}^-$ in Formula (Ia-2) mentioned above. In addition, the monovalent anionic functional group represented by $A_{42}^-$ has the same definition as $A_{32}^-$ in Formula (Ia-3) mentioned above, and suitable aspects thereof are also the same.

$M_{41a}^+$, $M_{41b}^+$, and $M_{42}^+$ each independently represent an organic cation.

$L_{41}$ represents a trivalent organic group.

In addition, in the compound PIa-4 formed by substituting an organic cation represented by $M_{41a}^+$, $M_{41b}^+$, and $M_{42}^+$ with $H^+$ in Formula (Ia-4), the acid dissociation constant a2 derived from the acidic site represented by $A_{42}H$ is larger than the acid dissociation constant a1-5 derived from the acidic site represented by $A_{41a}H$ and the acid dissociation constant a1-6 derived from the acidic site represented by $A_{41b}H$. Incidentally, the acid dissociation constant a1-5 and the acid dissociation constant a1-6 correspond to the above-mentioned acid dissociation constant a1.

Furthermore, $A_{41a}^-$, $A_{41b}^-$, and $A_{42}^-$ may be the same as or different from each other. In addition, $M_{41a}^-$, $M_{45b}^-$, and $M_{42}^-$ may be the same as or different from each other.

Moreover, at least one of $M_{41a}^+$, $M_{41b}^+$, $M_{42}^+$, $A_{41a}^-$, $A_{41b}^-$, $A_{42}^-$, or $L_{41}$ may have an acid-decomposable group as a substituent.

The divalent organic group represented by each of $L_{21}$ and $L_{22}$ in Formula (Ia-2) and $L_{31}$ and $L_{32}$ in Formula (Ia-3) is not particularly limited, but examples thereof include —CO—, —NR—, —O—, —S—, —SO—, —$SO_2$—, an alkylene group (which preferably has 1 to 6 carbon atoms, and may be linear or branched), a cycloalkylene group (preferably having 3 to 15 carbon atoms), an alkenylene group (preferably having 2 to 6 carbon atoms), a divalent aliphatic heterocyclic group (preferably having a 5- to 10-membered ring, more preferably having a 5- to 7-membered ring, and still more preferably having a 5- or 6-membered ring, each having at least one of an N atom, an O atom, an S atom, or an Se atom in the ring structure), a divalent aromatic heterocyclic group (preferably having a 5- to 10-membered ring, more preferably having a 5- to 7-membered ring, and still more preferably having a 5- or 6-membered ring, each having at least one of an N atom, an O atom, an S atom, or an Se atom in the ring structure), a divalent aromatic hydrocarbon ring group (preferably having a 6- to 10-membered ring, and more preferably having a 6-membered ring), and a divalent organic group formed by combination of a plurality of these groups. Examples of R include a hydrogen atom or a monovalent organic group. The monovalent organic group is not particularly limited, but is preferably, for example, an alkyl group (preferably having 1 to 6 carbon atoms).

In addition, the alkylene group, the cycloalkylene group, the alkenylene group, the divalent aliphatic heterocyclic group, the divalent aromatic heterocyclic group, and the divalent aromatic hydrocarbon ring group may each have a substituent. Examples of the substituent include a halogen atom (preferably a fluorine atom).

As the divalent organic group represented by each of $L_{21}$ and $L_{22}$ in Formula (Ia-2) and $L_{31}$ and $L_{32}$ in Formula (Ia-3), for example, a divalent organic group represented by Formula (L2) is preferable.

(L2)

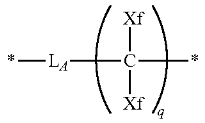

In Formula (L2), q represents an integer of 1 to 3. * represents a bonding position.

Xf's each independently represent a fluorine atom or an alkyl group substituted with at least one fluorine atom. The alkyl group preferably has 1 to 10 carbon atoms, and more preferably has 1 to 4 carbon atoms. In addition, a perfluoroalkyl group is preferable as the alkyl group substituted with at least one fluorine atom.

Xf is preferably the fluorine atom or a perfluoroalkyl group having 1 to 4 carbon atoms, and more preferably the fluorine atom or $CF_3$. In particular, it is still more preferable that both Xf's are fluorine atoms.

$L_A$ represents a single bond or a divalent linking group.

The divalent linking group represented by $L_A$ is not particularly limited, but examples thereof include —CO—, —O—, —SO—, —$SO_2$—, an alkylene group (which preferably has 1 to 6 carbon atoms and may be linear or branched), a cycloalkylene group (preferably having 3 to 15 carbon atoms), a divalent aromatic hydrocarbon ring group (preferably having a 6 to 10-membered ring, and more preferably having a 6-membered ring), and a divalent linking group formed by combination of a plurality of these groups.

In addition, the alkylene group, the cycloalkylene group, and the divalent aromatic hydrocarbon ring group may have a substituent. Examples of the substituent include a halogen atom (preferably a fluorine atom).

Examples of the divalent organic group represented by Formula (L2) include *—$CF_2$—*, *—$CF_2$—$CF_2$—*, *—$CF_2$—$CF_2$—$CF_2$—*, *-Ph-O—$SO_2$—$CF_2$—*, *-Ph-O—$SO_2$—$CF_2$—$CF_2$—*-Ph-O—$SO_2$—$CF_2$—$CF_2$—$CF_2$—*, and d*-Ph-OCO—$CF_2$—*. Furthermore, Ph is a phenylene group which may have a substituent, and is preferably a 1,4-phenylene group. The substituent is not particularly limited, but is preferably an alkyl group (for example, preferably an alkyl group having 1 to 10 carbon atoms, and more preferably an alkyl group having 1 to 6 carbon atoms), an alkoxy group (for example, preferably an alkoxy group having 1 to 10 carbon atoms, and more preferably an alkoxy group having 1 to 6 carbon atoms), or an alkoxycarbonyl group (for example, preferably an alkoxycarbonyl group having 2 to 10 carbon atoms, and more preferably an alkoxycarbonyl group having 2 to 6 carbon atoms).

In a case where $L_{21}$ and $L_{22}$ in Formula (Ia-2) represent a divalent organic group represented by Formula (L2), it is preferable that a bonding site (*) on the $L_A$ side in Formula (L2) is bonded to $A_{21a}^-$ and $A_{21b}^-$ in Formula (Ia-2).

In addition, in a case where $L_{31}$ and $L_{32}$ in Formula (Ia-3) represent a divalent organic group represented by Formula (L2), it is preferable that a bonding site (*) on the $L_A$ side in Formula (L2) is combined with $A_{31a}^-$ and $A_{32}^-$ in Formula (Ia-3).

The trivalent organic group represented by $L_{41}$ in Formula (Ia-4) is not particularly limited, but examples thereof include a trivalent organic group represented by Formula (L3).

(L3)

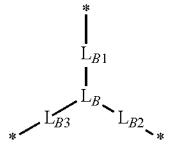

In Formula (L3), $L_B$ represents a trivalent hydrocarbon ring group or a trivalent heterocyclic group. * represents a bonding position.

The hydrocarbon ring group may be an aromatic hydrocarbon ring group or an aliphatic hydrocarbon ring group. The number of carbon atoms included in the hydrocarbon ring group is preferably 6 to 18, and more preferably 6 to 14. The heterocyclic group may be either an aromatic heterocyclic group or an aliphatic heterocyclic group. The heterocyclic ring group is preferably a 5- to 10-membered ring, more preferably a 5- to 7-membered ring, and still more preferably a 5- or 6-membered ring, each of which has at least one N atom, O atom, S atom, or Se atom in the ring structure.

As $L_B$, above all, the trivalent hydrocarbon ring group is preferable, and a benzene ring group or an adamantane ring group is more preferable. The benzene ring group or the adamantane ring group may have a substituent. The substituent is not particularly limited, but examples thereof include a halogen atom (preferably a fluorine atom).

In addition, in Formula (L3), $L_{B1}$ to $L_{B3}$ each independently represent a single bond or a divalent linking group. The divalent linking group represented by LB1 to LB3 is not particularly limited, and for example, —CO—, —NR—, —O—, —S—, —SO—, —$SO_2$—, or an alkylene group (which preferably has 1 to 6 carbon atoms, and may be linear or branched), a cycloalkylene group (preferably having 3 to 15 carbon atoms), an alkenylene group (preferably having 2 to 6 carbon atoms), a divalent aliphatic heterocyclic group (preferably having a 5- to 10-membered ring, more preferably having a 5- to 7-membered ring, and still more preferably having a 5- or 6-membered ring, each having at least one of an N atom, an O atom, an S atom, or an Se atom in the ring structure), a divalent aromatic heterocyclic group (preferably having a 5- to 10-membered ring, more preferably having a 5- to 7-membered ring, and still more preferably having a 5- or 6-membered ring, each having at least one of an N atom, an O atom, an S atom, or an Se atom in the ring structure), a divalent aromatic hydrocarbon ring group (preferably having a 6- to 10-membered ring, and more preferably having a 6-membered ring), and a divalent linking group formed by combination of a plurality of these groups. Examples of R include a hydrogen atom or a monovalent organic group. The monovalent organic group is not particularly limited, but is preferably, for example, an alkyl group (preferably having 1 to 6 carbon atoms).

In addition, the alkylene group, the cycloalkylene group, the alkenylene group, the divalent aliphatic heterocyclic group, the divalent aromatic heterocyclic group, and the divalent aromatic hydrocarbon ring group may each have a substituent. Examples of the substituent include a halogen atom (preferably a fluorine atom).

As the divalent linking group represented by each of $L_{B1}$ to $L_{B3}$, among those, —CO—, —NR—, —O—, —S—, —SO—, —$SO_2$—, the alkylene group which may have a substituent, and the divalent linking group formed by combination of these groups are preferable.

As the divalent linking group represented by each of $L_{B1}$ to $L_{B3}$, the divalent linking group represented by Formula (L3-1) is more preferable.

(L3-1)

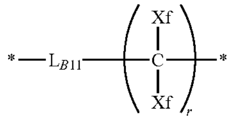

In Formula (L3-1), $L_{B11}$ represents a single bond or a divalent linking group.

The divalent linking group represented by $L_{B11}$ is not particularly limited, but examples thereof include —CO—, —O—, —SO—, —$SO_2$—, an alkylene group (which preferably has 1 to 6 carbon atoms, and may be linear or branched) which may have a substituent, and a divalent linking group formed by combination of a plurality of these groups. The substituent is not particularly limited, but examples thereof include a halogen atom.

r represents an integer of 1 to 3.

Xf has the same definition as Xf in Formula (L2) mentioned above, and suitable aspects thereof are also the same.

* represents a bonding position.

Examples of the divalent linking groups represented by each of $L_{B1}$ to $L_{B3}$ include *—O—*, *—O—$SO_2CF_2$—*, *—O—$SO_2$—$CF_2$—$CF_2$—*, *—O—$SO_2$—$CF_2$—$CF_2$—$CF_2$—*, and *—COO—$CH_2$—$CH_2$—*.

In a case where $L_{41}$ in Formula (Ia-4) includes a divalent organic group represented by Formula (L3-1), and the divalent organic group represented by Formula (L3-1) and $A_{42}^-$ are bonded to each other, it is preferable that the bonding site (*) on the carbon atom side specified in Formula (L3-1) is bonded to $A_{42}^-$ in Formula (Ia-4).

Next, a compound represented by Formula (Ia-5) will be described.

(Ia-5)

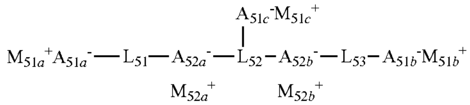

In Formula (Ia-5), $A_{51a}^-$, $A_{51b}^-$, and $A_{51c}^-$ each independently represent a monovalent anionic functional group. Here, the monovalent anionic functional group represented by each of $A_{51a}^-$, $A_{51b}^-$, and $A_{51c}^-$ is intended to be a monovalent group including the above-mentioned anionic site $A_1^-$. The monovalent anionic functional group represented by each of $A_{51a}^-$, $A_{51b}^-$, and $A_{51c}^-$ is not particularly limited, but examples thereof include a monovalent anionic functional group selected from the group consisting of Formulae (AX-1) to (AX-3) mentioned above.

$A_{52a}^-$ and $A_{51b}^-$ each represent a divalent anionic functional group. Here, the divalent anionic functional group represented by each of $A_{52a}^-$ and $A_{52b}^-$ is intended to be a divalent group including the above-mentioned anionic site $A_2^-$. Examples of the divalent anionic functional group represented by $A_{22}^-$ include a divalent anionic functional group selected from the group consisting of Formulae (BX-8) to (BX-11) mentioned above.

$M_{51a}^+$, $M_{52b}^+$, $M_{51c}^+$, $M_{52a}^+$, and $M_{52b}^+$ each independently represent an organic cation. The organic cation represented by each of $M_{51a}^+$, $M_{51b}^+$, $M_{51c}^+$, $M_{52a}^+$, and $M_{52b}^+$ has the same definition as the above-mentioned $M_1^-$, and suitable aspects thereof are also the same.

$L_{51}$ and $L_{53}$ each independently represent a divalent organic group. The divalent organic group represented by each of $L_{51}$ and $L_{53}$ has the same definition as $L_{21}$ and $L_{22}$ in Formula (Ia-2) mentioned above, and suitable aspects thereof are also the same.

$L_{52}$ represents a trivalent organic group. The trivalent organic group represented by $L_{52}$ has the same definition as $L_{41}$ in Formula (Ia-4) mentioned above, and suitable aspects thereof are also the same.

In addition, in the compound PIa-5 formed by substituting an organic cation represented by each of $M_{51a}^+$, $M_{51b}^+$, $M_{51c}^+$, $M_{52a}^+$, and $M_{52b}^+$ with $H^+$ in Formula (Ia-5), the acid dissociation constant a2-1 derived from the acidic site represented by $A_{52a}H$ and the acid dissociation constant a2-2 derived from the acidic site represented by $A_{52b}H$ are larger than the acid dissociation constant a1-1 derived from the acidic site represented by $A_{51a}H$, the acid dissociation constant a1-2 derived from the acidic site represented by $A_{51b}H$, and the acid dissociation constant a1-3 derived from the acidic site represented by $A_{51c}H$. Incidentally, the acid dissociation constants a1-1 to a1-3 correspond to the above-mentioned acid dissociation constant a1, and the acid dissociation constants a2-1 and a2-2 correspond to the above-mentioned acid dissociation constant a2.

Furthermore, $A_{51a}^-$, $A_{51b}^-$, and $A_{51c}^-$ may be the same as or different from each other. Moreover, $A_{52a}^-$ and $A_{52b}^-$ may be the same as or different from each other. In addition, $M_{51a}^+$, $M_{51b}^+$, $M_{51c}^+$, $M_{52a}^+$, and $M_{52b}^+$ may be the same as or different from each other.

Moreover, at least one of $M_{51b}$, $M_{51c}^+$, $M_{52a}^+$, $M_{52b}^+$, $A_{51a}^-$, $A_{51b}^-$, $A_{51c}^-$, $L_{51}$, $L_{52}$, or $L_{53}$ may have an acid-decomposable group as a substituent.

Compound (II)

The compound (II) is an acid generating compound, including a compound having two or more of the structural sites X and one or more of the following structural sites Z, in which the compound generates an acid including the two or more first acidic sites derived from the structural site X and the structural sites Z upon irradiation with actinic rays or radiation.

Structural site Z: a nonionic site capable of neutralizing an acid.

In the compound (II), the definition of the structural site X and the definitions of $A_1^-$ and $M_1^+$ are the same as the definition of the structural site X in the compound (I), and the definitions of $A_1^-$ and $M_1^+$, each mentioned above, and suitable aspects thereof are also the same.

In the compound PII formed by substituting the cationic site $M_1^+$ in the structural site X with $H^+$ in the compound (II), a suitable range of the acid dissociation constant a1 derived from the acidic site represented by $HA_1$, formed by substituting the cationic site $M_1^+$ in the structural site X with $H^+$, is the same as the acid dissociation constant a1 in the compound PI.

Furthermore, in a case where the compound (II) is, for example, a compound that generates an acid having two sites of the first acidic site derived from the structural site X and the structural site Z, the compound PII corresponds to a "compound having two $HA_1$'s". In a case where the acid dissociation constant of the compound PII was determined, the acid dissociation constant in a case where the compound PII serves as a "compound having one $A_1^-$ and one $HA_1$" and the acid dissociation constant in a case where the "compound having one $A_1^-$ and one $HA_1$" serves as a "compound having two $A_1^-$'s" correspond to the acid dissociation constant a1.

The acid dissociation constant a1 is determined by the above-mentioned method for measuring an acid dissociation constant.

The compound PII corresponds to an acid generated upon irradiating the compound (II) with actinic rays or radiation.

Furthermore, two or more sites of the structural site X may be the same as or different from each other. In addition, two or more $A_1^-$'s and two or more $M_1^+$'s may be the same as or different from each other.

The nonionic site capable of neutralizing an acid in the structural site Z is not particularly limited, and is preferably, for example, a site including a functional group having a group or electron which is capable of electrostatically interacting with a proton.

Examples of the functional group having a group or electron capable of electrostatically interacting with a proton include a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following formula.

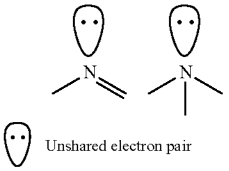

Examples of the partial structure of the functional group having a group or electron capable of electrostatically interacting with a proton include a crown ether structure, an azacrown ether structure, primary to tertiary amine structures, a pyridine structure, an imidazole structure, and a pyrazine structure, and among these, the primary to tertiary amine structures are preferable.

The compound (II) is not particularly limited, but examples thereof include compounds represented by Formula (IIa-1) and Formula (IIa-2).

(IIa-1)

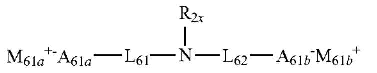

(IIa-2)

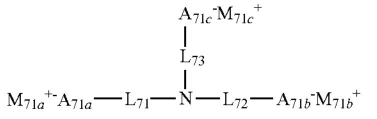

In Formula (IIa-1), $A_{61a}^-$ and $A_{61b}^-$ each have the same definition as $A_{11}^-$ in Formula (Ia-1) mentioned above, and suitable aspects thereof are also the same. In addition, $M_{61a}^+$ and $M_{61b}^+$ each have the same definition as $M_{11}^+$ in Formula (Ia-1) mentioned above, and suitable aspects thereof are also the same.

In Formula (IIa-1), $L_{61}$ and $L_{62}$ each have the same definition as $L_1$ in Formula (Ia-1) mentioned above, and suitable aspects thereof are also the same.

In Formula (IIa-1), $R_{2X}$ represents a monovalent organic group. The monovalent organic group represented by $R_{2X}$ is not particularly limited, but examples thereof include an alkyl group (which preferably has 1 to 10 carbon atoms, and may be linear or branched), a cycloalkyl group (preferably having 3 to 15 carbon atoms), and an alkenyl group (preferably having 2 to 6 carbon atoms), in which $-CH_2-$ may be substituted with one or a combination of two or more selected from the group consisting of $-CO-$, $-NH-$, $-O-$, $-S-$, $-SO-$, and $-SO_2-$.

In addition, the alkylene group, the cycloalkylene group, and the alkenylene group may have a substituent. The substituent is not particularly limited, but examples thereof include a halogen atom (preferably a fluorine atom).

In addition, in the compound PIIa-1 formed by substituting an organic cation represented by $M_{61a}^+$ and $M_{61b}^+$ with $H^+$ in Formula (IIa-1), the acid dissociation constant a1-7 derived from the acidic site represented by $A_{61a}H$ and the acid dissociation constant a1-8 derived from the acidic site represented by $A_{61b}H$ correspond to the above-mentioned acid dissociation constant a1.

Furthermore, the compound PIIa-1 formed by substituting the cationic sites $M_{61a}^+$ and $M_{61b}^+$ in the structural site X with $H^+$ in the compound (IIa-1) corresponds to $HA_{61a}$-$L_{61}$-$N(R_{2X})$-$L_{62}$-$A_{61b}H$. In addition, the acids generated from the compound PIIa-1 and the compound represented by Formula (IIa-1) upon irradiation with actinic rays or radiation are the same.

Moreover, at least one of $M_{61a}^+$, $M_{61b}^+$, $A_{61a}^-$, $A_{61b}^-$, $L_{61}$, $L_{62}$, or $R_{2X}$ may have an acid-decomposable group as a substituent.

In Formula (IIa-2), $A_{71a}^-$, $A_{71b}^-$, and $A_{71c}^-$ each have the same definition as $A_{11}^-$ in Formula (Ia-1) mentioned above, and suitable aspects thereof are also the same. In addition, $M_{71a}^+$, $M_{71b}^+$, and $M_{71c}^+$ each have the same definition as $M_{11}^+$ in Formula (Ia-1) mentioned above, and suitable aspects thereof are also the same.

In Formula (IIa-2), $L_{71}$, $L_{72}$, and $L_{73}$ each have the same definition as $L_1$ in Formula (Ia-1) mentioned above, and suitable aspects thereof are also the same.

In addition, in the compound PIIa-2 formed by substituting an organic cation represented by $M_{71a}^+$, $M_{71b}^+$, and $M_{71c}^+$ with $H^+$ in Formula (IIa-2), the acid dissociation constant a1-9 derived from the acidic site represented by $A_{71a}H$, the acid dissociation constant a1-10 derived from the acidic site represented by $A_{71b}H$, and the acid dissociation constant a1-11 derived from the acidic site represented by $A_{71c}H$ correspond to the above-mentioned acid dissociation constant a1.

Furthermore, the compound PIIa-2 formed by substituting the cationic sites $M_{71a}^+$, $M_{71b}^+$, and $M_{71c}^+$ in the structural site X with $H^+$ in the compound (IIa-1) corresponds to $HA_{71a}$-$L_{71}$-$N(L_{73}$-$A_{71c}H)$-$L_{72}$-$A_{71b}H$. In addition, the acids generated from the compound PIIa-2 and the compound represented by Formula (IIa-2) upon irradiation with actinic rays or radiation are the same.

Moreover, at least one of $M_{71a}^+$, $M_{71b}^+$, $M_{71c}^+$, $A_{71a}^-$, $A_{71b}^-$, $A_{71c}^-$, $L_{71}$, $L_{72}$, or $L_{73}$ may have an acid-decomposable group as a substituent.

In addition, the photoacid generator which is an onium salt is a compound having two or more of the following structural sites X, which may be compound generates two acidic sites derived from the following structural sites X upon irradiation with actinic rays or radiation.

Structural site X: a structural site which consists of an anionic site $A_1^-$ and a cationic site $M_1^+$, and forms an acidic site represented by $HA_1$ upon irradiation with actinic rays or radiation Two or more sites of the structural site X may be the same as or different from each other. In addition, two or more $A_1^-$'s and two or more $M_1^+$'s may be the same as or different from each other.

The definition of the structural site X and the definitions of $A_1^-$ and $M_1^+$ are the same as the definition of the structural site X in the compound (1), and the definitions of $A_1^-$ and $M_1^+$, each mentioned above, and suitable aspects thereof are also the same.

The organic cations and the other sites shown below can be appropriately combined and used as a specific salt which is an onium salt.

First, the organic cation will be exemplified.

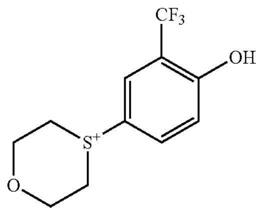

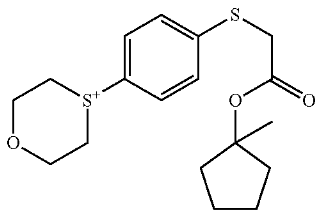

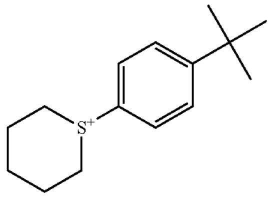

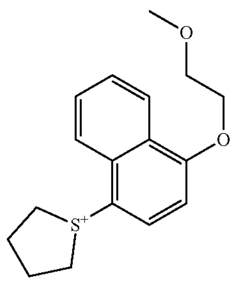
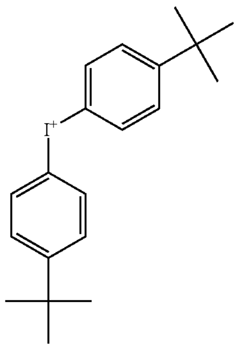

-continued
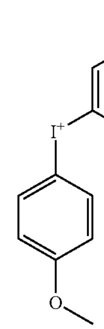
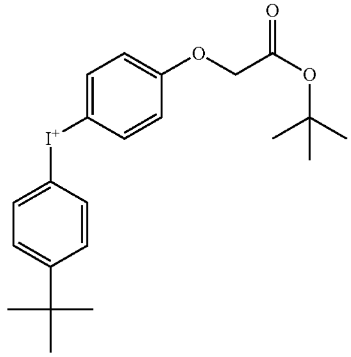
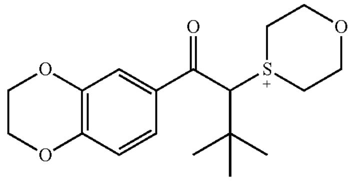
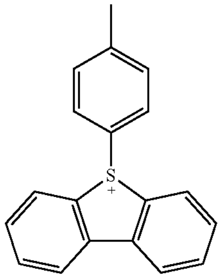
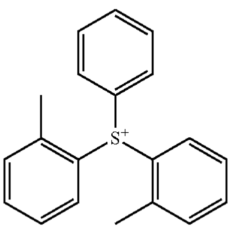
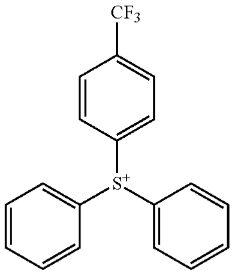
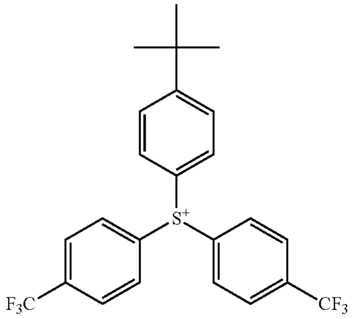
-continued
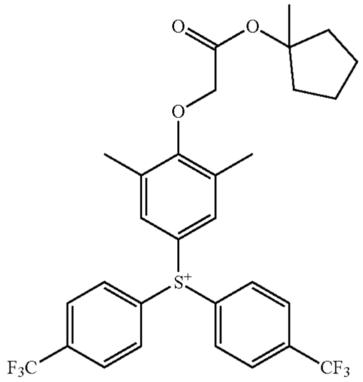
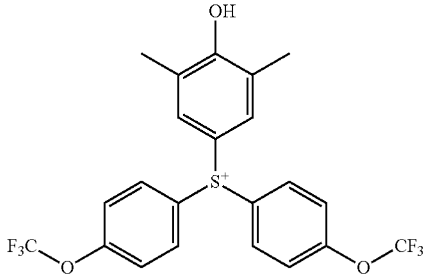
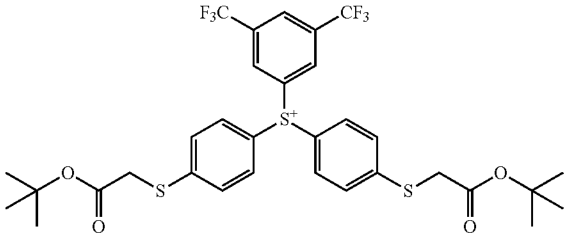
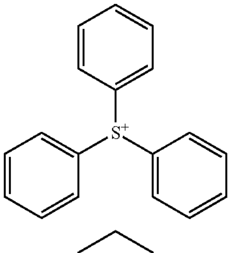
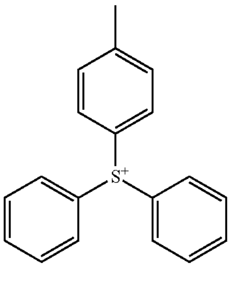
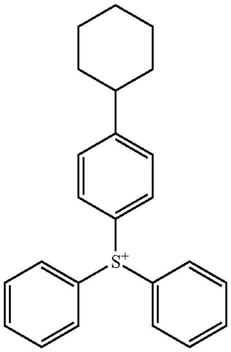
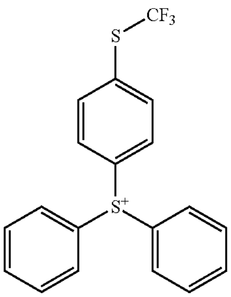

-continued
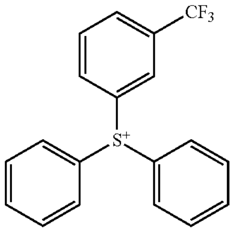
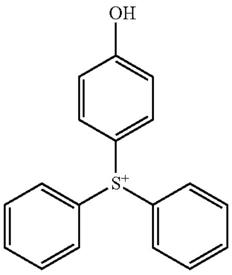
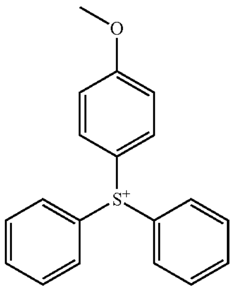
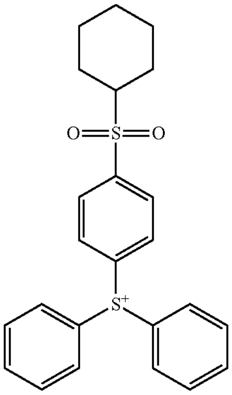
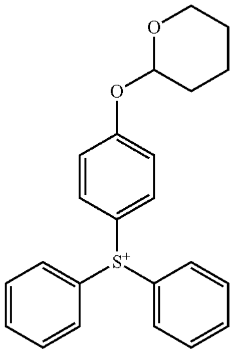
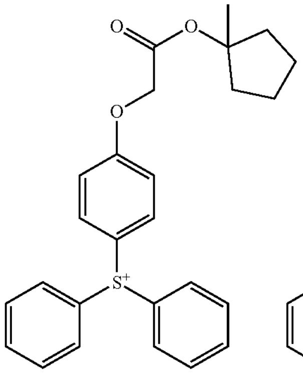
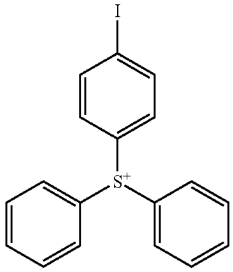
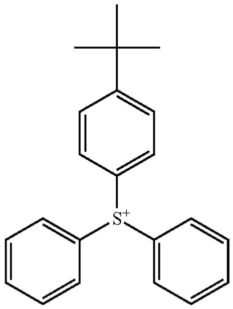
-continued
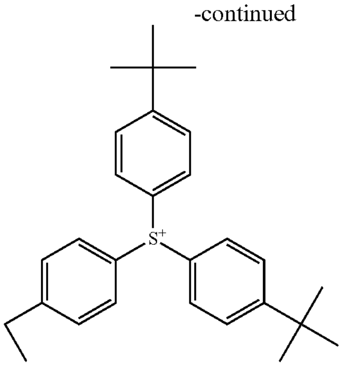
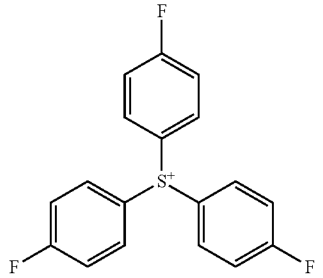
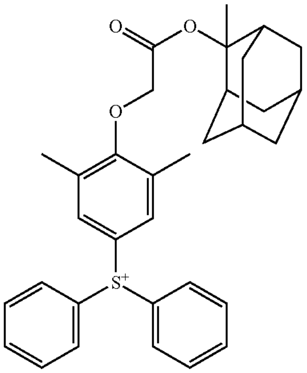
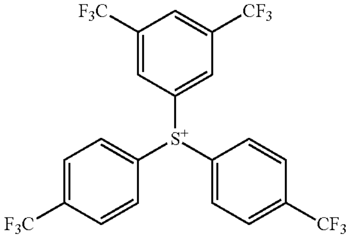
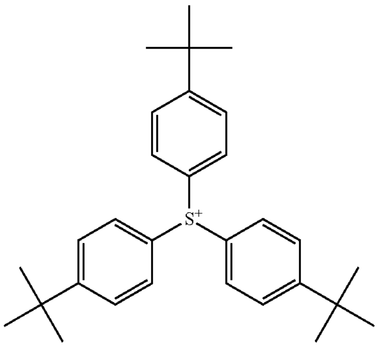
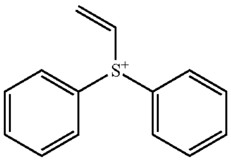

-continued
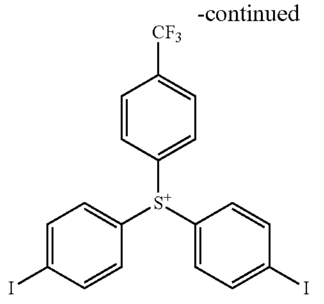
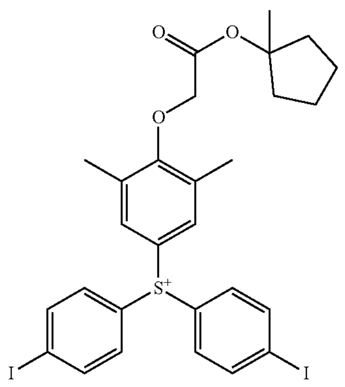
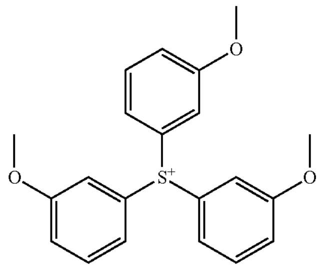
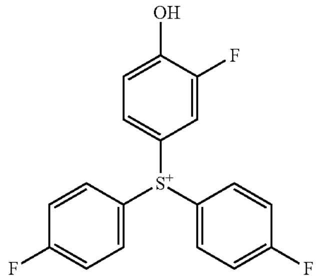
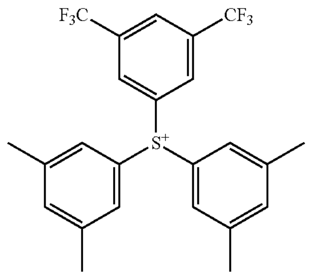
-continued
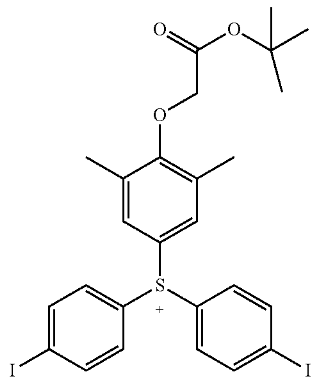
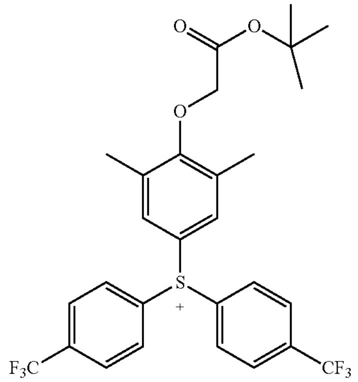
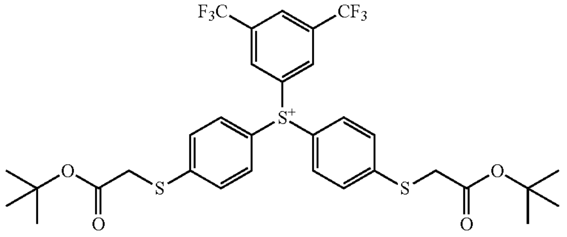
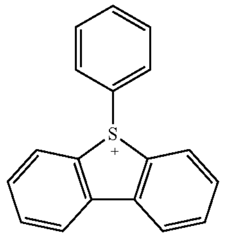
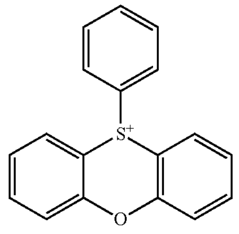
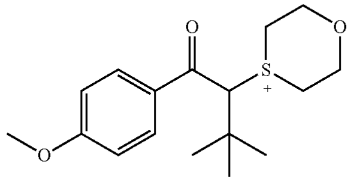
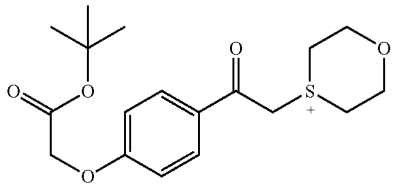

-continued
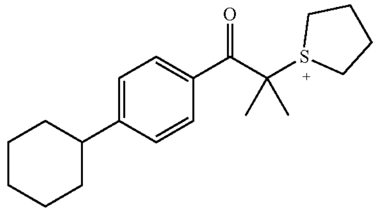
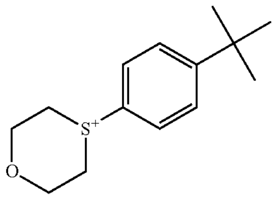
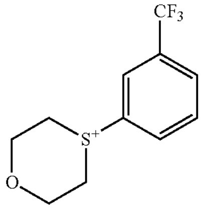
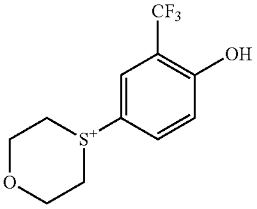
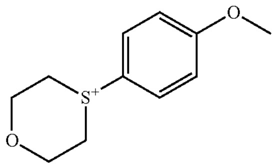
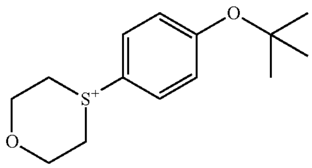
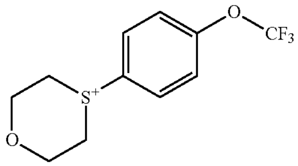
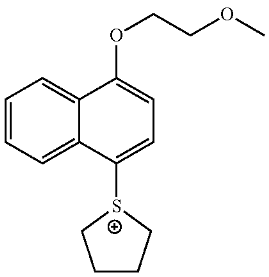
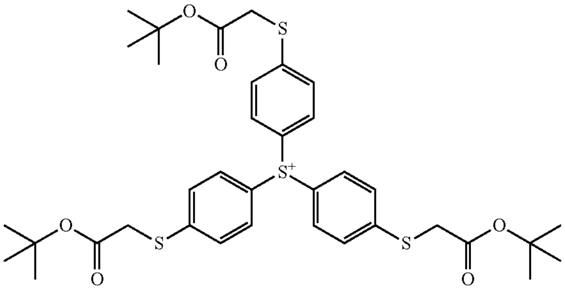
-continued
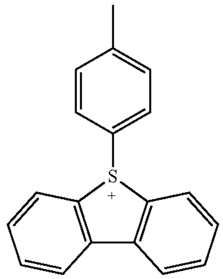
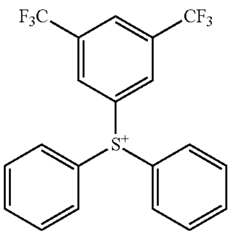
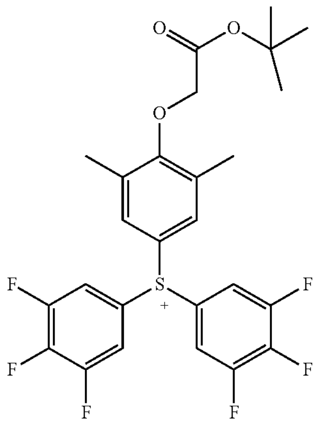
Next, a site (organic anion) other than the organic cation will be exemplified.
The numerical value shown in the vicinity of the anionic functional group in the following organic anions is a pKa of an acid group formed by bonding hydrogen to each anionic functional group.
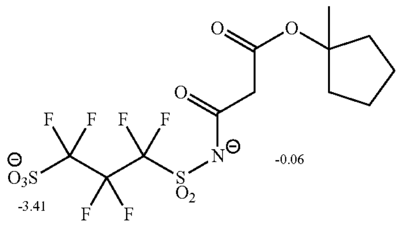
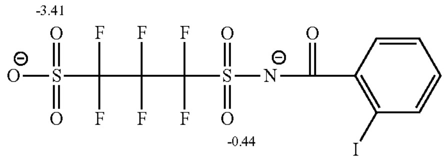

-continued
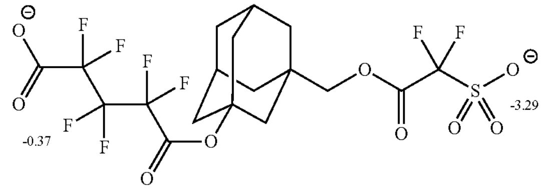
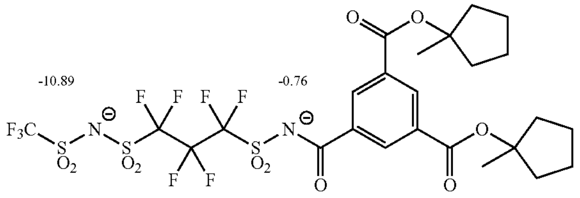
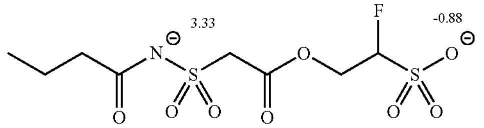
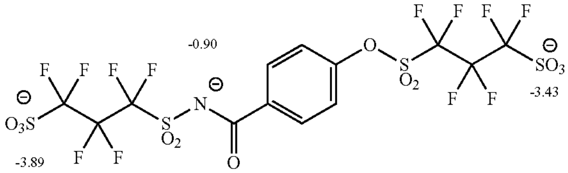
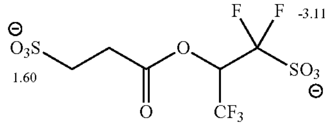
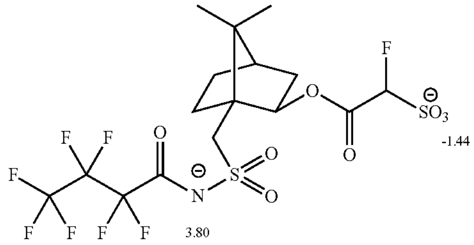
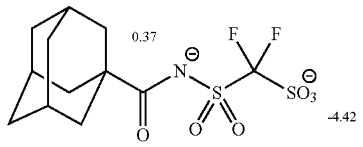
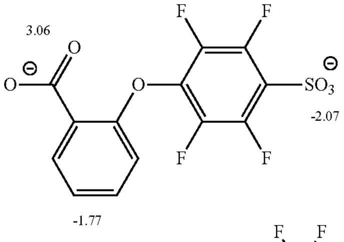
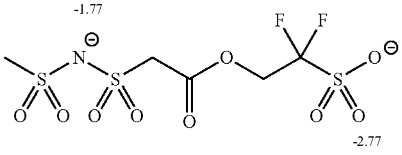
-continued
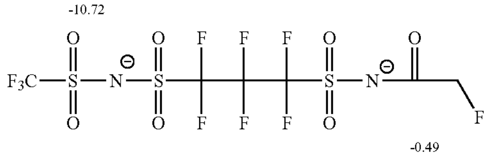
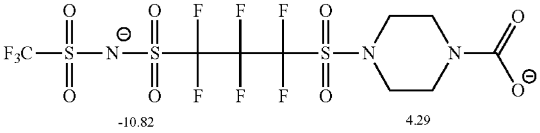
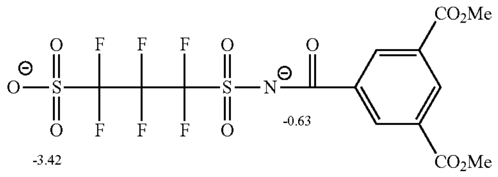
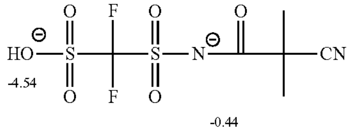
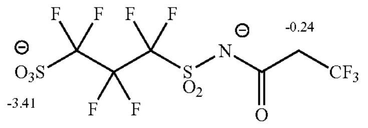
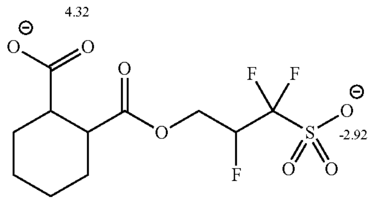
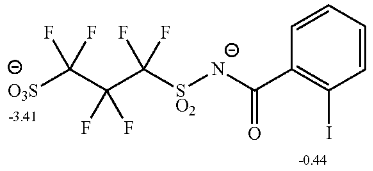
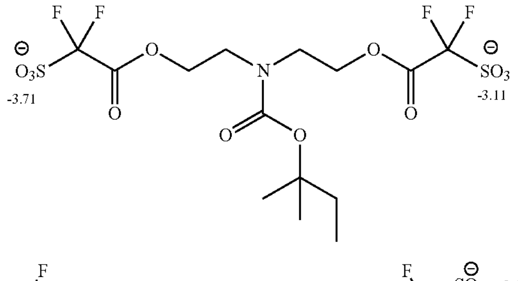
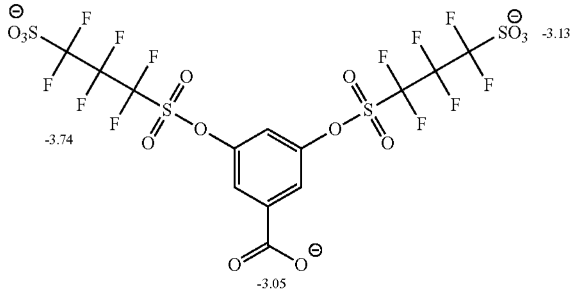

-continued
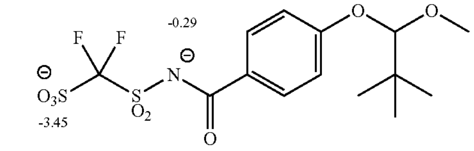
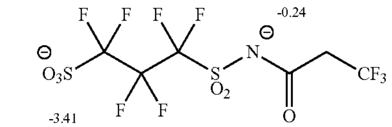
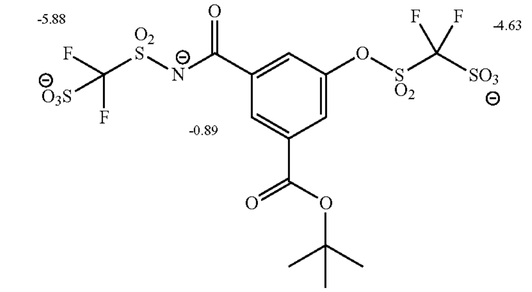
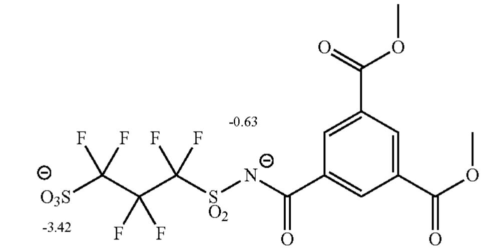
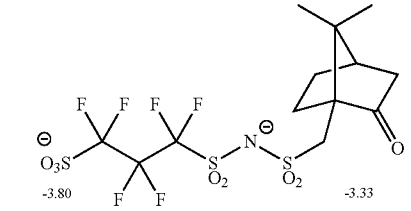
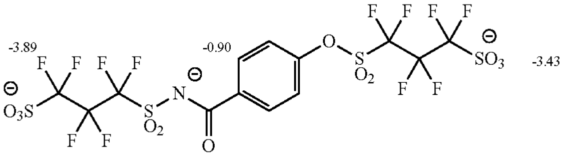
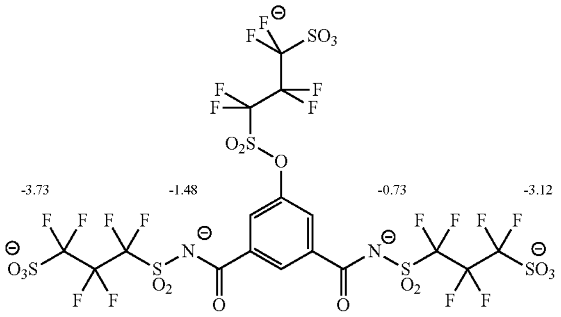
-continued
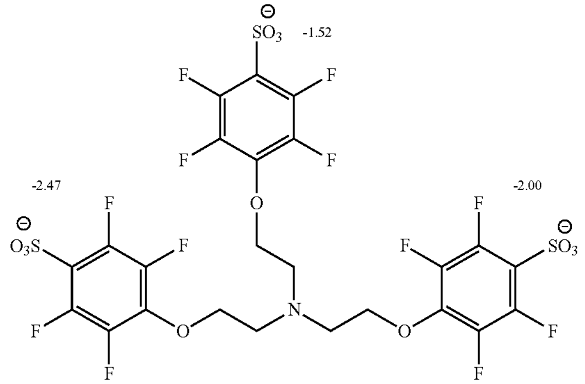
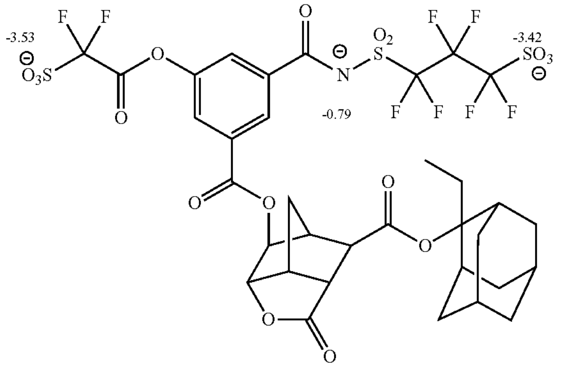
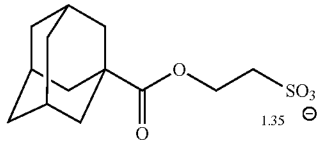
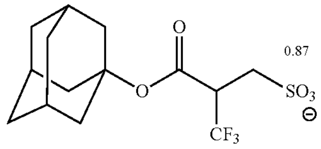
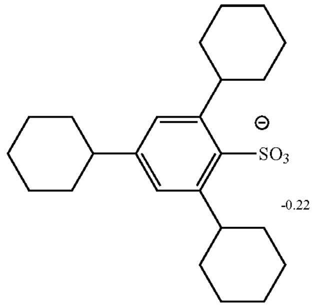
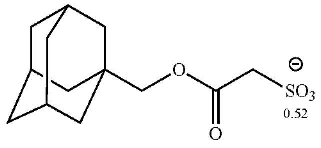
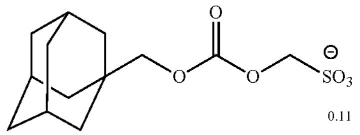

-continued
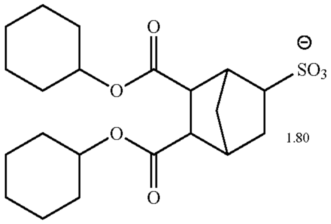
1.80
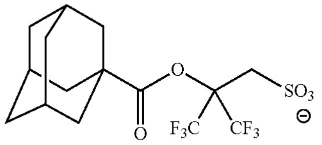
0.06
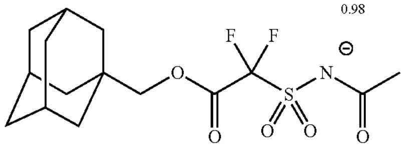
0.98
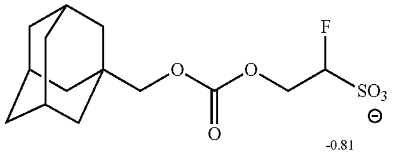
-0.81
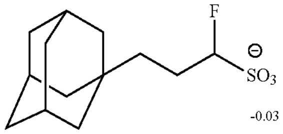
-0.03
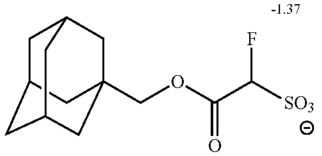
-1.37
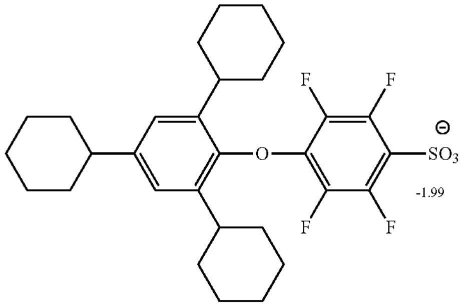
-1.99
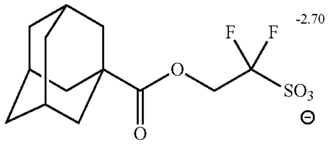
-2.70
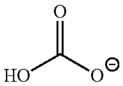
1.35
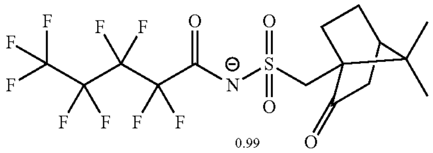
0.99
-continued
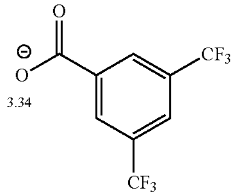
3.34
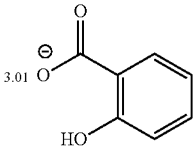
3.01
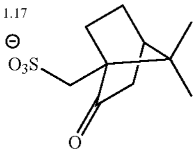
1.17
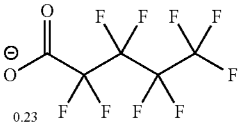
0.23
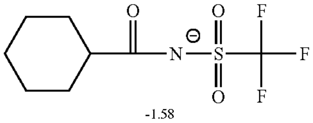
-1.58
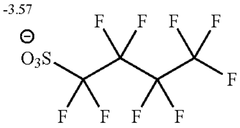
-3.57
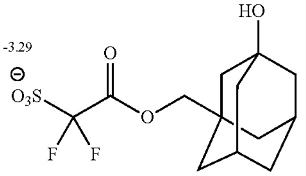
-3.29
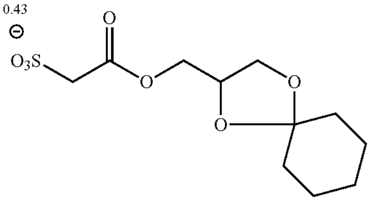
0.43
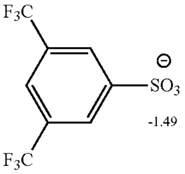
-1.49
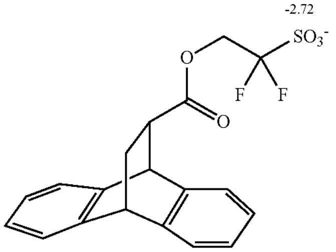
-2.72
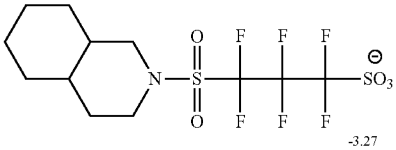
-3.27

-continued

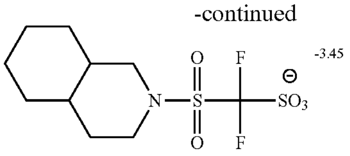

(Specific Salt which is Intramolecular Salt)

The specific salt which is an intramolecular salt preferably has a sulfonate anion or a carboxylate anion (preferably an aromatic sulfonate or aromatic carboxylate anion), and more preferably has a sulfonium cation or an iodine cation.

Examples of the specific salt which is an intramolecular salt include a compound (ZbI) and a compound (ZbII).

The compound (ZbI) is a compound represented by a newly defined general formula, that is, General Formula (ZaI) in which one of $R^{201}$ to $R^{203}$ is an aryl group having a group including —$SO_3^-$ or —$COO^-$ as a substituent.

The compound (ZbII) is a compound represented by a newly defined general formula, that is, General Formula (ZaII) in which one of $R^{204}$ and $R^{205}$ is an aryl group having a group including —$SO_3^-$ or —$COO^-$ as a substituent.

Examples of the group including —$SO_3^-$ or —$COO^-$ in the compound (ZbI) and the compound (ZbII) include a group (a group represented by "AX-$[C(Xf)(Xf)]_o$—$[C(R_4)(R_5)]_p$-$(L)_q$-") obtained by removing W from the organic anion represented by Formula (AN) shown in the description of the organic anion.

The specific salt which is an intramolecular salt are exemplified.

In the following specific salts, the numerical value shown in the vicinity of a site (anionic functional group) in which a hydrogen atom of an acid group is substituted with a cation represents a pKa of the acid group assuming that the hydrogen atom is not substituted with the cation.

In other words, the pKa shown below is a pKa of an acid group (a group formed by bonding an anionic functional group to a hydrogen atom) in a compound (acid) assuming that an anionic functional group of an intramolecular salt is bonded to a hydrogen atom.

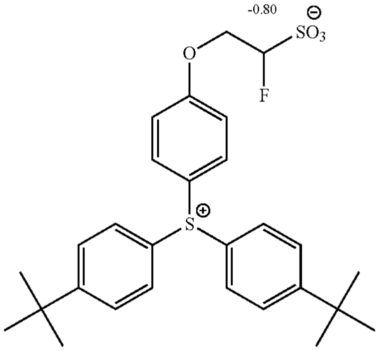

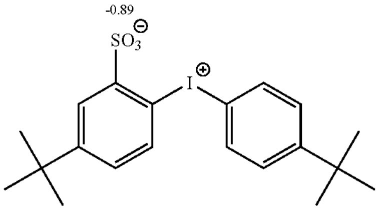

In the resist composition, the content of the additive B is preferably 1% to 99% by mass, more preferably 3% to 90% by mass, and still more preferably 5% to 80% by mass by mass with respect to the total solid content of the composition.

In addition, the additive B may be used alone or in combination of two or more kinds thereof. In a case where two or more kinds of such other photoacid generators are used, a total content thereof is preferably within the suitable content range.

[Hydrophobic Resin]

The resist composition may include a hydrophobic resin different from the resin A, in addition to the resin A.

Although it is preferable that the hydrophobic resin is designed to be unevenly distributed on a surface of the resist film, it does not necessarily need to have a hydrophilic group in the molecule as different from the surfactant, and does not need to contribute to uniform mixing of polar materials and non-polar materials.

Examples of the effect caused by the addition of the hydrophobic resin include a control of static and dynamic contact angles of a surface of the resist film with respect to water and suppression of out gas.

The hydrophobic resin preferably has any one or more of a "fluorine atom", a "silicon atom", and a "$CH_3$ partial structure which is contained in a side chain moiety of a resin" from the viewpoint of uneven distribution on the film surface layer, and more preferably has two or more kinds thereof. In addition, the hydrophobic resin preferably has a hydrocarbon group having 5 or more carbon atoms. These groups may be contained in the main chain of the resin or may be substituted in a side chain.

Examples of the hydrophobic resin include the compounds described in paragraphs [0275] to [0279] of WO2020/004306A.

In a case where the resist composition includes a hydrophobic resin, the content of the hydrophobic resin is preferably 0.01% to 20% by mass, more preferably 0.1% to 15% by mass, still more preferably 0.1% to 10% by mass, and particularly preferably 0.1% to 8.0% by mass with respect to the total solid content of the resist composition.

The hydrophobic resins may be used alone or in combination of two or more kinds thereof. In a case where two or more kinds of such other photoacid generators are used, a total content thereof is preferably within the suitable content range.

[Surfactant]

The resist composition may include a surfactant. In a case where the surfactant is included, it is possible to form a pattern having more excellent adhesiveness and fewer development defects.

The surfactant is preferably a fluorine-based and/or silicon-based surfactant.

As the fluorine-based and/or silicon-based surfactant, for example, the surfactants disclosed in paragraphs [0218] and [0219] of WO2018/19395A can be used.

In a case where the resist composition includes a surfactant, the content of the surfactant is preferably 0.0001% to 2% by mass, and more preferably 0.0005% to 1% by mass with respect to the total solid content of the composition.

The surfactants may be used alone or in combination of two or more kinds thereof.

In a case where two or more kinds of such other photoacid generators are used, a total content thereof is preferably within the suitable content range.

[Other Additives]

The resist composition may include other additives as a component different from the above-mentioned components.

Examples of such other additives include a basic compound (CA) and a low-molecular-weight compound (CD) having a nitrogen atom and having a group which leaves by the action of an acid.

Specific examples of the basic compound (CA) include those described in paragraphs [0132] to [0136] of WO2020/066824A.

Specific examples of the low-molecular-weight compound (CD) having a nitrogen atom and a group which leaves by the action of an acid include those described in paragraphs [0156] to [0163] of WO2020/066824A.

In a case where the resist composition includes such other additives, the content of such additives is preferably 0.1% to 40% by mass, more preferably 0.1% to 30% by mass, and still more preferably 0.4% to 25% by mass with respect to the total solid content of the composition.

The acid diffusion control agents may be used alone or in combination of two or more kinds thereof. In a case where two or more kinds of such other photoacid generators are used, a total content thereof is preferably within the suitable content range.

[Solvent]

The resist composition may include a solvent.

The solvent preferably includes at least one solvent of (M1) propylene glycol monoalkyl ether carboxylate, or (M2) at least one selected from the group consisting of a propylene glycol monoalkyl ether, a lactic acid ester, an acetic acid ester, an alkoxypropionic acid ester, a chain ketone, a cyclic ketone, a lactone, and an alkylene carbonate as a solvent. Furthermore, this solvent may further include components other than the components (M1) and (M2).

The present inventors have found that by using such a solvent and the above-mentioned resin in combination, a pattern having a small number of development defects can be formed while improving the coating property of the composition. A reason thereof is not necessarily clear, but the present inventors have considered that since these solvents have a good balance among the solubility, the boiling point, and the viscosity of the resin, the unevenness of the film thickness of a composition film, the generation of precipitates during spin coating, and the like can be suppressed.

Details of the component (M1) and the component (M2) are described in paragraphs [0218] to [0226] of WO2020/004306A.

In a case where the solvent further includes a component other than the components (M1) and (M2), the content of the component other than the components (M1) and (M2) is preferably 5% to 30% by mass with respect to the total amount of the solvent.

The content of the solvent in the resist composition is preferably set so that the concentration of solid contents is 30% by mass or less, more preferably set so that the concentration of solid contents is 10% by mass or less, and more preferably set so that the concentration of solid contents is 2% by mass or less. The lower limit thereof is preferably set to 0.05% by mass or more, more preferably set to 0.1% by mass or more, and still more preferably set to 0.5% by mass or more.

With this content, the coating property of the resist composition can be further improved.

In other words, the content of the solvent in the resist composition is preferably 70% to 99.95% by mass, more preferably 90% to 99.9% by mass, and still more preferably 98% to 99.5% by mass with respect to the total mass of the composition.

The solvents may be used alone or in combination of two or more kinds thereof. In a case where two or more kinds of such other photoacid generators are used, a total content thereof is preferably within the suitable content range.

Furthermore, the solid content means all the components excluding the solvent.

[Other Additives]

The resist composition may further include a dissolution inhibiting compound, a dye, a plasticizer, a photosensitizer, a light absorber, and/or a compound accelerating a solubility in a developer (an alicyclic or aliphatic compound including a carboxylic acid group), or the like.

The resist composition may further include a dissolution inhibiting compound. Here, the “dissolution inhibiting compound” is intended to be a compound having a molecular weight of 3,000 or less, having a solubility in an organic developer decreases by decomposition by the action of an acid.

The resist composition of the embodiment of the present invention is also suitably used as a photosensitive composition for EUV light.

EUV light has a wavelength of 13.5 nm, which is a shorter wavelength than that of ArF (wavelength of 193 nm) light or the like, and therefore, the EUV light has a smaller number of incidence photons upon exposure with the same sensitivity. Thus, an effect of “photon shot noise” that the number of photons is statistically non-uniform is significant, and a deterioration in LER and a bridge defect are caused. In order to reduce the photon shot noise, a method in which an exposure amount increases to cause an increase in the number of incidence photons is available, but the method is a trade-off with a demand for a higher sensitivity.

In a case where the A value obtained by Formula (1) is high, the absorption efficiency of EUV light and electron beam of the resist film formed from the resist composition is higher, which is effective in reducing the photon shot noise. The A value represents the absorption efficiency of EUV light and electron beams of the resist film in terms of a mass proportion.

$$A=([H]\times0.04+[C]\times1.0+[N]\times2.1+[O]\times3.6+[F]\times5.6+[S]\times1.5+[I]\times39.5)/([H]\times1+[C]\times12+[N]\times14+[O]\times16+[F]\times19+[S]\times32+[I]\times127) \quad \text{Formula (1):}$$

The A value is preferably 0.120 or more. The upper limit is not particularly limited, but in a case where the A value is extremely high, the transmittance of EUV light and electron beams of the resist film is lowered and the optical image profile in the resist film is deteriorated, which results in difficulty in obtaining a good pattern shape, and therefore, the upper limit is preferably 0.240 or less, and more preferably 0.220 or less.

Moreover, in Formula (1), [H] represents a molar ratio of hydrogen atoms derived from the total solid content with respect to all the atoms of the total solid content in the actinic ray-sensitive or radiation-sensitive resin composition, [C] represents a molar ratio of carbon atoms derived from the total solid content with respect to all the atoms of the total solid content in the actinic ray-sensitive or radiation-sensitive resin composition, [N] represents a molar ratio of nitrogen atoms derived from the total solid content with respect to all the atoms of the total solid content in the actinic ray-sensitive or radiation-sensitive resin composition, [O] represents a molar ratio of oxygen atoms derived from the total solid content with respect to all the atoms of the total solid content in the actinic ray-sensitive or radiation-sensitive resin composition, [F] represents a molar ratio of fluorine atoms derived from the total solid content with respect to all the atoms of the total solid content in the actinic ray-sensitive or radiation-sensitive resin composition, [S] represents a molar ratio of sulfur atoms derived from the total solid content with respect to all the atoms of the total solid content in the actinic ray-sensitive or radiation-sensitive resin composition, and [I] represents a molar ratio of iodine atoms derived from the total solid content with respect to all the atoms of the total solid content in the actinic ray-sensitive or radiation-sensitive resin composition.

For example, in a case where the resist composition includes the resin A, the additive B, and the solvent, the resin A and the additive B correspond to a solid content. That is, the total atoms of the total solid content correspond to a total of all the atoms derived from the resin A and all the atoms derived from the additive B. For example, [H] represents a molar ratio of hydrogen atoms derived from the total solid content with respect to all the atoms in the total solid content, and by way of description based on the example above, [H] represents a molar ratio of a sum of the hydrogen atoms derived from the resin A and the hydrogen atoms derived from the additive B with respect to a sum of all the atoms derived from the resin A and all the atoms derived from the additive B.

The A value can be calculated by computation of the structure of constituent components of the total solid content in the resist composition, and the atomic number ratio contained in a case where the content is already known. In addition, even in a case where the constituent component is not known yet, it is possible to calculate a constituent atomic number ratio by subjecting a resist film obtained after evaporating the solvent components of the resist composition to computation according to an analytic approach such as elemental analysis.

[Resist Film and Pattern Forming Method]

The procedure of the pattern forming method using the resist composition is not particularly limited, but preferably has the following steps.

Step 1: A step of forming a resist film on a substrate, using a resist composition Step 2: A step of exposing the resist film Step 3: A step of developing the exposed resist film using a developer Hereinafter, the procedure of each of the steps will be described in detail.

<Step 1: Resist Film Forming Step>

The step 1 is a step of forming a resist film on a substrate, using a resist composition.

The definition of the resist composition is as described above.

Examples of a method in which a resist film is formed on a substrate, using a resist composition include a method in which a resist composition is applied onto a substrate.

Incidentally, it is preferable that the resist composition before the application is filtered through a filter, as necessary. A pore size of the filter is preferably 0.1 μm or less, more preferably 0.05 μm or less, and still more preferably 0.03 μm or less. In addition, the filter is preferably a polytetrafluoroethylene-, polyethylene-, or nylon-made filter.

The resist composition can be applied onto a substrate (for example, silicon and silicon dioxide coating) as used in the manufacture of integrated circuit elements by a suitable application method such as ones using a spinner or a coater. The application method is preferably spin application using a spinner. A rotation speed upon the spin application using a spinner is preferably 1,000 to 3,000 rpm.

After the application of the resist composition, the substrate may be dried to form a resist film. In addition, various underlying films (an inorganic film, an organic film, or an antireflection film) may be formed on the underlayer of the resist film, as necessary.

Examples of the drying method include a method of heating and drying. The heating can be carried out using a unit included in an ordinary exposure machine and/or an ordinary development machine, and may also be carried out using a hot plate or the like. A heating temperature is preferably 80° C. to 150° C., more preferably 80° C. to 140° C., and still more preferably 80° C. to 130° C. A heating time is preferably 30 to 1,000 seconds, more preferably 60 to 800 seconds, and still more preferably 60 to 600 seconds.

A film thickness of the resist film is not particularly limited, but is preferably 10 to 120 nm from the viewpoint that a fine pattern having higher accuracy can be formed. Among those, in a case of performing EUV exposure, the film thickness of the resist film is more preferably 10 to 65 nm, and still more preferably 15 to 50 nm.

Moreover, a topcoat may be formed on the upper layer of the resist film, using the topcoat composition.

It is preferable that the topcoat composition is not mixed with the resist film and can be uniformly applied onto the upper layer of the resist film. The topcoat is not particularly limited, a topcoat known in the related art can be formed by the methods known in the related art, and the topcoat can be formed, based on the description in paragraphs [0072] to [0082] of JP2014-059543A, for example.

It is preferable that a topcoat including a basic compound as described in JP2013-61648A, for example, is formed on a resist film. Specific examples of the basic compound which can be included in the topcoat include a basic compound which may be included in the resist composition.

In addition, it is also preferable that the topcoat includes a compound which includes at least one group or bond selected from the group consisting of an ether bond, a thioether bond, a hydroxyl group, a thiol group, a carbonyl bond, and an ester bond.

<Step 2: Exposing Step>

The step 2 is a step of exposing the resist film.

Examples of the exposing method include a method of irradiating the resist film formed with actinic rays or radiation through a predetermined mask.

Examples of the actinic rays or radiation include infrared light, visible light, ultraviolet light, far ultraviolet light, extreme ultraviolet light, X-rays, and electron beams, preferably a far ultraviolet light having a wavelength of 250 nm or less, more preferably a far ultraviolet light having a wavelength of 220 nm or less, and particularly preferably a far ultraviolet light having a wavelength of 1 to 200 nm, specifically, KrF excimer laser (248 nm), ArF excimer laser (193 nm), $F_2$ excimer laser (157 nm), EUV light (13 nm), X-rays, and electron beams.

It is preferable to perform baking (heating) before performing development after the exposure. The baking accelerates a reaction in the exposed portion, and the sensitivity and the pattern shape are improved.

A heating temperature is preferably 80° C. to 150° C., more preferably 80° C. to 140° C., and still more preferably 80° C. to 130° C.

A heating time is preferably 10 to 1,000 seconds, more preferably 10 to 180 seconds, and still more preferably 30 to 120 seconds.

The heating can be carried out using a unit included in an ordinary exposure machine and/or an ordinary development machine, and may also be performed using a hot plate or the like.

This step is also called post-exposure baking (PEB).

<Step 3: Developing Step>

The step 3 is a step of developing the exposed resist film using a developer to form a pattern.

The developer may be either an alkali developer or a developer including an organic solvent (hereinafter also referred to as an organic developer).

Examples of the developing method include a method in which a substrate is immersed in a tank filled with a developer for a certain period of time (a dip method), a method in which development is performed by heaping a developer up onto the surface of a substrate by surface tension, and then leaving it to stand for a certain period of time (a puddle method), a method in which a developer is sprayed on the surface of a substrate (a spray method), and a method in which a developer is continuously jetted onto a substrate rotating at a constant rate while scanning a developer jetting nozzle at a constant rate (a dynamic dispense method).

In addition, after the step of performing development, a step of stopping the development may be carried out while substituting the solvent with another solvent.

A developing time is not particularly limited as long as it is a period of time where the unexposed portion of a resin is sufficiently dissolved, and is preferably 10 to 300 seconds, and more preferably 20 to 120 seconds.

The temperature of the developer is preferably 0° C. to 50° C., and more preferably 15° C. to 35° C.

As the alkali developer, it is preferable to use an aqueous alkali solution including an alkali. The type of the aqueous alkali solution is not particularly limited, but examples thereof include an aqueous alkali solution including a quaternary ammonium salt typified by tetramethylammonium hydroxide, an inorganic alkali, a primary amine, a secondary amine, a tertiary amine, an alcoholamine, a cyclic amine, or the like. Among those, the aqueous solutions of the quaternary ammonium salts typified by tetramethylammonium hydroxide (TMAH) are preferable as the alkali developer. An appropriate amount of an alcohol, a surfactant, or the like may be added to the alkali developer. The alkali concentration of the alkali developer is usually 0.1% to 20% by mass. Furthermore, the pH of the alkali developer is usually 10.0 to 15.0. The content of water in the alkali developer is preferably 51% to 99.95% by mass.

The organic developer is preferably a developer containing at least one organic solvent selected from the group consisting of a ketone-based solvent, an ester-based solvent, an alcohol-based solvent, an amide-based solvent, an ether-based solvent, and a hydrocarbon-based solvent.

A plurality of the solvents may be mixed or the solvent may be used in admixture with a solvent other than those described above or water. The moisture content in the entire developer is preferably less than 50% by mass, more preferably less than 20% by mass, and still more preferably less than 10% by mass, and particularly preferably moisture is not substantially contained.

The content of the organic solvent with respect to the organic developer is preferably 50% to 100% by mass, more preferably 80% to 100% by mass, still more preferably 90% to 100% by mass or less, and particularly preferably 95% to 100% by mass or less with respect to the total amount of the developer.

<Other Steps>

It is preferable that the pattern forming method includes a step of performing cleaning using a rinsing liquid after the step 3.

Examples of the rinsing liquid used in the rinsing step after the step of performing development using an alkali developer include pure water. Furthermore, an appropriate amount of a surfactant may be added to pure water.

An appropriate amount of a surfactant may be added to the rinsing liquid.

The rinsing liquid used in the rinsing step after the developing step with an organic developer is not particularly limited as long as the rinsing liquid does not dissolve the pattern, and a solution including a common organic solvent can be used. As the rinsing liquid, a rinsing liquid containing at least one organic solvent selected from the group consisting of a hydrocarbon-based solvent, a ketone-based solvent, an ester-based solvent, an alcohol-based solvent, an amide-based solvent, and an ether-based solvent is preferably used.

A method for the rinsing step is not particularly limited, but examples thereof include a method in which a rinsing liquid is continuously jetted on a substrate rotated at a constant rate (a rotation application method), a method in which a substrate is dipped in a tank filled with a rinsing liquid for a certain period of time (a dip method), and a method in which a rinsing liquid is sprayed on a substrate surface (a spray method).

Furthermore, the pattern forming method of the embodiment of the present invention may include a heating step (post bake) after the rinsing step. By the present step, the developer and the rinsing liquid remaining between and inside the patterns are removed by baking. In addition, the present step also has an effect that a resist pattern is annealed and the surface roughness of the pattern is improved. The heating step after the rinsing step is usually performed at 40° C. to 250° C. (preferably 90° C. to 200° C.) for usually 10 seconds to 3 minutes (preferably 30 seconds to 120 seconds).

In addition, an etching treatment on the substrate may be carried out using a pattern thus formed as a mask. That is, the substrate (or the underlayer film and the substrate) may be processed using the pattern thus formed in the step 3 as a mask to form a pattern on the substrate.

A method for processing the substrate (or the underlayer film and the substrate) is not particularly limited, but a method in which a pattern is formed on a substrate by subjecting the substrate (or the underlayer film and the substrate) to dry etching using the pattern thus formed in the step 3 as a mask is preferable. Oxygen plasma etching is preferable as the dry etching.

It is preferable that various materials (for example, a solvent, a developer, a rinsing liquid, a composition for forming an antireflection film, and a composition for forming a topcoat) used in the resist composition and the pattern forming method of the embodiment of the present invention do not include impurities such as metals. The content of the impurities included in these materials is preferably 1 ppm by mass or less, more preferably 10 ppb by mass or less, still more preferably 100 ppt by mass or less, particularly preferably 10 ppt by mass or less, and most preferably 1 ppt by mass or less. Here, examples of the metal impurities include Na, K, Ca, Fe, Cu, Mg, Al, Li, Cr, Ni, Sn, Ag, As, Au, Ba, Cd, Co, Pb, Ti, V, W, and Zn.

Examples of a method for removing impurities such as metals from the various materials include filtration using a filter. Details of filtration using a filter are described in paragraph [0321] of WO2020/004306A.

In addition, examples of a method for reducing impurities such as metals included in various materials include a method of selecting raw materials having a low content of metals as raw materials constituting various materials, a method of subjecting raw materials constituting various materials to filter filtration, and a method of performing distillation under the condition for suppressing the contamination as much as possible by, for example, lining the inside of a device with TEFLON (registered trademark).

In addition to the filter filtration, removal of impurities by an adsorbing material may be performed, or a combination of filter filtration and an adsorbing material may be used. As the adsorbing material, known adsorbing materials may be used, and for example, inorganic adsorbing materials such as silica gel and zeolite, and organic adsorbing materials such as activated carbon can be used. It is necessary to prevent the incorporation of impurities such as metals in the production process in order to reduce the metal impurities included in the various materials. Sufficient removal of metal impurities from a production device can be confirmed by measuring a content of metal components included in a cleaning liquid used to clean the production device. The content of the metal components included in the cleaning liquid after the use is preferably 100 parts per trillion (ppt) by mass or less, more preferably 10 ppt by mass or less, and still more preferably 1 ppt by mass or less.

A conductive compound may be added to an organic treatment liquid such as a rinsing liquid in order to prevent breakdown of chemical liquid pipes and various parts (a filter, an O-ring, a tube, and the like) due to electrostatic charging, and subsequently generated electrostatic discharging. The conductive compound is not particularly limited, but examples thereof include methanol. The addition amount is not particularly limited, but from the viewpoint that preferred development characteristics or rinsing characteristics are maintained, the addition amount is preferably 10% by mass or less, and more preferably 5% by mass or less.

For the chemical liquid pipe, for example, various pipes coated with stainless steel (SUS), or a polyethylene, polypropylene, or fluororesin (a polytetrafluoroethylene or perfluoroalkoxy resin, and the like) that has been subjected to an antistatic treatment can be used. In the same manner, for the filter or the O-ring, polyethylene, polypropylene, or a fluororesin (a polytetrafluoroethylene or perfluoroalkoxy resin, and the like) that has been subjected to an antistatic treatment can be used.

[Method for Manufacturing Electronic Device]

Moreover, the present invention further relates to a method for manufacturing an electronic device, including the pattern forming method, and an electronic device manufactured by the manufacturing method.

The electronic device of an embodiment of the present invention is suitably mounted on electric and electronic equipment (for example, home appliances, office automation (OA)-related equipment, media-related equipment, optical equipment, telecommunication equipment, and the like).

EXAMPLES

Hereinbelow, the present invention will be described in more detail with reference to Examples. The materials, the amounts of materials used, the proportions, the treatment details, the treatment procedure, and the like shown in Examples below may be appropriately modified as long as the modifications do not depart from the spirit of the present invention.

Therefore, the scope of the present invention should not be construed as being limited to Examples shown below.

[Various Components of Actinic Ray-Sensitive or Radiation-Sensitive Resin Composition (Resist Composition)]

The components included in the resist composition subjected to tests in Examples will be described below.

[Resin]

The molar ratios, the weight-average molecular weights (Mw), and the dispersities (Mw/Mn) of the repeating units of the resins (A-1 to A-67 and A'-1 to A'-4) used in the preparation of the resist composition are shown in the following table.

The resins shown in the following table were synthesized according to a method for synthesizing the resin A-1 (Synthesis Example 1) which will be described later.

In the table, the "Type" column shows the type of each repeating unit constituting the resin.

The "Molar ratio" column shows the content (% by mole) of each repeating unit with respect to all the repeating units.

The "SP value" column shows the SP value of each repeating unit.

Hereinbelow, the resins A-1 to A-67 and A'-1 correspond to the resin A.

TABLE 1

| | Repeating unit 1 | | | Repeating unit 2 | | | Repeating unit 3 | | | Repeating unit 4 | | | Repeating unit 5 | | | | |
|---|---|---|---|---|---|---|---|---|---|---|---|---|---|---|---|---|---|
| Table 1-1 | Type | Molar ratio | SP value | Type | Molar ratio | SP value | Type | Molar ratio | SP value | Type | Molar ratio | SP value | Type | Molar ratio | SP value | Mw | Mw/Mn |
| A-1 | M-1 | 40 | 20.2 | M-12 | 10 | 19.8 | M-71 | 20 | 21.7 | M-34 | 30 | 16.3 | — | — | — | 10,000 | 1.60 |
| A-2 | M-2 | 30 | 20.5 | — | — | — | M-72 | 35 | 19.5 | M-37 | 10 | 16.7 | M-33 | 2.5 | 16.8 | 8,000 | 1.54 |
| A-3 | M-3 | 30 | 18.7 | M-20 | 20 | 24.5 | M-73 | 30 | 19.8 | M-31 | 20 | 17.4 | — | — | — | 9,000 | 1.67 |
| A-4 | M-4 | 15 | 20.2 | M-14 | 15 | 15.9 | M-74 | 40 | 19.0 | M-31 | 30 | 17.4 | — | — | — | 7,500 | 1.55 |
| A-5 | M-5 | 35 | 18.9 | M-13 | 5 | 21.9 | M-75 | 20 | 21.3 | M-35 | 40 | 17.3 | — | — | — | 8,500 | 1.59 |
| A-6 | M-6 | 35 | 20.0 | M-2 | 25 | 20.5 | M-76 | 50 | 22.2 | M-32 | 5 | 17.2 | M-37 | 5 | 16.7 | 5,500 | 1.68 |
| A-7 | M-7 | 15 | 18.8 | M-1 | 25 | 20.2 | M-77 | 45 | 19.5 | M-32 | 5 | 17.2 | M-38 | 10 | 17.3 | 4,500 | 1.77 |
| A-8 | M-8 | 25 | 23.7 | M-19 | 15 | 21.9 | M-78 | 50 | 20.6 | M-31 | 10 | 17.4 | — | — | — | 12,000 | 1.84 |
| A-9 | M-9 | 25 | 23.5 | M-19 | 30 | 21.9 | M-79 | 25 | 20.9 | M-49 | 20 | 17.4 | — | — | — | 14,000 | 1.65 |
| A-10 | M-10 | 20 | 20.7 | M-28 | 35 | 17.5 | M-80 | 35 | 20.7 | M-42 | 10 | 16.7 | — | — | — | 8,800 | 1.55 |
| A-11 | M-11 | 40 | 20.9 | — | — | — | M-81 | 30 | 19.0 | M-39 | 20 | 17.1 | M-32 | 10 | 17.2 | 22,000 | 1.56 |
| A-12 | M-19 | 30 | 21.9 | M-15 | 30 | 16.9 | M-82 | 35 | 23.6 | M-36 | 5 | 17.0 | — | — | — | 14,000 | 1.65 |
| A-13 | M-16 | 25 | 17.2 | M-19 | 25 | 21.9 | M-83 | 35 | 21.6 | M-47 | 15 | 18.2 | — | — | — | 6,500 | 1.40 |
| A-14 | M-17 | 30 | 19.6 | M-14 | 20 | 15.9 | M-84 | 40 | 20.8 | M-33 | 10 | 16.8 | — | — | — | 6,700 | 1.50 |

TABLE 1-continued

| Table 1-1 | Repeating unit 1 Type | Molar ratio | SP value | Repeating unit 2 Type | Molar ratio | SP value | Repeating unit 3 Type | Molar ratio | SP value | Repeating unit 4 Type | Molar ratio | SP value | Repeating unit 5 Type | Molar ratio | SP value | Mw | Mw/Mn |
|---|---|---|---|---|---|---|---|---|---|---|---|---|---|---|---|---|---|
| A-15 | M-18 | 10 | 21.9 | M-8 | 10 | 23.7 | M-85 | 60 | 24.9 | M-66 | 10 | 18.9 | M-41 | 10 | 17.3 | 7,200 | 1.54 |
| A-16 | M-21 | 20 | 25.4 | M-3 | 15 | 18.7 | M-86 | 55 | 22.6 | M-43 | 5 | 16.1 | M-46 | 5 | 17.3 | 8,000 | 1.29 |
| A-17 | M-22 | 25 | 23.6 | — | — | — | M-87 | 70 | 22.0 | M-45 | 5 | 16.2 | — | — | — | 4,500 | 1.35 |
| A-18 | M-23 | 15 | 19.4 | M-4 | 20 | 20.2 | M-88 | 55 | 21.4 | M-31 | 10 | 17.4 | — | — | — | 5,000 | 1.25 |
| A-19 | M-24 | 35 | 20.8 | M-68 | 10 | 22.6 | M-89 | 40 | 22.7 | M-44 | 5 | 16.1 | M-40 | 10 | 17.0 | 5,500 | 1.50 |
| A-20 | M-25 | 20 | 21.7 | M-19 | 25 | 21.9 | M-90 | 45 | 19.9 | M-31 | 10 | 17.4 | — | — | — | 5,600 | 1.60 |
| A-21 | M-26 | 40 | 17.7 | M-61 | 10 | 27.0 | M-91 | 25 | 22.4 | M-55 | 10 | 17.5 | M-58 | 15 | 19.2 | 7,800 | 1.56 |
| A-22 | M-27 | 10 | 20.3 | M-20 | 5 | 24.5 | M-92 | 80 | 19.1 | M-50 | 5 | 18.6 | — | — | — | 9,000 | 1.54 |
| A-23 | M-30 | 20 | 23.2 | M-6 | 30 | 20.0 | M-93 | 25 | 20.4 | M-48 | 25 | 16.9 | — | — | — | 8,000 | 1.74 |
| A-24 | M-62 | 20 | 19.9 | M-8 | 20 | 23.7 | M-94 | 35 | 18.0 | M-51 | 10 | 17.8 | M-54 | 15 | 18.3 | 7,500 | 1.55 |
| A-25 | — | — | — | — | — | — | M-95 | 50 | 20.7 | M-65 | 50 | 17.3 | — | — | — | 8,600 | 1.72 |
| A-26 | M-63 | 20 | 20.4 | — | — | — | M-96 | 40 | 19.4 | M-59 | 40 | 18.6 | — | — | — | 12,500 | 1.80 |
| A-27 | M-64 | 20 | 19.2 | M-4 | 30 | 20.2 | M-77 | 45 | 19.5 | M-52 | 5 | 19.1 | — | — | — | 5,500 | 1.33 |
| A-28 | M-4 | 20 | 20.2 | M-19 | 20 | 21.9 | M-84 | 50 | 20.8 | M-69 | 10 | 17.6 | — | — | — | 4,500 | 1.40 |
| A-29 | M-19 | 30 | 21.9 | — | — | — | M-72 | 60 | 19.5 | M-70 | 10 | 17.6 | — | — | — | 6,500 | 1.55 |
| A-30 | M-102 | 25 | 21.0 | — | — | — | M-71 | 25 | 21.7 | M-43 | 50 | 16.1 | — | — | — | 6,000 | 1.65 |
| A-31 | M-1 | 15 | 20.2 | M-23 | 15 | 19.4 | M-82 | 30 | 23.6 | M-32 | 20 | 17.2 | M-53 | 20 | 16.4 | 5,900 | 1.56 |
| A-32 | M-4 | 20 | 20.2 | M-20 | 20 | 24.5 | M-81 | 50 | 19.0 | M-55 | 5 | 17.5 | M-33 | 5 | 16.8 | 8,900 | 1.55 |
| A-33 | M-8 | 35 | 23.7 | M-14 | 15 | 15.9 | M-87 | 40 | 22.0 | M-56 | 5 | 16.8 | M-32 | 5 | 17.2 | 12,000 | 1.65 |
| A-34 | M-6 | 40 | 20.0 | | | — | M-97 | 35 | 23.6 | M-60 | 15 | 20.1 | M-67 | 10 | 19.7 | 8,000 | 1.55 |
| A-35 | M-11 | 35 | 20.9 | M-15 | 15 | 16.9 | M-89 | 35 | 2.27 | M-57 | 10 | 16.7 | M-37 | 5 | 16.7 | 14,000 | 1.56 |

TABLE 2

| Table 1-2 | Repeating unit 1 Type | Molar ratio | SP value | Repeating unit 2 Type | Molar ratio | SP value | Repeating unit 3 Type | Molar ratio | SP value | Repeating unit 4 Type | Molar ratio | SP value | Repeating unit 5 Type | Molar ratio | SP value | Mw | Mw/Mn |
|---|---|---|---|---|---|---|---|---|---|---|---|---|---|---|---|---|---|
| A-36 | M-4 | 60 | 20.2 | — | — | — | M-88 | 40 | 21.4 | — | — | — | — | — | — | 12,000 | 1.65 |
| A-37 | M-2 | 50 | 20.5 | — | — | — | M-72 | 50 | 19.5 | — | — | — | — | — | — | 8,000 | 1.40 |
| A-38 | M-1 | 40 | 20.2 | M-12 | 15 | 19.8 | M-77 | 45 | 19.5 | — | — | — | — | — | — | 6,500 | 1.54 |
| A-39 | M-9 | 30 | 23.5 | M-14 | 15 | 15.9 | M-81 | 55 | 19.0 | — | — | — | — | — | — | 5,500 | 1.29 |
| A-40 | M-5 | 20 | 18.9 | M-10 | 20 | 20.7 | M-90 | 60 | 19.9 | — | — | — | — | — | — | 4,000 | 1.35 |
| A-41 | M-8 | 20 | 23.7 | M-28 | 10 | 17.5 | M-89 | 70 | 22.7 | — | — | — | — | — | — | 8,800 | 1.25 |
| A-42 | M-15 | 45 | 16.9 | — | — | — | M-82 | 55 | 23.6 | — | — | — | — | — | — | 10,000 | 1.50 |
| A-43 | M-3 | 45 | 18.7 | — | — | — | M-83 | 55 | 21.6 | — | — | — | — | — | — | 7,100 | 1.67 |
| A-44 | M-19 | 30 | 21.9 | — | — | — | M-77 | 70 | 19.5 | — | — | — | — | — | — | 6,600 | 1.65 |
| A-45 | M-23 | 20 | 19.4 | — | — | — | M-86 | 80 | 22.6 | — | — | — | — | — | — | 12,200 | 1.55 |
| A-46 | M-13 | 25 | 21.9 | M-1 | 40 | 20.2 | M-77 | 35 | 19.5 | — | — | — | — | — | — | 7,700 | 1.56 |
| A-47 | M-18 | 20 | 21.9 | M-64 | 35 | 19.2 | M-95 | 45 | 20.7 | — | — | — | — | — | — | 6,700 | 1.65 |
| A-48 | M-6 | 40 | 20.0 | M-14 | 10 | 15.9 | M-72 | 50 | 19.5 | — | — | — | — | — | — | 5,400 | 1.40 |
| A-49 | M-1 | 30 | 20.2 | M-19 | 20 | 21.9 | M-79 | 50 | 20.9 | — | — | — | — | — | — | 4,300 | 1.54 |
| A-50 | M-8 | 15 | 23.7 | M-10 | 15 | 20.7 | M-88 | 70 | 21.4 | — | — | — | — | — | — | 5,400 | 1.29 |
| A-51 | M-5 | 20 | 18.9 | M-27 | 20 | 20.3 | M-85 | 60 | 24.9 | — | — | — | — | — | — | 6,800 | 1.35 |
| A-52 | M-24 | 25 | 20.8 | M-30 | 20 | 23.2 | M-97 | 55 | 23.6 | — | — | — | — | — | — | 7,100 | 1.25 |
| A-53 | M-16 | 30 | 17.2 | — | — | — | M-77 | 70 | 19.5 | — | — | — | — | — | — | 7,400 | 1.50 |
| A-54 | M-25 | 10 | 21.7 | — | — | — | M-87 | 90 | 22.0 | — | — | — | — | — | — | 6,900 | 1.60 |
| A-55 | M-26 | 25 | 17.7 | M-29 | 20 | 19.0 | M-96 | 55 | 19.4 | — | — | — | — | — | — | 8,500 | 1.55 |
| A-56 | M-19 | 20 | 21.9 | — | — | — | M-83 | 80 | 21.6 | — | — | — | — | — | — | 6,500 | 1.55 |
| A-57 | M-6 | 25 | 20.0 | — | — | — | M-81 | 75 | 19.0 | — | — | — | — | — | — | 5,500 | 1.55 |
| A-58 | M-2 | 30 | 20.5 | — | — | — | M-88 | 70 | 21.4 | — | — | — | — | — | — | 4,000 | 1.55 |
| A-59 | M-20 | 20 | 24.5 | — | — | — | M-97 | 80 | 23.6 | — | — | — | — | — | — | 8,800 | 1.55 |
| A-60 | M-4 | 25 | 20.2 | — | — | — | M-83 | 75 | 21.6 | — | — | — | — | — | — | 10,000 | 1.55 |
| A-61 | — | — | — | — | — | — | M-95 | 100 | 20.7 | — | — | — | — | — | — | 7,100 | 1.55 |
| A-62 | — | — | — | — | — | — | M-76 | 100 | 22.2 | — | — | — | — | — | — | 6,600 | 1.55 |
| A-63 | — | — | — | — | — | — | M-87 | 100 | 22.0 | — | — | — | — | — | — | 12,200 | 1.55 |
| A-64 | — | — | — | — | — | — | M-86 | 100 | 22.6 | — | — | — | — | — | — | 7,700 | 1.55 |
| A-65 | — | — | — | — | — | — | M-84 | 100 | 20.8 | — | — | — | — | — | — | 6,700 | 1.55 |
| A-66 | — | — | — | — | — | — | M-88 | 100 | 21.4 | — | — | — | — | — | — | 8,500 | 1.55 |
| A-67 | — | — | — | — | — | — | M-77 | 100 | 19.5 | — | — | — | — | — | — | 20,000 | 1.55 |
| A'-1 | M-19 | 60 | 21.9 | M-99 | 10 | 18.3 | M-98 | 30 | 22.2 | — | — | — | — | — | — | 10,000 | 1.60 |
| A'-2 | M-19 | 63 | 21.9 | — | — | — | M-100 | 10 | 24.1 | M-101 | 27 | 18.2 | — | — | — | 10,000 | 1.60 |
| A'-3 | M-19 | 50 | 21.9 | — | — | — | — | — | — | M-31 | 50 | 17.4 | — | — | — | 10,000 | 1.60 |
| A'-4 | M-19 | 50 | 21.9 | — | — | — | M-103 | 50 | 21.8 | — | — | — | — | — | — | 10,000 | 1.60 |

The structures of the monomers corresponding to the respective repeating units in the resins are shown below.
Furthermore, among the following monomers, M-71 to M-98 and M-100 are monomers from which the repeating unit a1 is derived.
M-1
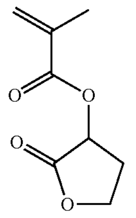
M-2
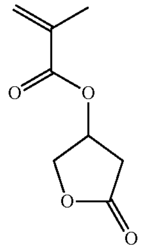
M-3
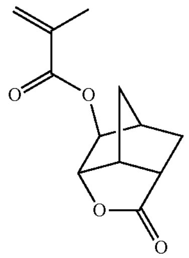
M-4
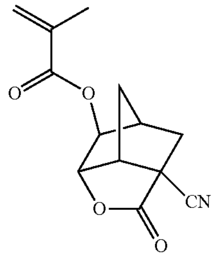
M-5
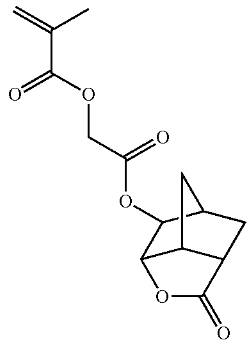
-continued
M-6
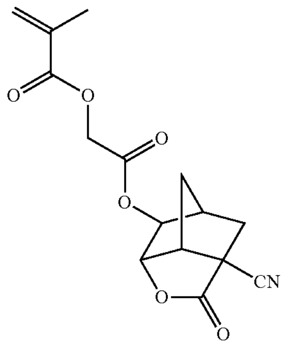
M-7
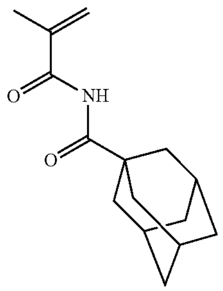
M-8
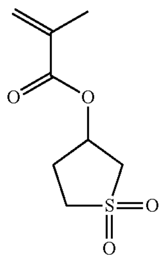
M-9
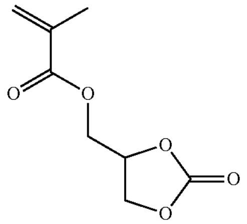
M-10
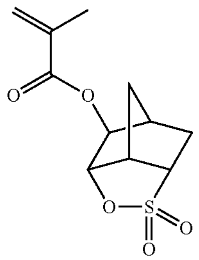

M-11
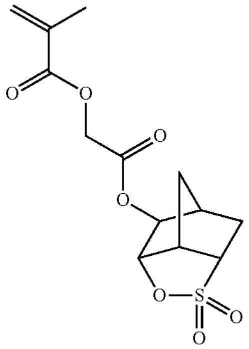
M-12
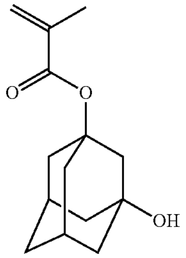
M-13
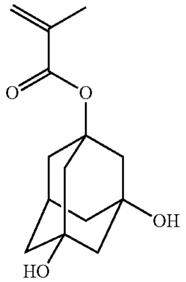
M-14
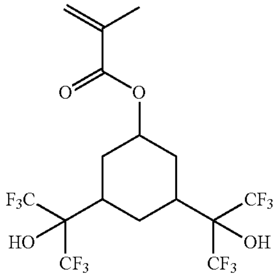
M-15
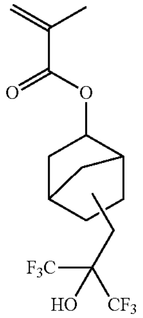
M-16
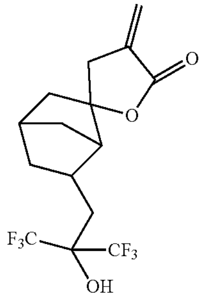
M-17
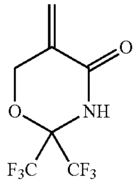
M-18
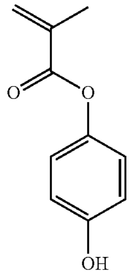
M-19
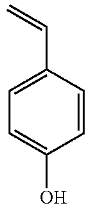
M-20
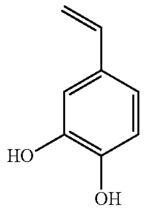
M-21
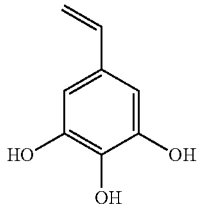

-continued
M-22
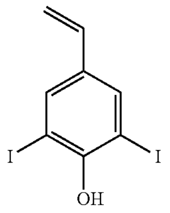
M-23
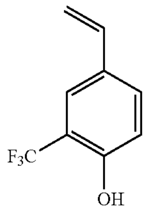
M-24
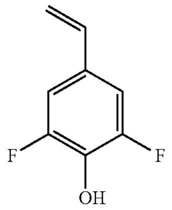
M-25
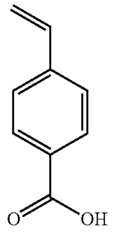
M-26
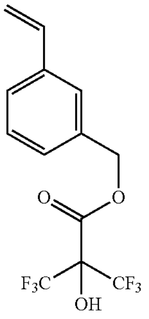
M-27
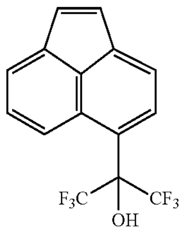
-continued
M-28
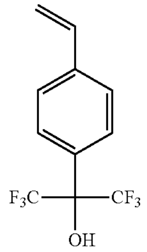
M-29
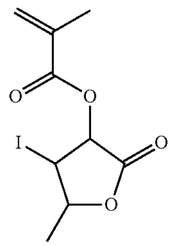
M-30
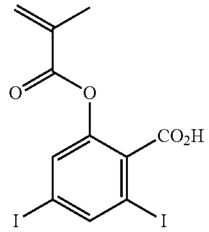
M-31
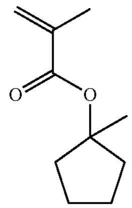
M-32
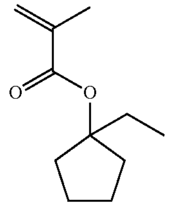
M-33
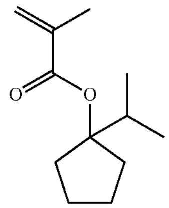
M-34
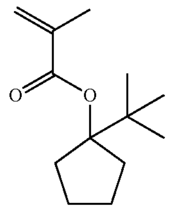

-continued
M-35
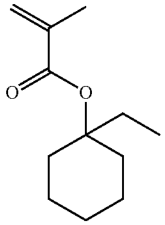
M-36
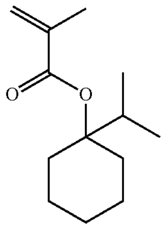
M-37
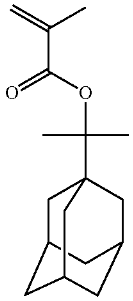
M-38
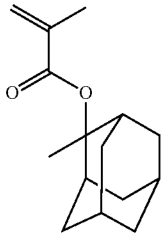
M-39
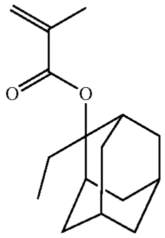
M-40
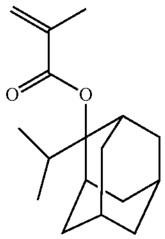
-continued
M-41
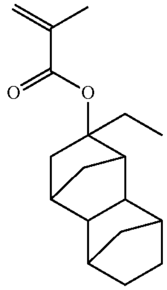
M-42
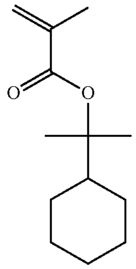
M-43
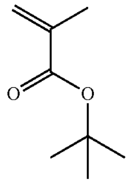
M-44
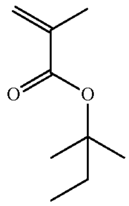
M-45
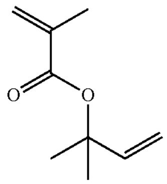
M-46
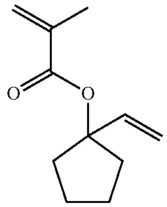
M-47
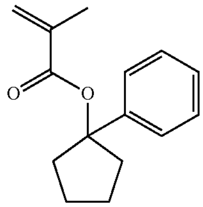

-continued
M-48
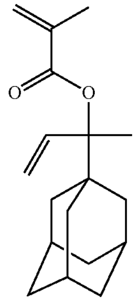
M-49
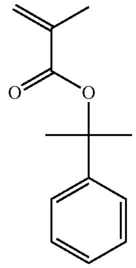
M-50
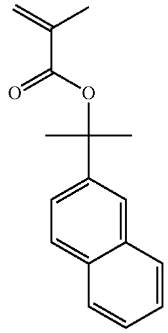
M-51
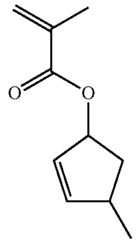
M-52
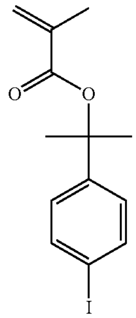
-continued
M-53
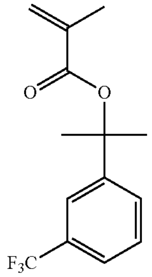
M-54
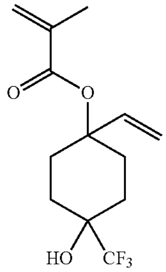
M-55
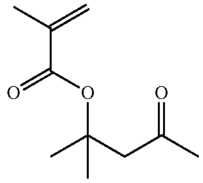
M-56
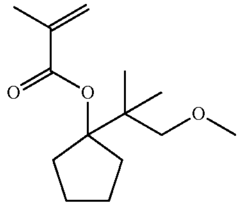
M-57
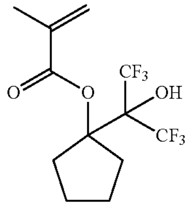
M-58
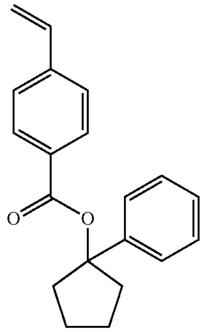

-continued
M-59
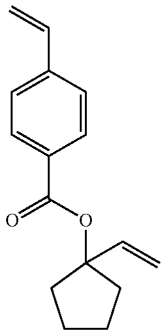
M-60
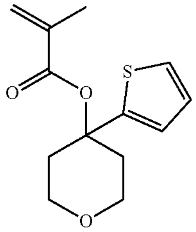
M-61
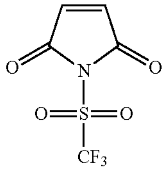
M-62
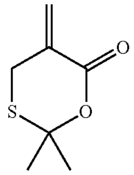
M-63
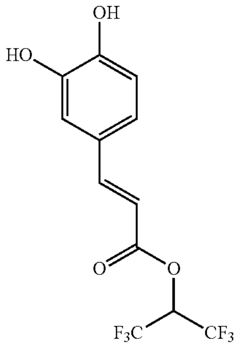
M-64
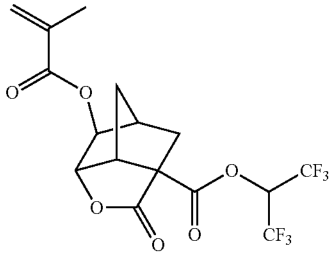
-continued
M-65
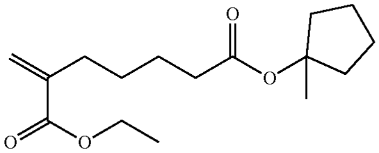
M-66
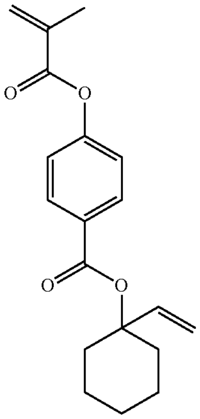
M-67
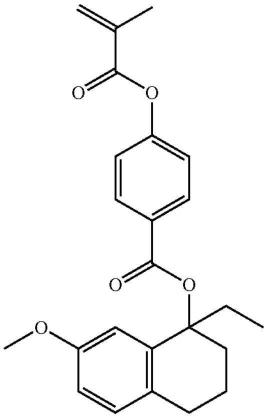
M-68
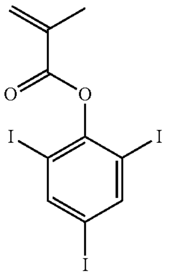
M-69
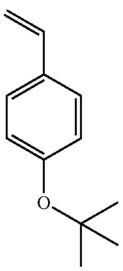

-continued
M-70
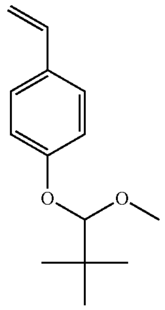
M-71
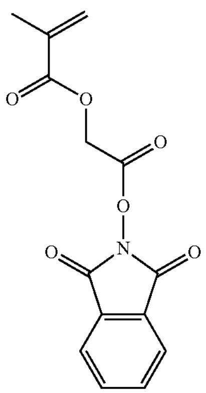
M-72
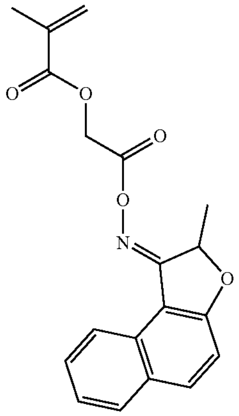
M-73
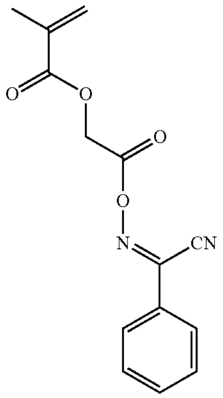
-continued
M-74
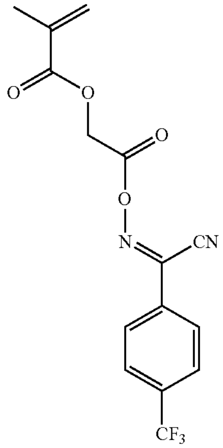
M-75
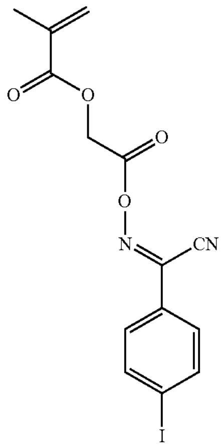
M-76
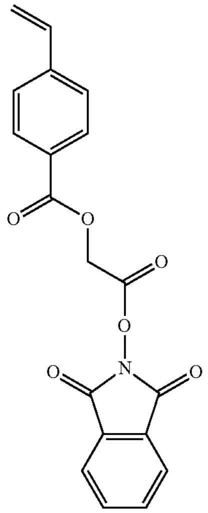

-continued
M-77
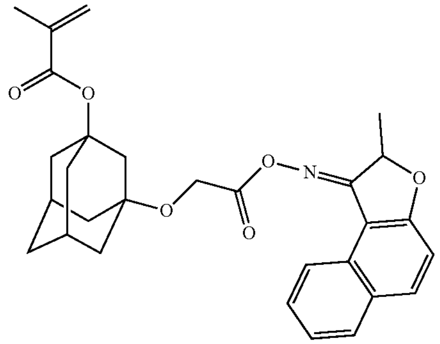
M-78
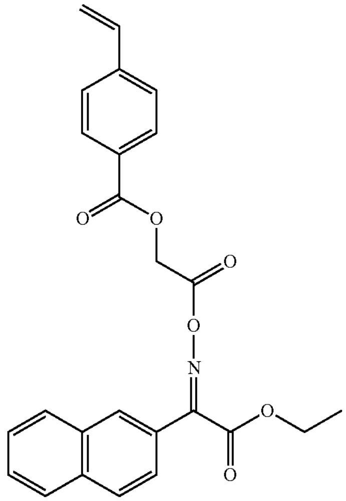
M-79
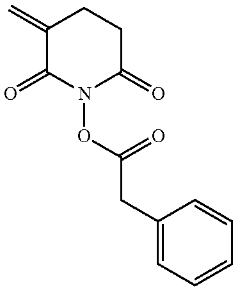
M-80
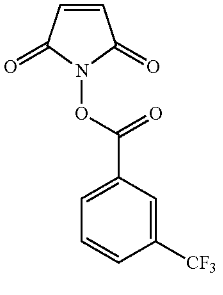
-continued
M-81
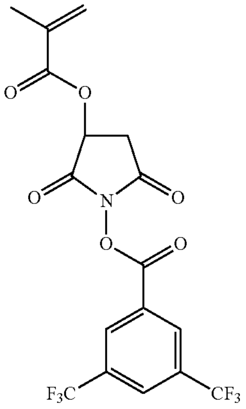
M-82
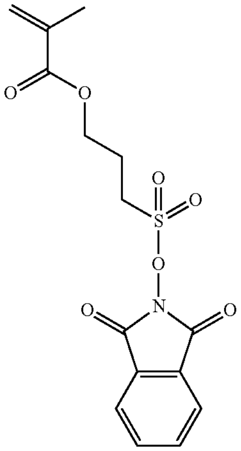
M-83
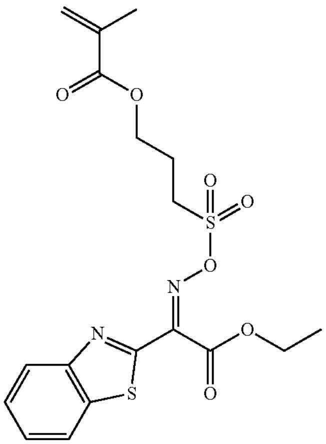

-continued
M-84
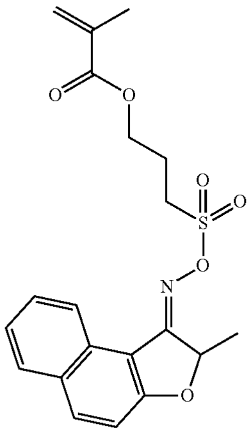
M-85
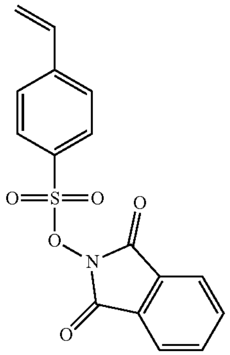
M-86
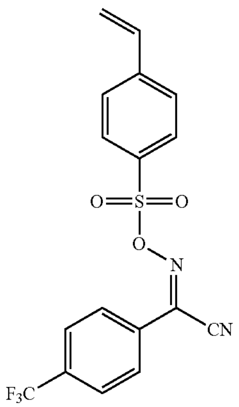
M-87
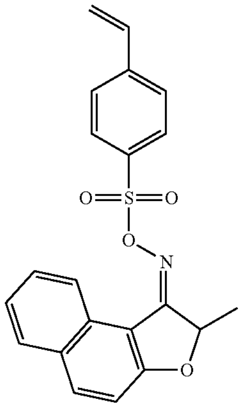
-continued
M-88
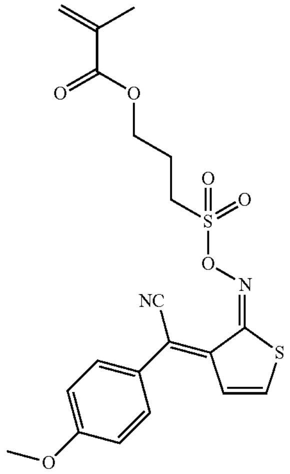
M-89
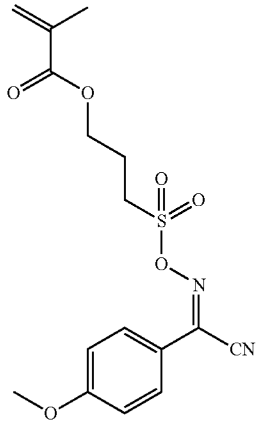
M-90
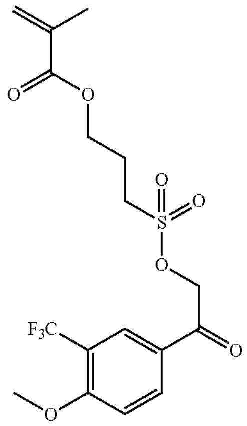

-continued
M-91
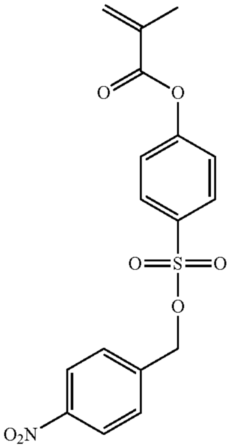
M-92
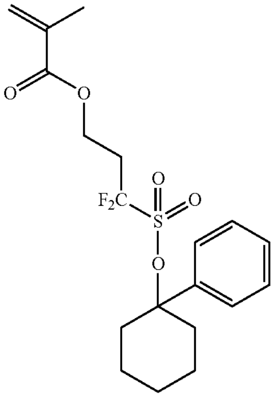
M-93
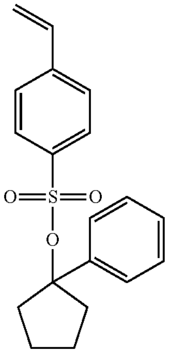
M-94
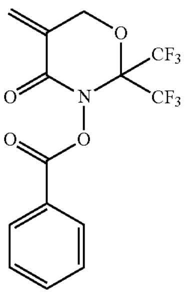
-continued
M-95
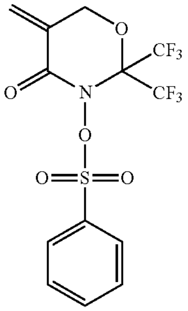
M-96
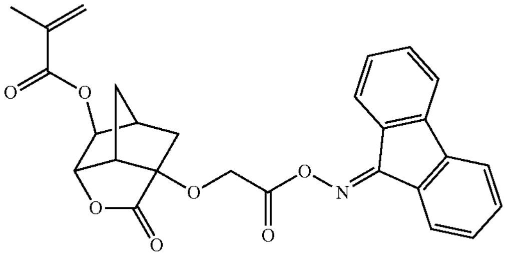
M-97
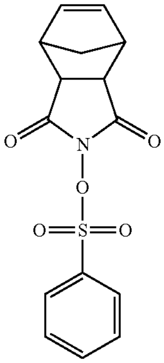
M-98
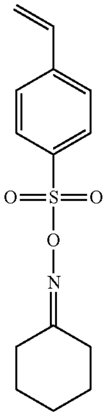
M-99
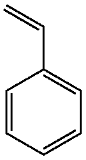

-continued

M-100

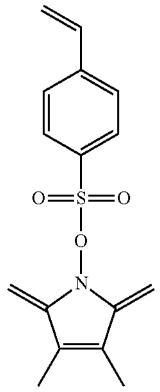

M-101

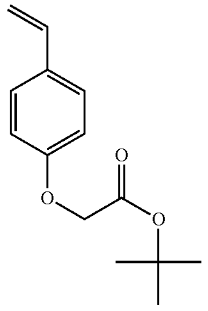

M-102

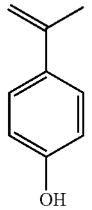

-continued

M-103

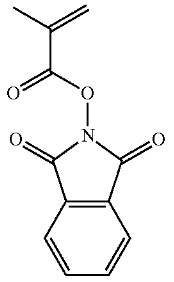

Synthesis Example 1: Synthesis of Resin A-1

Cyclohexanone (62 g) was heated to 85° C. under a nitrogen stream. While stirring this liquid, a mixed solution of a monomer (34 g) represented by Formula M-1, a monomer (13.5 g) represented by Formula M-12, a monomer (29 g) represented by Formula M-71, a monomer (31 g) represented by Formula M-34, cyclohexanone (246 g), and a cyclohexanone solution [10% by mass] (100.7 g) of dimethyl 2,2'-azobisisobutyrate [V-601, manufactured by FUJIFILM Wako Pure Chemical Corporation] was added dropwise over 6 hours to obtain a reaction solution. After completion of the dropwise addition, the reaction solution was further stirred at 85° C. for 2 hours. The obtained reaction solution was cooled, then reprecipitated with a large amount of methanol/water (mass ratio: 7:3), and filtered, and the obtained solid was vacuum-dried to obtain a resin A-1 (83 g). It should be noted that all the operations were performed under a yellow light.

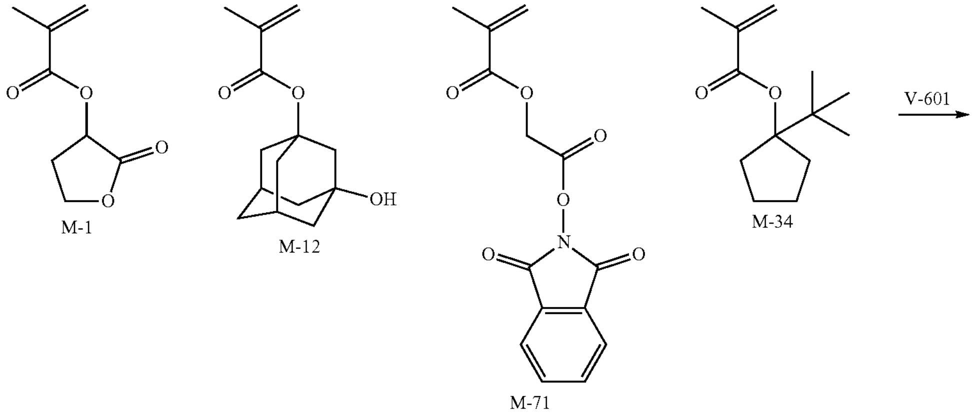

M-1 M-12 M-71 M-34

-continued

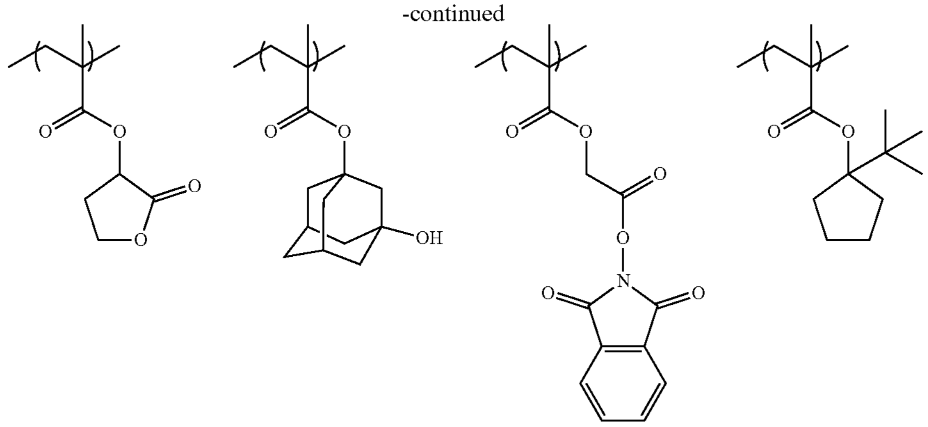

A-1

[Additive B]

The structure of the additive B (the specific acid or the specific salt) used in the preparation of the resist composition is shown below.

In the following specific salts, the numerical value shown in the vicinity of a site (anionic functional group) in which a hydrogen atom of an acid group is substituted with a cation represents a pKa of the acid group in the acid assuming that the hydrogen atom is not substituted with the cation. Furthermore, B-1 to B-29 are each a specific salt corresponding to the compound (I) or the compound (II) described in the specification.

The numerical value shown in the vicinity of a specific acid indicates a pKa of the acid group of the specific acid. In a case where the specific acid has a plurality of acid groups, only the pK of the acid group showing the lowest pKa among the plurality of acid groups is shown.

B-1

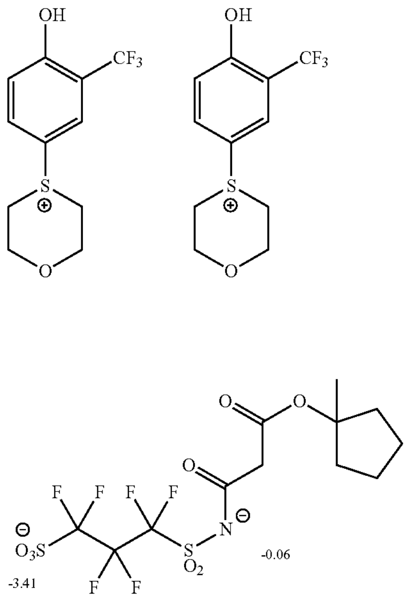

-continued

B-2

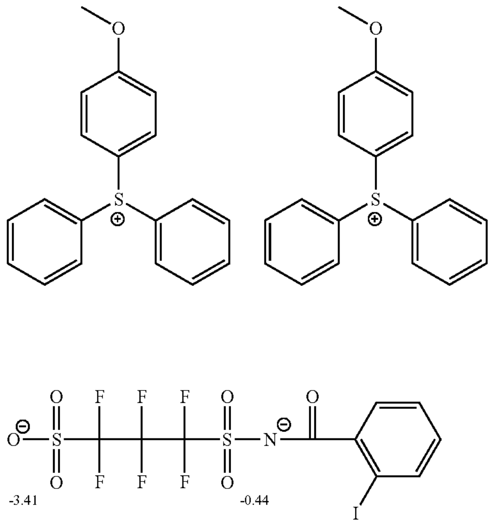

B-3

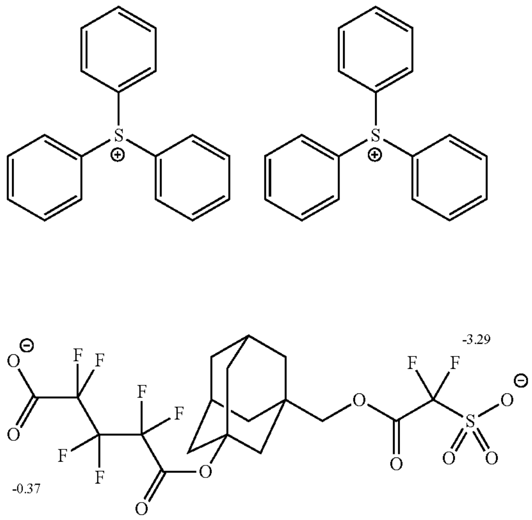

-continued
B-4
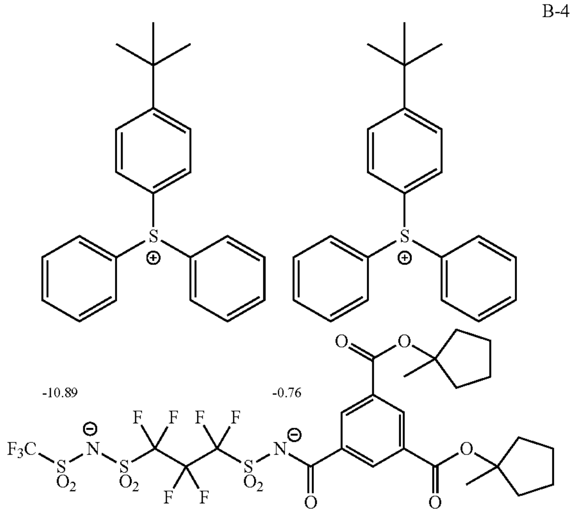
B-5
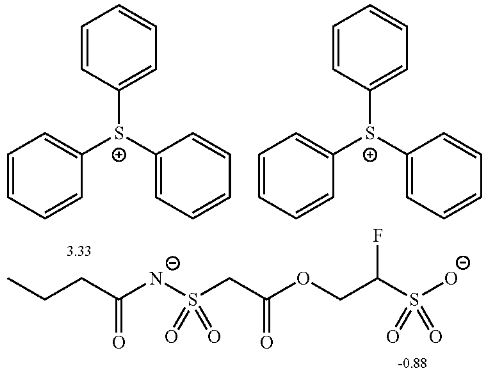
B-6
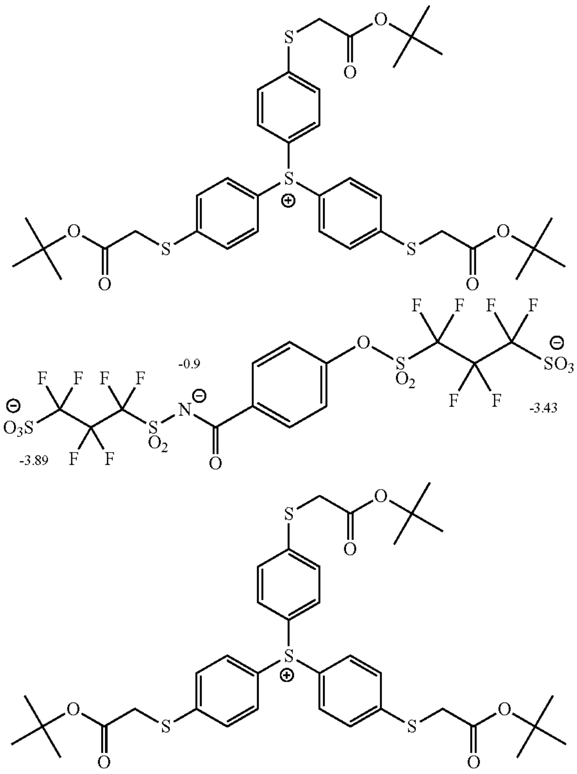
-continued
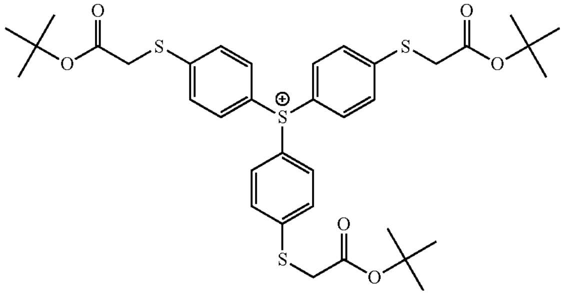
B-7
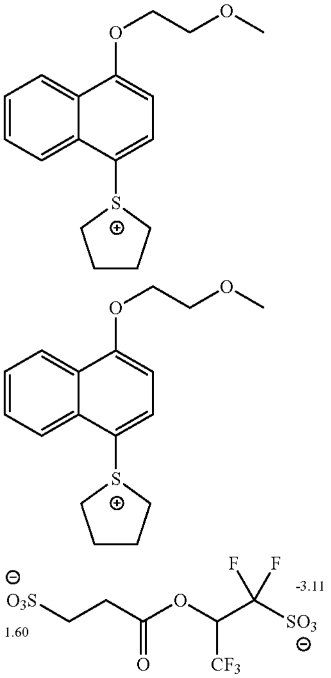
B-8
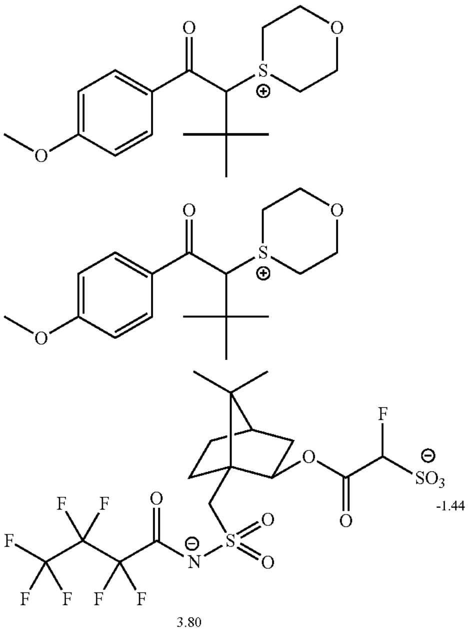

-continued
B-9
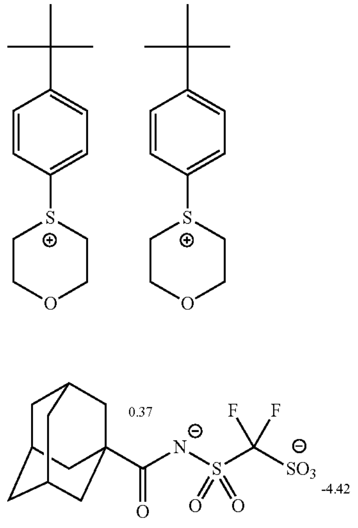
B-10
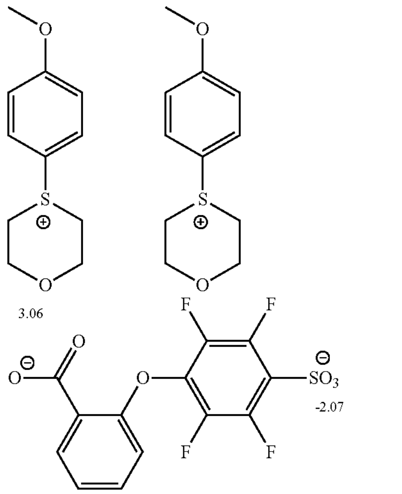
B-11
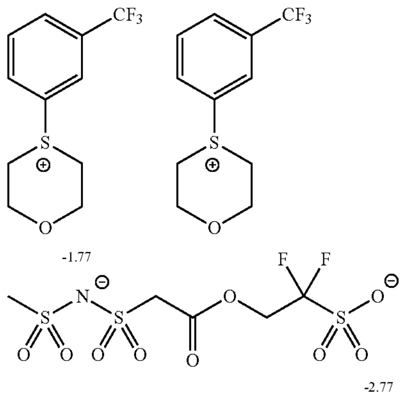
B-12
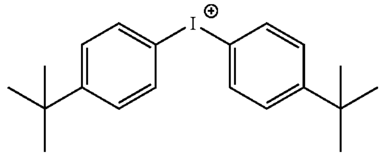
-continued
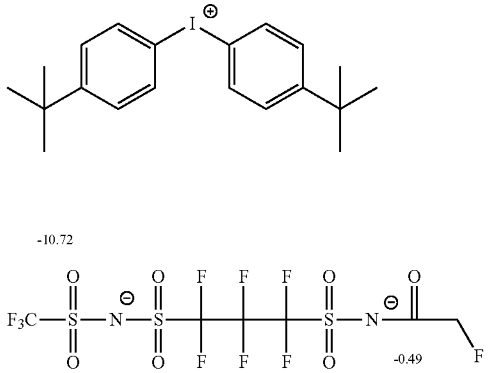
B-13
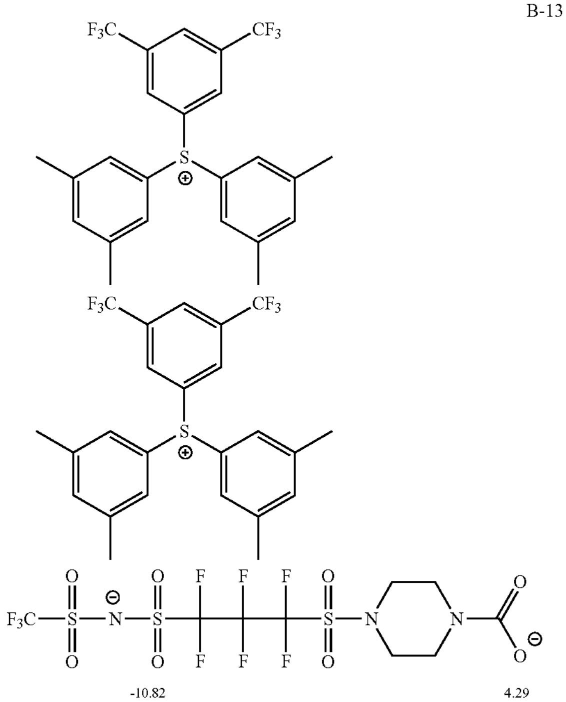
B-14
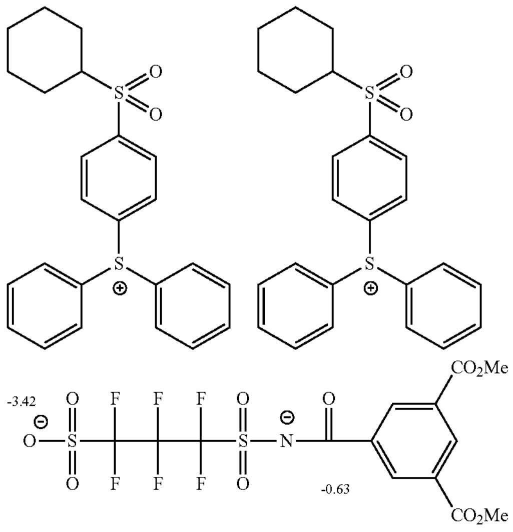

-continued
B-15
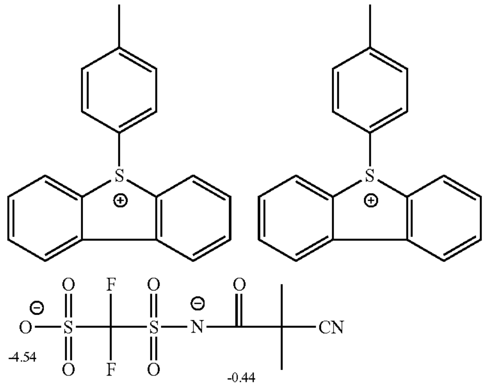
B-16
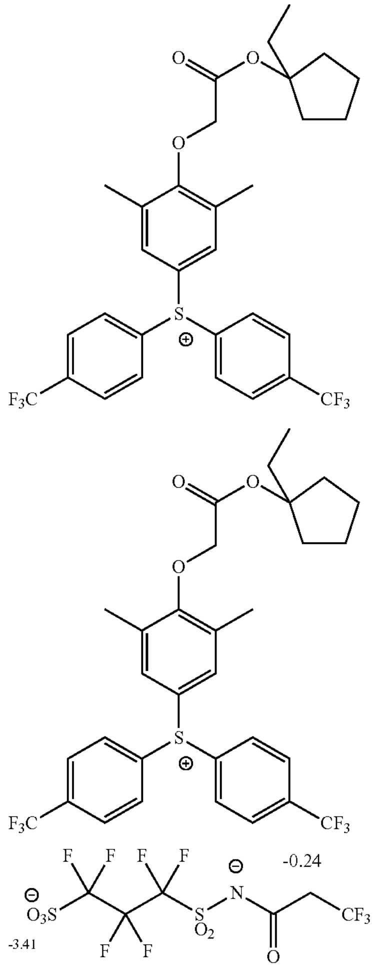
B-17
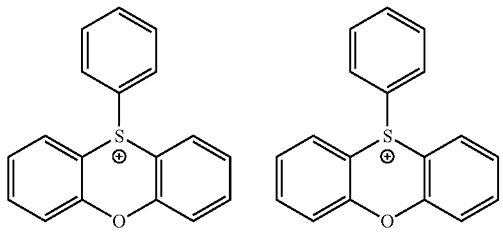
-continued
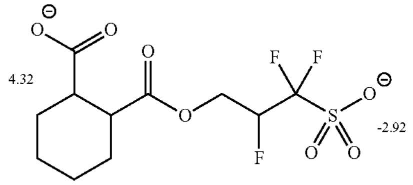
B-18
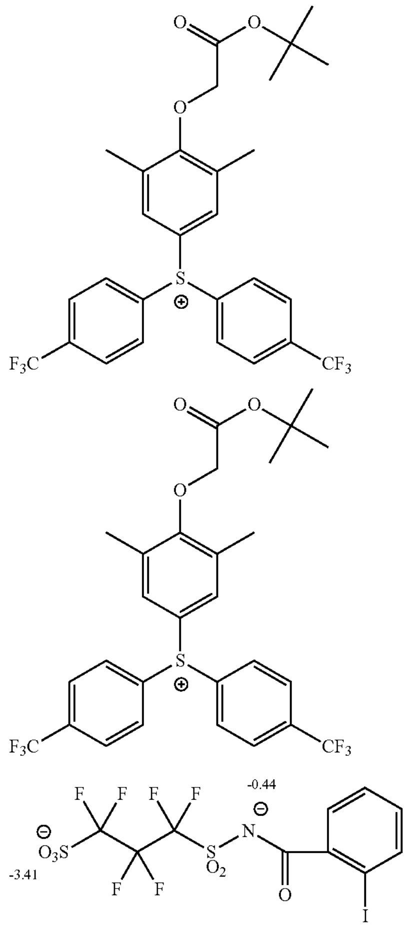
B-19
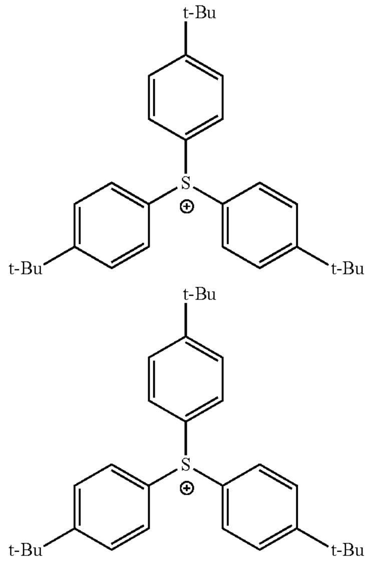

-continued
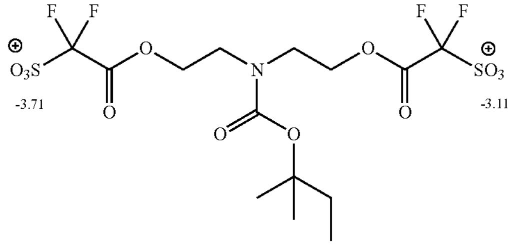
B-20
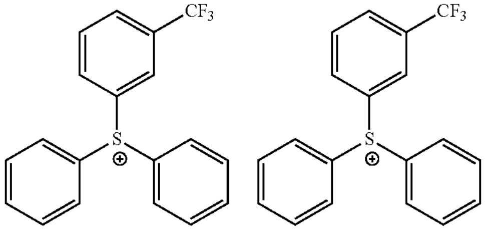
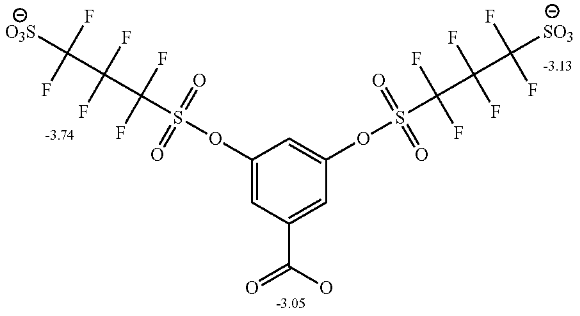
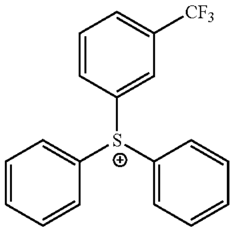
B-21
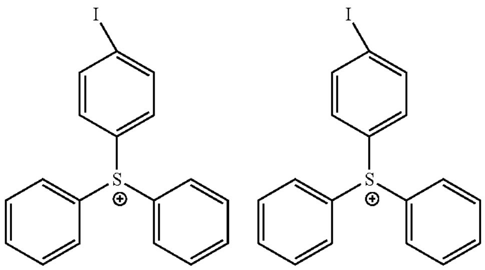
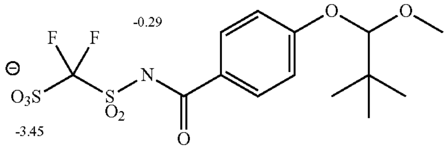
-continued
B-22
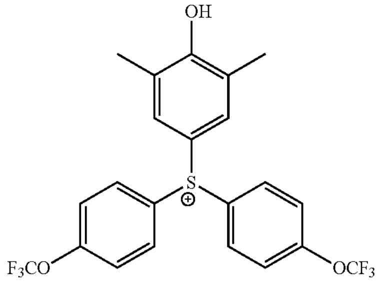
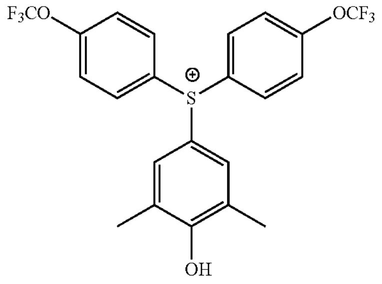
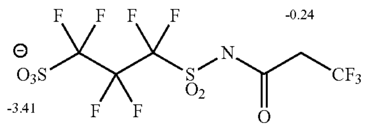
B-23
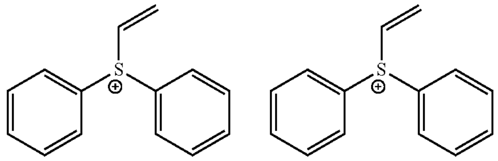
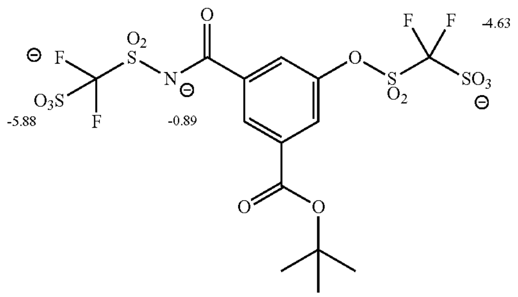
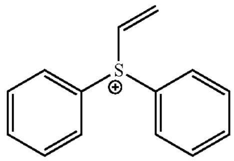

-continued
B-24
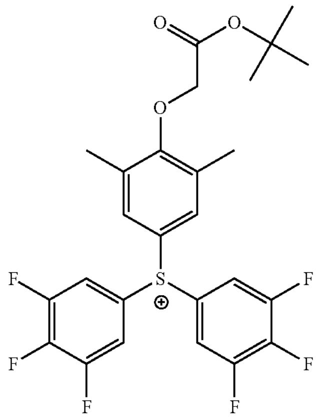
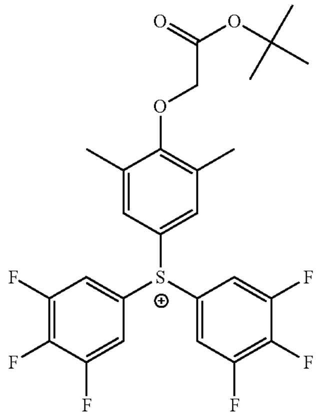
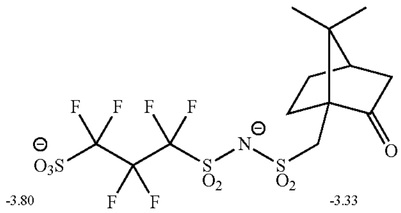
B-25
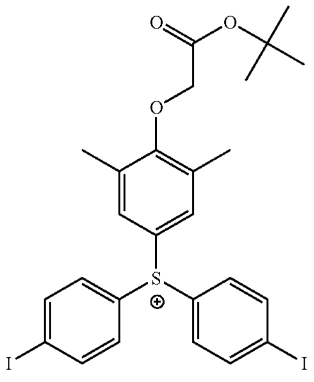
-continued
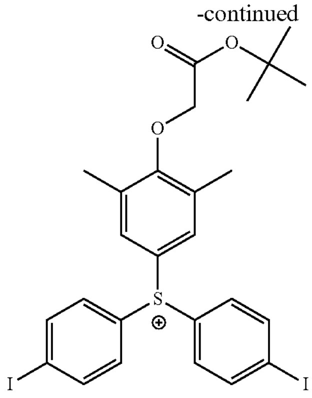
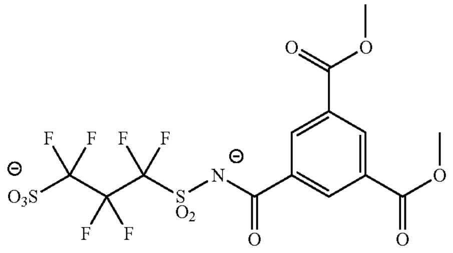
B-26
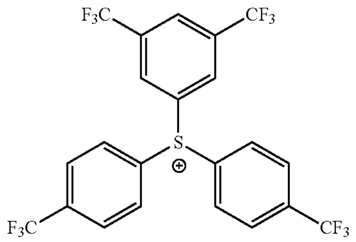
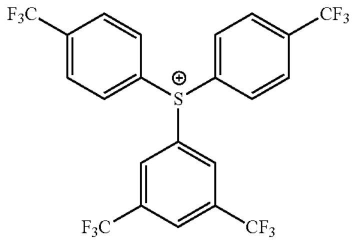
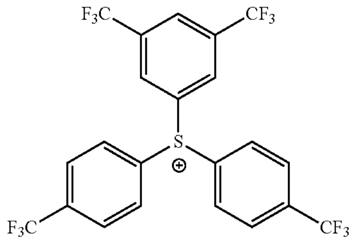
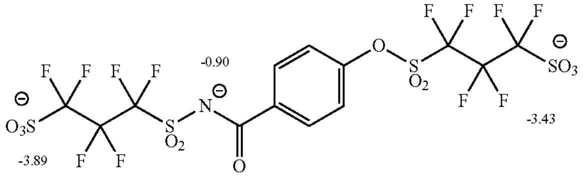

-continued
B-27
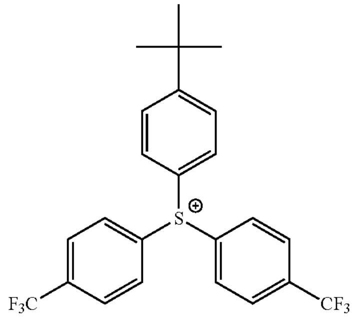
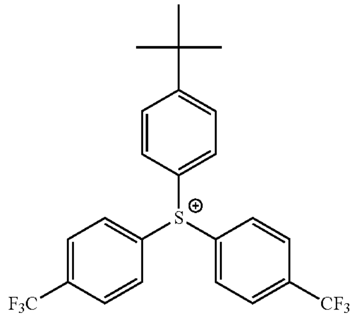
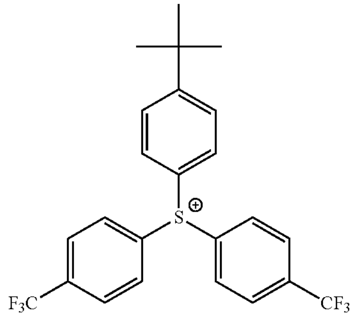
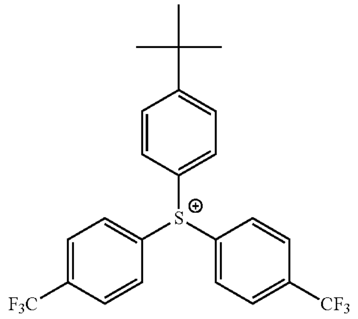
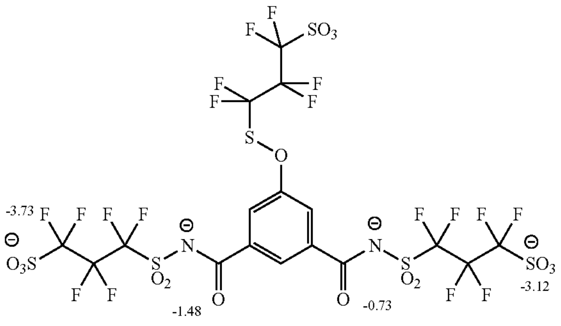
-continued
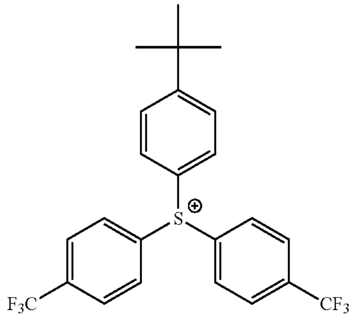
B-28
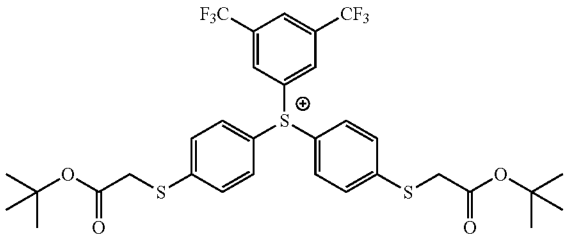
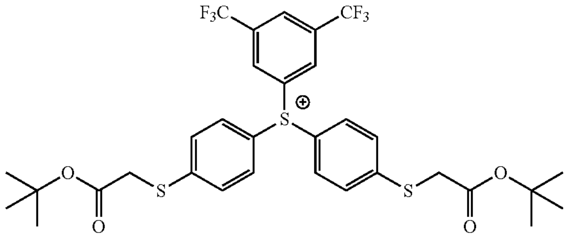
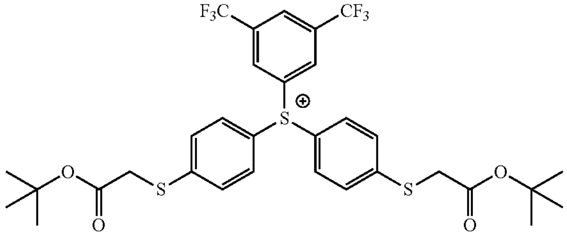
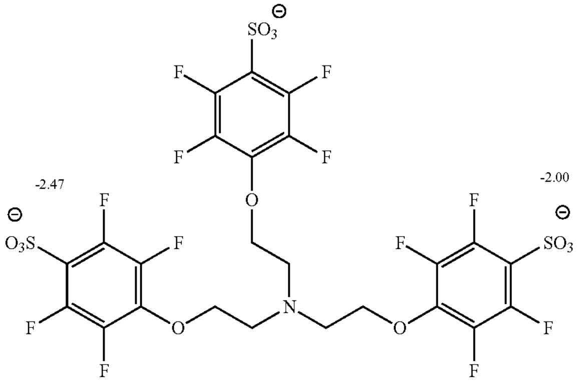

-continued
B-29
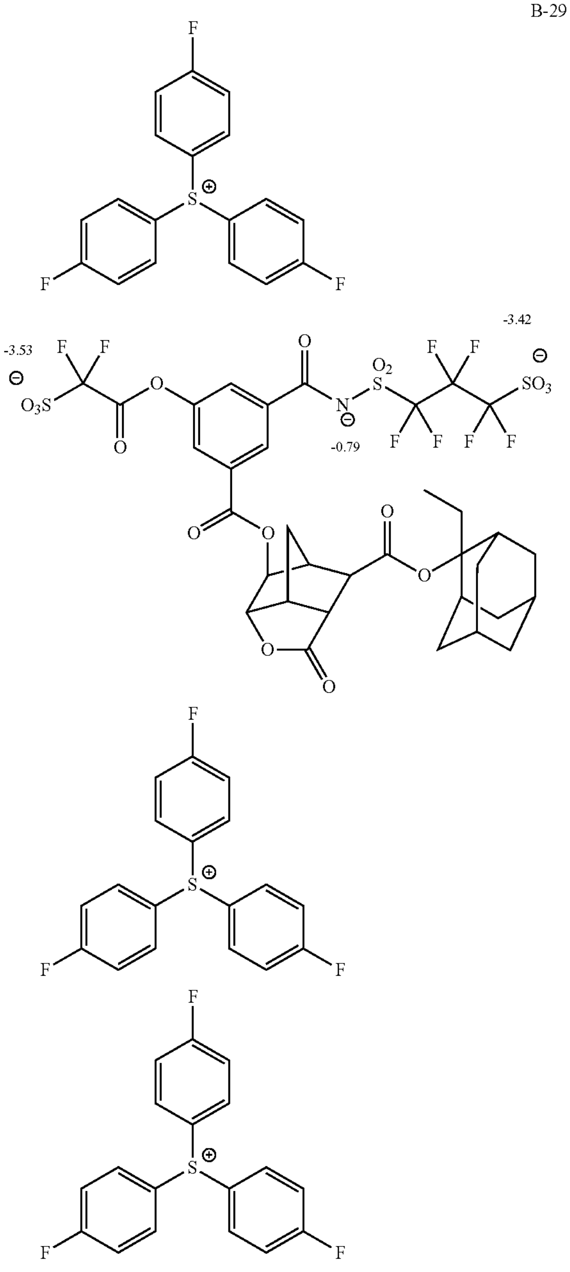
B-30
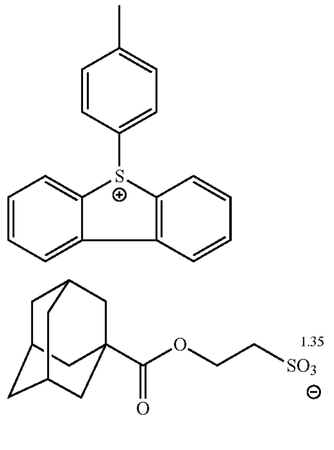
-continued
B-31
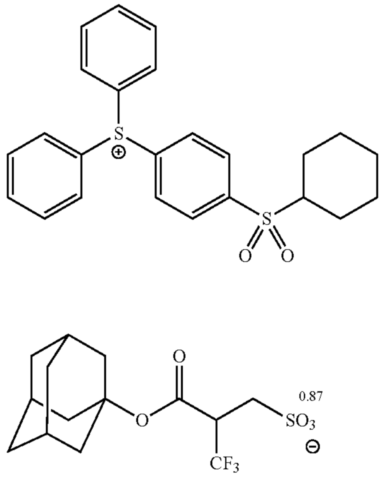
B-32
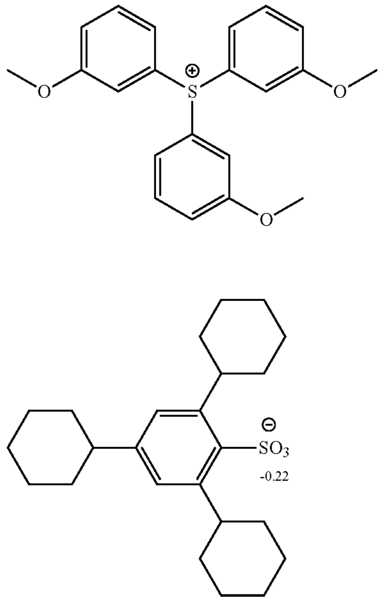
B-33
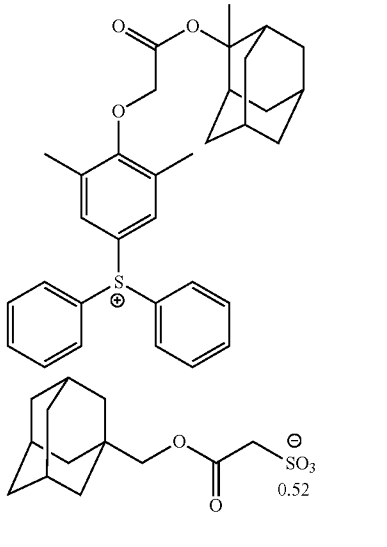

-continued
B-34
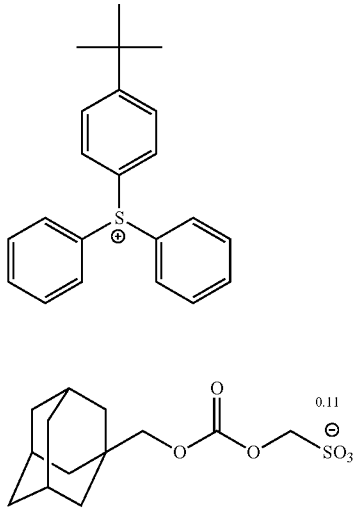
B-35
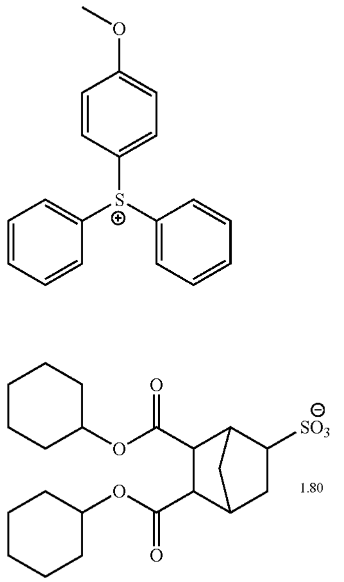
B-36
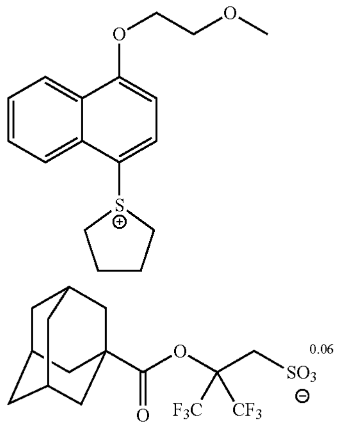
-continued
B-37
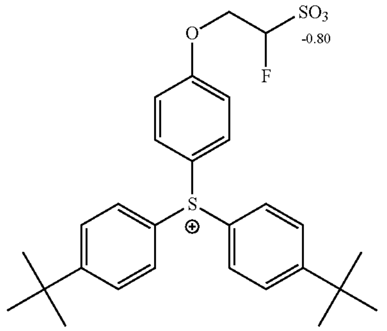
B-38
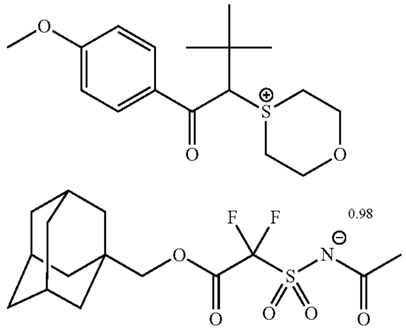
B-39
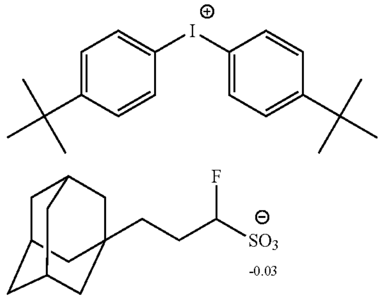
B-40
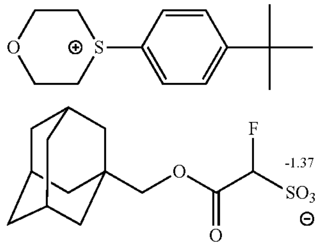
B-41
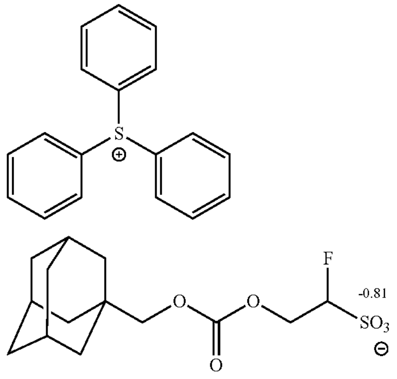

-continued
B-42
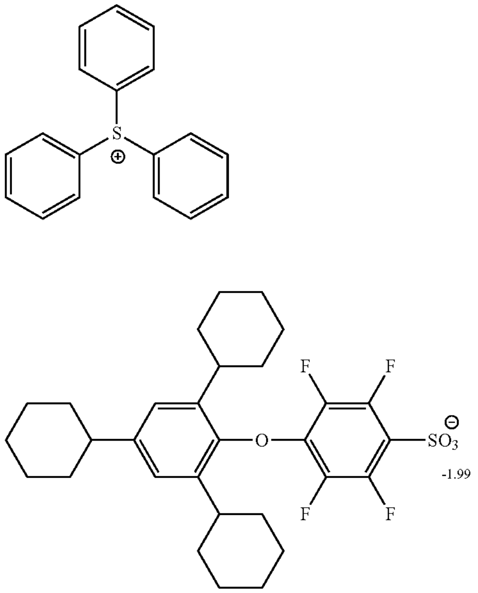
B-43
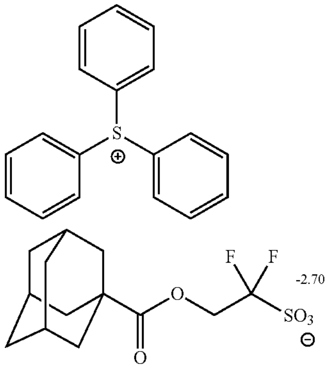
B-44
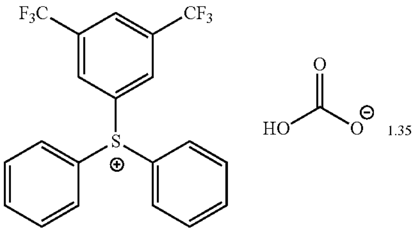
B-45
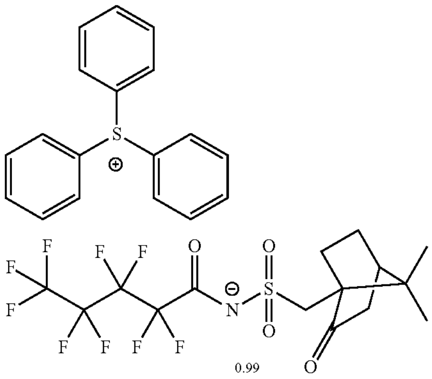
-continued
B-46
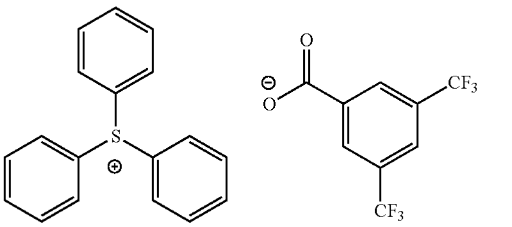
B-47
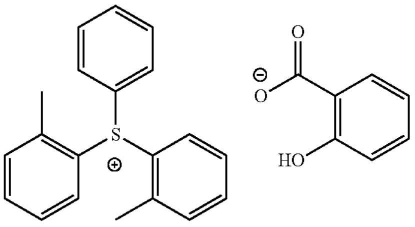
B-48
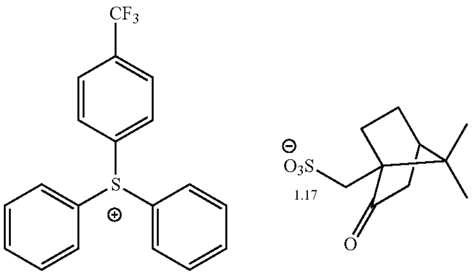
B-49
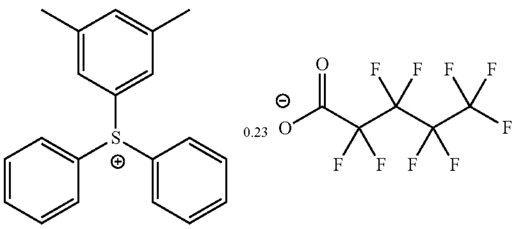
B-50
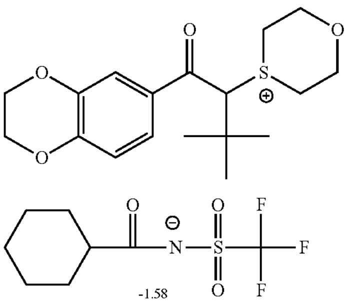
B-51
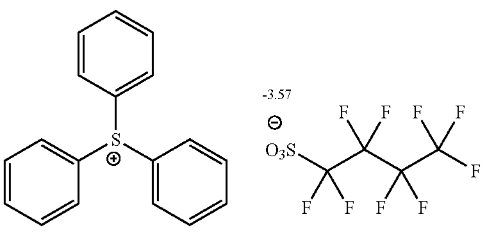

-continued
B-52
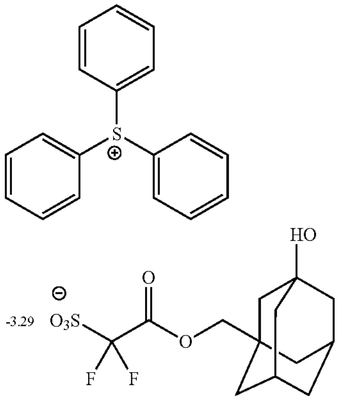
B-53
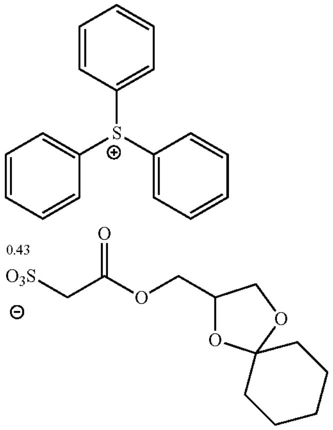
B-54
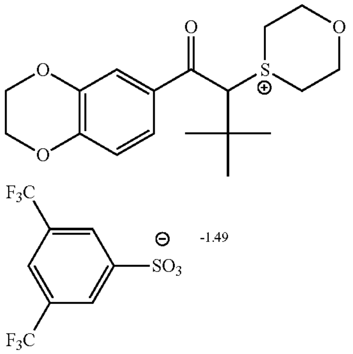
B-55
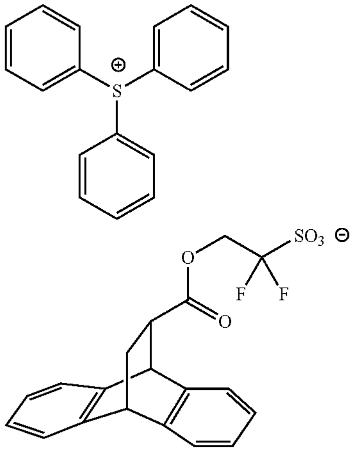
-continued
B-56
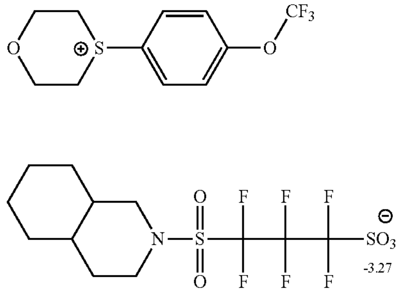
B-57
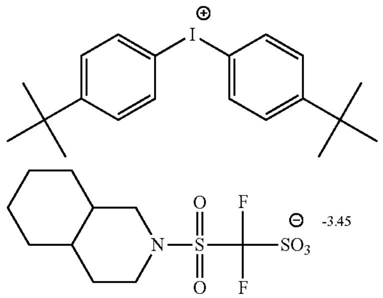
B-58
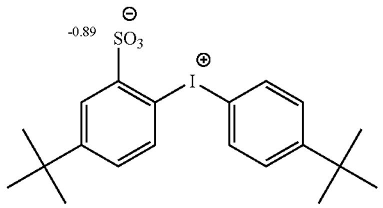
B-59
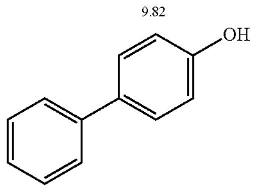
B-60
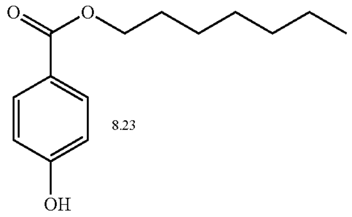
B-61
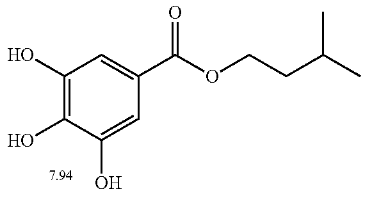
B-62
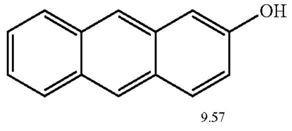

-continued
B-63
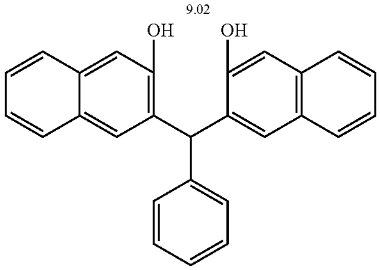
9.02
B-64
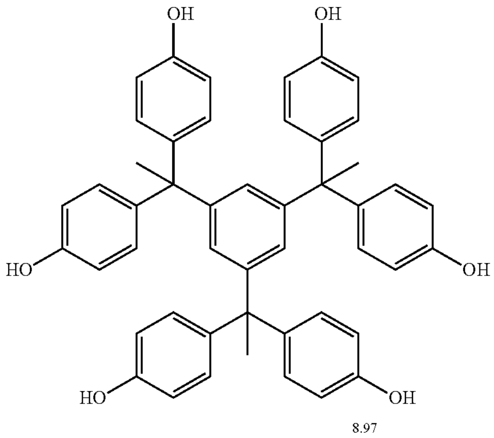
8.97
B-65
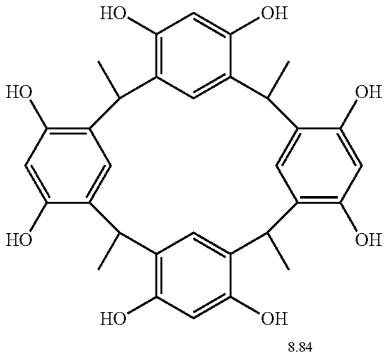
8.84
B-66
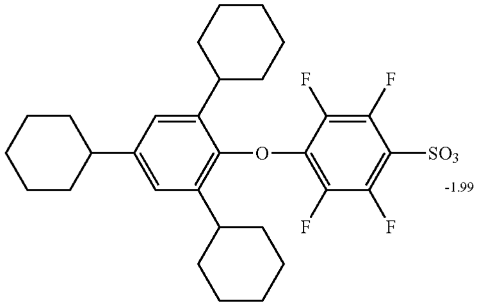
-1.99
-continued
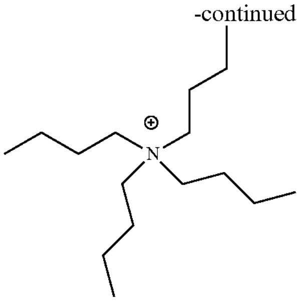
B-67
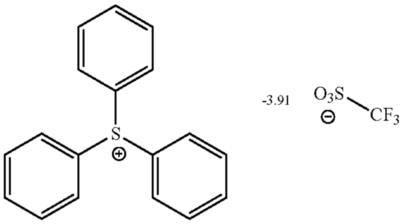
-3.91
[Other Additives]
The structures of such other additives used in the preparation of the resist composition are shown below.
C-1
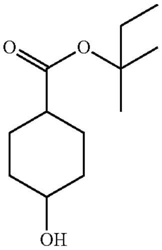
C-2
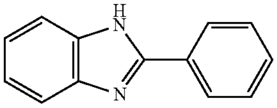
C-3
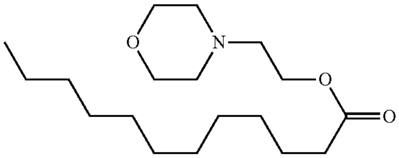
C-4
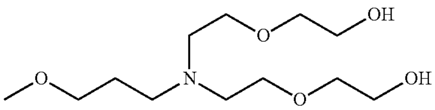
C-5
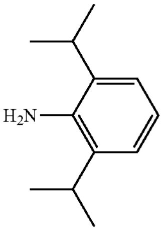

[Hydrophobic Resin]
The structure of a hydrophobic resin used for preparing the resist composition is shown below.
D-1
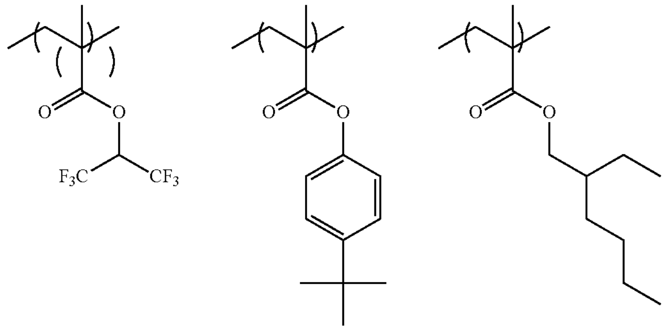
D-2
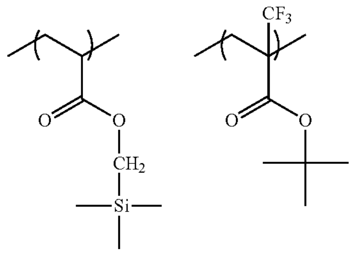
D-3
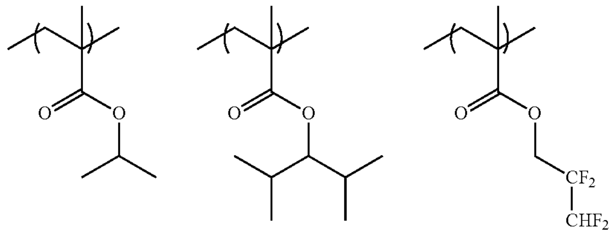
D-4
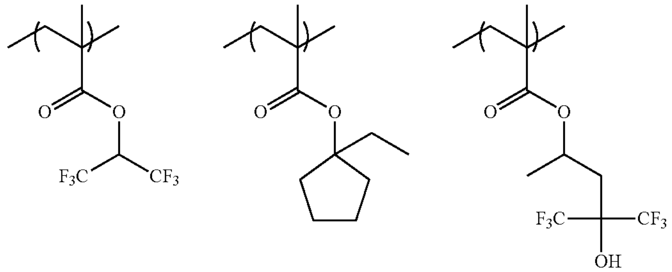
D-5
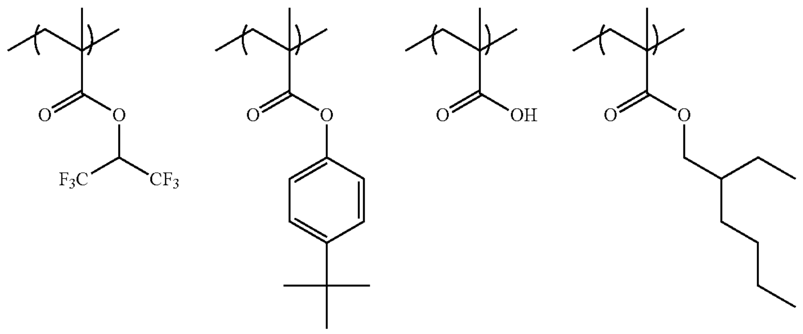

-continued

D-6

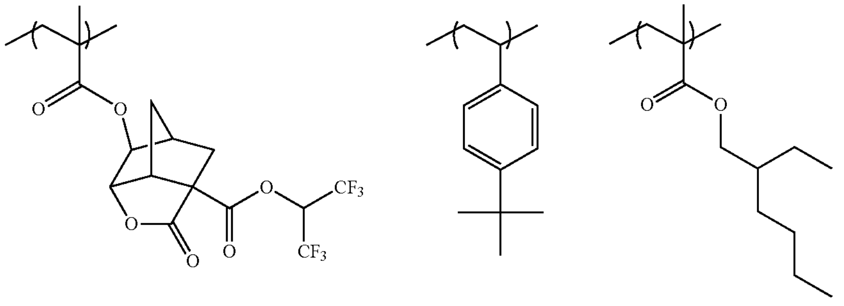

D-7

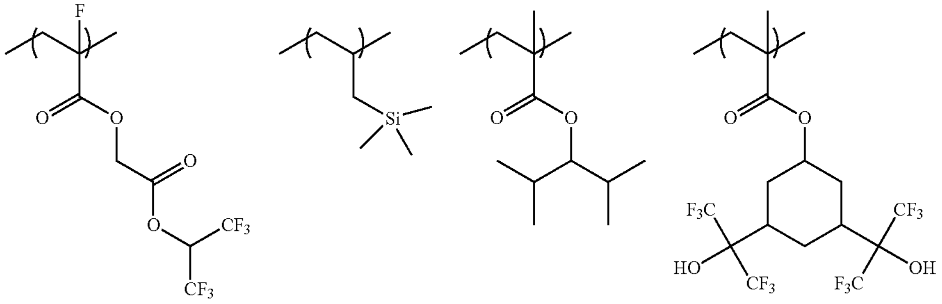

The compositional ratio (%-by-mass ratio; corresponding in order from the left) of the respective repeating units of the hydrophobic resin, the weight-average molecular weight (Mw), and the dispersity (Mw/Mn) are shown below.

Furthermore, the hydrophobic resin was synthesized according to the synthesis method of the resin A-1 (Synthesis Example 1).

TABLE 3

| Table 2 | Mass ratio of repeating units | | | | Mw | Mw/Mn |
|---|---|---|---|---|---|---|
| D-1 | 50 | 45 | 5 | — | 6,500 | 1.52 |
| D-2 | 50 | 50 | — | — | 25,000 | 1.65 |
| D-3 | 30 | 65 | 5 | — | 22,000 | 1.55 |
| D-4 | 40 | 40 | 20 | — | 12,000 | 1.68 |
| D-5 | 40 | 50 | 5 | 5 | 5,500 | 1.49 |
| D-6 | 90 | 8 | 2 | — | 12,000 | 1.63 |
| D-7 | 20 | 30 | 40 | 10 | 13,000 | 1.55 |

[Surfactant]

The surfactants used in the preparation of the resist composition are shown below.

H-1: MEGAFACE F176 (manufactured by DIC Corporation, fluorine-based surfactant)

H-2: MEGAFACE R08 (manufactured by DIC Corporation, fluorine- and silicon-based surfactant)

H-3: PF656 (manufactured by OMNOVA Solutions Inc., fluorine-based surfactant)

[Solvent]

The solvents used in the preparation of the resist composition are shown below.

G-1: Propylene glycol monomethyl ether acetate (PGMEA)

G-2: Propylene glycol monomethyl ether (PGME)

G-3: Propylene glycol monoethyl ether (PGEE)

G-4: Cyclohexanone

G-5: Cyclopentanone

G-6: 2-Heptanone

G-7: Ethyl lactate

G-8: γ-Butyrolactone

G-9: Propylene carbonate

[Preparation of Resist Composition]

The respective components shown in the following table were mixed so that the concentration of solid contents was 1.4% by mass. Next, the obtained mixed liquid was filtered initially through a polyethylene-made filter having a pore diameter of 50 nm, then through a nylon-made filter having a pore diameter of 10 nm, and lastly through a polyethylene-made filter having a pore diameter of 5 nm in this order to obtain resist compositions (Re-1 to Re-67 and Re'-1 to Re'-5). Furthermore, the solid content means all the components excluding the solvent. The obtained resist composition was used in Examples and Comparative Examples.

In the table, the "Amount" column shows the content (% by mass) of each solid content component with respect to the total solid content.

In the table, the "Mixing ratio" column for the solvent shows the mixing ratio (mass ratio) of each solvent.

TABLE 4

| Table | Solid content | | | | | | | | | | Solvent | |
|---|---|---|---|---|---|---|---|---|---|---|---|---|
| | Resin | | Additive B | | Other additives | | Hydrophobic resin | | Surfactant | | | Mixing ratio |
| 3-1 | Type | Amount | Type | Amount | Type | Amount | Type | Amount | Type | Amount | Type | (mass ratio) |
| Re-1 | A-1 | 85.0 | B-1 | 15.0 | — | — | — | — | — | — | G-1/G-2 | 80/20 |
| Re-2 | A-2 | 56.5 | B-2 | 40.2 | — | — | D-1 | 3.3 | — | — | G-1/G-5 | 85/15 |
| Re-3 | A-3 | 77.7 | B-3 | 22.3 | — | — | — | — | — | — | G-1/G-2 | 80/20 |
| Re-4 | A-4 | 95.0 | B-4 | 5.0 | — | — | — | — | — | — | G-1/G-2/G-8 | 40/20/40 |
| Re-5 | A-5 | 88.0 | B-5 | 12.0 | — | — | — | — | — | — | G-1/G-2 | 80/20 |
| Re-6 | A-6 | 63.7 | B-6 | 28.0 | C-1 | 4.3 | D-2 | 4 | — | — | G-1/G-9 | 85/15 |
| Re-7 | A-7 | 84.9 | B-7 | 15.0 | — | — | — | — | H-1 | 0.1 | G-1/G-7 | 90/10 |
| Re-8 | A-8 | 90.0 | B-8 | 10.0 | — | — | — | — | — | — | G-1/G-2 | 80/20 |
| Re-9 | A-9 | 34.5 | B-9 | 65.5 | — | — | — | — | — | — | G-1/G-2 | 80/20 |
| Re-10 | A-10 | 87.2 | B-10 | 10.0 | C-2 | 2.8 | — | — | — | — | G-1/G-2/G-6 | 70/20/10 |
| Re-11 | A-11 | 85.5 | B-11 | 14.5 | — | — | — | — | — | — | G-1/G-2 | 80/20 |
| Re-12 | A-12 | 47.6 | B-12 | 45.8 | — | — | D-3 | 6.6 | — | — | G-1/G-4 | 80/20 |
| Re-13 | A-13 | 94.0 | B-13 | 6.0 | — | — | — | — | — | — | G-1/G-2 | 80/20 |
| Re-14 | A-14 | 75.7 | B-14 | 12.0 | C-3 | 12.2 | — | — | H-2 | 0.1 | G-4 | 100 |
| Re-15 | A-15 | 66.1 | B-15 | 33.9 | — | — | — | — | — | — | G-1/G-5 | 85/15 |
| Re-16 | A-16 | 88.0 | B-16 | 12.0 | — | — | — | — | — | — | G-1/G-2 | 80/20 |
| Re-17 | A-17 | 63.5 | B-17 | 26.0 | C-4 | 10.5 | — | — | — | — | G-1/G-3 | 75/25 |
| Re-18 | A-18 | 92.0 | B-18 | 8.0 | — | | — | — | — | — | G-1/G-2/G-8 | 34/33/33 |
| Re-19 | A-19 | 67.5 | B-19 | 11.3 | C-5 | 21.2 | — | — | — | — | G-1/G-2 | 80/20 |
| Re-20 | A-20 | 93.5 | B-20 | 6.5 | — | — | — | — | — | — | G-1/G-2 | 80/20 |
| Re-21 | A-21 | 62.0 | B-21 | 22.0 | C-1 | 10.5 | — | — | — | — | G-1/G-6 | 80/20 |
| | | | | | C-2 | 5.5 | | | | | | |
| Re-22 | A-22 | 93.9 | B-22 | 6.0 | — | — | — | — | H-3 | 0.1 | G-1/G-8 | 85/15 |
| Re-23 | A-23 | 85.9 | B-23 | 12.0 | — | — | D-4 | 2.1 | — | — | G-1/G-2/G-8 | 80/15/5 |
| Re-24 | A-24 | 89.5 | B-24 | 8.0 | — | — | D-5 | 2.5 | — | — | G-1/G-2 | 80/20 |
| Re-25 | A-25 | 84.9 | B-25 | 15.1 | — | — | — | — | — | — | G-1/G-7 | 90/10 |
| Re-26 | A-26 | 82.0 | B-26 | 18.0 | — | — | — | — | — | — | G-1/G-4 | 80/20 |
| Re-27 | A-27 | 44.8 | B-27 | 55.2 | — | — | — | — | — | — | G-1/G-2 | 80/20 |
| Re-28 | A-28 | 35.4 | B-28 | 64.5 | — | — | — | — | H-3 | 0.1 | G-4 | 100 |
| Re-29 | A-29 | 27.9 | B-29 | 72.1 | — | — | — | — | — | — | G-1/G-5 | 85/15 |
| Re-30 | A-30 | 75.0 | B-30 | 20.0 | — | — | — | — | — | — | G-1/G-2 | 80/20 |
| | | | B-63 | 5.0 | | | | | | | | |
| Re-31 | A-31 | 79.9 | B-31 | 15.0 | — | — | — | — | H-1 | 0.1 | G-1/G-3 | 75/25 |
| | | | B-65 | 5.0 | | | | | | | | |
| Re-32 | A-32 | 85.0 | B-32 | 15.0 | — | — | — | — | — | — | G-1/G-2/G-8 | 40/20/40 |
| Re-33 | A-33 | 79.8 | B-33 | 15.0 | — | — | D-6 | 5.2 | — | — | G-1/G-2 | 80/20 |
| Re-34 | A-34 | 85.0 | B-34 | 15.0 | — | — | — | — | — | — | G-1/G-2 | 80/20 |
| Re-35 | A-35 | 77.9 | B-35 | 22.1 | — | — | — | — | — | — | G-1/G-2 | 80/20 |

TABLE 5

| Table | Solid content | | | | | | | | | | Solvent | |
|---|---|---|---|---|---|---|---|---|---|---|---|---|
| | Resin | | Additive B | | Other additives | | Hydrophobic resin | | Surfactant | | | Mixing ratio |
| 3-2 | Type | Amount | Type | Amount | Type | Amount | Type | Amount | Type | Amount | Type | (mass ratio) |
| Re-36 | A-36 | 76.1 | B-36 | 17.8 | — | — | D-7 | 6.1 | — | — | G-1/G-9 | 85/15 |
| Re-37 | A-37 | 80.5 | B-37 | 19.5 | — | — | — | — | — | — | G-1/G-7 | 90/10 |
| Re-38 | A-38 | 85.7 | B-38 | 14.3 | — | — | — | — | — | — | G-1/G-2 | 80/20 |
| Re-39 | A-39 | 80.5 | B-39 | 19.5 | — | — | — | — | — | — | G-1/G-7 | 90/10 |
| Re-40 | A-40 | 79.7 | B-40 | 20.3 | — | — | — | — | — | — | G-I/G-4 | 80/20 |
| Re-41 | A-41 | 90.1 | B-41 | 9.9 | — | — | — | — | — | — | G-1/G-2 | 80/20 |
| Re-42 | A-42 | 81.5 | B-42 | 18.5 | — | — | — | — | — | — | G-1/G-2 | 80/20 |
| Re-43 | A-43 | 82.4 | B-43 | 17.6 | — | — | — | — | — | — | G-1/G-2/G-8 | 34/33/33 |
| Re-44 | A-44 | 85.5 | B-44 | 14.5 | — | — | — | — | — | — | G-1/G-2 | 80/20 |
| Re-45 | A-45 | 54.8 | B-45 | 45.2 | — | — | — | — | — | — | G-1/G-9 | 85/15 |
| Re-46 | A-46 | 66.7 | B-46 | 33.3 | — | — | — | — | — | — | G-1/G-7 | 90/10 |
| Re-47 | A-47 | 80.0 | B-47 | 15.0 | — | — | — | — | — | — | G-1/G-2 | 80/20 |
| | | | B-64 | 5.0 | | | | | | | | |
| Re-48 | A-48 | 80.6 | B-48 | 19.4 | — | — | — | — | — | — | G-1/G-2 | 80/20 |
| Re-49 | A-49 | 76.9 | B-49 | 22.5 | C-1 | 0.6 | — | — | — | — | G-1/G-2/G-8 | 34/33/33 |
| Re-50 | A-50 | 47.9 | B-50 | 52.1 | — | — | — | — | — | — | G-1/G-7 | 90/10 |
| Re-51 | A-51 | 69.5 | B-51 | 30.5 | — | — | — | — | — | — | G-I/G-4 | 80/20 |
| Re-52 | A-52 | 82.5 | B-52 | 17.5 | — | — | — | — | — | — | G-1/G-2 | 80/20 |
| Re-53 | A-53 | 85.5 | B-53 | 14.5 | — | — | — | — | — | — | G-1/G-2 | 80/20 |
| Re-54 | A-54 | 89.5 | B-54 | 10.5 | — | — | — | — | — | — | G-1/G-2 | 80/20 |
| Re-55 | A-55 | 82.4 | B-55 | 17.6 | — | — | — | — | — | — | G-1/G-2/G-8 | 40/20/40 |
| Re-56 | A-56 | 84.4 | B-56 | 15.6 | — | — | — | — | — | — | G-1/G-7 | 90/10 |

TABLE 5-continued

| Table | Solid content | | | | | | | | | | Solvent | |
|---|---|---|---|---|---|---|---|---|---|---|---|---|
| | Resin | | Additive B | | Other additives | | Hydrophobic resin | | Surfactant | | | Mixing ratio |
| 3-2 | Type | Amount | Type | Amount | Type | Amount | Type | Amount | Type | Amount | Type | (mass ratio) |
| Re-57 | A-57 | 82.5 | B-57 | 17.5 | — | — | — | — | — | — | G-I/G-4 | 80/20 |
| Re-58 | A-58 | 85.1 | B-58 | 14.9 | — | — | — | — | — | — | G-1/G-2 | 80/20 |
| Re-59 | A-59 | 77.3 | B-59 | 22.7 | — | — | — | — | — | — | G-1/G-2 | 80/20 |
| Re-60 | A-60 | 68.8 | B-60 | 31.2 | — | — | — | — | — | — | G-1/G-2/G-8 | 34/33/33 |
| Re-61 | A-61 | 80.5 | B-61 | 19.5 | — | — | — | — | — | — | G-1/G-2 | 80/20 |
| Re-62 | A-62 | 75.9 | B-62 | 24.1 | — | — | — | — | — | — | G-1/G-9 | 85/15 |
| Re-63 | A-63 | 79.8 | B-63 | 20.2 | — | — | — | — | — | — | G-1/G-7 | 90/10 |
| Re-64 | A-64 | 78.6 | B-64 | 21.4 | — | — | — | — | — | — | G-1/G-2 | 80/20 |
| Re-65 | A-65 | 77.5 | B-65 | 22.5 | — | — | — | — | — | — | G-1/G-2/G-8 | 40/20/40 |
| Re-66 | A-66 | 78.5 | B-66 | 21.5 | — | — | — | — | — | — | G-1/G-2 | 80/20 |
| Re-67 | A-67 | 66.7 | B-46 | 33.3 | — | — | — | — | — | — | G-1/G-2 | 80/20 |
| Re'-1 | A'-1 | 66.7 | B-67 | 33.3 | — | — | — | — | — | — | G-1/G-2 | 80/20 |
| Re'-2 | A'-2 | 66.7 | B-46 | 33.3 | — | — | — | — | — | — | G-1/G-2 | 80/20 |
| Re'-3 | A'-3 | 66.7 | B-46 | 33.3 | — | — | — | — | — | — | G-1/G-2 | 80/20 |
| Re'-4 | A'-4 | 66.7 | B-46 | 33.3 | — | — | — | — | — | — | G-1/G-2 | 80/20 |
| Re'-5 | A-1 | 100.0 | — | — | — | — | | — | — | — | G-1/G-2 | 80/20 |

[Tests]

[Pattern Formation (1): EUV Exposure and Organic Solvent Development]

<Pattern Formation>

A composition for forming an underlayer film, AL412 (manufactured by Brewer Science, Inc.) was applied onto a silicon wafer having a diameter of 12 inches and baked at 205° C. for 60 seconds to form an underlying film having a film thickness of 20 nm. The resist composition prepared as mentioned above was applied thereon and baked at 100° C. for 60 seconds to form a resist film having a film thickness of 20 nm.

The film was exposed through a reflective type mask with a line size of 20 nm and a line:space of 1:1, using an EUV exposure machine (manufactured by ASML; NXE3350, NA 0.33, Dipole 450, outer sigma 0.87, inner sigma 0.60).

Then, in Examples 1-1 to 1-67 and Comparative Examples 1-1 to 1-5, heating (PEB) was performed at 100° C. for 60 seconds. This step was omitted in Examples 1-68 to 1-134 and Comparative Examples 1-6 to 1-10.

Next, a negative tone pattern with a line size of 20 nm and a line:space of 1:1 was formed by performing development with n-butyl acetate for 30 seconds and rotating the wafer at a rotation speed of 2,000 rpm for 40 seconds.

<Evaluation of Defect Suppressing Properties>

The defect suppressing properties of the resist composition were evaluated according to the following evaluation standard by counting the number of defects per silicon wafer of the patterns obtained by the above-mentioned methods, using UVision5 (manufactured by AMAT) and SEMVisionG4 (manufactured by AMAT). The smaller the number of defects, the better the defect suppressing properties.

"A": The number of defects is 50 or less

"B": The number of defects is more than 50 and 100 or less

"C": The number of defects is more than 100 and 200 or less

"D": The number of defects is more than 200 and 300 or less

"E": The number of defects is more than 300 and 400 or less

"F": The number of defects is more than 400 and 500 or less

"G": The number of defects is more than 500 and 600 or less

"H": The number of defects is more than 600

<Evaluation of Resolution (Limit Resolution, nm)>

In the pattern forming method, the exposure was performed at an optimum exposure amount Eop (μC/$cm^2$) (an exposure amount in which a pattern formed using the resist composition reproduces a pattern of a mask used for exposure).

Next, a test of forming a line-and-space pattern was carried out by gradually changing the exposure amount from the optimum exposure amount Eop. At this time, the minimum dimension of a pattern which was resolved without collapsing was determined using a critical dimension scanning electron microscope (SEM (S-9380II, Hitachi, Ltd.)). This was defined as a "limit resolution (nm)". The smaller the limit resolution value, the better the resolution.

In addition, the limit resolution (nm) is preferably 18.0 nm or less, 17.0 nm or less, 16.0 nm or less, 15.0 nm or less, 14.0 nm or less, 13.0 nm or less, and 12.0 nm or less in this order.

<Results>

The evaluation results are shown in the following table.

In the table, the "Resist composition" column shows the type of a resist composition used.

The "Amount of repeating unit a1" column shows the content (% by mole) of the repeating unit a1 contained in the resin A included in the resist composition used with respect to all the repeating units of the resin A.

The "Amount of acid-decomposable repeating unit" column shows the content (% by mole) of a repeating unit having an acid-decomposable group contained in the resin A included in the resist composition used with respect to all the repeating units of the resin A. Furthermore, the repeating unit having an acid-decomposable group is other than the repeating unit a1.

The "SP Value of 18.0 or more" column shows whether or not the SP values of substantially all the repeating units constituting the resin A included in the resist composition used are 18.0 $MPa^{0.5}$ or more. A case where the present requirements were satisfied was described as A and a case where the present requirements were not satisfied was described as B.

The "Lactone-containing repeating unit" column shows whether or not the resin A included in the resist composition used has a repeating unit having a lactone group. A case where the present requirements were satisfied was described as A and a case where the present requirements were not satisfied was described as B.

The "PEB" column shows whether or not post exposure bake (PEB) was performed in the formation of a pattern. A case where the present requirements were satisfied was described as A and a case where the present requirements were not satisfied was described as B.

TABLE 6

| | | Characteristics of resist composition | | | | | Results | |
|---|---|---|---|---|---|---|---|---|
| Table 4-1 | Resist composition | Amount of repeating unit a1 | Amount of acid-decomposable repeating unit | SP value of 18.0 or more | Lactone-containing repeating unit | PEB | Defect suppressing properties | Limit Resolution (nm) |
| Example 1-1 | Re-1 | 20 | 30 | B | A | A | D | 14.4 |
| Example 1-2 | Re-2 | 35 | 35 | B | A | A | D | 14.5 |
| Example 1-3 | Re-3 | 30 | 20 | B | A | A | C | 13.4 |
| Example 1-4 | Re-4 | 40 | 30 | B | A | A | C | 13.5 |
| Example 1-5 | Re-5 | 20 | 40 | B | A | A | D | 14.2 |
| Example 1-6 | Re-6 | 50 | 10 | B | A | A | B | 12.5 |
| Example 1-7 | Re-7 | 45 | 15 | B | A | A | B | 12.4 |
| Example 1-8 | Re-8 | 50 | 10 | B | B | A | C | 13.5 |
| Example 1-9 | Re-9 | 25 | 20 | B | B | A | D | 14.7 |
| Example 1-10 | Re-10 | 35 | 10 | B | B | A | D | 14.8 |
| Example 1-11 | Re-11 | 30 | 30 | B | B | A | E | 15.4 |
| Example 1-12 | Re-12 | 35 | 5 | B | B | A | D | 14.5 |
| Example 1-13 | Re-13 | 35 | 15 | B | A | A | C | 13.6 |
| Example 1-14 | Re-14 | 40 | 10 | B | B | A | C | 13.4 |
| Example 1-15 | Re-15 | 60 | 20 | B | B | A | C | 13.3 |
| Example 1-16 | Re-16 | 55 | 10 | B | A | A | B | 12.3 |
| Example 1-17 | Re-17 | 70 | 5 | B | B | A | C | 13.8 |
| Example 1-18 | Re-18 | 55 | 10 | B | A | A | B | 12.8 |
| Example 1-19 | Re-19 | 40 | 15 | B | B | A | C | 13.7 |
| Example 1-20 | Re-20 | 45 | 10 | B | B | A | C | 13.5 |
| Example 1-21 | Re-21 | 25 | 25 | B | B | A | E | 15.7 |
| Example 1-22 | Re-22 | 80 | 5 | A | B | A | B | 12.5 |
| Example 1-23 | Re-23 | 25 | 25 | B | A | A | D | 14.4 |
| Example 1-24 | Re-24 | 35 | 25 | B | A | A | D | 14.2 |
| Example 1-25 | Re-25 | 50 | 50 | B | B | A | D | 14.5 |
| Example 1-26 | Re-26 | 40 | 40 | A | A | A | B | 12.4 |
| Example 1-27 | Re-27 | 45 | 5 | A | A | A | A | 11.5 |
| Example 1-28 | Re-28 | 50 | 10 | B | A | A | B | 12.5 |
| Example 1-29 | Re-29 | 60 | 10 | B | B | A | C | 13.4 |
| Example 1-30 | Re-30 | 25 | 50 | B | B | A | E | 15.8 |
| Example 1-31 | Re-31 | 30 | 40 | B | A | A | D | 14.8 |
| Example 1-32 | Re-32 | 50 | 10 | B | A | A | B | 12.4 |

TABLE 6-continued

| Table 4-1 | Resist composition | Characteristics of resist composition: Amount of repeating unit a1 | Amount of acid-decomposable repeating unit | SP value of 18.0 or more | Lactone-containing repeating unit | PEB | Results: Defect suppressing properties | Limit Resolution (nm) |
|---|---|---|---|---|---|---|---|---|
| Example 1-33 | Re-33 | 40 | 10 | B | B | A | C | 13.3 |
| Example 1-34 | Re-34 | 35 | 25 | A | A | A | C | 13.9 |
| Example 1-35 | Re-35 | 35 | 15 | B | B | A | D | 14.3 |

TABLE 7

| Table 4-2 | Resist composition | Characteristics of resist compsition: Amount of repeating unit a1 | Amount of acid-decomposable repeating unit | SP value of 18.0 or more | Lactone-containing repeating unit | PEB | Results: Defect suppressing properties | Limit Resolution (nm) |
|---|---|---|---|---|---|---|---|---|
| Example 1-36 | Re-36 | 40 | 0 | A | A | A | A | 11.8 |
| Example 1-37 | Re-37 | 50 | 0 | A | A | A | A | 11.3 |
| Example 1-38 | Re-38 | 45 | 0 | A | A | A | A | 11.2 |
| Example 1-39 | Re-39 | 55 | 0 | B | B | A | C | 13.7 |
| Example 1-40 | Re-40 | 60 | 0 | A | A | A | A | 11.5 |
| Example 1-41 | Re-41 | 70 | 0 | B | B | A | C | 13.6 |
| Example 1-42 | Re-42 | 55 | 0 | B | B | A | C | 13.4 |
| Example 1-43 | Re-43 | 55 | 0 | A | A | A | A | 11.6 |
| Example 1-44 | Re-44 | 70 | 0 | A | B | A | B | 12.2 |
| Example 1-45 | Re-45 | 80 | 0 | A | B | A | B | 12.7 |
| Example 1-46 | Re-46 | 35 | 0 | A | A | A | B | 12.6 |
| Example 1-47 | Re-47 | 45 | 0 | A | A | A | A | 11.5 |
| Example 1-48 | Re-48 | 50 | 0 | B | A | A | B | 12.4 |
| Example 1-49 | Re-49 | 50 | 0 | A | A | A | A | 11.3 |
| Example 1-50 | Re-50 | 70 | 0 | A | B | A | B | 12.8 |
| Example 1-51 | Re-51 | 60 | 0 | A | A | A | A | 11.7 |
| Example 1-52 | Re-52 | 55 | 0 | A | B | A | B | 12.4 |
| Example 1-53 | Re-53 | 70 | 0 | B | A | A | B | 12.9 |
| Example 1-54 | Re-54 | 90 | 0 | A | B | A | B | 12.5 |
| Example 1-55 | Re-55 | 55 | 0 | B | A | A | B | 12.6 |
| Example 1-56 | Re-56 | 80 | 0 | A | B | A | B | 12.4 |
| Example 1-57 | Re-57 | 75 | 0 | A | A | A | A | 11.4 |
| Example 1-58 | Re-58 | 70 | 0 | A | A | A | A | 11.5 |
| Example 1-59 | Re-59 | 80 | 0 | A | B | A | B | 12.2 |
| Example 1-60 | Re-60 | 75 | 0 | A | A | A | A | 11.5 |
| Example 1-61 | Re-61 | 100 | 0 | A | B | A | B | 12.4 |

TABLE 7-continued

| Table 4-2 | Resist composition | Characteristics of resist compsition: Amount of repeating unit a1 | Amount of acid-decomposable repeating unit | SP value of 18.0 or more | Lactone-containing repeating unit | PEB | Results: Defect suppressing properties | Limit Resolution (nm) |
|---|---|---|---|---|---|---|---|---|
| Example 1-62 | Re-62 | 100 | 0 | A | B | A | B | 12.6 |
| Example 1-63 | Re-63 | 100 | 0 | A | B | A | B | 12.5 |
| Example 1-64 | Re-64 | 100 | 0 | A | B | A | B | 12.7 |
| Example 1-65 | Re-65 | 100 | 0 | A | B | A | B | 12.3 |
| Example 1-66 | Re-66 | 100 | 0 | A | B | A | B | 12.4 |
| Example 1-67 | Re-67 | 100 | 0 | A | B | A | B | 12.3 |
| Comparative Example 1-1 | Re'-1 | 30 | 0 | A | B | A | H | 19.2 |
| Comparative Example 1-2 | Re'-2 | 10 | 27 | A | B | A | H | 18.8 |
| Comparative Example 1-3 | Re'-3 | — | 50 | B | B | A | H | 18.9 |
| Comparative Example 1-4 | Re'-4 | — | 0 | A | B | A | Non-resolution | Non-resolution |
| Comparative Example 1-5 | Re'-5 | 20 | 30 | B | A | A | H | 19.1 |

TABLE 8

| Table 4-3 | Resist composition | Characteristics of resist composition: Amount of repeating unit a1 | Amount of acid-decomposable repeating unit | SP value of 18.0 or more | Lactone-containing repeating unit | PEB | Results: Defect suppressing properties | Limit Resolution (nm) |
|---|---|---|---|---|---|---|---|---|
| Example 1-68 | Re-1 | 20 | 30 | B | A | B | F | 16.2 |
| Example 1-69 | Re-2 | 35 | 35 | B | A | B | F | 16.4 |
| Example 1-70 | Re-3 | 30 | 20 | B | A | B | D | 14.4 |
| Example 1-71 | Re-4 | 40 | 30 | B | A | B | D | 14.6 |
| Example 1-72 | Re-5 | 20 | 40 | B | A | B | F | 16.5 |
| Example 1-73 | Re-6 | 50 | 10 | B | A | B | B | 12.5 |
| Example 1-74 | Re-7 | 45 | 15 | B | A | B | B | 12.4 |
| Example 1-75 | Re-8 | 50 | 10 | B | B | B | C | 13.5 |
| Example 1-76 | Re-9 | 25 | 20 | B | B | B | E | 15.5 |
| Example 1-77 | Re-10 | 35 | 10 | B | B | B | E | 15.4 |
| Example 1-78 | Re-11 | 30 | 30 | B | B | B | G | 17.5 |
| Example 1-79 | Re-12 | 35 | 5 | B | B | B | E | 15.3 |
| Example 1-80 | Re-13 | 35 | 15 | B | A | B | D | 14.8 |
| Example 1-81 | Re-14 | 40 | 10 | B | B | B | C | 13.2 |
| Example 1-82 | Re-15 | 60 | 20 | B | B | B | C | 13.6 |
| Example 1-83 | Re-16 | 55 | 10 | B | A | B | B | 12.6 |
| Example 1-84 | Re-17 | 70 | 5 | B | B | B | C | 13.7 |
| Example 1-85 | Re-18 | 55 | 10 | B | A | B | B | 12.3 |
| Example 1-86 | Re-19 | 40 | 15 | B | B | B | C | 13.5 |
| Example 1-87 | Re-20 | 45 | 10 | B | B | B | C | 13.4 |
| Example 1-88 | Re-21 | 25 | 25 | B | B | B | G | 17.4 |
| Example 1-89 | Re-22 | 80 | 5 | A | B | B | B | 2.4 |
| Example 1-90 | Re-23 | 25 | 25 | B | A | B | F | 16.2 |
| Example 1-91 | Re-24 | 35 | 25 | B | A | B | F | 16.7 |
| Example 1-92 | Re-25 | 50 | 50 | B | B | B | E | 15.5 |
| Example 1-93 | Re-26 | 40 | 40 | A | A | B | B | 12.7 |
| Example 1-94 | Re-27 | 45 | 5 | A | A | B | A | 11.5 |
| Example 1-95 | Re-28 | 50 | 10 | B | A | B | B | 12.6 |
| Example 1-96 | Re-29 | 60 | 10 | B | B | B | C | 13.6 |
| Example 1-97 | Re-30 | 25 | 50 | B | B | B | G | 17.2 |
| Example 1-98 | Re-31 | 30 | 40 | B | A | B | F | 16.8 |
| Example 1-99 | Re-32 | 50 | 10 | B | A | B | B | 12.2 |
| Example 1-100 | Re-33 | 40 | 10 | B | B | B | C | 13.5 |
| Example 1-101 | Re-34 | 35 | 25 | A | A | B | E | 15.4 |
| Example 1-102 | Re-35 | 35 | 15 | B | B | B | E | 15.8 |

TABLE 9

| Table 4-4 | Resist composition | Characteristics of resist composition: Amount of repeating unit a1 | Amount of acid-decomposable repeating unit | SP value of 18.0 or more | Lactone-containing repeating unit | PEB | Results: Defect suppressing properties | Limit Resolution (nm) |
|---|---|---|---|---|---|---|---|---|
| Example 1-103 | Re-36 | 40 | 0 | A | A | B | A | 11.1 |
| Example 1-104 | Re-37 | 50 | 0 | A | A | B | A | 11.2 |
| Example 1-105 | Re-38 | 45 | 0 | A | A | B | A | 11.2 |
| Example 1-106 | Re-39 | 55 | 0 | B | B | B | C | 13.7 |
| Example 1-107 | Re-40 | 60 | 0 | A | A | B | A | 11.4 |
| Example 1-108 | Re-41 | 70 | 0 | B | B | B | C | 13.2 |
| Example 1-109 | Re-42 | 55 | 0 | B | B | B | C | 13.6 |
| Example 1-110 | Re-43 | 55 | 0 | A | A | B | A | 11.3 |
| Example 1-111 | Re-44 | 70 | 0 | A | B | B | B | 12.1 |
| Example 1-112 | Re-45 | 80 | 0 | A | B | B | B | 12.4 |
| Example 1-113 | Re-46 | 35 | 0 | A | A | B | C | 13.4 |
| Example 1-114 | Re-47 | 45 | 0 | A | A | B | A | 11.3 |
| Example 1-115 | Re-48 | 50 | 0 | B | A | B | B | 12.2 |
| Example 1-116 | Re-49 | 50 | 0 | A | A | B | A | 11.4 |
| Example 1-117 | Re-50 | 70 | 0 | A | B | B | B | 12.5 |
| Example 1-118 | Re-51 | 60 | 0 | A | A | B | A | 11.6 |
| Example 1-119 | Re-52 | 55 | 0 | A | B | B | B | 12.2 |
| Example 1-120 | Re-53 | 70 | 0 | B | A | B | B | 12.4 |
| Example 1-121 | Re-54 | 90 | 0 | A | B | B | B | 12.3 |
| Example 1-122 | Re-55 | 55 | 0 | B | A | B | B | 12.3 |
| Example 1-123 | Re-56 | 80 | 0 | A | B | B | B | 12.4 |
| Example 1-124 | Re-57 | 75 | 0 | A | A | B | A | 11.2 |
| Example 1-125 | Re-58 | 70 | 0 | A | A | B | A | 11.4 |
| Example 1-126 | Re-59 | 80 | 0 | A | B | B | B | 12.5 |
| Example 1-127 | Re-60 | 75 | 0 | A | A | B | A | 11.1 |
| Example 1-128 | Re-61 | 100 | 0 | A | B | B | B | 12.5 |
| Example 1-129 | Re-62 | 100 | 0 | A | B | B | B | 12.4 |
| Example 1-130 | Re-63 | 100 | 0 | A | B | B | B | 12.3 |
| Example 1-131 | Re-64 | 100 | 0 | A | B | B | B | 12.6 |
| Example 1-132 | Re-65 | 100 | 0 | A | B | B | B | 12.4 |
| Example 1-133 | Re-66 | 100 | 0 | A | B | B | B | 12.7 |
| Example 1-134 | Re-67 | 100 | 0 | A | B | B | B | 12.4 |
| Comparative Example 1-6 | Re'-1 | 30 | 0 | A | B | B | Non-resolution | Non-resolution |
| Comparative Example 1-7 | Re'-2 | 10 | 27 | A | B | B | Non-resolution | Non-resolution |
| Comparative Example 1-8 | Re'-3 | — | 50 | B | B | B | Non-resolution | Non-resolution |
| Comparative Example 1-9 | Re'-4 | — | 0 | A | B | B | Non-resolution | Non-resolution |
| Comparative Example 1-10 | Re'-5 | 20 | 30 | B | A | B | H | 19.8 |

From the results shown in the table, it was confirmed that in a case where a pattern was formed by organic solvent development using the resist composition of the embodiment of the present invention, the defect performance (defect suppressing properties) and the resolution were excellent. On the other hand, these performances are insufficient in the resist compositions of Comparative Examples which do not correspond to the resist composition of the embodiment of the present invention.

In addition, the greater the number satisfying each requirement, of a requirement that the amount of the repeating unit at in the resin A is 40% by mole or more, a requirement that the amount of the repeating unit having an acid-decomposable group in the resin A is 20% by mole or less, a requirement that the SP values of substantially all the repeating units of the repeating unit are 18.0 $MPa^{0.5}$ or more, and a requirement that the resin A has a repeating unit having a lactone group, the more excellent the effect of the present invention (refer to a comparison between Examples in which PEB was performed, a comparison between Examples in which PEB was not performed, and the like).

[Pattern Formation (2): EUV Exposure and Alkali Development]

<Pattern Formation>

A composition for forming an underlayer film, AL412 (manufactured by Brewer Science, Inc.) was applied onto a silicon wafer having a diameter of 12 inches and baked at 205° C. for 60 seconds to form an underlying film having a film thickness of 20 nm. The resist composition prepared as mentioned above was applied thereon and baked at 100° C. for 60 seconds to form a resist film having a film thickness of 20 nm.

The film was exposed through a reflective type mask with a line size of 20 nm and a line:space of 1:1, using an EUV exposure machine (manufactured by ASML; NXE3350, NA 0.33, Dipole 45°, outer sigma 0.87, inner sigma 0.60).

Then, in Examples 2-1 to 2-67 and Comparative Examples 2-1 to 2-5, the wafer was heated (PEB) at 100° C. for 60 seconds. This step was omitted in Examples 2-68 to 2-134 and Comparative Examples 2-6 to 2-10.

Next, the wafer was developed with a 2.38% by mass aqueous tetramethylammonium hydroxide (TMAH) solution for 30 seconds and rinsed with water for 20 seconds. Subsequently, the wafer was rotated at a rotation speed of 2,000 rpm for 40 seconds to form a positive tone pattern with a line size of 20 nm and a line:space of 1:1.

Using the obtained positive tone pattern, the defect suppressing properties and the resolution properties were evaluated in the same manner as described above.

The evaluation results are shown in the following table.

The meaning of each column in the table is as described above.

TABLE 10

| Table 5-1 | Resist composition | Characteristics of resist composition: Amount of repeating unit a1 | Amount of acid-decomposable repeating unit | SP value of 18.0 or more | Lactone-containing repeating unit | PEB | Results: Defect suppressing properties | Limit Resolution (nm) |
|---|---|---|---|---|---|---|---|---|
| Example 2-1 | Re-1 | 20 | 30 | B | A | A | D | 14.5 |
| Example 2-2 | Re-2 | 35 | 35 | B | A | A | D | 14.4 |
| Example 2-3 | Re-3 | 30 | 20 | B | A | A | C | 13.3 |
| Example 2-4 | Re-4 | 40 | 30 | B | A | A | C | 13.5 |
| Example 2-5 | Re-5 | 20 | 40 | B | A | A | D | 14.6 |
| Example 2-6 | Re-6 | 50 | 10 | B | A | A | B | 12.6 |
| Example 2-7 | Re-7 | 45 | 15 | B | A | A | B | 12.5 |
| Example 2-8 | Re-8 | 50 | 10 | B | B | A | C | 13.6 |
| Example 2-9 | Re-9 | 25 | 20 | B | B | A | D | 14.7 |
| Example 2-10 | Re-10 | 35 | 10 | B | B | A | D | 14.4 |
| Example 2-11 | Re-11 | 30 | 30 | B | B | A | E | 15.2 |
| Example 2-12 | Re-12 | 35 | 5 | B | B | A | D | 14.2 |
| Example 2-13 | Re-13 | 35 | 15 | B | A | A | C | 13.3 |
| Example 2-14 | Re-14 | 40 | 10 | B | B | A | C | 13.4 |
| Example 2-15 | Re-15 | 60 | 20 | B | B | A | C | 13.2 |
| Example 2-16 | Re-16 | 55 | 10 | B | A | A | B | 12.4 |
| Example 2-17 | Re-17 | 70 | 5 | B | B | A | C | 13.5 |
| Example 2-18 | Re-18 | 55 | 10 | B | A | A | B | 12.6 |
| Example 2-19 | Re-19 | 40 | 15 | B | B | A | C | 13.3 |
| Example 2-20 | Re-20 | 45 | 10 | B | B | A | C | 13.7 |
| Example 2-21 | Re-21 | 25 | 25 | B | B | A | E | 15.3 |
| Example 2-22 | Re-22 | 80 | 5 | A | B | A | B | 12.4 |
| Example 2-23 | Re-23 | 25 | 25 | B | A | A | D | 14.4 |
| Example 2-24 | Re-24 | 35 | 25 | B | A | A | D | 14.8 |
| Example 2-25 | Re-25 | 50 | 50 | B | B | A | D | 14.7 |
| Example 2-26 | Re-26 | 40 | 40 | A | A | A | B | 12.4 |
| Example 2-27 | Re-27 | 45 | 5 | A | A | A | A | 11.4 |
| Example 2-28 | Re-28 | 50 | 10 | B | A | A | B | 12.5 |
| Example 2-29 | Re-29 | 60 | 10 | B | B | A | C | 13.9 |
| Example 2-30 | Re-30 | 25 | 50 | B | B | A | E | 15.3 |
| Example 2-31 | Re-31 | 30 | 40 | B | A | A | D | 14.7 |
| Example 2-32 | Re-32 | 50 | 10 | B | A | A | B | 12.6 |
| Example 2-33 | Re-33 | 40 | 10 | B | B | A | C | 13.3 |
| Example 2-34 | Re-34 | 35 | 25 | A | A | A | C | 13.7 |
| Example 2-35 | Re-35 | 35 | 15 | B | B | A | D | 14.4 |

TABLE 11

| Table 5-2 | Resist composition | Characteristics of resist composition: Amount of repeating unit a1 | Amount of acid-decomposable repeating unit | SP value of 18.0 or more | Lactone-containing repeating unit | PEB | Results: Defect suppressing properties | Limit Resolution (nm) |
|---|---|---|---|---|---|---|---|---|
| Example 2-36 | Re-36 | 40 | 0 | A | A | A | A | 11.7 |
| Example 2-37 | Re-37 | 50 | 0 | A | A | A | A | 11.6 |
| Example 2-38 | Re-38 | 45 | 0 | A | A | A | A | 11.1 |
| Example 2-39 | Re-39 | 55 | 0 | B | B | A | C | 13.2 |
| Example 2-40 | Re-30 | 60 | 0 | A | A | A | A | 11.5 |
| Example 2-41 | Re-41 | 70 | 0 | B | B | A | C | 13.1 |
| Example 2-42 | Re-42 | 55 | 0 | B | B | A | C | 13.3 |
| Example 2-43 | Re-43 | 55 | 0 | A | A | A | A | 11.8 |
| Example 2-44 | Re-44 | 70 | 0 | A | B | A | B | 12.3 |
| Example 2-45 | Re-45 | 80 | 0 | A | B | A | B | 12.4 |
| Example 2-46 | Re-46 | 35 | 0 | A | A | A | B | 12.3 |
| Example 2-47 | Re-47 | 45 | 0 | A | A | A | A | 11.3 |
| Example 2-48 | Re-48 | 50 | 0 | B | A | A | B | 12.4 |
| Example 2-49 | Re-49 | 50 | 0 | A | A | A | A | 11.3 |
| Example 2-50 | Re-50 | 70 | 0 | A | B | A | B | 12.5 |
| Example 2-51 | Re-51 | 60 | 0 | A | A | A | A | 11.5 |
| Example 2-52 | Re-52 | 55 | 0 | A | B | A | B | 12.3 |
| Example 2-53 | Re-53 | 70 | 0 | B | A | A | B | 12.5 |
| Example 2-54 | Re-54 | 90 | 0 | A | B | A | B | 12.6 |
| Example 2-55 | Re-55 | 55 | 0 | B | A | A | B | 12.3 |
| Example 2-56 | Re-56 | 80 | 0 | A | B | A | B | 12.4 |
| Example 2-57 | Re-57 | 75 | 0 | A | A | A | A | 11.3 |
| Example 2-58 | Re-58 | 70 | 0 | A | A | A | A | 11.6 |
| Example 2-59 | Re-59 | 80 | 0 | A | B | A | B | 12.3 |
| Example 2-60 | Re-60 | 75 | 0 | A | A | A | A | 11.4 |
| Example 2-61 | Re-61 | 100 | 0 | A | B | A | B | 12.3 |
| Example 2-62 | Re-62 | 100 | 0 | A | B | A | B | 12.6 |
| Example 2-63 | Re-63 | 100 | 0 | A | B | A | B | 12.4 |
| Example 2-64 | Re-64 | 100 | 0 | A | B | A | B | 12.7 |
| Example 2-65 | Re-65 | 100 | 0 | A | B | A | B | 12.4 |
| Example 2-66 | Re-66 | 100 | 0 | A | B | A | B | 12.4 |
| Example 2-67 | Re-67 | 100 | 0 | A | B | A | B | 12.2 |
| Comparative Example 2-1 | Re'-1 | 30 | 0 | A | B | A | H | 19.2 |
| Comparative Example 2-2 | Re'-2 | 10 | 27 | A | B | A | H | 18.9 |
| Comparative Example 2-3 | Re'-3 | — | 50 | B | B | A | H | 19.4 |

TABLE 11-continued

| Table 5-2 | Resist composition | Characteristics of resist composition: Amount of repeating unit a1 | Amount of acid-decomposable repeating unit | SP value of 18.0 or more | Lactone-containing repeating unit | PEB | Results: Defect suppressing properties | Limit Resolution (nm) |
|---|---|---|---|---|---|---|---|---|
| Comparative Example 2-4 | Re'-4 | — | 0 | A | B | A | Non-resolution | Non-resolution |
| Comparative Example 2-5 | Re'-5 | 20 | 30 | B | A | A | H | 18.9 |

TABLE 12

| Table 5-3 | Resist composition | Characteristics of resist composition: Amount of repeating unit a1 | Amount of acid-decomposable repeating unit | SP value of 18.0 or more | Lactone-containing repeating unit | PEB | Results: Defect suppressing properties | Limit Resolution (nm) |
|---|---|---|---|---|---|---|---|---|
| Example 2-68 | Re-1 | 20 | 30 | B | A | B | F | 16.4 |
| Example 2-69 | Re-2 | 35 | 35 | B | A | B | F | 16.4 |
| Example 2-70 | Re-3 | 30 | 20 | B | A | B | D | 14.4 |
| Example 2-71 | Re-4 | 40 | 30 | B | A | B | D | 14.5 |
| Example 2-72 | Re-5 | 20 | 40 | B | A | B | F | 16.5 |
| Example 2-73 | Re-6 | 50 | 10 | B | A | B | B | 12.5 |
| Example 2-74 | Re-7 | 45 | 15 | B | A | B | B | 12.4 |
| Example 2-75 | Re-8 | 50 | 10 | B | B | B | C | 13.5 |
| Example 2-76 | Re-9 | 25 | 20 | B | B | B | E | 15.2 |
| Example 2-77 | Re-10 | 35 | 10 | B | B | B | E | 15.4 |
| Example 2-78 | Re-11 | 30 | 30 | B | B | B | G | 17.5 |
| Example 2-79 | Re-12 | 35 | 5 | B | B | B | E | 15.3 |
| Example 2-80 | Re-13 | 35 | 15 | B | A | B | D | 14.7 |
| Example 2-81 | Re-14 | 40 | 10 | B | B | B | C | 13.2 |
| Example 2-82 | Re-15 | 60 | 20 | B | B | B | C | 13.6 |
| Example 2-83 | Re-16 | 55 | 10 | B | A | B | B | 12.3 |
| Example 2-84 | Re-17 | 70 | 5 | B | B | B | C | 13.5 |
| Example 2-85 | Re-18 | 55 | 10 | B | A | B | B | 12.3 |
| Example 2-86 | Re-19 | 40 | 15 | B | B | B | C | 13.5 |
| Example 2-87 | Re-20 | 45 | 10 | B | B | B | C | 13.4 |
| Example 2-88 | Re-21 | 25 | 25 | B | B | B | G | 17.4 |
| Example 2-89 | Re-22 | 80 | 5 | A | B | B | B | 12.4 |
| Example 2-90 | Re-23 | 25 | 25 | B | A | B | F | 16.2 |
| Example 2-91 | Re-24 | 35 | 25 | B | A | B | F | 16.4 |
| Example 2-92 | Re-25 | 50 | 50 | B | B | B | E | 15.5 |
| Example 2-93 | Re-26 | 40 | 40 | A | A | B | B | 12.7 |
| Example 2-94 | Re-27 | 45 | 5 | A | A | B | A | 11.3 |
| Example 2-95 | Re-28 | 50 | 10 | B | A | B | B | 12.5 |
| Example 2-96 | Re-29 | 60 | 10 | B | B | B | C | 13.6 |
| Example 2-97 | Re-30 | 25 | 50 | B | B | B | G | 17.2 |
| Example 2-98 | Re-31 | 30 | 40 | B | A | B | F | 16.8 |
| Example 2-99 | Re-32 | 50 | 10 | B | A | B | B | 12.2 |
| Example 2-100 | Re-33 | 40 | 10 | B | B | B | C | 13.5 |
| Example 2-101 | Re-34 | 35 | 25 | A | A | B | E | 15.4 |
| Example 2-102 | Re-35 | 35 | 15 | B | B | B | E | 15.8 |

TABLE 13

| Table 5-4 | Resist composition | Characteristics of resist composition: Amount of repeating unit a1 | Amount of acid-decomposable repeating unit | SP value of 18.0 or more | Lactone-containing repeating unit | PEB | Results: Defect suppressing properties | Limit Resolution (nm) |
|---|---|---|---|---|---|---|---|---|
| Example 2-103 | Re-36 | 40 | 0 | A | A | B | A | 11.1 |
| Example 2-104 | Re-37 | 50 | 0 | A | A | B | A | 11.2 |
| Example 2-105 | Re-38 | 45 | 0 | A | A | B | A | 11.2 |
| Example 2-106 | Re-39 | 55 | 0 | B | B | B | C | 13.7 |
| Example 2-407 | Re-40 | 60 | 0 | A | A | B | A | 11.4 |
| Example 2-108 | Re-41 | 70 | 0 | B | B | B | C | 13.2 |

TABLE 13-continued

| Table 5-4 | Resist composition | Characteristics of resist composition: Amount of repeating unit a1 | Amount of acid-decomposable repeating unit | SP value of 18.0 or more | Lactone-containing repeating unit | PEB | Results: Defect suppressing properties | Limit Resolution (nm) |
|---|---|---|---|---|---|---|---|---|
| Example 2-109 | Re-42 | 55 | 0 | B | B | B | C | 13.6 |
| Example 2-110 | Re-43 | 55 | 0 | A | A | B | A | 11.3 |
| Example 2-111 | Re-44 | 70 | 0 | A | B | B | B | 12.1 |
| Example 2-112 | Re-45 | 80 | 0 | A | B | B | B | 12.4 |
| Example 2-113 | Re-46 | 35 | 0 | A | A | B | C | 13.4 |
| Example 2-114 | Re-47 | 45 | 0 | A | A | B | A | 11.3 |
| Example 2-115 | Re-48 | 50 | 0 | B | A | B | B | 12.3 |
| Example 2-116 | Re-49 | 50 | 0 | A | A | B | A | 11.4 |
| Example 2-117 | Re-50 | 70 | 0 | A | B | B | B | 12.5 |
| Example 2-118 | Re-51 | 60 | 0 | A | A | B | A | 11.8 |
| Example 2-119 | Re-52 | 55 | 0 | A | B | B | B | 12.2 |
| Example 2-120 | Re-53 | 70 | 0 | B | A | B | B | 12.4 |
| Example 2-121 | Re-54 | 90 | 0 | A | B | B | B | 12.4 |
| Example 2-122 | Re-55 | 55 | 0 | B | A | B | B | 12.3 |
| Example 2-123 | Re-56 | 80 | 0 | A | B | B | B | 12.4 |
| Example 2-124 | Re-57 | 75 | 0 | A | A | B | A | 11.2 |
| Example 2-125 | Re-58 | 70 | 0 | A | A | B | A | 11.4 |
| Example 2-126 | Re-59 | 80 | 0 | A | B | B | B | 12.3 |
| Example 2-127 | Re-60 | 75 | 0 | A | A | B | A | 11.1 |
| Example 2-128 | Re-61 | 100 | 0 | A | B | B | B | 12.5 |
| Example 2-129 | Re-62 | 100 | 0 | A | B | B | B | 12.4 |
| Example 2-130 | Re-63 | 100 | 0 | A | B | B | B | 12.4 |
| Example 2-131 | Re-64 | 100 | 0 | A | B | B | B | 12.6 |
| Example 2-132 | Re-65 | 100 | 0 | A | B | B | B | 12.4 |
| Example 2-133 | Re-66 | 100 | 0 | A | B | B | B | 12.5 |
| Example 2-134 | Re-67 | 100 | 0 | A | B | B | B | 12.4 |
| Comparative Example 2-6 | Re'-1 | 30 | 0 | A | B | B | Non-resolution | Non-resolution |
| Comparative Example 2-7 | Re'-2 | 10 | 27 | A | B | B | Non-resolution | Non-resolution |
| Comparative Example 2-8 | Re'-3 | — | 50 | B | B | B | Non-resolution | Non-resolution |
| Comparative Example 2-9 | Re'-4 | — | 0 | A | B | B | Non-resolution | Non-resolution |
| Comparative Example 2-10 | Re'-5 | 20 | 30 | B | A | B | H | 20.9 |

From the results shown in the table, it was confirmed that even in a case where a pattern was formed by alkali development using the resist composition of the embodiment of the present invention, the defect performance (defect suppressing properties) and the resolution were excellent. On the other hand, these performances are insufficient in the resist compositions of Comparative Examples which do not correspond to the resist composition of the embodiment of the present invention.

In addition, the greater the number satisfying each requirement, of a requirement that the amount of the repeating unit at in the resin A is 40% by mole or more, a requirement that the amount of the repeating unit having an acid-decomposable group in the resin A is 20% by mole or less, a requirement that the SP values of substantially all the repeating units of the repeating unit are 18.0 $MPa^{0.5}$ or more, and a requirement that the resin A has a repeating unit having a lactone group, the more excellent the effect of the present invention (refer to a comparison between Examples in which PEB was performed, a comparison between Examples in which PEB was not performed, and the like).

What is claimed is:

1. An actinic ray-sensitive or radiation-sensitive resin composition comprising:

a resin A having a repeating unit a1 having a group represented by any one of General Formula (1), (2), (3), (4), (5), or (6), which is a nonionic group that decomposes upon irradiation with actinic rays or radiation and a content of which is 20% by mole or more with respect to all repeating units; and an additive B that is at least any one of an acid having an acid group having a pKa of −3.60 or more, or a salt having a structure in which a hydrogen atom of an acid group having a pKa of −3.60 or more is substituted with a cation, (1)

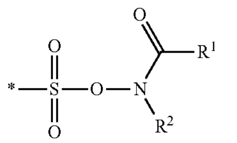

(2)

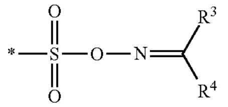

(3)

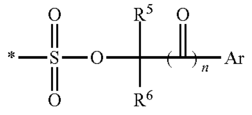

-continued (4)

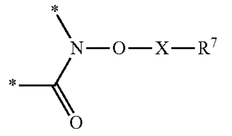

(5)

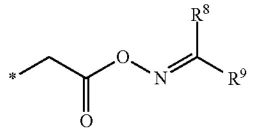

(6)

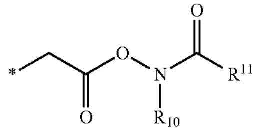

in General Formulae (1) to (6), * represents a bonding position, in General Formula (1), $R^1$ and $R^2$ each independently represent an organic group, and $R^1$ and $R^2$ may be bonded to each other to form a ring;

in General Formula (2), $R^3$ and $R^4$ each independently represent an organic group, and $R^3$ and $R^4$ may be bonded to each other to form a ring;

in General Formula (3), $R^5$ and $R^6$ each independently represent a hydrogen atom or an organic group, and $R^5$ and $R^6$ may be bonded to each other to form a ring;

n represents 0 or 1, and

Ar represents an aromatic ring group which may have a substituent;

in General Formula (4), $R^7$ represents an organic group, and

X represents —CO— or —$SO_2$—;

in General Formula (5), $R^8$ and $R^9$ each independently represent an organic group, and $R^8$ and $R^9$ may be bonded to each other to form a ring; and in General Formula (6), $R^{10}$ and $R^{11}$ each independently represent an organic group, and $R^{10}$ and $R^{11}$ may be bonded to each other to form a ring, and wherein any one of the following requirements 1 to 5 is satisfied:

requirement 1: the resin A has a repeating unit having an acid-decomposable group which does not correspond to the group represented by any one of General Formula (1), (2), (3), (4), (5) or (6), and a content of the repeating unit having an acid-decomposable group which does not correspond to the group represented by any one of General Formula (1), (2), (3), (4), (5) or (6) is 10% by mole or more with respect to all the repeating units in the resin A, requirement 2: the resin A has a repeating unit having a lactone group, and a content of the repeating unit having a lactone group is 10% by mole or more with respect to all the repeating units in the resin A, requirement 3: the resin A has a repeating unit having a sultone group or a carbonate group, and a content of the repeating unit having a sultone group or a carbonate group is 10% by mole or more with respect to all the repeating units in the resin A, requirement 4: the resin A has a repeating unit having a carboxyl group, and a content of the repeating unit having a carboxyl group is 10% by mole or more with respect to all the repeating units in the resin A, requirement 5: the resin A has a repeating unit having a fluorine atom or an iodine atom, and a content of the repeating unit having a fluorine atom or an iodine atom is 10% by mole or more with respect to all the repeating units in the resin A.

2. The actinic ray-sensitive or radiation-sensitive resin composition according to claim 1, wherein the actinic ray-sensitive or radiation-sensitive resin composition includes the resin A having a content of the repeating unit a1 of 40% by mole or more with respect to all the repeating units.

3. The actinic ray-sensitive or radiation-sensitive resin composition according to claim 2, wherein a content of a repeating unit having an acid-decomposable group not corresponding to any one of the groups represented by General Formulae (1) to (6) in the resin A is 20% by mole or less with respect to all the repeating units.

4. The actinic ray-sensitive or radiation-sensitive resin composition according to claim 2, wherein SP values of all the repeating units constituting the resin A are 18.0 $MPa^{0.5}$ or more.

5. The actinic ray-sensitive or radiation-sensitive resin composition according to claim 2, wherein the resin A has a repeating unit having a lactone group.

6. The actinic ray-sensitive or radiation-sensitive resin composition according to claim 2, wherein a concentration of solid contents is 2% by mass or less.

7. A resist film formed of the actinic ray-sensitive or radiation-sensitive resin composition according to claim 2.

8. The actinic ray-sensitive or radiation-sensitive resin composition according to claim 1, wherein a content of a repeating unit having an acid-decomposable group not corresponding to any one of the groups represented by General Formulae (1) to (6) in the resin A is 20% by mole or less with respect to all the repeating units.

9. The actinic ray-sensitive or radiation-sensitive resin composition according to claim 8, wherein SP values of all the repeating units constituting the resin A are 18.0 $MPa^{0.5}$ or more.

10. The actinic ray-sensitive or radiation-sensitive resin composition according to claim 8, wherein the resin A has a repeating unit having a lactone group.

11. The actinic ray-sensitive or radiation-sensitive resin composition according to claim 8, wherein a concentration of solid contents is 2% by mass or less.

12. The actinic ray-sensitive or radiation-sensitive resin composition according to claim 1, wherein SP values of all the repeating units constituting the resin A are 18.0 $MPa^{0.5}$ or more.

13. The actinic ray-sensitive or radiation-sensitive resin composition according to claim 1, wherein the resin A has a repeating unit having a lactone group.

14. The actinic ray-sensitive or radiation-sensitive resin composition according to claim 1, wherein a concentration of solid contents is 2% by mass or less.

15. A resist film formed of the actinic ray-sensitive or radiation-sensitive resin composition according to claim 1.

16. A pattern forming method comprising:

a step of forming a resist film on a substrate using the actinic ray-sensitive or radiation-sensitive resin composition according to claim 1;

a step of exposing the resist film; and a step of developing the exposed resist film using a developer.

17. A method for manufacturing an electronic device, comprising the pattern forming method according to claim 16.

18. A pattern forming method comprising:

a step of forming a resist film on a substrate using the actinic ray-sensitive or radiation-sensitive resin composition according to claim 2;

a step of exposing the resist film; and a step of developing the exposed resist film using a developer.

19. A method for manufacturing an electronic device, comprising the pattern forming method according to claim 18.

20. A resist film formed of the actinic ray-sensitive or radiation-sensitive resin composition according to claim 8.

* * * * *